(12) United States Patent
Kuwabara et al.

(10) Patent No.: US 12,426,499 B2
(45) Date of Patent: Sep. 23, 2025

(54) ORGANIC ELECTROLUMINESCENCE DEVICE AND FUSED POLYCYCLIC COMPOUND FOR ORGANIC ELECTROLUMINESCENCE DEVICE

(71) Applicant: Samsung Display Co., Ltd., Yongin-si (KR)

(72) Inventors: Hirokazu Kuwabara, Yokohama (JP); Ryuhei Furue, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 719 days.

(21) Appl. No.: 17/102,168

(22) Filed: Nov. 23, 2020

(65) Prior Publication Data

US 2021/0320257 A1  Oct. 14, 2021

(30) Foreign Application Priority Data

Mar. 31, 2020 (KR) .................. 10-2020-0039162

(51) Int. Cl.
*H10K 85/60* (2023.01)
*H10K 50/15* (2023.01)
(Continued)

(52) U.S. Cl.
CPC ......... *H10K 85/636* (2023.02); *H10K 85/211* (2023.02); *H10K 85/622* (2023.02);
(Continued)

(58) Field of Classification Search
CPC .. H10K 85/622; H10K 85/211; H10K 85/631; H10K 85/6572; H10K 85/6574;
(Continued)

(56) References Cited

U.S. PATENT DOCUMENTS 11,335,860 B2   5/2022 Uno
2015/0123086 A1*  5/2015 Lee .................. H10K 50/858
                                                 438/26
(Continued)

FOREIGN PATENT DOCUMENTS

CN    105431439 A    3/2016
CN    110343105 A    10/2019
(Continued)

OTHER PUBLICATIONS

Chinese Examination report dated Aug. 6, 2025, in corresponding Chinese Patent Application No. CN 202110167012.3 (8 pages).

*Primary Examiner* — Jennifer A Boyd
*Assistant Examiner* — Braelyn R Watson
(74) *Attorney, Agent, or Firm* — Womble Bond Dickinson (US) LLP

(57) ABSTRACT

An organic electroluminescence device includes a first electrode and a second electrode facing each other, and a plurality of organic layers disposed between the first electrode and the second electrode, wherein at least one of the plurality of organic layers includes a fused polycyclic com-
(Continued)

pound represented by Formula 1, and the device exhibits improved luminous efficiency.

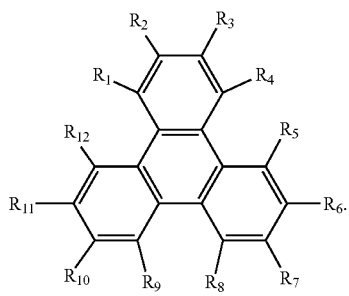

Formula 1

18 Claims, 2 Drawing Sheets

(51) Int. Cl.
*H10K 50/16* (2023.01)
*H10K 50/81* (2023.01)
*H10K 50/82* (2023.01)
*H10K 85/20* (2023.01)
*H10K 101/20* (2023.01)

(52) U.S. Cl.
CPC ....... *H10K 85/631* (2023.02); *H10K 85/6572* (2023.02); *H10K 85/6574* (2023.02); *H10K 85/6576* (2023.02); *H10K 85/658* (2023.02); *H10K 50/15* (2023.02); *H10K 50/16* (2023.02); *H10K 50/81* (2023.02); *H10K 50/82* (2023.02); *H10K 2101/20* (2023.02)

(58) Field of Classification Search
CPC .... H10K 85/6576; H10K 50/15; H10K 50/16; H10K 50/11; H10K 2101/20; H10K 85/322; H10K 85/657; H10K 85/636; H10K 50/81; H10K 50/82; H10K 50/844; H10K 85/658; H10K 85/649; H10K 85/656; C07F 5/027; C09K 11/06; C09K 2211/1029; C09K 2211/1055; C09K 2211/107; C09K 2211/1085; C09K 2211/1096; C09K 2211/1014–1096; H01L 51/0071; H01L 51/0062; H01L 51/0069
See application file for complete search history.

(56) References Cited

U.S. PATENT DOCUMENTS

| | | | |
|---|---|---|---|
| 2019/0312210 A1 | 10/2019 | Akashi et al. | |
| 2020/0144513 A1 | 5/2020 | Hatakeyama et al. | |
| 2020/0144514 A1* | 5/2020 | Hatakeyama | ..... C07F 9/657163 |
| 2020/0185626 A1 | 6/2020 | Yuuki | |
| 2022/0006012 A1* | 1/2022 | Hatakeyama | ........ H10K 85/615 |

FOREIGN PATENT DOCUMENTS

| | | |
|---|---|---|
| CN | 110551131 A | 12/2019 |
| EP | 3502104 A1 | 6/2019 |
| EP | 3543230 A1 | 9/2019 |
| JP | 5935199 B2 | 6/2016 |
| KR | 10-2016-0119683 A | 10/2016 |
| KR | 10-1955648 B1 | 3/2019 |
| KR | 10-2020-0071192 A | 6/2020 |
| WO | WO 2015/102118 A1 | 7/2015 |
| WO | WO 2018/074167 A1 | 4/2018 |

* cited by examiner

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2020-0039162, filed on Mar. 31, 2020, the entire content of which is hereby incorporated by reference.

BACKGROUND

One or more aspects of embodiments of the present disclosure relate to an organic electroluminescence device and a fused polycyclic compound utilized for the same, and for example, to a fused polycyclic compound utilized as a luminescent material and an organic electroluminescence device including the same.

Organic electroluminescence displays are being developed as image display devices. Unlike liquid crystal display devices and/or the like, an organic electroluminescence display is a so-called self-luminescent display device, in which holes and electrons respectively injected from a first electrode and a second electrode recombine in an emission layer, and a luminescent organic compound in the emission layer emits light to implement display.

Display device applications demand an organic electroluminescence device having a low driving voltage, a high luminous efficiency, and/or a long service life (life span), and new materials capable of stably attaining such characteristics in an organic electroluminescence device are desired.

In recent years, in order to implement a highly efficient organic electroluminescence device, technologies pertaining to phosphorescence emission (which uses energy in a triplet state) and/or delayed fluorescence emission (which uses singlet excitons generated by the collision of triplet excitons (triplet-triplet annihilation, TTA)) are being developed, and materials for thermally activated delayed fluorescence (TADF) are being developed.

SUMMARY

One or more aspects of embodiments of the present disclosure are directed toward an organic electroluminescence device with improved luminous efficiency.

One or more aspects of embodiments of the present disclosure are directed toward a fused polycyclic compound that can improve the luminous efficiency of an organic electroluminescence device.

One or more example embodiments of the present disclosure provide an organic electroluminescence device including a first electrode, a second electrode facing the first electrode, and a plurality of organic layers between the first electrode and the second electrode. At least one organic layer among the plurality of organic layers includes a fused polycyclic compound represented by Formula 1:

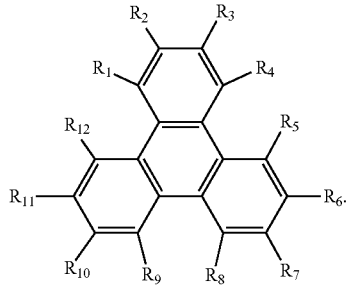

Formula 1

In Formula 1, $R_1$ to $R_{12}$ may each independently be a hydrogen atom, a deuterium atom, a halogen atom, a substituted or unsubstituted oxy group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring; and two or more pairs of adjacent $R_1$ to $R_{12}$ groups are each fused to a substituent represented by Formula 2:

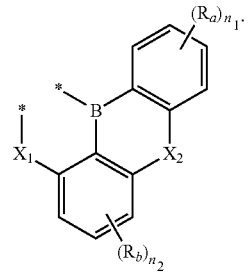

Formula 2

In Formula 2, —* is a position of fusion to one of the two or more pairs of adjacent $R_1$ to $R_{12}$ groups in Formula 1; $X_1$ and $X_2$ may each independently be $NAr_1$, O, or S; $Ar_1$ may be a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring; $R_a$ and $R_b$ may each independently be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring; $n_1$ may be an integer of 0 to 4; and $n_2$ may be an integer of 0 to 3. For example, two or more substituents represented by Formula 2 may be fused to Formula 1.

In an embodiment, the plurality of organic layers may include a hole transport region on the first electrode, an emission layer on the hole transport region, and an electron transport region on the emission layer. The emission layer may include the fused polycyclic compound.

In an embodiment, the emission layer may be to emit delayed fluorescence.

In an embodiment, the emission layer may be a delayed fluorescence emission layer including a host and a dopant, and the dopant may be or include the fused polycyclic compound.

In an embodiment, two or three substituents represented by Formula 2 may be fused to the fused polycyclic compound represented by Formula 1, and the two or three fused substituents represented by Formula 2 may be the same as each other.

In an embodiment, the substituent represented by Formula 2 may be represented by any one among Formula 2-1 to Formula 2-8:

Formula 2-1

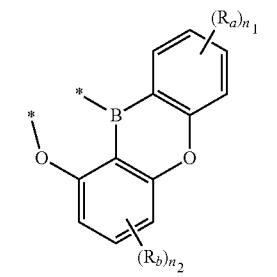

Formula 2-2

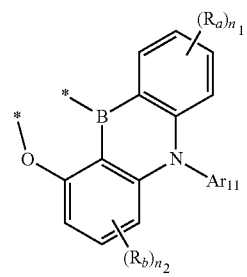

Formula 2-3

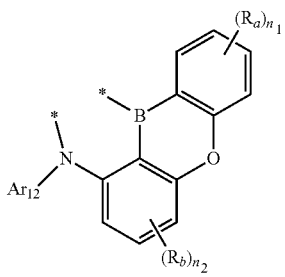

Formula 2-4

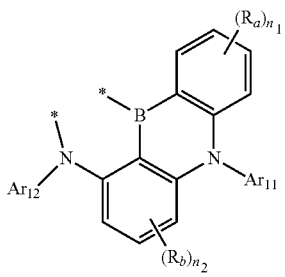

Formula 2-5

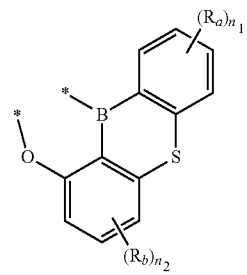

Formula 2-6

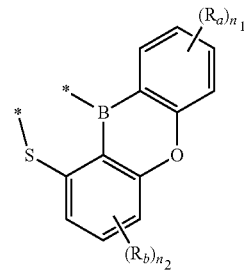

Formula 2-7

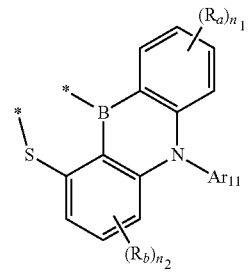

Formula 2-8

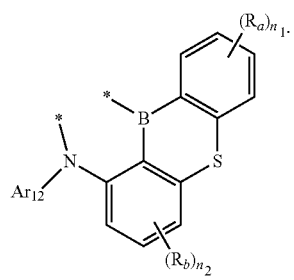

In Formula 2-1 to Formula 2-8, $Ar_{11}$ and $Ar_{12}$ may each independently be a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. $R_a$ and $R_b$; and $n_1$ and $n_2$ may each independently be the same as defined in Formula 2.

In an embodiment, the substituent represented by Formula 2 may be represented by Formula 2-a:

Formula 2-a

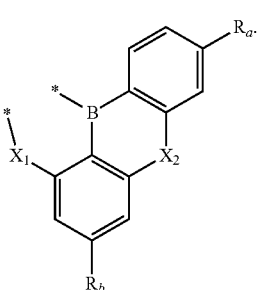

In Formula 2-a, $X_1$ and $X_2$, and $R_a$ and $R_b$ may each independently be the same as defined in Formula 2.

In an embodiment, the fused polycyclic compound represented by Formula 1 may be represented by any one among Formula 3-1 to Formula 3-5:

Formula 3-1
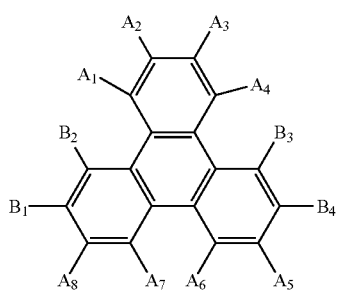

Formula 3-2
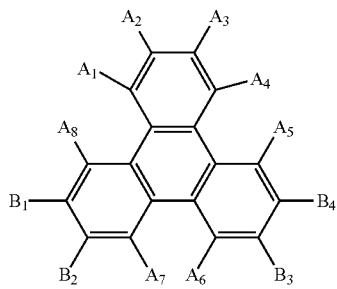

Formula 3-3
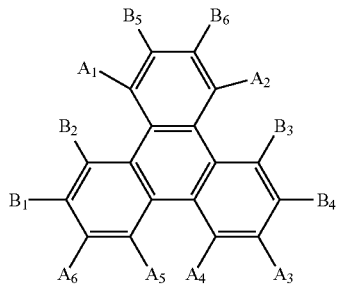

Formula 3-4
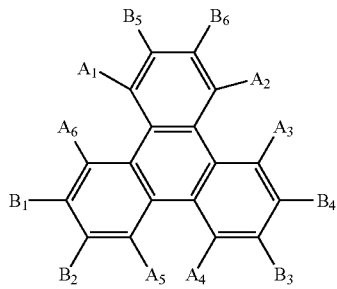

Formula 3-5
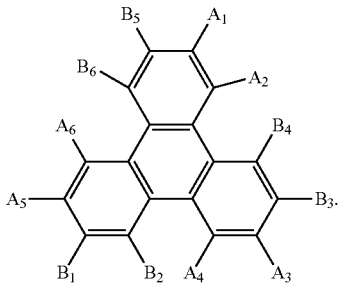

In Formula 3-1 to Formula 3-5, $A_1$ to $A_8$ may each independently be a hydrogen atom, a deuterium atom, a halogen atom, a substituted or unsubstituted oxy group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring; and $B_1$ and $B_2$, $B_3$ and $B_4$, and $B_5$ and $B_6$ may each be fused to the substituent represented by Formula 2.

In an embodiment, the fused polycyclic compound represented by Formula 1 may be represented by any one among Formula 4-1 to Formula 4-8:

Formula 4-1
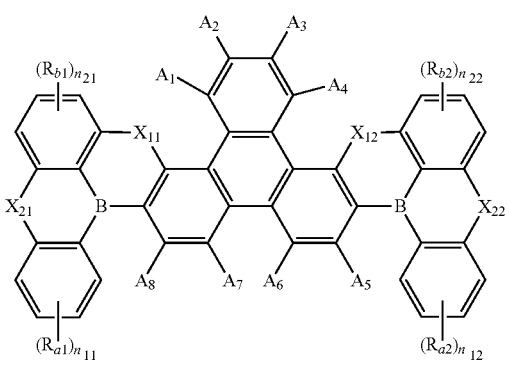

Formula 4-2
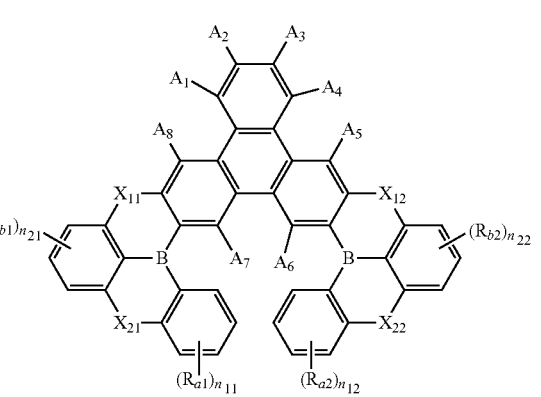

Formula 4-3
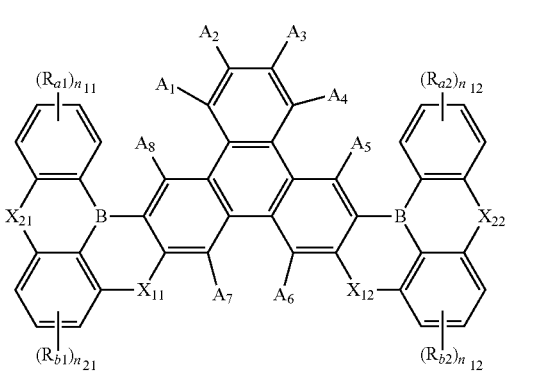

-continued

Formula 4-4

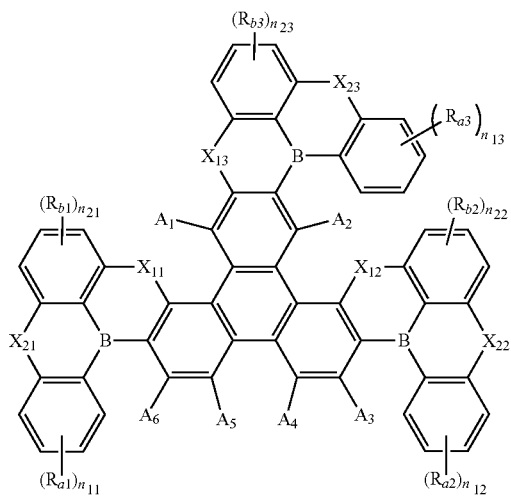

Formula 4-5

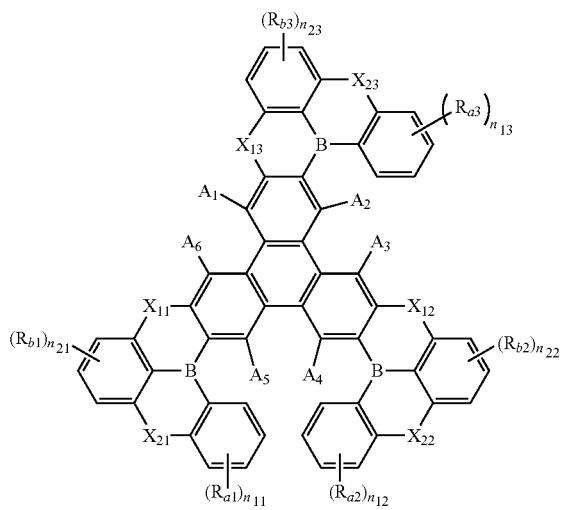

Formula 4-6

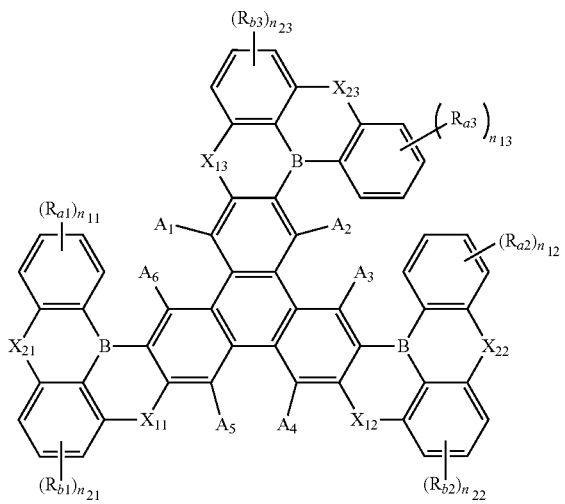

-continued

Formula 4-7

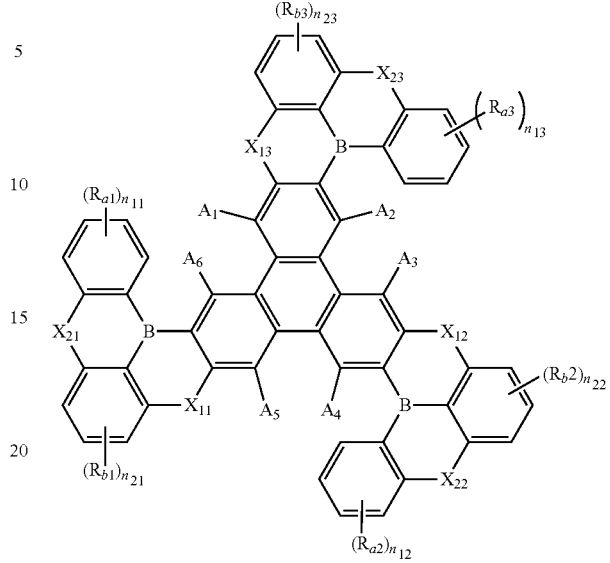

Formula 4-8

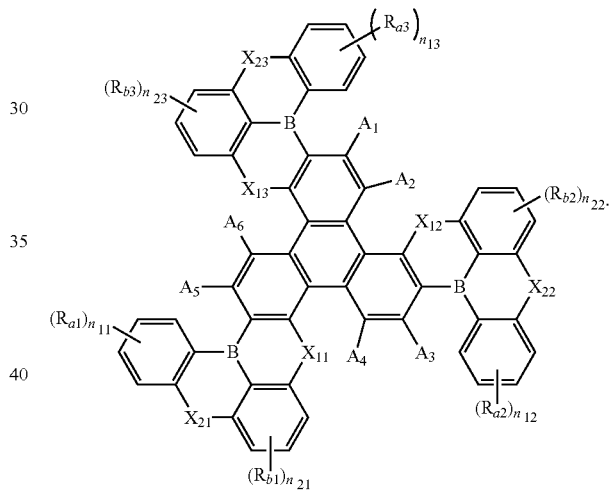

In Formula 4-1 to Formula 4-8, $X_{11}$, $X_{12}$, $X_{13}$, $X_{21}$, $X_{22}$, and $X_{23}$ may each independently be $NAr_1$, O, or S; $R_{a1}$, $R_{a2}$, $R_{a3}$, $R_{b1}$, $R_{b2}$, and $R_{b3}$ may each independently be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring; $n_{11}$, $n_{12}$, and $n_{13}$ may each independently be an integer of 0 to 4; $n_{21}$, $n_{22}$, and $n_{23}$ may each independently be an integer of 0 to 3; and $Ar_1$ and $A_1$ to $A_8$ may each independently be the same as defined in Formula 2 and Formula 3-1 to Formula 3-5.

In an embodiment, $R_a$ and $R_b$ (and e.g., $R_{a1}$, $R_{a2}$, $R_{a3}$, $R_{b1}$, $R_{b2}$, and $R_{b3}$) may each independently be a hydrogen atom, a deuterium atom, a substituted or unsubstituted methyl group, a substituted or unsubstituted t-butyl group, a substituted or unsubstituted arylamine group, a substituted or unsubstituted phenyl group, or a substituted or unsubstituted carbazole group.

In an embodiment, $R_1$ to $R_{12}$ may each independently be a hydrogen atom, a deuterium atom, or a position of fusion to the substituent represented by Formula 2.

In some embodiments, the organic electroluminescence device may further include a capping layer on the second electrode and having a refractive index of 1.6 or more.

In the organic electroluminescence device according to an embodiment of the present disclosure, the first electrode and the second electrode may each independently include any one selected from silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), indium (In), zinc (Zn), tin (Sn), and ytterbium (Yb), a compound of two or more thereof, a mixture of two or more thereof, or at least one oxide thereof.

The fused polycyclic compound according to an embodiment of the present disclosure may be represented by Formula 1.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
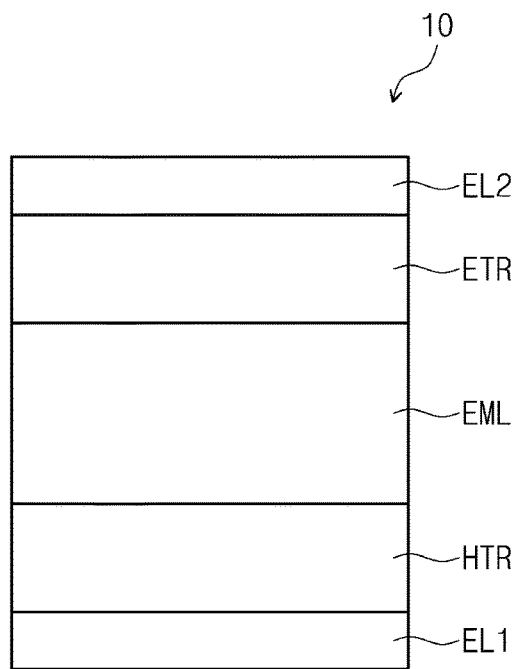
FIG. 1 is a cross-sectional view schematically illustrating an organic electroluminescence device according to an embodiment of the present disclosure.

The above objects, other objects, features and advantages of the present disclosure will be easily understood from example embodiments with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art.

When explaining each of drawings, like reference numbers are used for referring to like elements, and duplicative descriptions thereof may not be provided. In the accompanying drawings, the dimensions and sizes of elements may be exaggerated for clarity of explanation. It will be understood that, although the terms "first", "second", etc. may be used herein to describe various elements, these elements should not be limited by these terms. These terms are only used to distinguish one element from another. For example, a first element could alternatively be termed a second element, and, similarly, a second element could alternatively be termed a first element, without departing from the scope of the present disclosure. Singular forms encompass plural forms and vice versa, unless the context clearly indicates otherwise.

In the present specification, it will be understood that the terms "includes," "including," "comprises," "comprising," and/or "have" specify the presence of a feature, a fixed number, a step, a process, an element, a component, or a combination thereof disclosed in the specification, but do not exclude the presence or addition of one or more other features, steps, processes, elements, or components. It will be further understood that when a layer, a film, a region, or a plate is referred to as being cony ('under) another layer, film, region, or plate, it can be directly on (under) the layer, film, region, or plate, or intervening layers, films, regions, or plates may also be present. When an element is referred to as being "directly on," "directly connected to," or "directly coupled to" another element, there are no intervening elements present.

As used herein, expressions such as "at least one of," "one of," and "selected from," when preceding a list of elements, modify the entire list of elements and do not modify the individual elements of the list. As used herein, the term "and/or" includes any and all combinations of one or more of the associated listed items. Further, the use of "may" when describing embodiments of the present disclosure refers to "one or more embodiments of the present disclosure".

Hereinafter, an organic electroluminescence device according to an embodiment of the present disclosure and a fused polycyclic compound of an embodiment included therein will be described with reference to the accompanying drawings.

FIGS. 1 to 4 are cross-sectional views schematically illustrating organic electroluminescence devices according to embodiments of the present disclosure. Referring to FIGS. 1 to 4, in each organic electroluminescence device 10 according to embodiments of the present disclosure, a first electrode EU and a second electrode EL2 are disposed facing each other, and a plurality of organic layers may be disposed between the first electrode EL1 and the second electrode EL2. The plurality of organic layers may include a hole transport region HTR, an emission layer EML, an electron transport region ETR. For example, each of the organic electroluminescence devices 10 according to embodiments may include the first electrode EL1, the hole transport region HTR, the emission layer EML, the electron transport region ETR, and the second electrode EL2, which are sequentially stacked. In some embodiments, a capping layer CPL may be disposed on the second electrode EL2.

The organic electroluminescence device 10 may include a fused polycyclic compound according to an embodiment described below in at least of the plurality of organic layers disposed between the first electrode EU and the second electrode EL2. For example, the organic electroluminescence device 10 may include a fused polycyclic compound in the emission layer EML disposed between the first electrode EL1 and the second electrode EL2. However, embodiments are not limited thereto, and the organic electroluminescence device 10 may include a fused polycyclic compound in at least one of the hole transport region HTR and the electron transfer region ETR, which are among the plurality of organic layers disposed between the first electrode EL1 and the second electrode EL2, or in the capping layer CPL disposed on the second electrode EL2.

Figure 2:
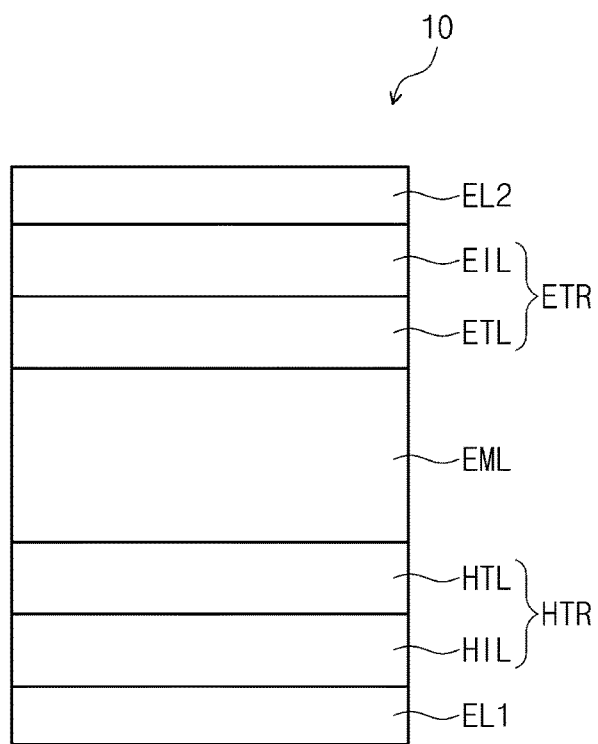
FIG. 2 is a cross-sectional view schematically illustrating an organic electroluminescence device according to an embodiment of the present disclosure.
Figure 3:
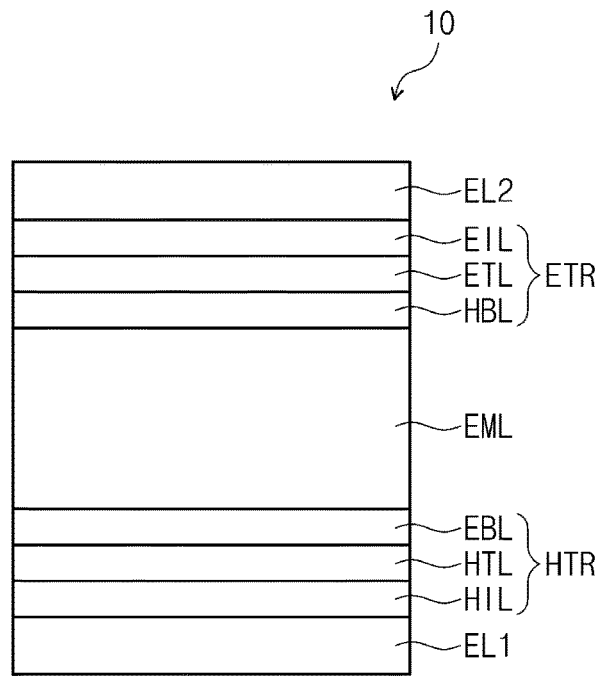
FIG. 3 is a cross-sectional view schematically illustrating an organic electroluminescence device according to an embodiment of the present disclosure.
Figure 4:
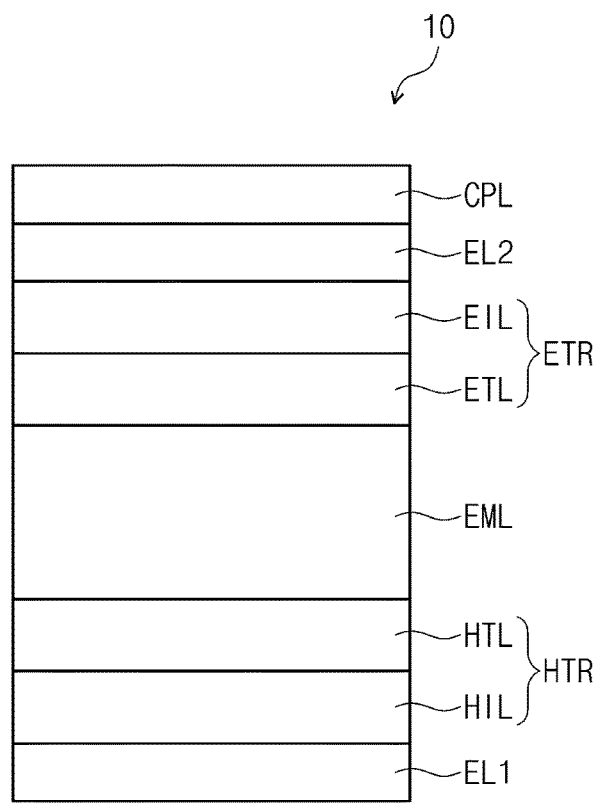
FIG. 4 is a cross-sectional view schematically illustrating an organic electroluminescence device according to an embodiment of the present disclosure.

Compared to FIG. 1, FIG. 2 illustrates a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. Compared to FIG. 1, FIG. 3 illustrates a cross-sectional view of an organic electroluminescence device 10 of an embodiment, in which the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared to FIG. 2, FIG. 4 illustrates a cross-sectional view of an organic electroluminescence device 10 of an embodiment including a capping layer CPL disposed on the second electrode EL2.

Hereinafter, it is described that the organic electroluminescence device 10 includes the fused polycyclic compound according to an embodiment in the emission layer EML, but the embodiments are not limited thereto, and in some embodiments, the polycyclic compound may be included in the hole transport region HTR, the electron transport region ETR, and/or the capping layer CPL.

The first electrode EL1 may have conductivity. The first electrode EU may be formed of a metal alloy and/or a conductive compound. The first electrode EL1 may be an anode. In some embodiments, the first electrode EU may be a pixel electrode. The first electrode EL1 may be a transmissive electrode, a transflective electrode, or a reflective electrode. When the first electrode EL1 is the transmissive electrode, the first electrode EL1 may include a transparent metal oxide, (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or a mixture thereof (e.g., a mixture of Ag and Mg). In some embodiments, the first electrode EU may have a multilayer structure including a reflective layer or a transflective layer formed of the above-described materials, and a transparent conductive layer formed of ITO, IZO, ZnO, ITZO, etc. For example, the first electrode EL1 may have a three-layer structure of ITO/Ag/ITO, but is not limited thereto. The thickness of the first electrode EL1 may be about 1,000 Å to about 10,000 Å, for example, about 1,000 Å to about 3,000 Å.

The hole transport region HTR is disposed on the first electrode EL1. The hole transport region HTR may include at least one of a hole injection layer HIL, a hole transport layer HTL, a hole buffer layer, or an electron blocking layer EBL. The thickness of the hole transport region HTR may be, for example, about 50 Å to about 1,500 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, or may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments are not limited thereto.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4',4"-tris(N,N-diphenylamino)triphenylamine (TDATA), 4,4',4"-tris{N,-(2-naphthyl) N-phenylamino)-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(naphthalene-1-yl)-N,N'-diphenyl-benzidine (NPB), N,N'-di(1-naphthyl)-N,N'-diphenyl-(1,1'-biphenyl)-4,4'-diamine (NPD), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole derivatives (such as N-phenyl carbazole and/or polyvinyl carbazole), fluorene derivatives, N,N'-bis (3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di (naphthalene-1-yl)-N,N'-diphenyl-benzidine (NPD), 4,4'-cyclohexylidene bis[N,N-bis(4-methylphenyl] benzenamine] (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), etc.

The thickness of the hole transport region HTR may be about 100 Å to about 10,000 Å, for example, about 100 Å to about 5,000 Å. The thickness of the hole injection region HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed substantially uniformly or non-uniformly in the hole transport region HTR. The charge generating material may be, for example, a p-dopant. The p-dopant may be one of quinone derivatives, metal oxides, or cyano group-containing compounds, but is not limited thereto. For example, non-limiting examples of the p-dopant may include quinone derivatives (such as tetracyanoquinodimethane (TCNQ) and/or 2,3,5,6-tetrafluoro-7,7',8,8'-tetracyanoquinodimethane (F4-TCNQ)), metal oxides (such as tungsten oxide and/or molybdenum oxide), etc., but is not limited thereto.

As described above, the hole transport region HTR may further include at least one of a hole buffer layer or an electron blocking layer EBL, in addition to the hole injection layer HIL and the hole transport layer HTL. The hole buffer layer may compensate for a resonance distance of the light wavelength emitted from an emission layer EML, and may thereby increase light emission efficiency. Materials that may be included in the hole transport region HTR may also be included in the hole buffer layer. The electron blocking layer EBL may prevent or reduce electrons from being injected from the electron transport region ETR to the hole transport region HTR.

The emission layer EML is provided on the hole transport region HTR. The thickness of the emission layer EML may be, for example, about 100 Å to about 1000 Å or about 100 Å to about 300 Å. The emission layer EML may have a single layer formed of a single material, a single layer formed of a plurality of different materials, or a multilayer structure having a plurality of layers formed of a plurality of different materials.

The emission layer EML in the organic electroluminescence device 10 of an embodiment may include a fused polycyclic compound of an embodiment.

In the description, the term "substituted or unsubstituted" may refer to a state of being unsubstituted, or substituted with at least one substituent selected from the group consisting of a deuterium atom, a halogen atom, a cyano group, a nitro group, an amine group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. Each of these example substituents may be further substituted, or unsubstituted. For example, a biphenyl group may be interpreted as an aryl group in itself, or as a phenyl group substituted with a phenyl group.

In the description, the phrase "bonded to an adjacent group to form a ring" may refer to a state of being bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The rings formed by being bonded to an adjacent group may be monocyclic or polycyclic. In some embodiments, the rings formed by being bonded to each other may be connected to another ring to form a spiro structure.

In the description, the term "an adjacent group" may refer to a substituent on the same atom or point, a substituent on an atom that is directly connected to the base atom or point, or a substituent sterically positioned (e.g., within intramolecular bonding distance) to the corresponding substituent. For example, two methyl groups in 1,2-dimethylbenzene may be interpreted as "adjacent groups" to each other, and two ethyl groups in 1,1-diethylcyclopentane may be interpreted as "adjacent groups" to each other.

In the description, the term "direct linkage" may refer to a single bond.

In the description, non-limiting examples of the halogen atom include a fluorine atom, a chlorine atom, a bromine atom, and an iodine atom.

In the description, the alkyl group may be a linear, branched or cyclic alkyl group. The number of carbons in the alkyl group may be 1 to 50, 1 to 30, 1 to 20, 1 to 10, or 1 to 6. Examples of the alkyl group include, but are not limited to, methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, the term "alkenyl group" refers to a hydrocarbon group including at least one carbon-carbon double bond in the middle or terminal end of an alkyl group having 2 or more carbon atoms. The alkenyl group may be linear or branched. The number of carbon atoms is not specifically limited, and may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but are not limited thereto.

In the description, the term "hydrocarbon ring" includes an aliphatic hydrocarbon ring and an aromatic hydrocarbon ring. The term "heterocycle" includes an aliphatic heterocycle and an aromatic heterocycle. The hydrocarbon ring and the heterocycle may each independently be monocyclic or polycyclic.

In the description, a hydrocarbon ring group may be any functional group or substituent derived from an aliphatic hydrocarbon ring, or any functional group or substituent derived from an aromatic hydrocarbon ring. The carbon number for forming a ring in the hydrocarbon ring group may be 5 to 60.

In the description, the hetero ring group may be a functional group or substituent derived from a hetero ring and including at least one heteroatom as an atom for forming a ring. The carbon number for forming a ring in the hetero ring group may be 5 to 60.

In the description, the term "aryl group" refers to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., but are not limited thereto.

In the description, the fluorenyl group may be substituted, and the two substituents may be combined with each other to form a spiro structure. Examples of the substituted fluorenyl group are as follows, but embodiments of the present disclosure are not limited thereto:

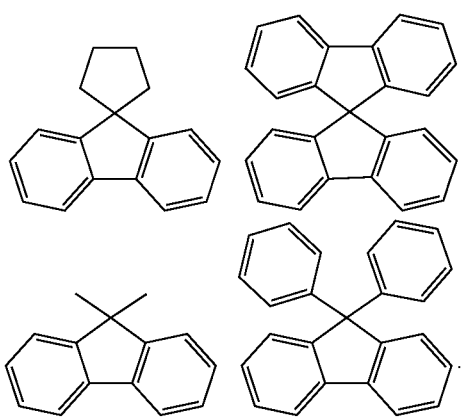

In the description, the heteroaryl group may include at least one of boron (B), oxygen (O), nitrogen (N), phosphorus (P), silicon (Si), or sulfur (S) as a hetero atom. When the heteroaryl group contains two or more hetero atoms, the two or more hetero atoms may be the same as or different from each other. The heteroaryl group may be a monocyclic heterocyclic group or a polycyclic heterocyclic group. The number of ring-forming carbon atoms in the heteroaryl group may be 2 to 30, 2 to 20, or 2 to 10. Examples of the heteroaryl group include, but are not limited to, thiophene, furan, pyrrole, imidazole, thiazole, oxazole, oxadiazole, triazole, pyridine, bipyridine, pyrimidine, triazine, triazole, acridyl, pyridazine, pyrazine, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuranyl, etc.

In the description, the term "silyl group" includes an alkyl silyl group and an aryl silyl group. Examples of the silyl group include, but are not limited to, trimethylsilyl, triethylsilyl, t-butyldimethylsilyl, vinyldimethylsilyl, propyldimethylsilyl, triphenylsilyl, diphenylsilyl, phenylsilyl, etc.

In the description, the term "boron group" includes an alkyl boron group and an aryl boron group. Examples of the boron group include, but are not limited to, trimethylboron, triethylboron, t-butyldimethylboron, triphenylboron, diphenylboron, phenylboron, etc.

In the description, the number of carbon atoms in an amine group is not specifically limited, but may be 1 to 30. The term "amine group" may include an alkyl amine group and an aryl amine group. Examples of the amine group include, but are not limited to, methylamine, dimethylamine, phenylamine, diphenylamine, naphthylamine, 9-methyl-anthracenylamine, triphenylamine, etc.

In the description, the term "hydrocarbon ring group" refers to any functional group or substituent derived from an aliphatic hydrocarbon ring. The hydrocarbon ring group may be a saturated hydrocarbon ring group having 5 to 20 ring-forming carbon atoms.

In the description, the heterocyclic group may include at least one of B, O, N, P, Si or S as a hetero atom. When the heterocyclic group contains two or more heteroatoms, the two or more heteroatoms may be the same as or different from each other. The heterocyclic group may be a monocyclic heterocyclic group or a polycyclic heterocyclic group, and includes a heteroaryl group. The number of ring-forming carbon atoms in the heterocyclic group may be 2 to 30, 2 to 20, or 2 to 10.

In the description, —* refers to a position to be connected.

The fused polycyclic compound of an embodiment includes a structure in which two or more polycyclic heterocycles are each fused through two heteroatoms (including one boron atom) to a central triphenylene core. The polycyclic heterocycle may thus add four fused rings including one boron atom and two hetero atoms selected from the group including nitrogen, oxygen, and sulfur. For example, in the fused polycyclic compound of an embodiment, the polycyclic heterocycle may be fused to the triphenylene core using one boron atom and one heteroatom as a bidentate linker.

The fused polycyclic compound of an embodiment may be represented by Formula 1:

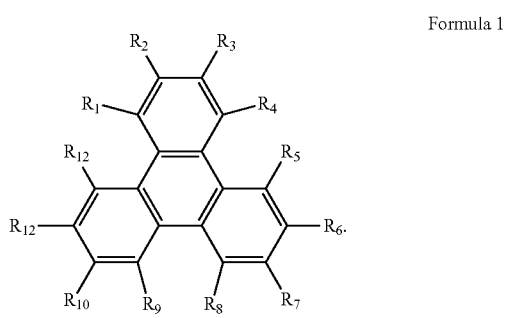

Formula 1

In Formula 1, $R_1$ to $R_{12}$ may each independently be a hydrogen atom, a deuterium atom, a halogen atom, a substituted or unsubstituted oxy group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In some embodiments, any adjacent pair among $R_1$ to $R_{12}$ may be bonded to an adjacent group to form a ring. In some embodiments, $R_1$ to $R_{12}$ may each independently be a hydrogen atom or a deuterium atom.

Any pair of adjacent $R_1$ to $R_{12}$ groups may be fused to a substituent represented by Formula 2. For example, two or more substituents represented by Formula 2 may be fused to the core of Formula 1. In Formula 1, at least two pairs among $R_1$ to $R_{12}$ may be fused to the substituent represented by Formula 2. For example, two or three substituents represented by Formula 2 may be fused to the fused polycyclic compound represented by Formula 1. A plurality of the substituents represented by Formula 2 may be the same (e.g., identical). However, the embodiments are not limited thereto, and in some embodiments, at least one of the plurality of substituents represented by Formula 2 may have a different structure from the other(s).

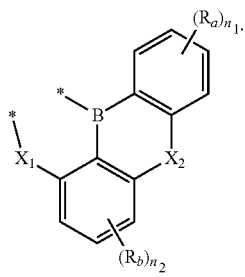

Formula 2

In Formula 2, —* is a position of fusion to one of the two or more pairs of adjacent $R_1$ to $R_{12}$ groups in Formula 1. The substituent represented by Formula 2 may be fused to any one pair among adjacent $R_1$ to $R_{12}$ groups in Formula 1 through a boron atom and $X_1$.

$X_1$ and $X_2$ may each independently be $NAr_1$, O, or S. For example, $X_1$ and $X_2$ may each independently be $NAr_1$ or O. $X_1$ and $X_2$ may be the same as or different from each other. For example, both of $X_1$ and $X_2$ may be $NAr_1$ or O. In some embodiments, one among $X_1$ and $X_2$ may be $NAr_1$, and the other may be O.

$Ar_1$ may be a substituted or unsubstituted aryl group having 6 to 30 ring-forming carbon atoms, or a substituted or unsubstituted heteroaryl group having 2 to 30 ring-forming carbon atoms. In some embodiments, $Ar_1$ may be bonded to an adjacent group to form a ring. For example, $Ar_1$ may be a substituted or unsubstituted phenyl group.

$R_a$ and $R_b$ may each independently be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In some embodiments, $R_a$ and $R_b$ may each independently be bonded to an adjacent group to form a ring. For example, $R_a$ and $R_b$ may each independently be a hydrogen atom, a deuterium atom, a substituted or unsubstituted methyl group, a substituted or unsubstituted t-butyl group, a substituted or unsubstituted arylamine group, a substituted or unsubstituted phenyl group, or a substituted or unsubstituted carbazole group. At least one among $R_a$ and $R_b$ may be a substituted or unsubstituted methyl group, a substituted or unsubstituted t-butyl group, a substituted or unsubstituted arylamine group, a substituted or unsubstituted phenyl group, or a substituted or unsubstituted carbazole group.

$n_1$ may be an integer of 0 to 4. $n_2$ may be an integer of 0 to 3. When each of $n_1$ and $n_2$ is 0, the fused polycyclic compound according to an embodiment is not substituted at each of $R_a$ and $R_b$ (e.g., those positions are both hydrogen). When $n_1$ and/or $n_2$ are an integer of 2 or more, the $R_a$'s and/or $R_b$'s may be the same, or at least one among the plurality of $R_a$'s and/or $R_b$'s may be different.

The fused polycyclic compound of an embodiment includes a structure in which two or more structures of Formula 2 including one boron atom and two hetero atoms are fused to a central triphenylene core. The fused polycyclic compound of an embodiment therefore includes two or more boron atoms, and two or more structures of Formula 2 are connected at the central triphenylene core to form an expanded conjugation structure, thereby stabilizing the structure of the polycyclic aromatic ring. The resulting half-width and wavelength range of the compound may be suitable for a blue luminescent material, and when the fused polycyclic compound of an embodiment is applied to a luminescence device, efficiency of the luminescence device may be improved.

The substituent represented by Formula 2 may be represented by any one among Formula 2-1 to Formula 2-8:

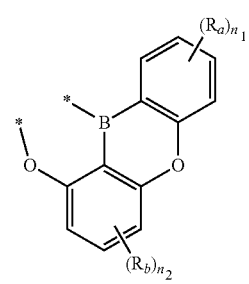

Formula 2-1

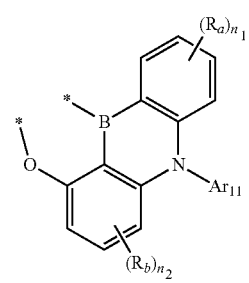

Formula 2-2

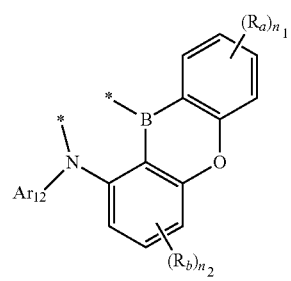

Formula 2-3

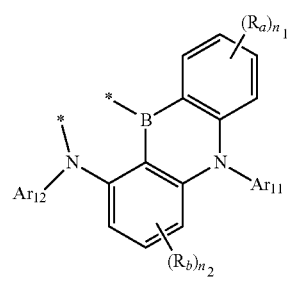

Formula 2-4

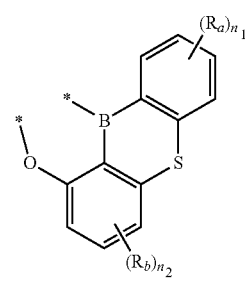

Formula 2-5

Formula 2-6

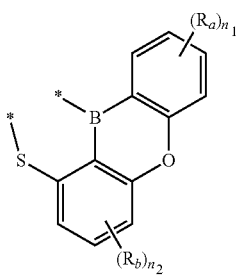

Formula 2-7

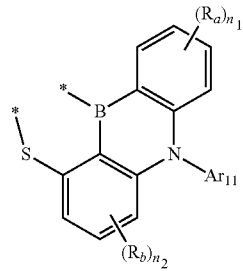

Formula 2-8

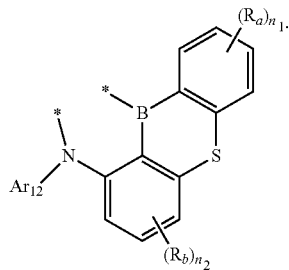

Formula 2-1 to Formula 2-8 are examples of Formula 2 in which each of $X_1$ and $X_2$ is specified as O, S, or $NAr_1$.

In Formula 2-1 to Formula 2-8, $Ar_{11}$ and $Ar_{12}$ are each independently a substituted or unsubstituted aryl group having 6 to 30 ring-forming carbon atoms, or a substituted or unsubstituted heteroaryl group having 2 to 30 ring-forming carbon atoms. In some embodiments, $Ar_{11}$ and $Ar_{12}$ may each independently be bonded to an adjacent group to form a ring. $Ar_{11}$ and $Ar_{12}$ may each independently be the same as described in connection with $Ar_1$ in Formula 2.

$R_a$ and $R_b$, and $n_1$ and $n_2$ may each independently be the same as described in connection with in Formula 2-1 to Formula 2-8.

In some embodiments, the substituent represented by Formula 2 may be represented by Formula 2-a:

Formula 2-a

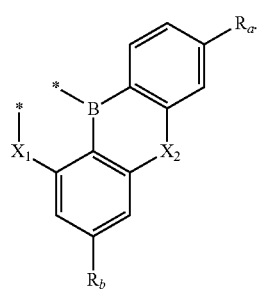

Formula 2-a is an example of Formula 2 in which the substituted positions of $R_a$ and $R_b$ are specified. As represented by Formula 2-a, each of $R_a$ and $R_b$ are substituted in a para-position to the boron atom.

In Formula 2-a, $X_1$ and $X_2$, and $R_a$ and $R_b$ may each independently be the same described in connection with Formula 2.

The fused polycyclic compound represented by Formula 1 may be represented by any one among Formula 3-1 to Formula 3-5:

Formula 3-1

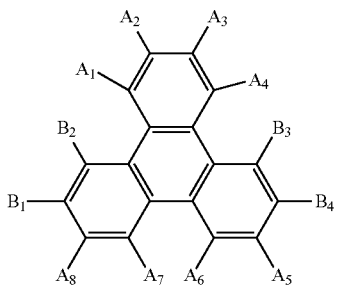

Formula 3-2

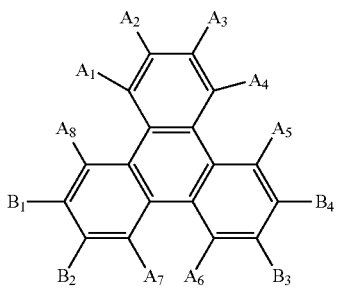

Formula 3-3

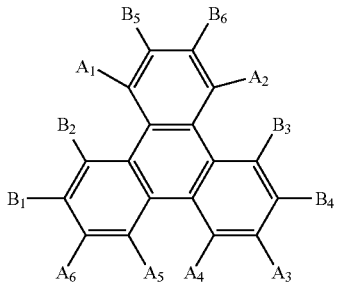

Formula 3-4

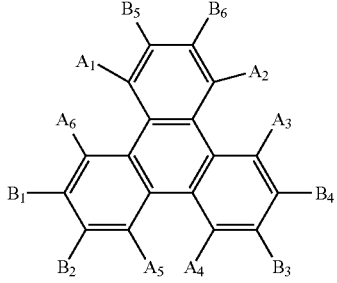

Formula 3-5

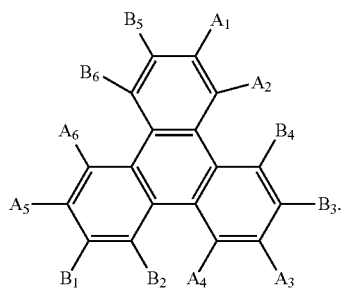

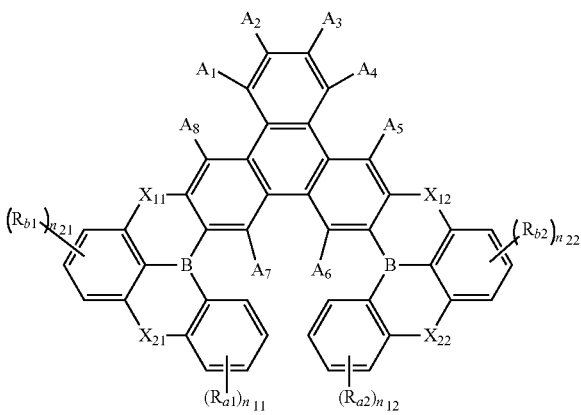

Formula 4-2

Formula 3-1 to Formula 3-5 are examples of Formula 2 in which the number and fused position of substituents in Formula 1 are specified.

In Formula 3-1 to Formula 3-5, $A_1$ to $A_8$ may each independently be a hydrogen atom, a deuterium atom, a halogen atom, a substituted or unsubstituted oxy group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In some embodiments, $A_1$ to $A_8$ may be bonded to an adjacent group to form a ring.

$B_1$ and $B_2$, $B_3$ and $B_4$, and $B_5$ and $B_6$ may each be a position of fusion to the substituent represented by Formula 2. In Formula 3-1 and Formula 3-2, two substituents represented by Formula 2 are connected (fused), and one of the two substituents represented by Formula 2 is fused at the $B_1$ and $B_2$ positions, while the other is at the $B_3$ and $B_4$ positions. In Formula 3-3 to Formula 3-5, three substituents represented by Formula 2 are connected (fused), and one of the three substituents represented by Formula 2 is fused at the $B_1$ and $B_2$ positions, another is at the $B_3$ and $B_4$ positions, and the other is at the $B_5$ and $B_6$ positions.

The fused polycyclic compound represented by Formula 1 may be represented by any one among Formula 4-1 to Formula 4-8:

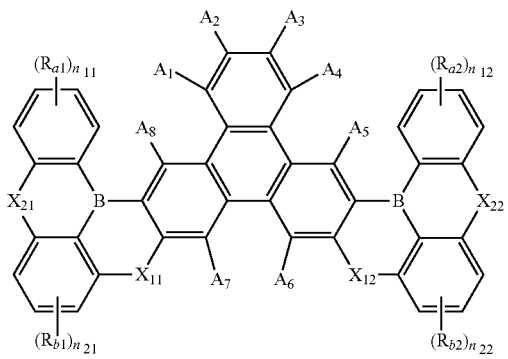

Formula 4-3

Formula 4-1

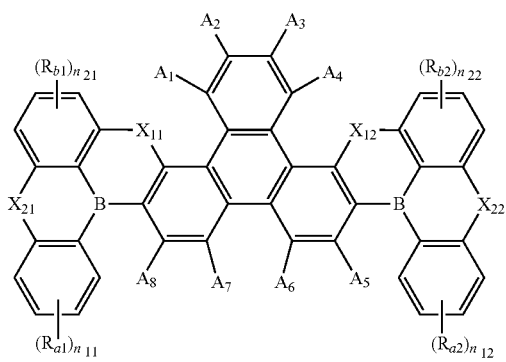

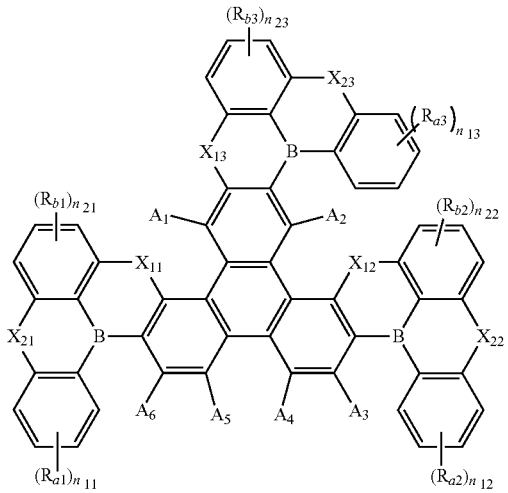

Formula 4-4

Formula 4-5

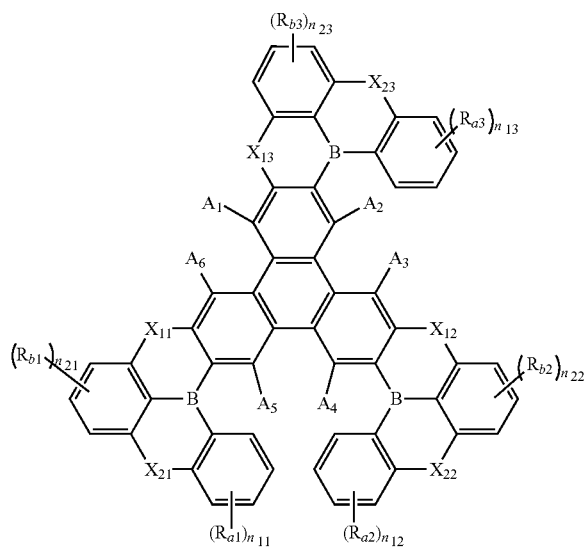

Formula 4-6

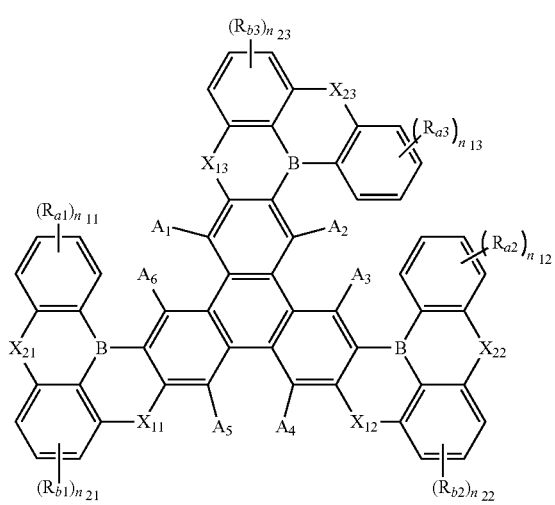

Formula 4-7

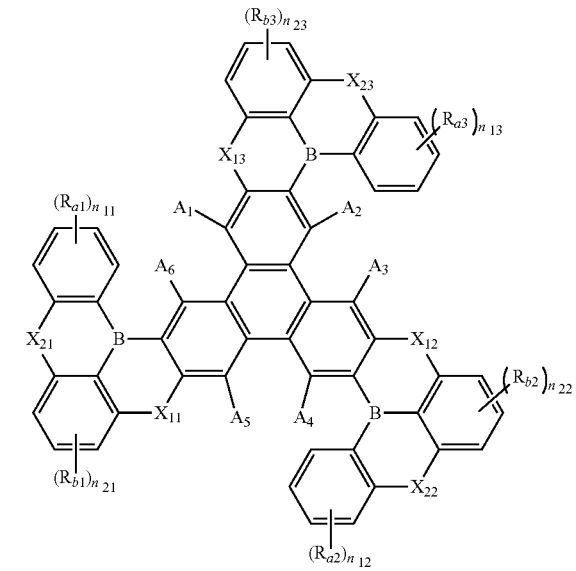

Formula 4-8

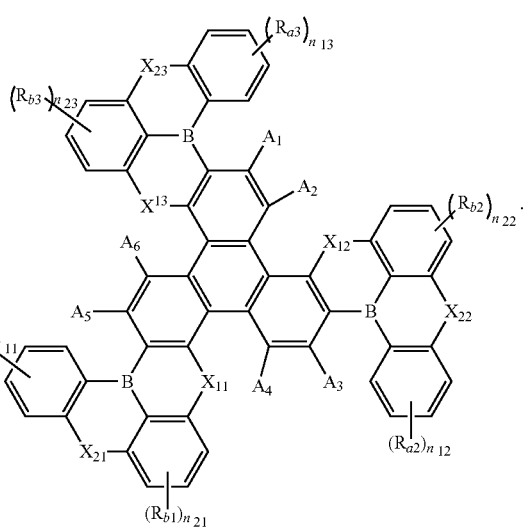

Formula 4-1 to Formula 4-8 are examples of Formula 1 in which the substituents represented by Formula 2 are fused at particular positions and with particular stereochemistry (e.g., position of the boron atom and the heteroatom).

In Formula 4-1 to Formula 4-8, $X_{11}$, $X_{12}$, $X_{13}$, $X_{21}$, $X_{22}$, and $X_{23}$ may each independently be $NAr_1$, O, or S. $X_{11}$, $X_{12}$, $X_{13}$, $X_{21}$, $X_{22}$, and $X_{23}$ may each independently be the same as described in connection with $X_1$ and $X_2$ in Formula 2.

$R_{a1}$, $R_{a2}$, $R_{a3}$, $R_{b1}$, $R_{b2}$, and $R_{b3}$ may each independently be a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In some embodiments, $R_{a1}$, $R_{a2}$, $R_{a3}$, $R_{b1}$, $R_{b2}$, and $R_{b3}$ may be bonded to an adjacent group to form a ring. $R_{a1}$, $R_{a2}$, $R_{a3}$, $R_{b1}$, $R_{b2}$, and $R_{b3}$ may each independently be the same as described in connection with $R_a$ and $R_b$ in Formula 2.

$n_{11}$, $n_{12}$ and $n_{13}$ may each independently be an integer of 0 to 4. $n_{21}$, $n_{22}$ and $n_{23}$ may each independently be an integer of 0 to 3. $n_{11}$, $n_{12}$, $n_{13}$, $n_{21}$, $n_{22}$, and $n_{23}$ may each independently be the same as described with respect to $n_1$ and $n_2$ in Formula 2.

$Ar_1$ and $A_1$ to $A_8$ may each independently be the same as described in Formula 2 and Formula 3-1 to Formula 3-5.

The fused polycyclic compound of an embodiment may be any one among compounds represented by Compound Group 1. The electroluminescence device 10 of an embodiment may include at least one fused polycyclic compound among the compounds represented by Compound Group 1 in the emission layer EML:

Compound Group 1

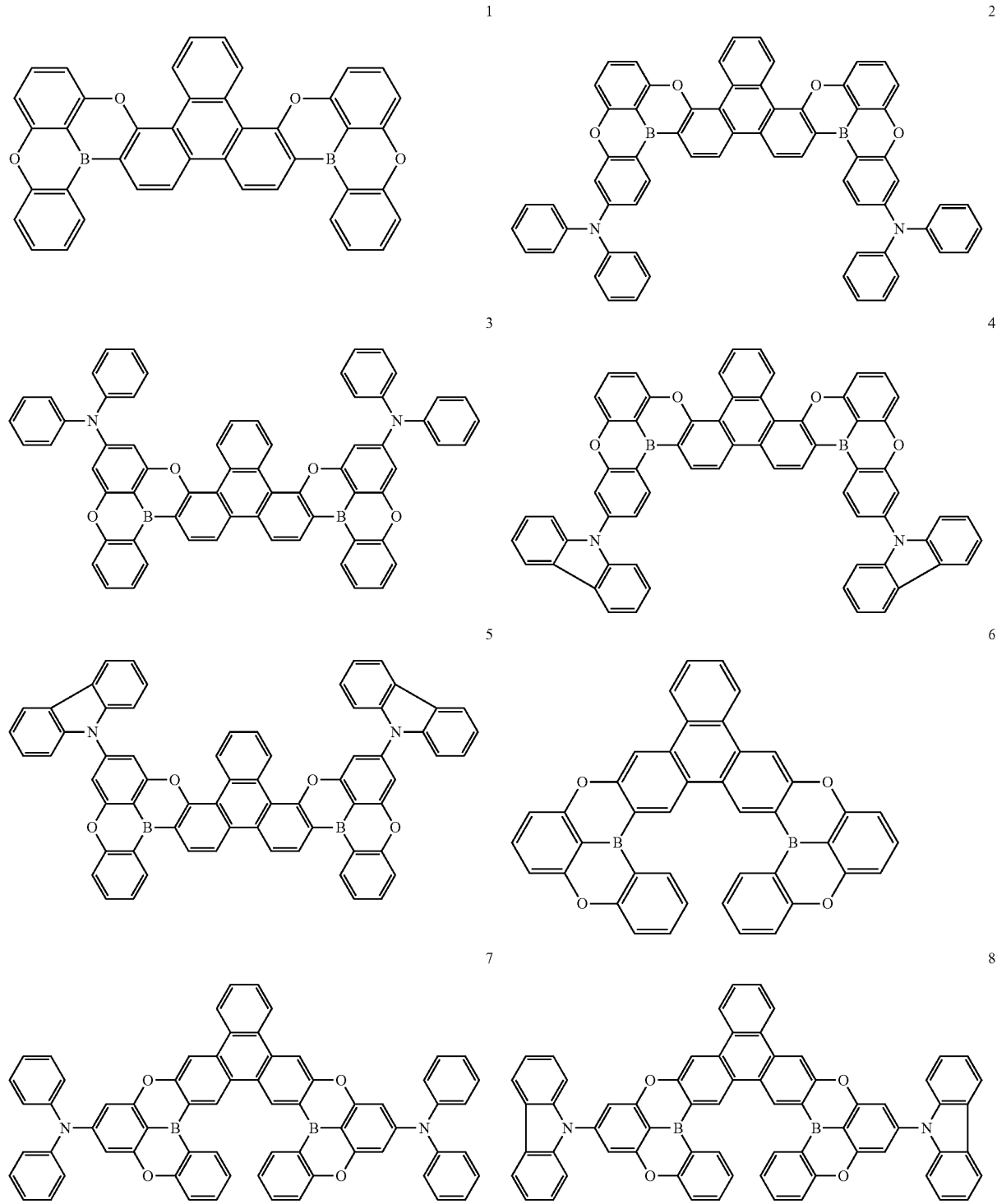

-continued
9
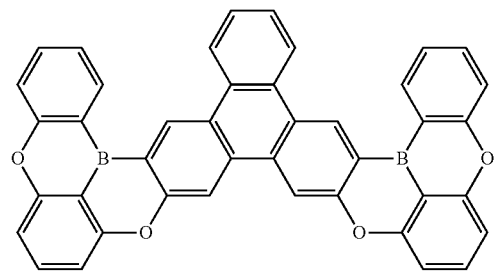
10
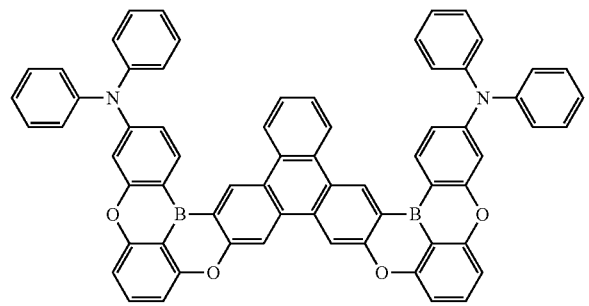
11
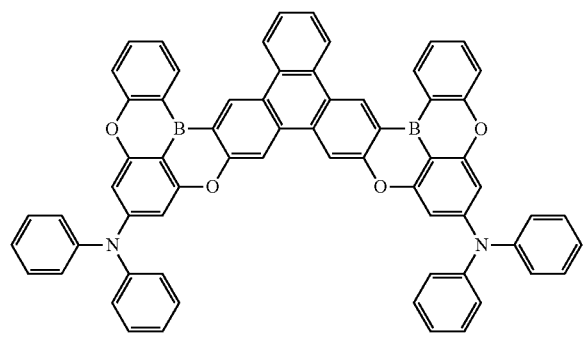
12
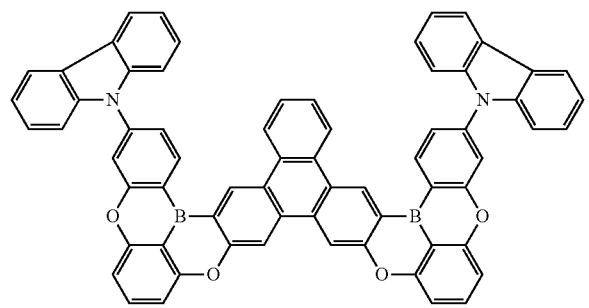
13
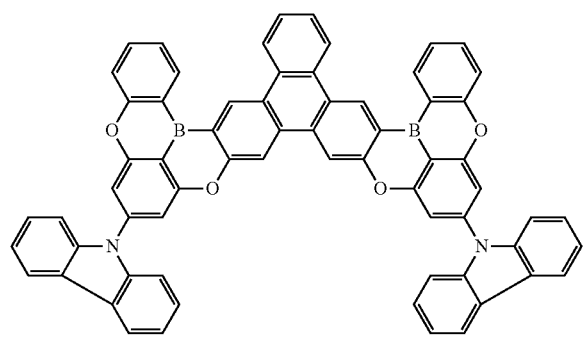
14
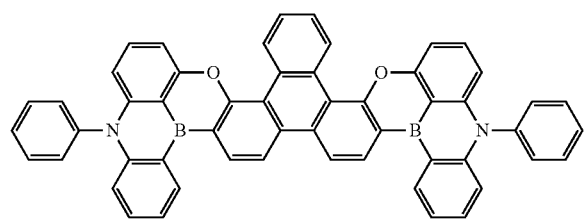
15
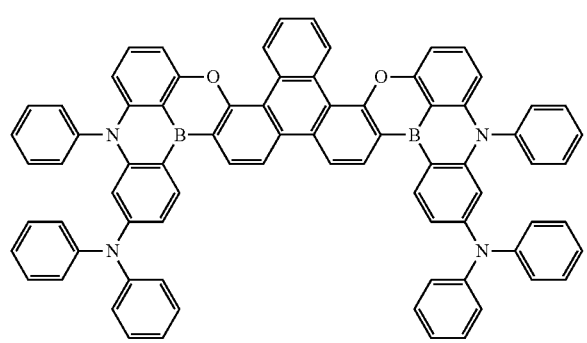
16
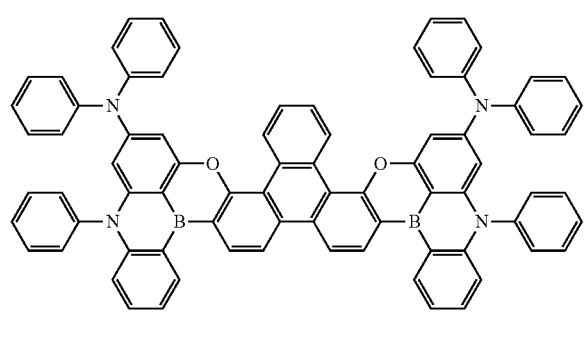

-continued
17
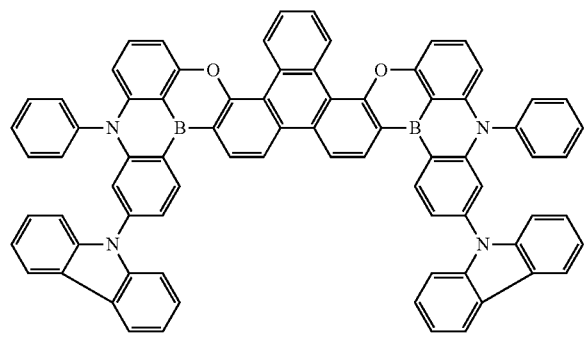
18
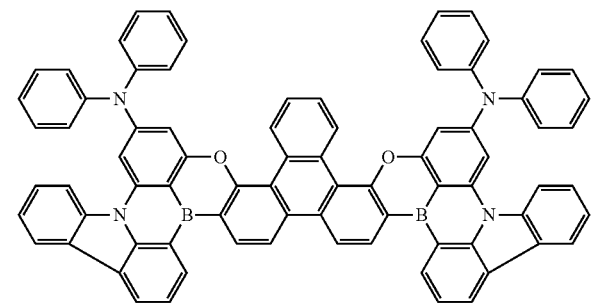
19
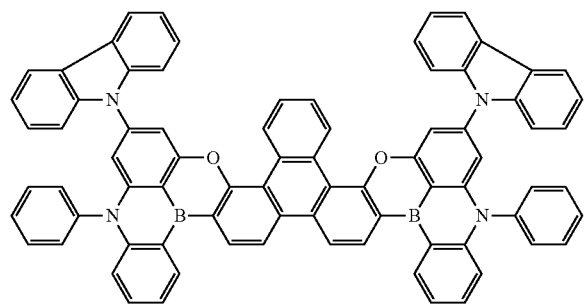
20
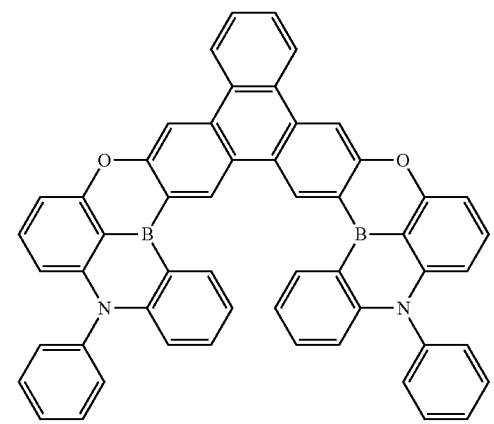
21
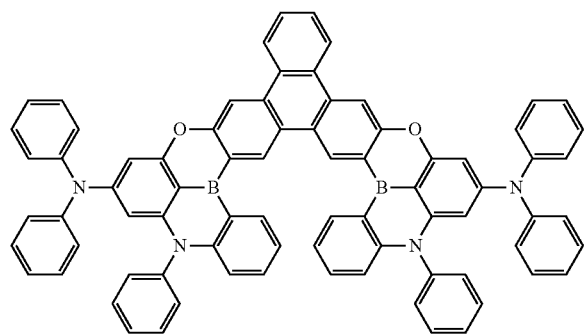
22
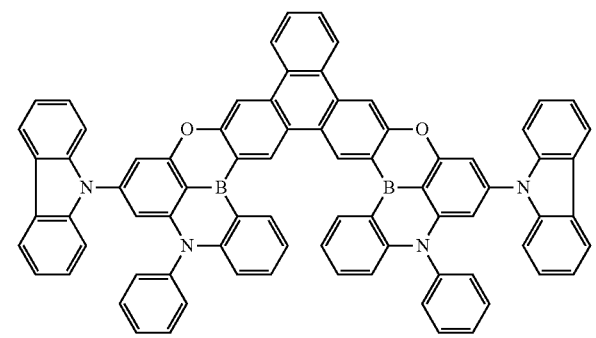
23
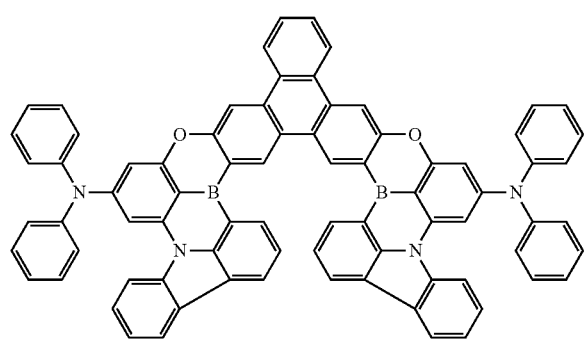
24
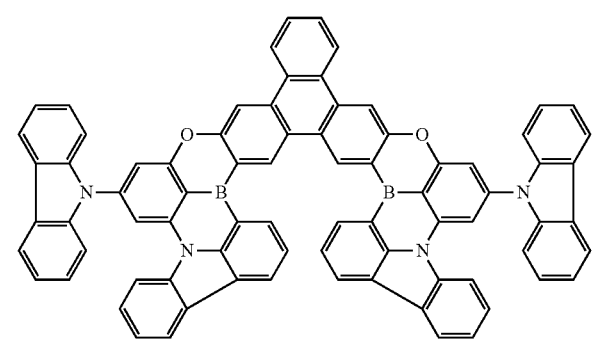

-continued
25
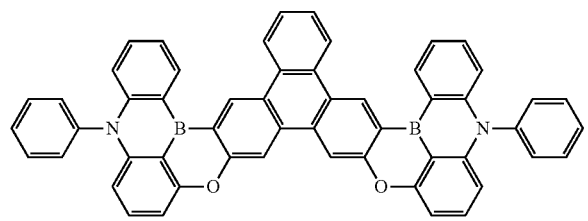
26
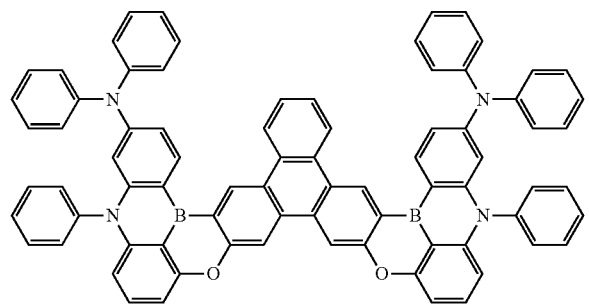
27
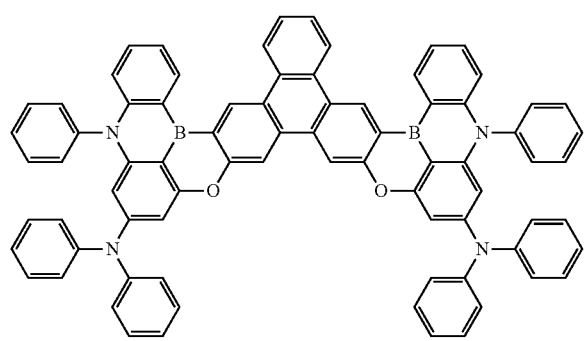
28
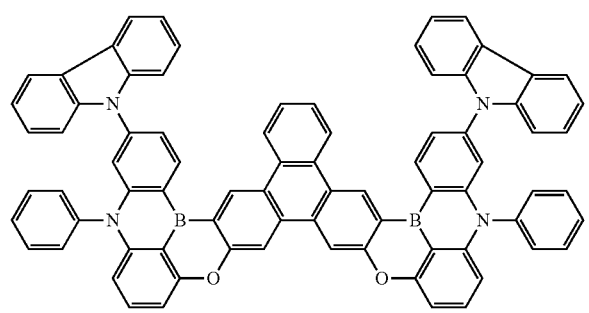
29
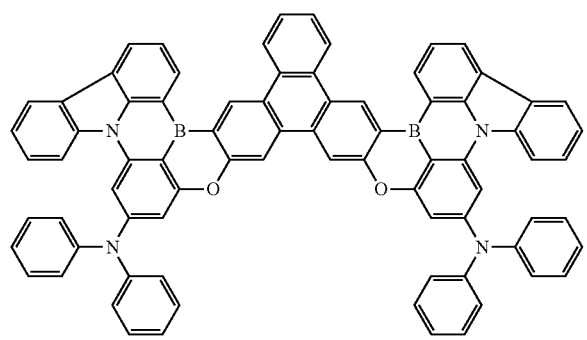
30
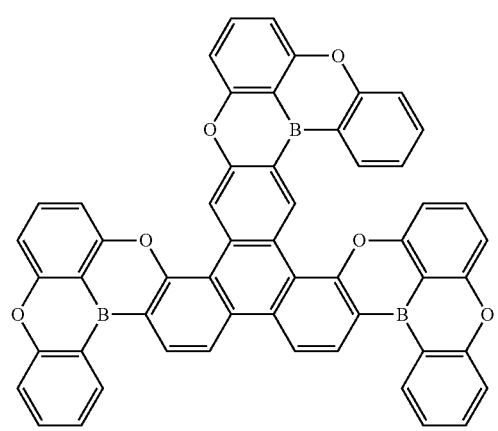
31
32
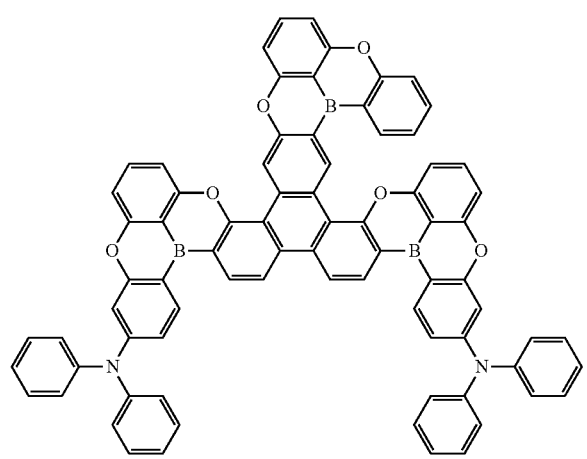

33
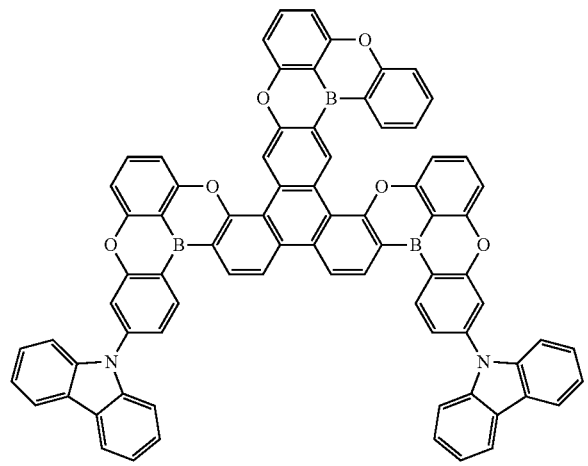
34
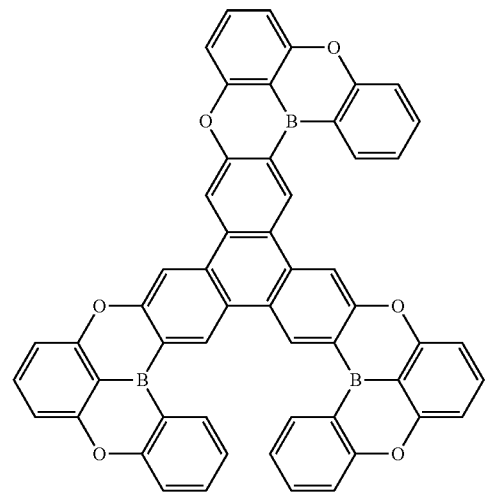
35
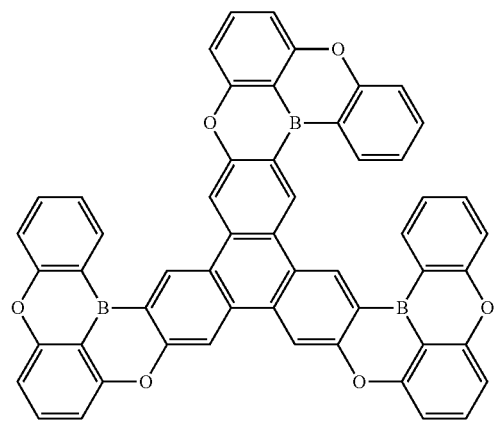
36
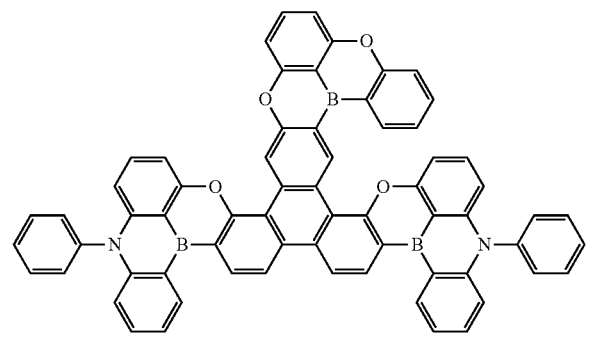
37
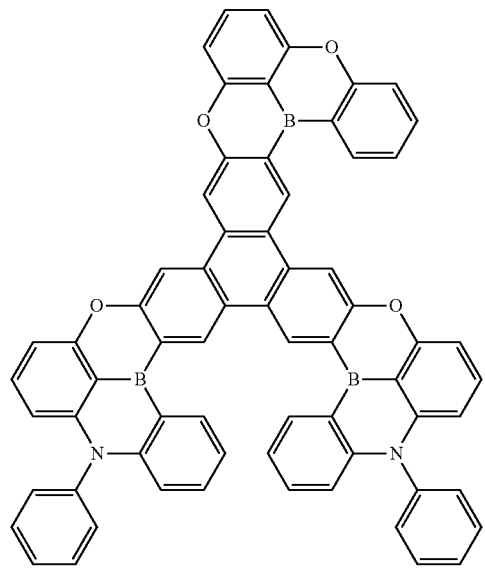
38
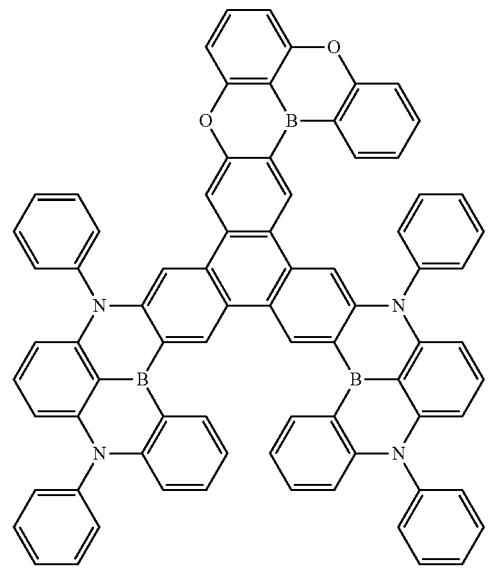

39
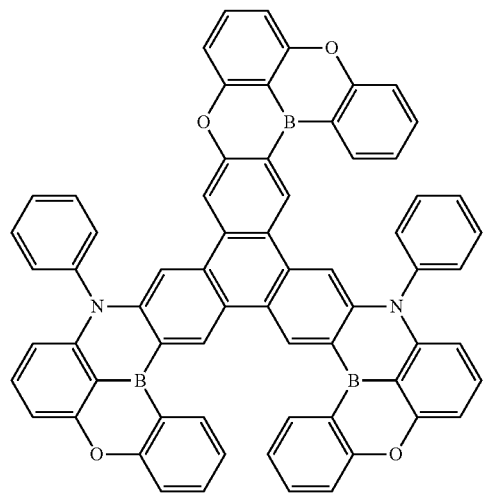
40
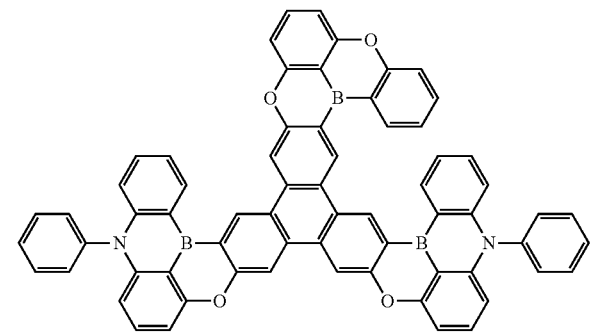
41
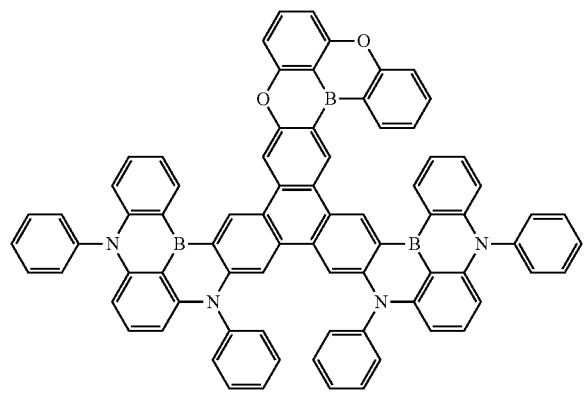
42
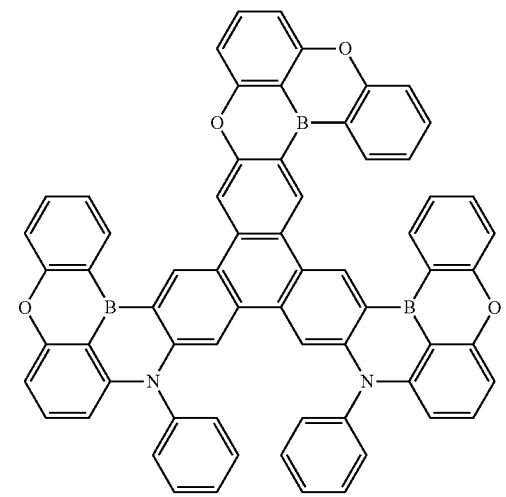
43
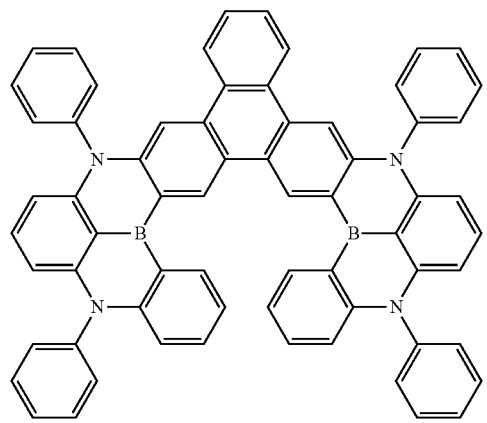
44
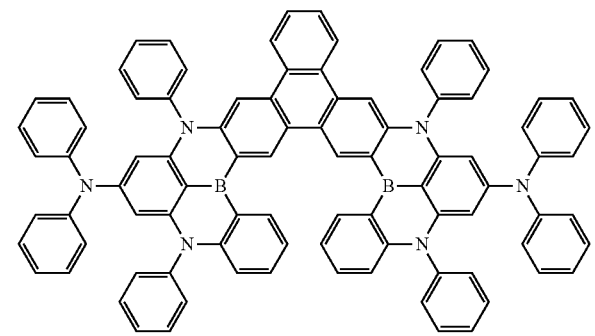

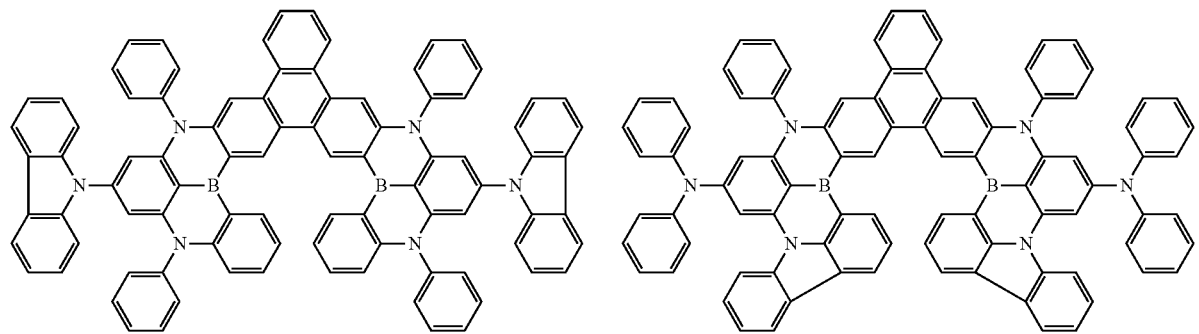
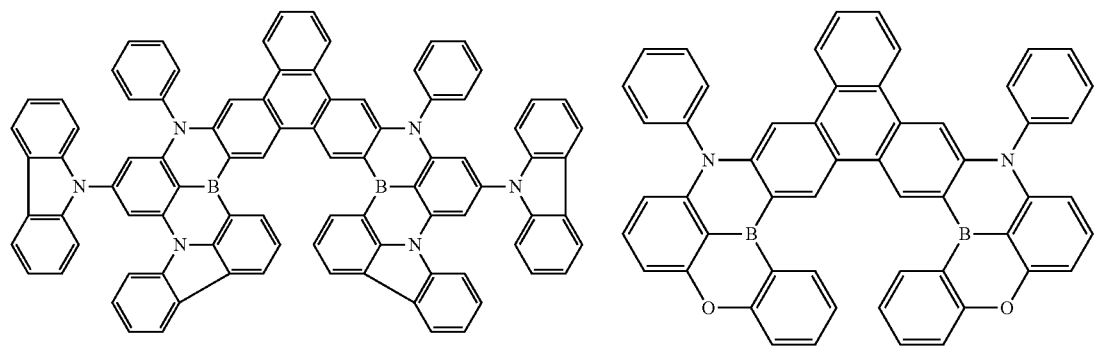
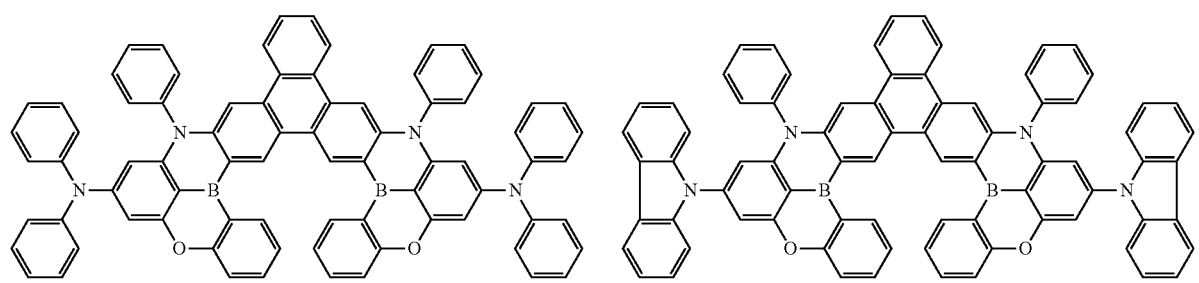
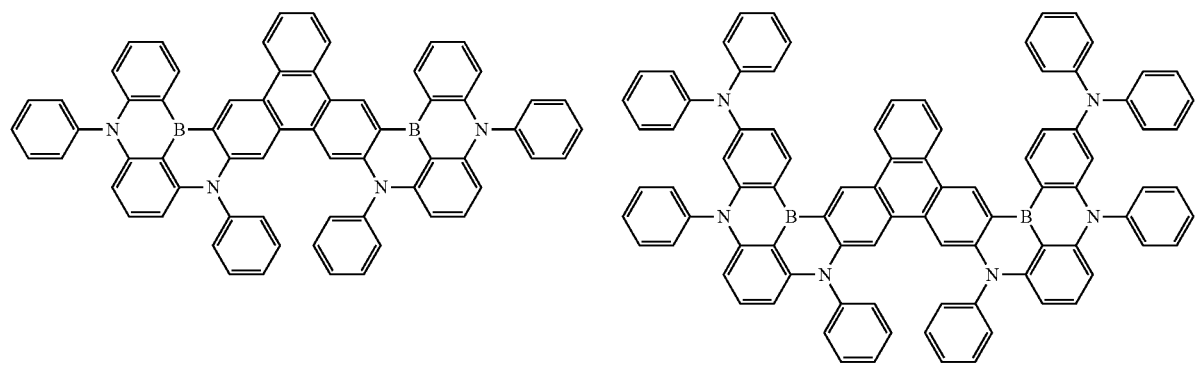

53
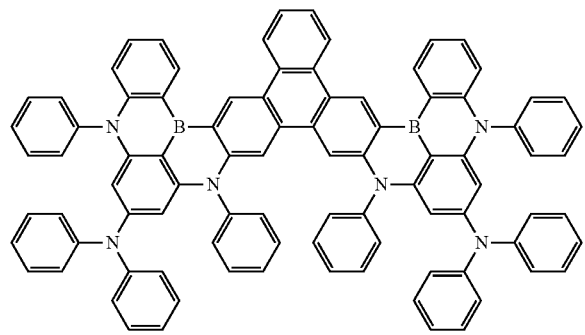
54
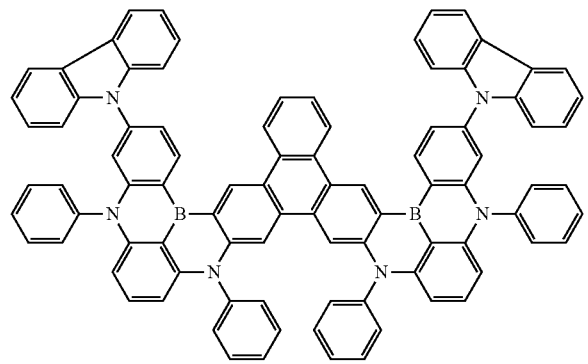
55
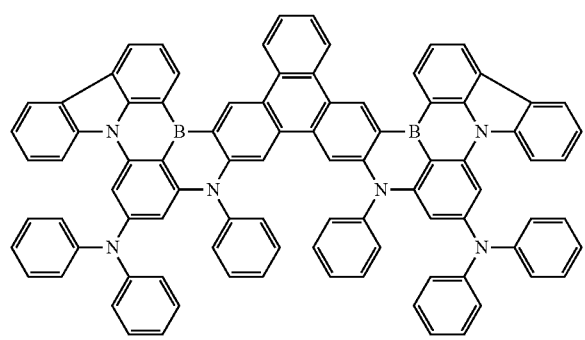
56
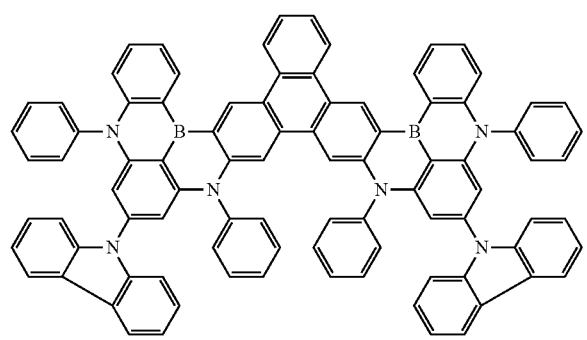
57
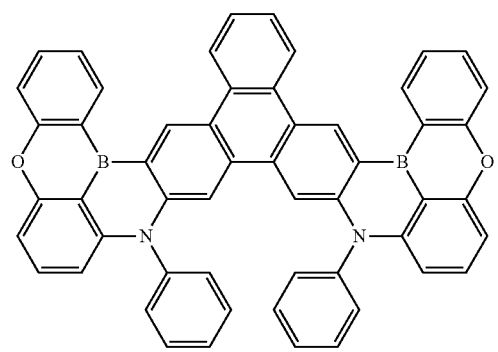
58
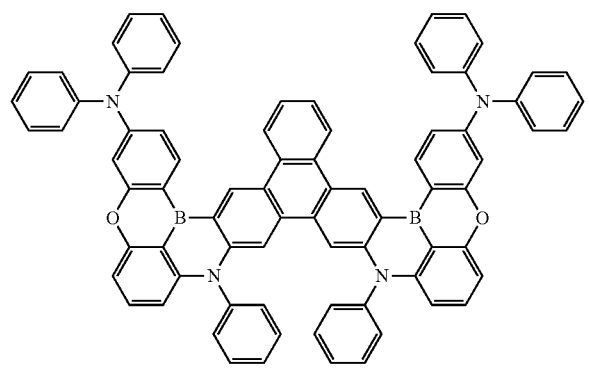
59
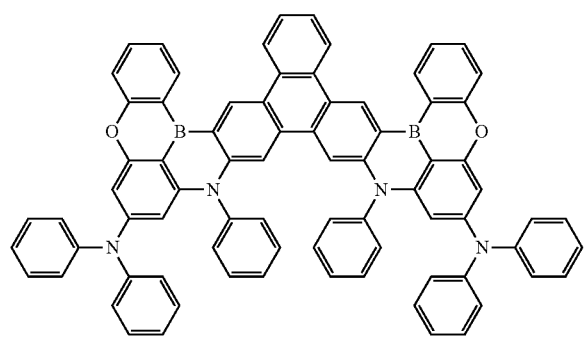
60
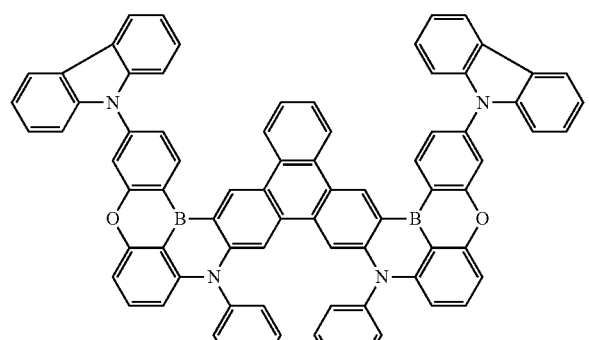

61
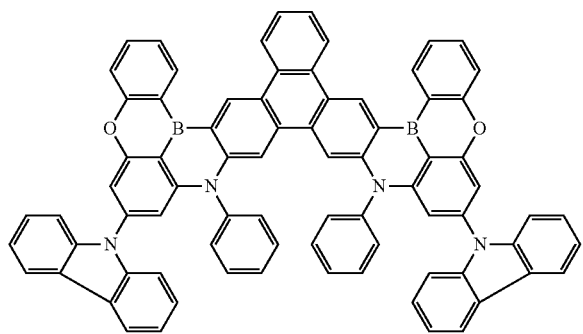
62
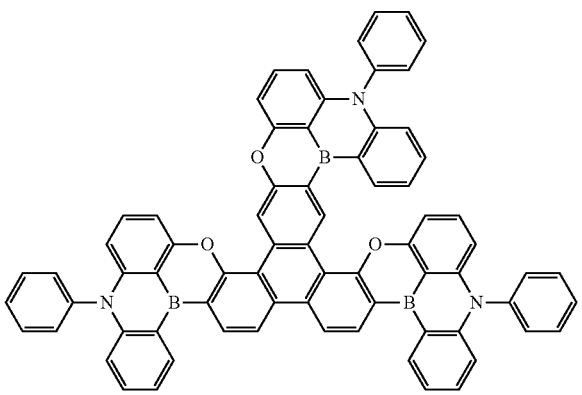
63
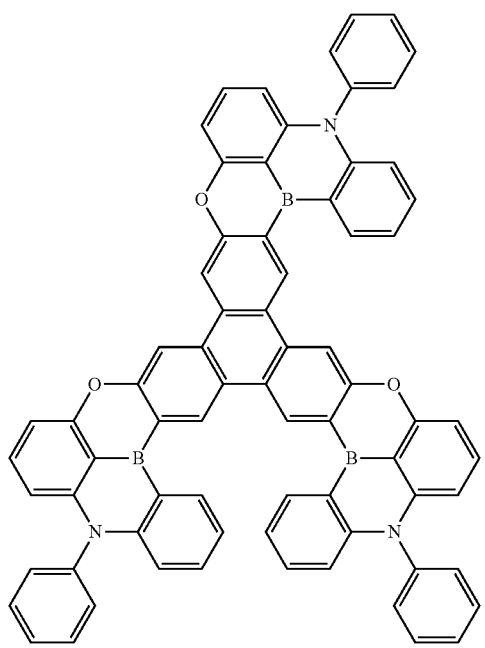
64
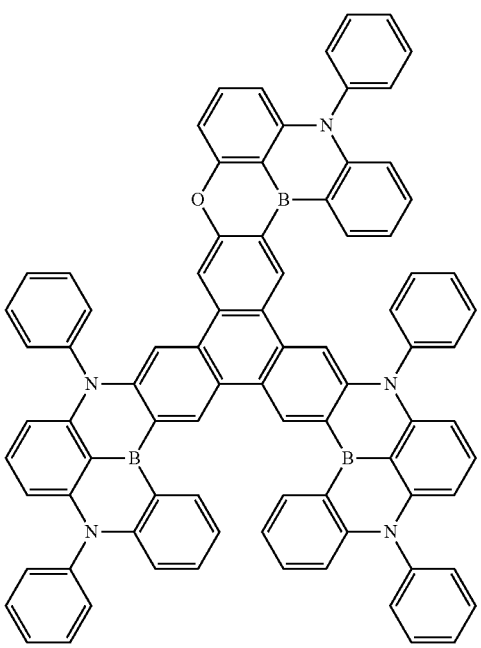
65
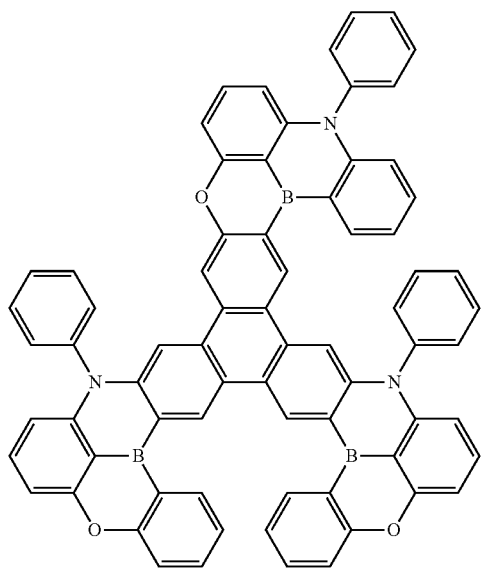
66
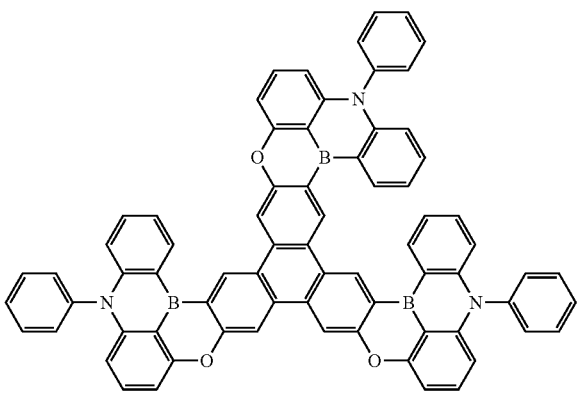

-continued
67
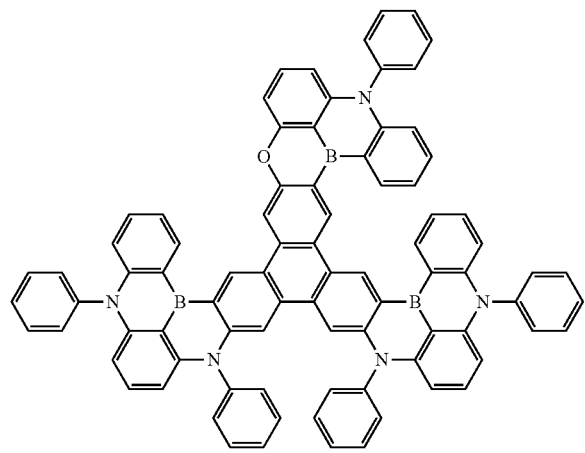
68
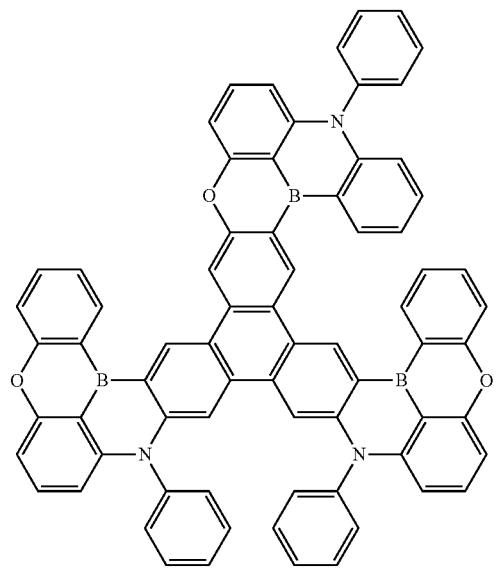
69
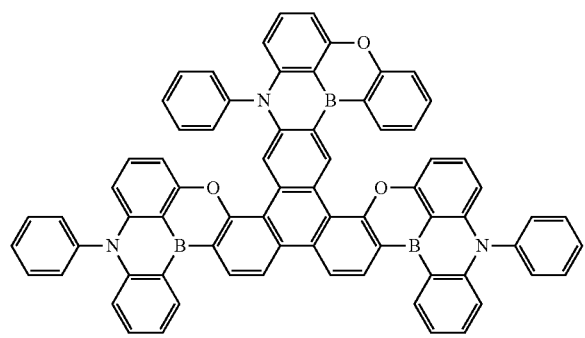
70
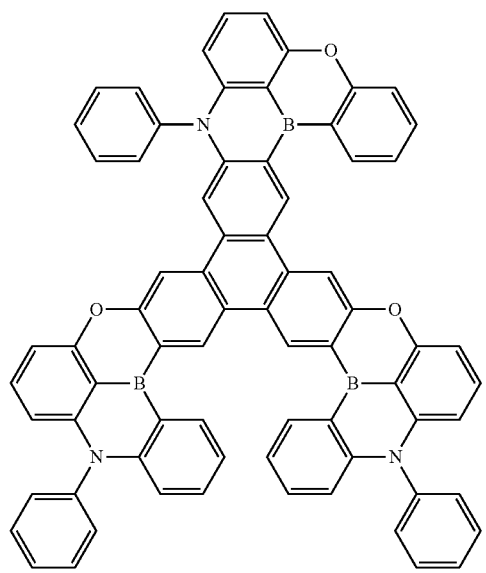

-continued
71
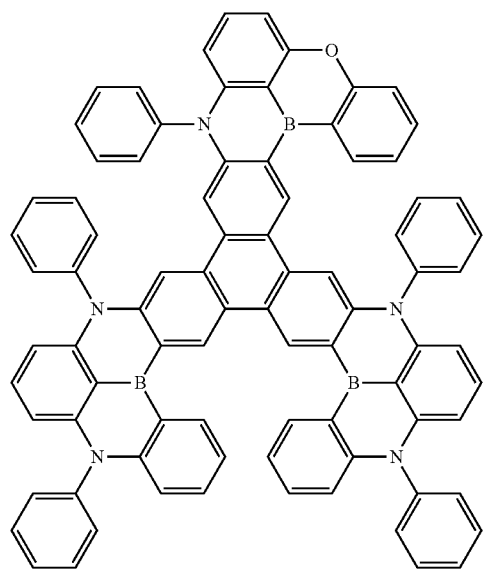
72
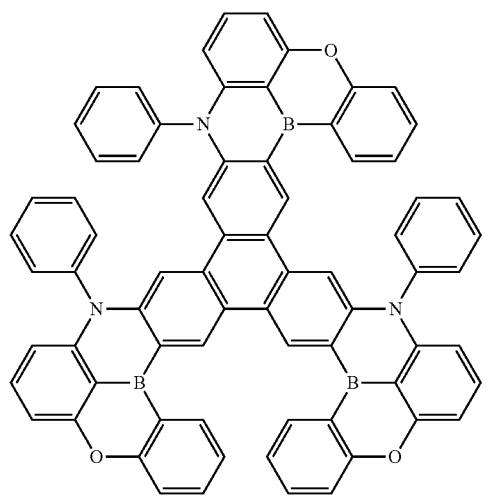
73
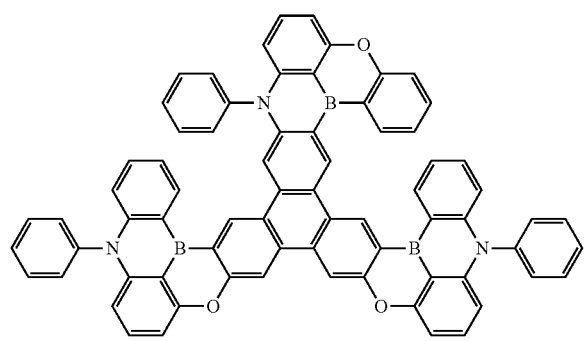
74
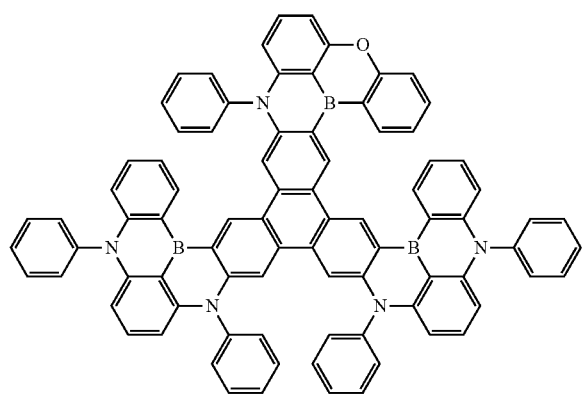
75
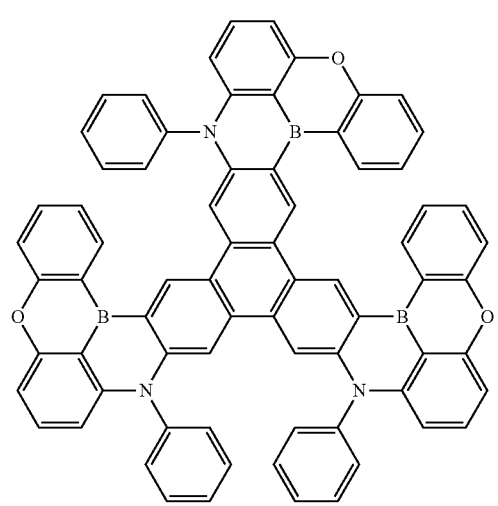
76
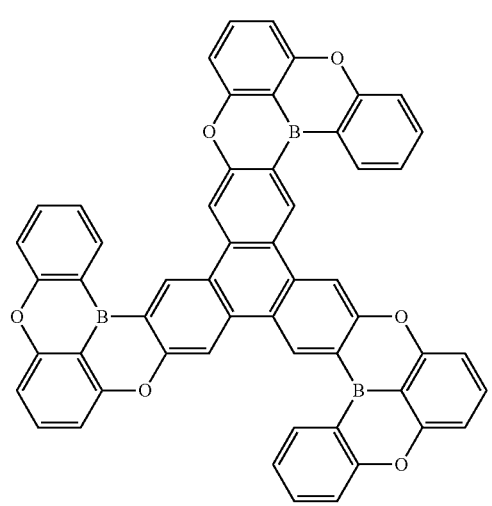

77
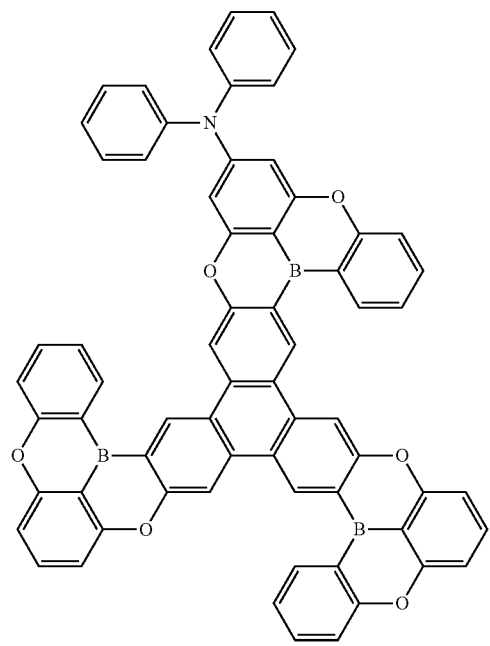
78
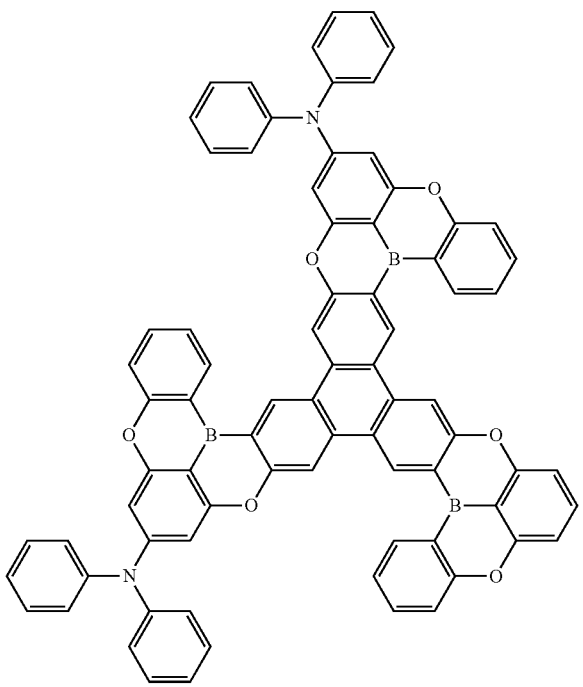
79
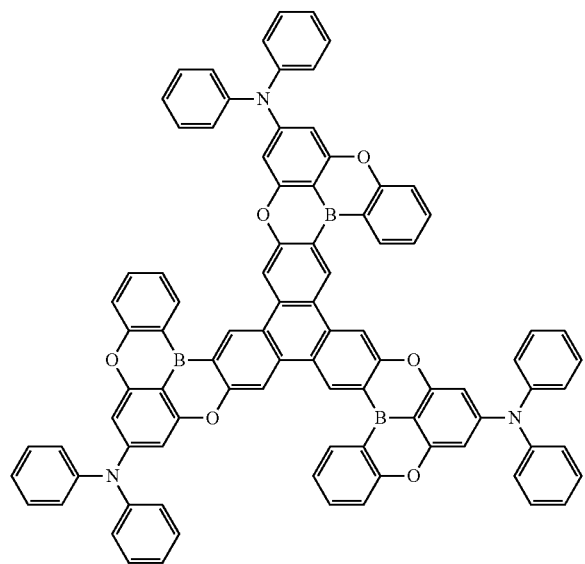
80
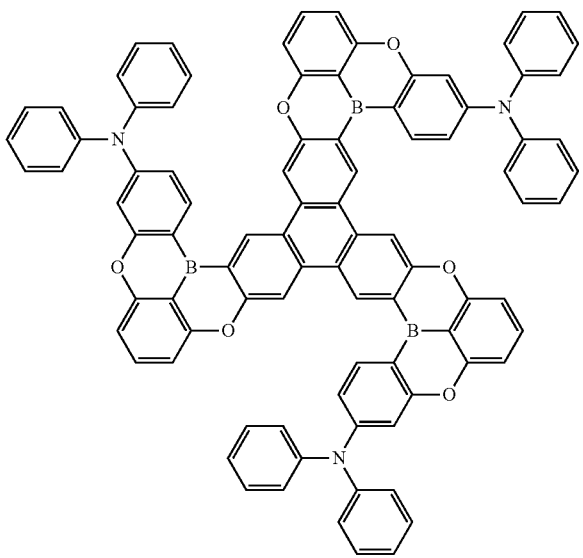

81
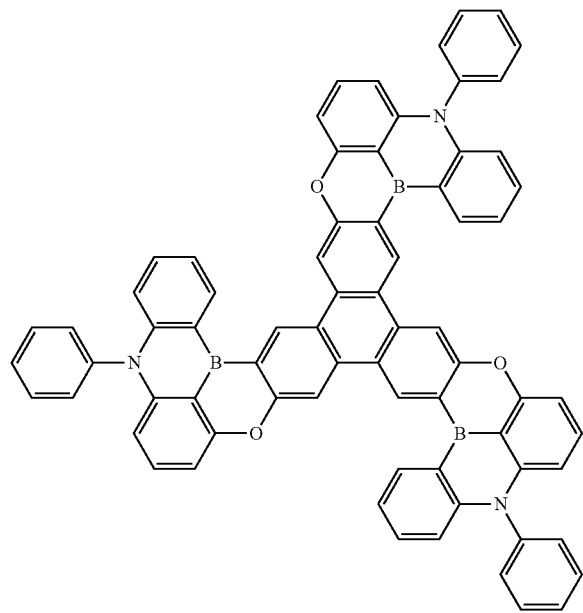
82
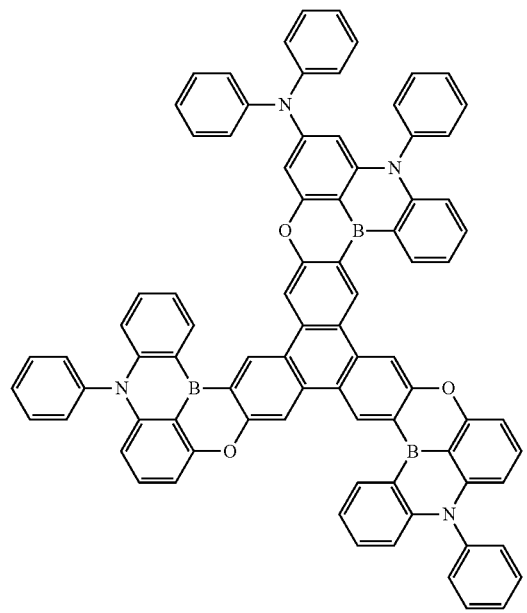
83
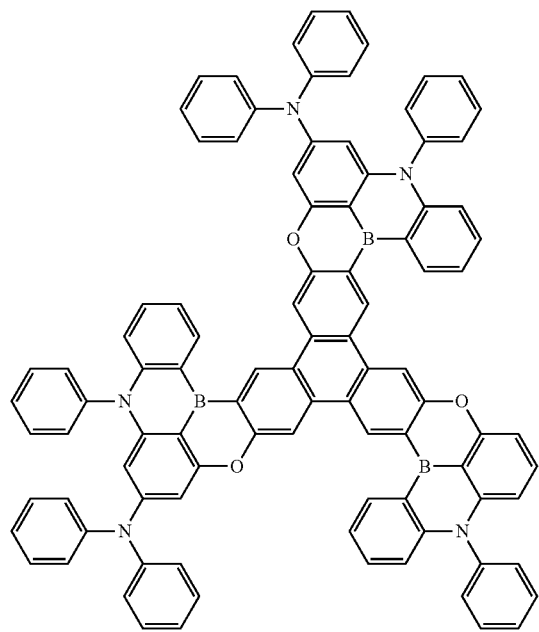
84
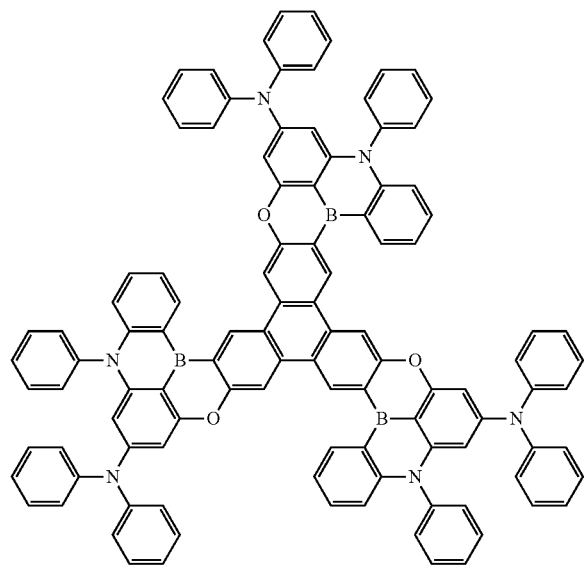

85
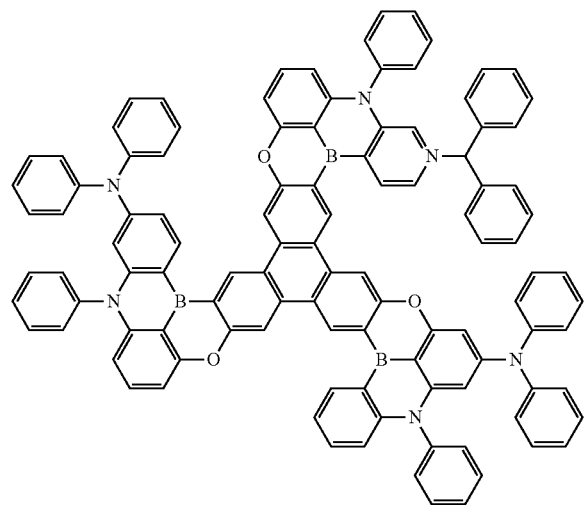
86
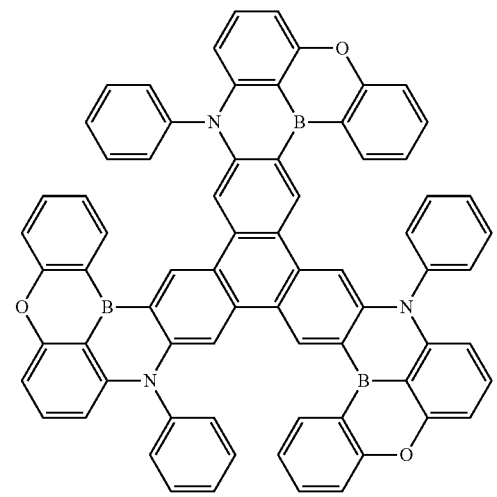
87
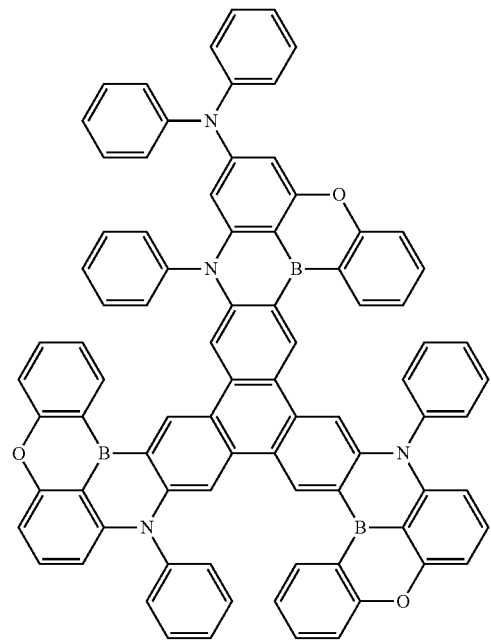
88
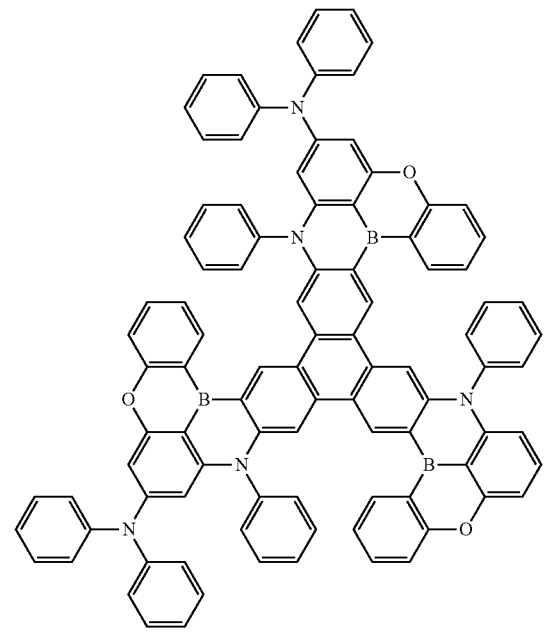

89
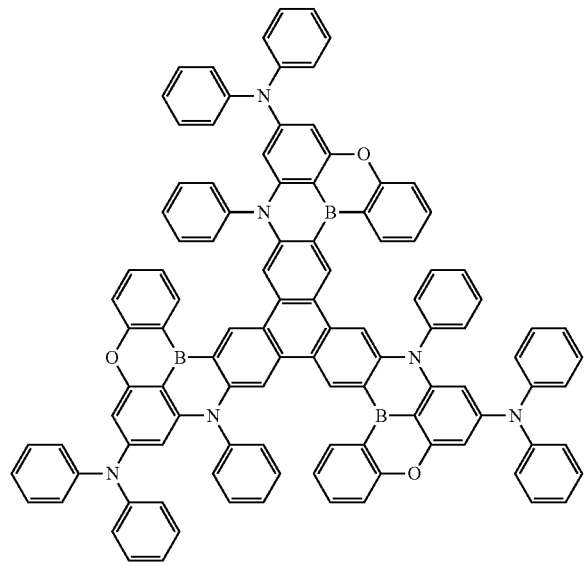
90
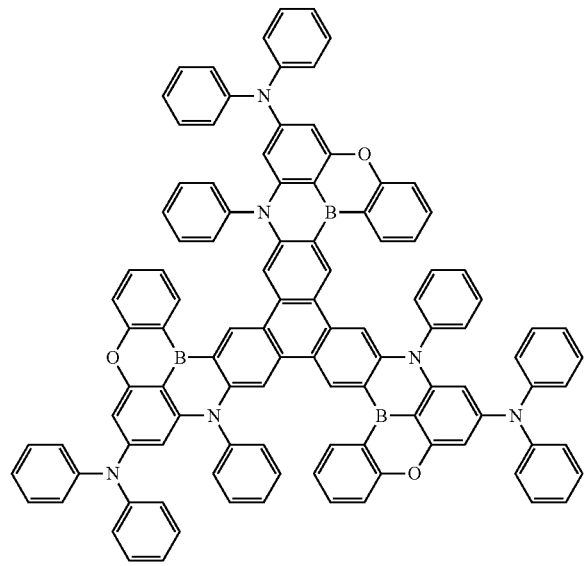
91
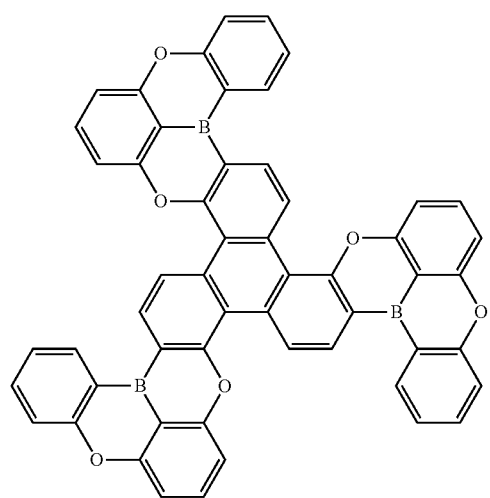
92
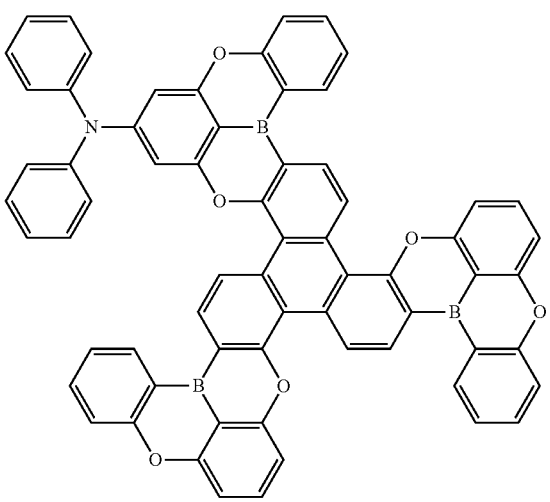

93
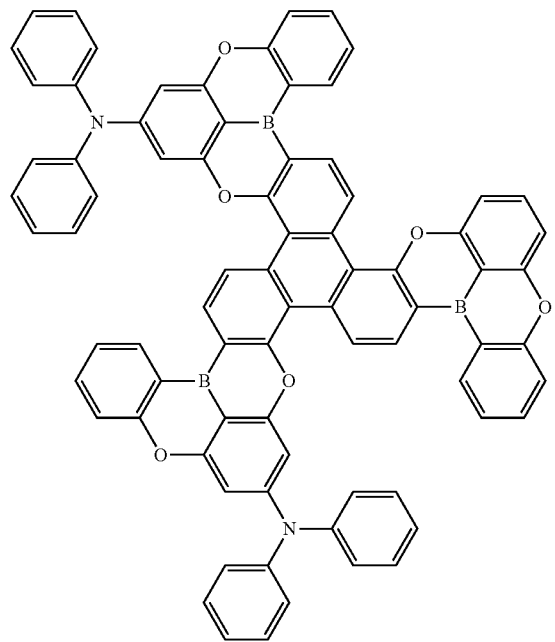
94
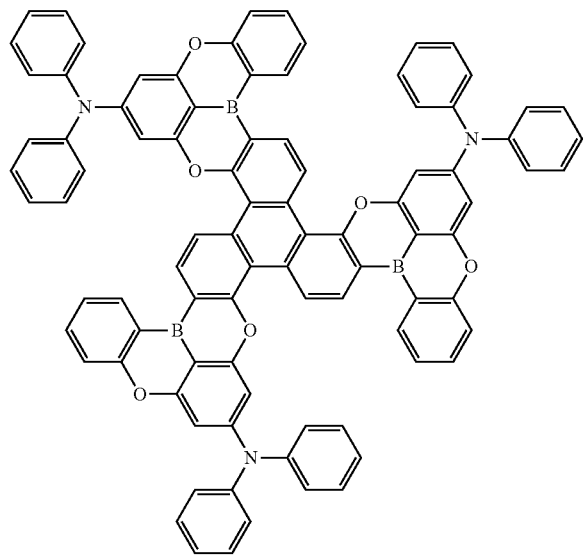
95
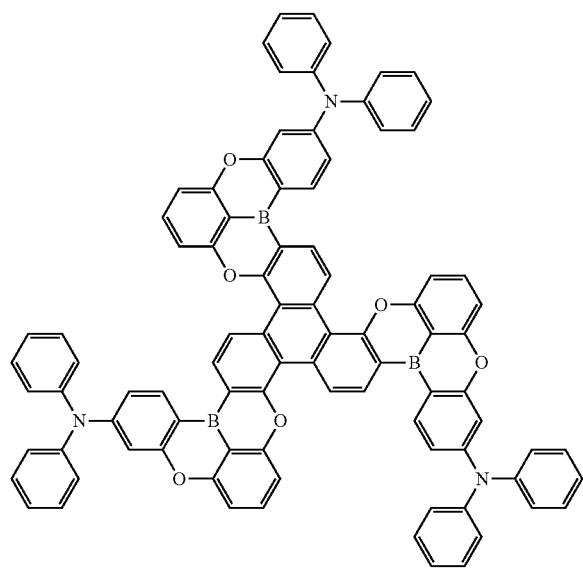
96
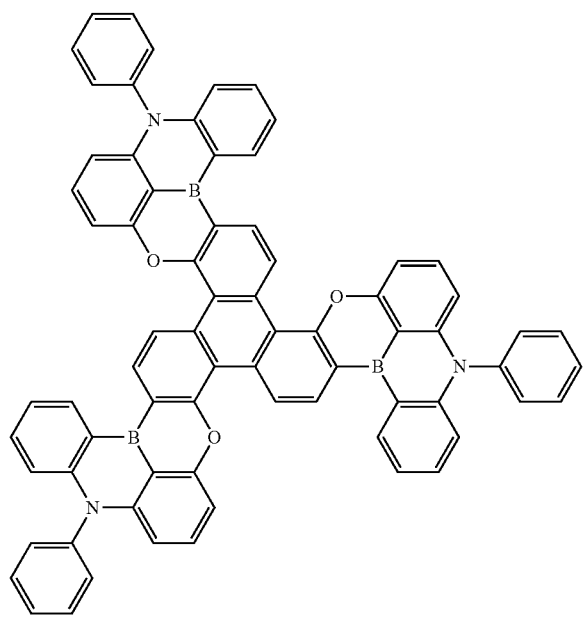

97
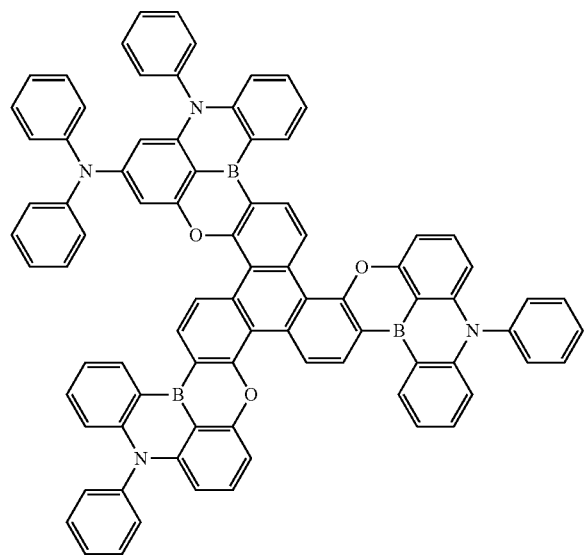
98
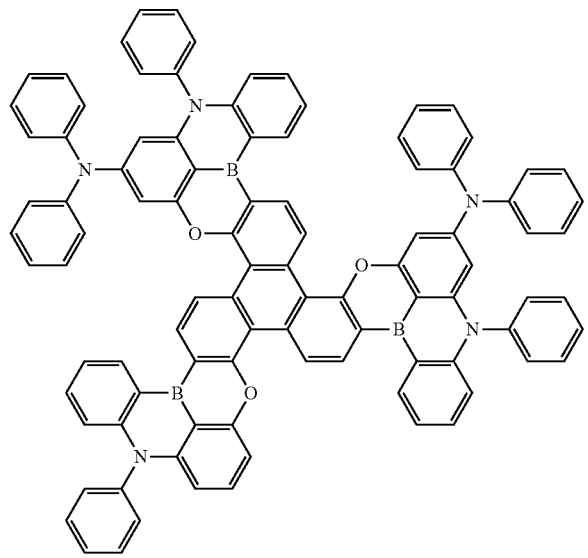
99
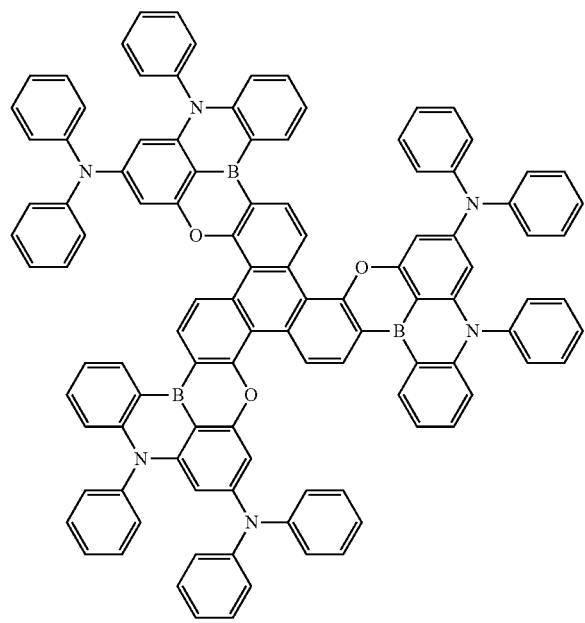
100
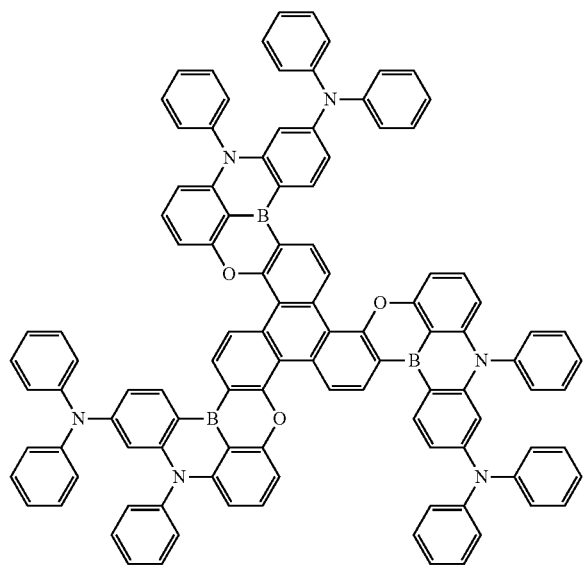

-continued
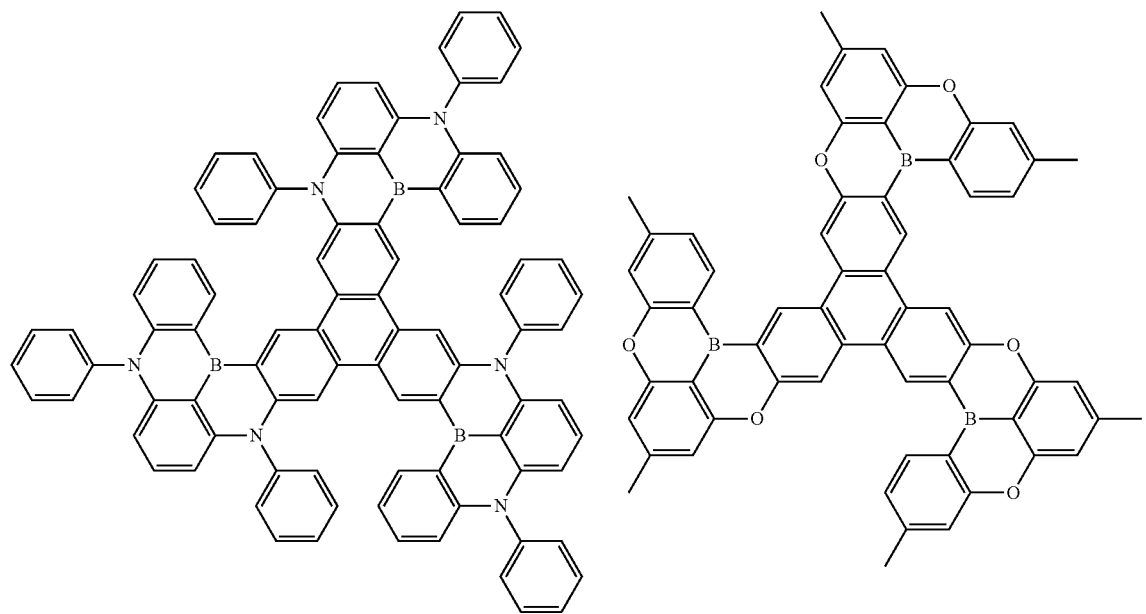
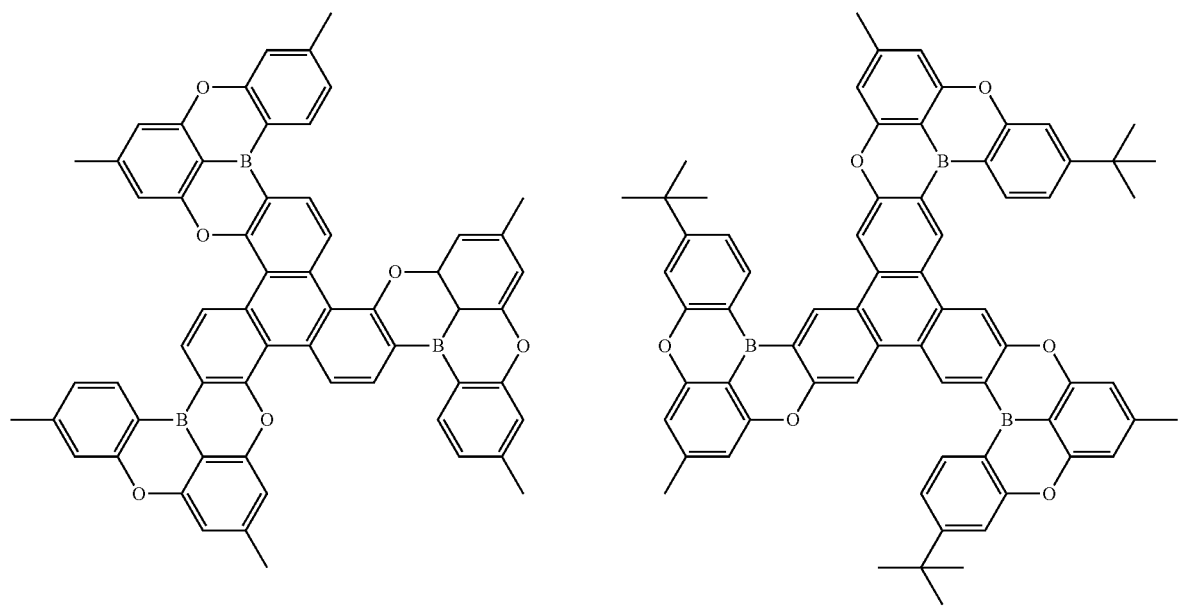

-continued
105
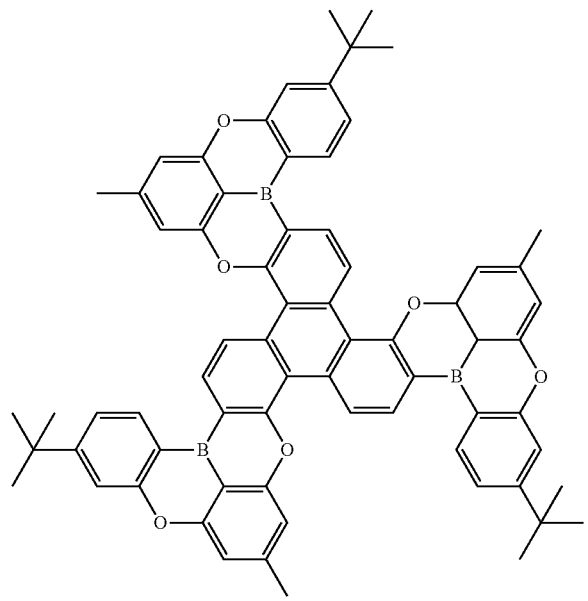
106
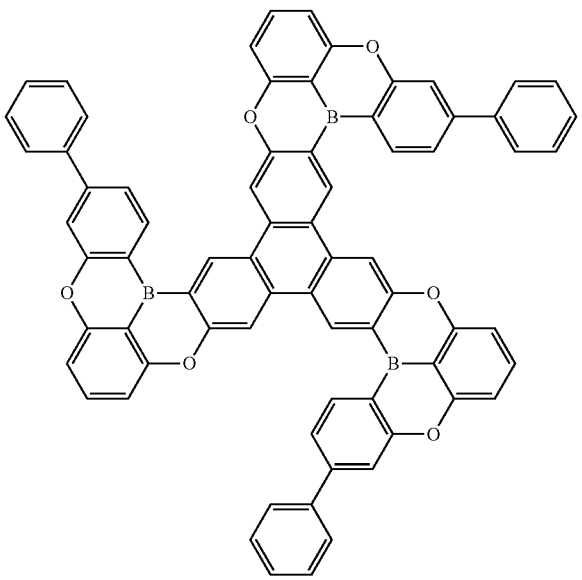
107
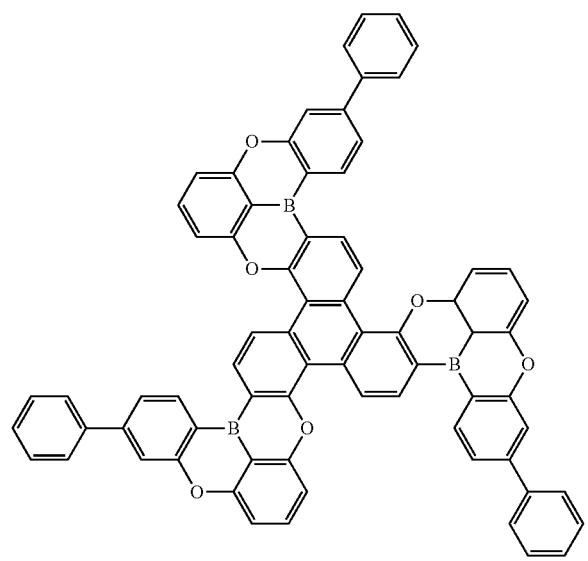
108
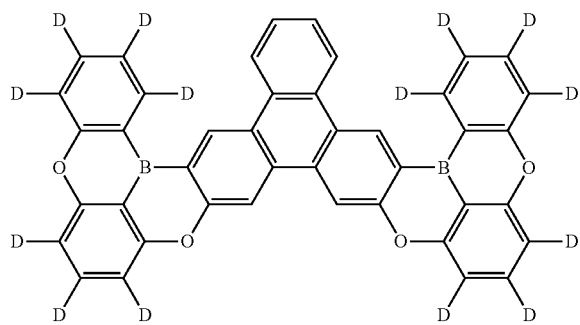
109
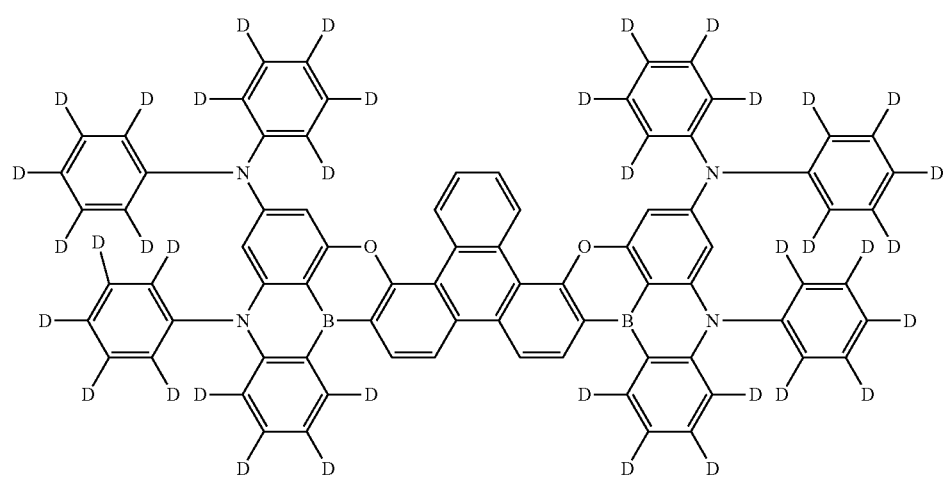

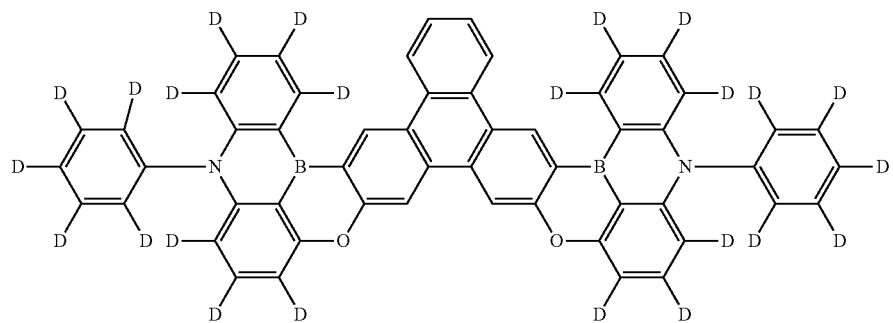
110
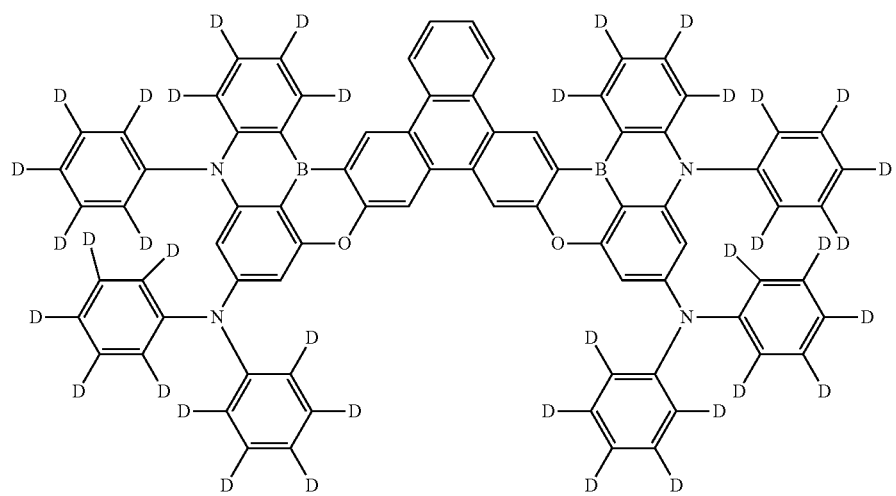
111
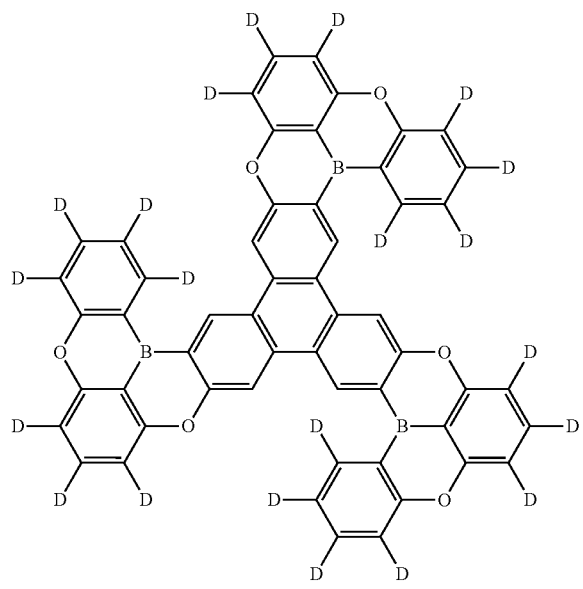
112
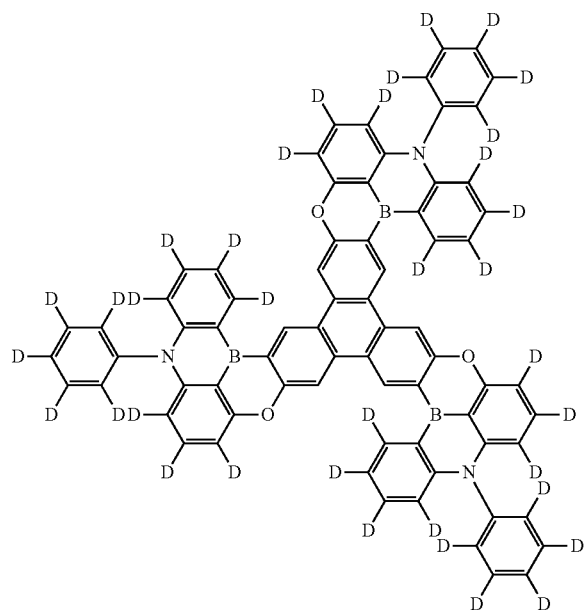
113

-continued
114
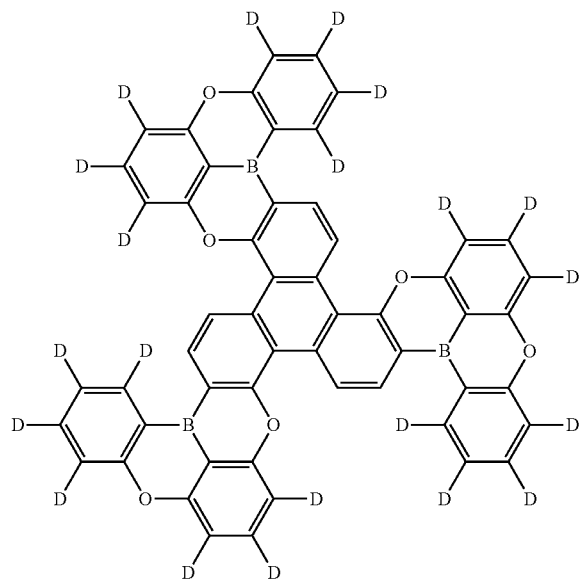
115
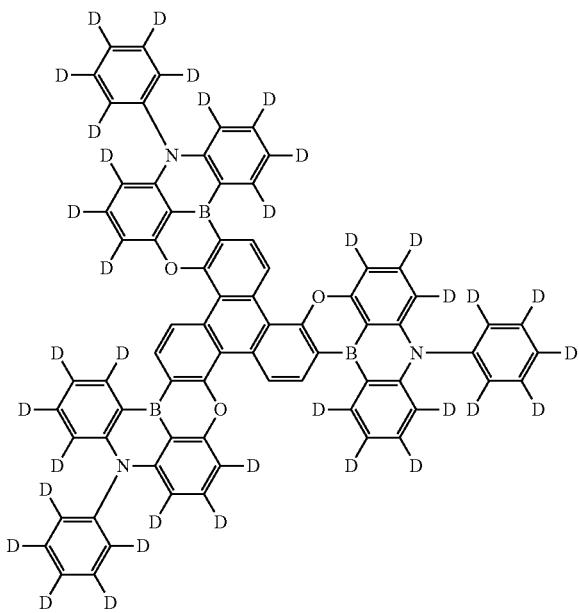
116
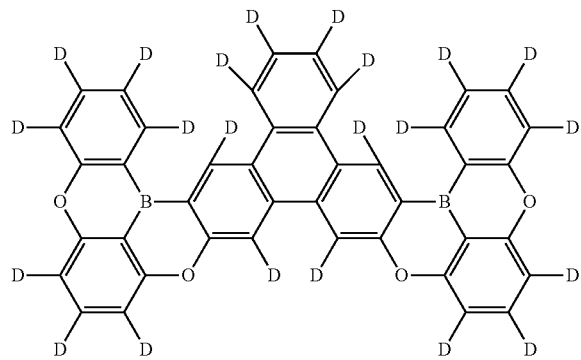
117
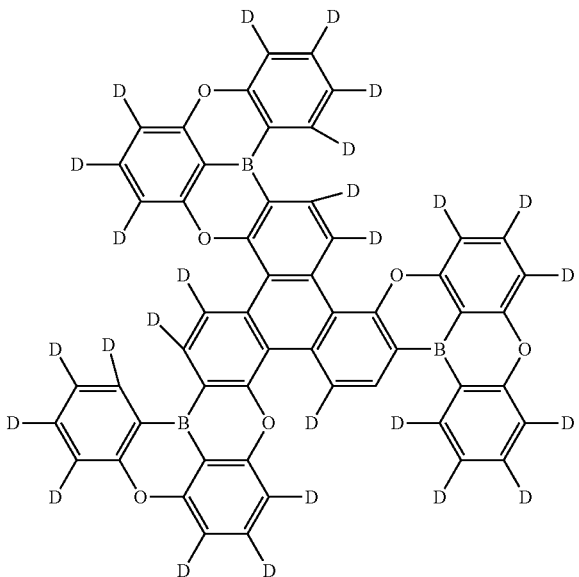
118
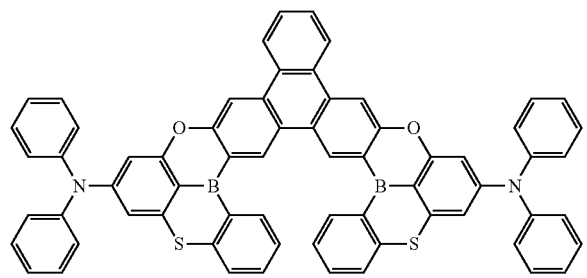
119
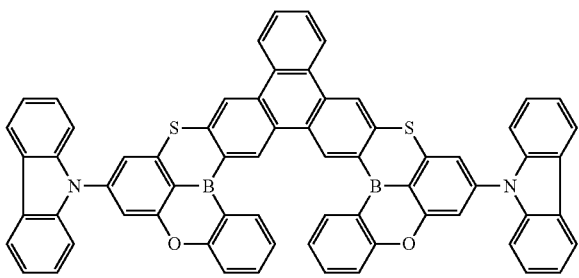

-continued
120
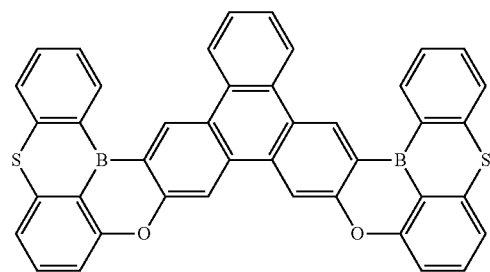
121
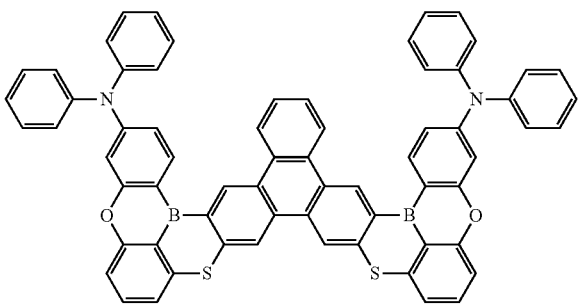
122
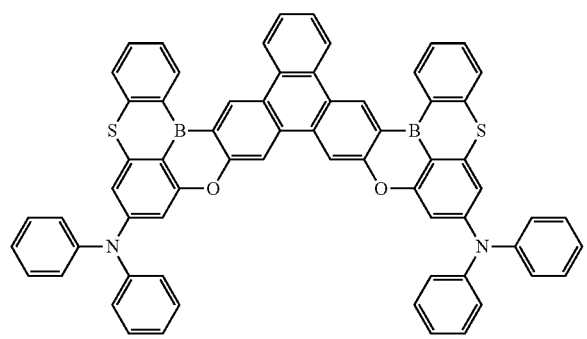
123
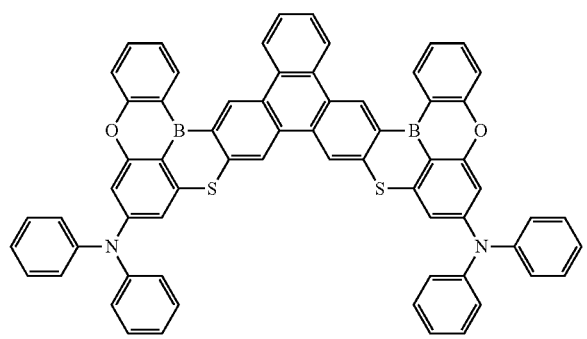
124
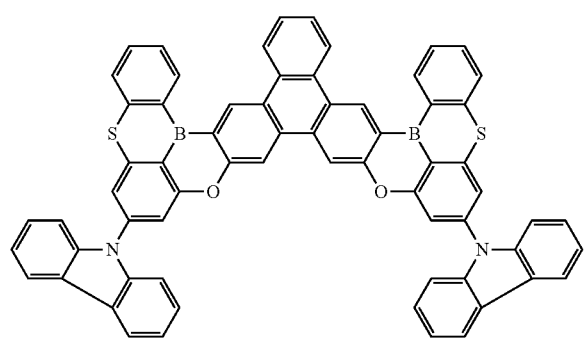
125
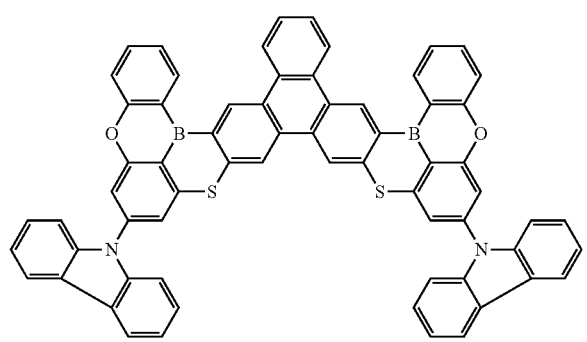
126
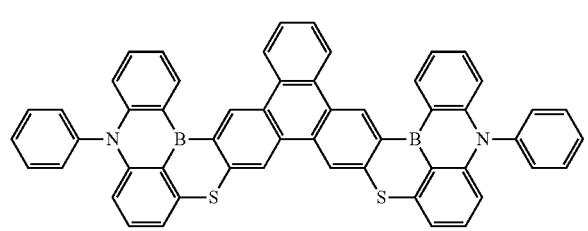
127
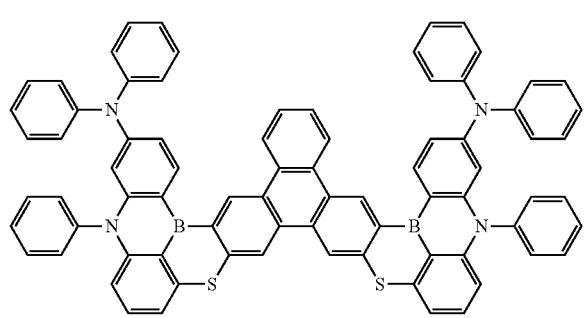

-continued
128
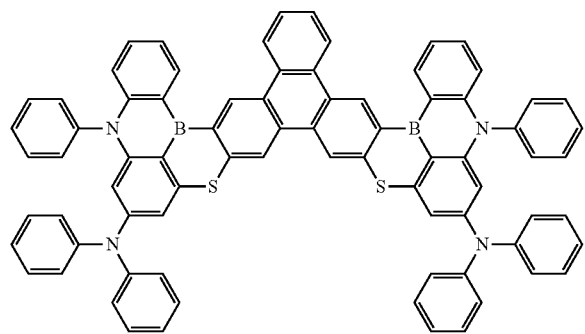
129
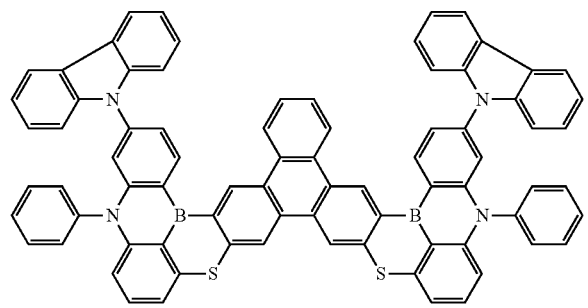
130
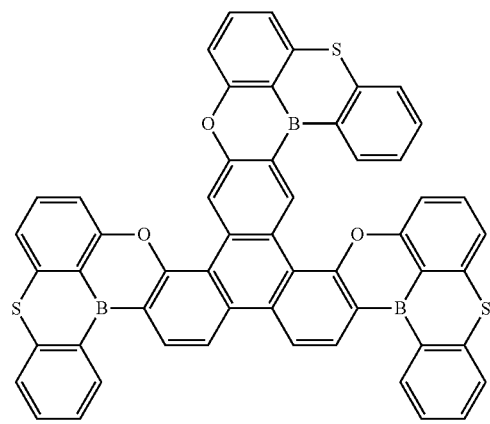
131
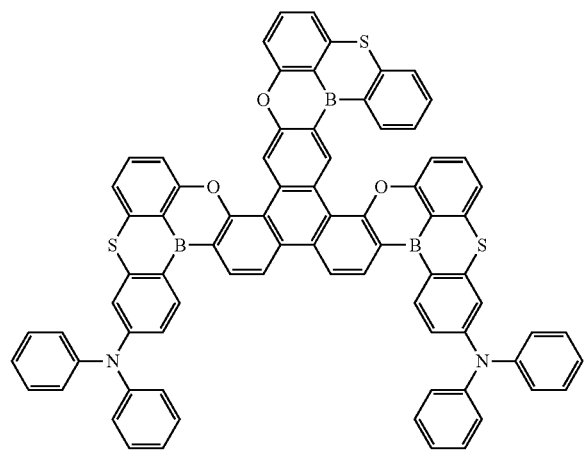
132
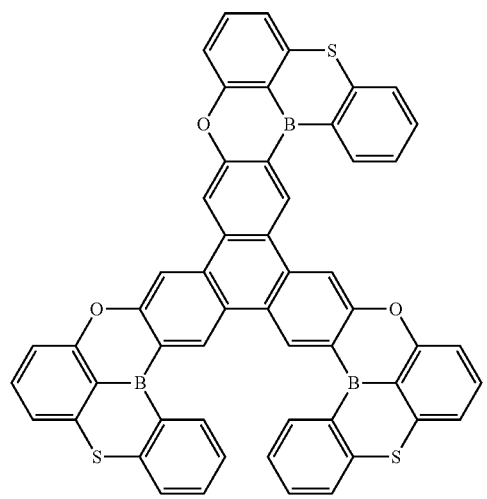
133
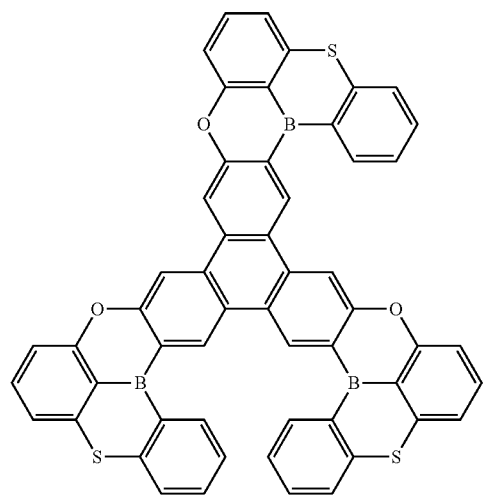

-continued
134
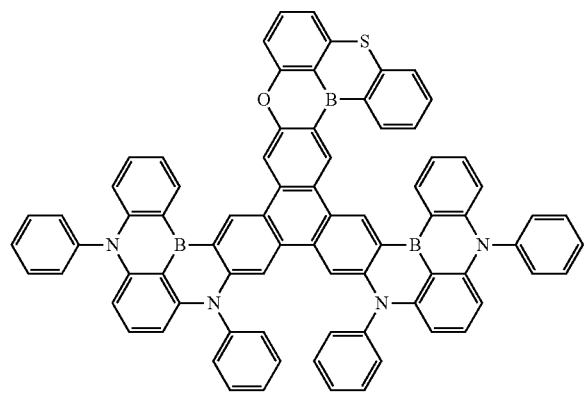
135
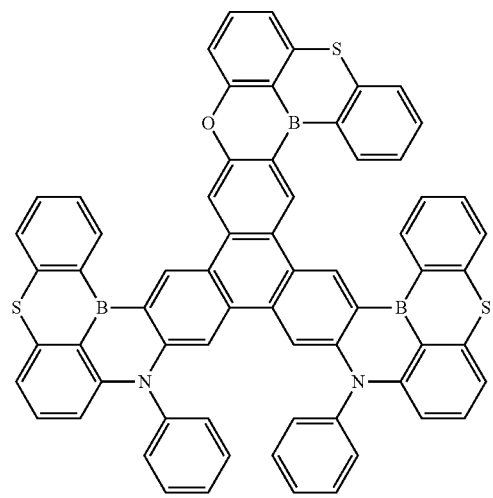
136
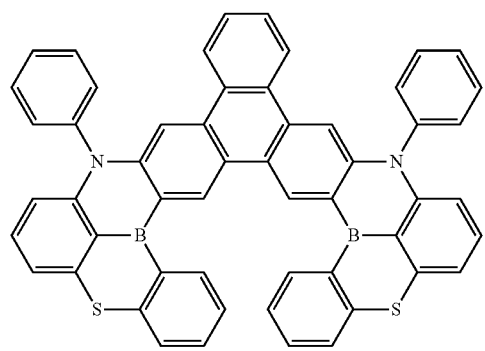
137
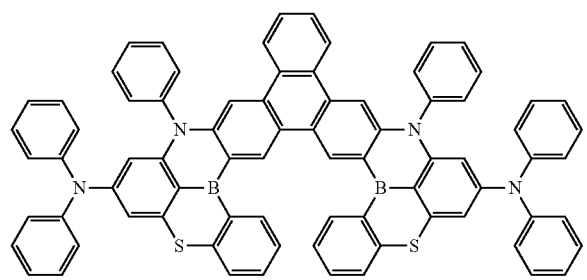
138
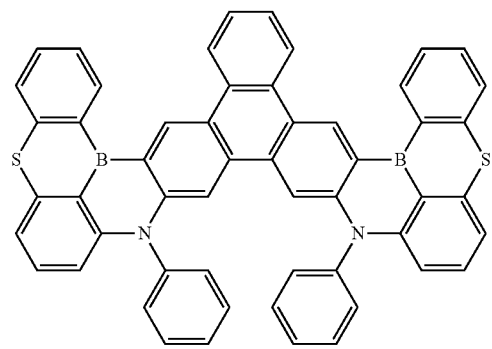
139
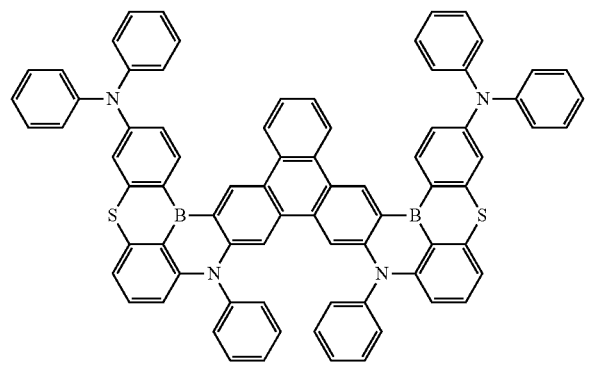

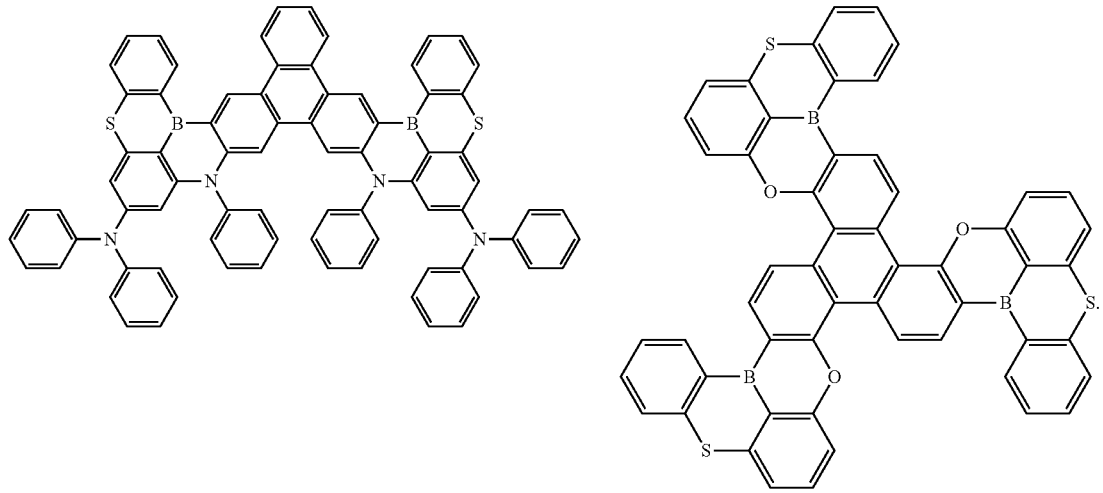

140

141

The emission spectrum of the fused polycyclic compound represented by Formula 1 may have a half-width of about 10 nm to about 50 nm, and for example a half-width of about 20 nm to about 40 nm. When the emission spectrum of the fused polycyclic compound has the above half-width, the luminous efficiency of a device including the compound may be improved. In addition, when the fused polycyclic compound of an embodiment is used as a blue light emitting device material for the luminescence device, the service life of the device may be improved.

The fused polycyclic compound represented by Formula 1 of an embodiment may be a thermally activated delayed fluorescence (TADF) emitting material. Furthermore, the fused polycyclic compound represented by Formula 1 of an embodiment may be a thermally activated delayed fluorescence dopant having an singlet-triplet energy difference ($\Delta E_{ST}$) between the lowest triplet exciton energy level (T1 level) and the lowest singlet exciton energy level (S1 level) of about 0.6 eV or less.

The fused polycyclic compound represented by Formula 1 of an embodiment may be a luminescence (luminescent) material having a luminescence center wavelength of about 430 nm to about 490 nm. For example, the fused polycyclic compound represented by Formula 1 of an embodiment may be a blue thermally activated delayed fluorescence (TADF) dopant. However, embodiments are not limited thereto, and when the fused polycyclic compound of an embodiment is used as a luminescence material, the fused polycyclic compound may be used as a dopant material to emit light having any suitable wavelength, and for example may be a red luminescence dopant, or a green luminescence dopant.

The emission layer EML in the organic electroluminescence device 10 of an embodiment may be to emit delayed fluorescence. For example, the emission layer EML may be to emit thermally activated delayed fluorescence (TADF).

In some embodiments, the emission layer EML of the organic electroluminescence device 10 may be to emit blue light. For example, the emission layer EML of the organic electroluminescence device 10 of an embodiment may be to emit blue light in the region of about 490 nm or more. However, embodiments are not limited thereto, and the emission layer EML may be to emit green light or red light.

In some embodiments, the organic electroluminescence device 10 of an embodiment may include a plurality of emission layers. The plurality of emission layers may be sequentially laminated, for example, the organic electroluminescence device 10 including the plurality of emission layers may be to emit white light. The organic electroluminescence device including a plurality of emission layers may be an organic electroluminescence device having a tandem structure. When the organic electroluminescence device 10 includes a plurality of emission layers, at least one emission layer EML may include the fused polycyclic compound of an embodiment as described above.

In an embodiment, the emission layer EML includes a host and a dopant, and may include the above-described fused polycyclic compound as a dopant. For example, the emission layer EML in the organic electroluminescence device 10 of an embodiment may include a host for emitting delayed fluorescence and a dopant for emitting delayed fluorescence, and may include the above-described fused polycyclic compound as a (the) dopant for emitting delayed fluorescence. The emission layer EML may include at least one among the fused polycyclic compounds represented by Compound Group 1 as a thermally activated delayed fluorescence dopant.

Any suitable material may be used as the host material of the emission layer EML, for example, fluoranthene derivatives, pyrene derivatives, arylacetylene derivatives, anthracene derivatives, fluorene derivatives, perylene derivatives, chrysene derivatives, etc., without specific limitation. In some embodiments, the host materials may include pyrene derivatives, perylene derivatives, and/or anthracene derivatives. In some embodiments, an anthracene derivative represented by Formula 5 may be used as a host material of the emission layer EML:

Formula 5

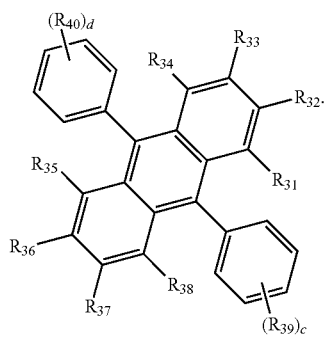

In Formula 5, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In some embodiments, $R_{31}$ to $R_{40}$ may be bonded to an adjacent group to form a ring.

In Formula 5, c and d may each independently be an integer of 0 to 5.

Formula 5 may be represented by any one among Compound 5-1 to Compound 5-16:

5-1

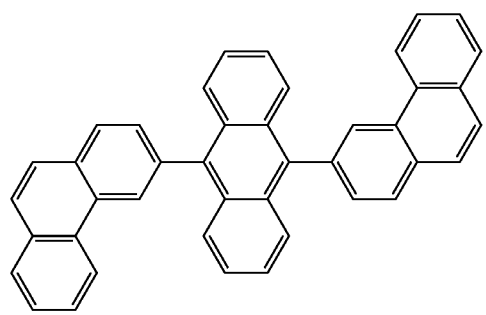

5-2

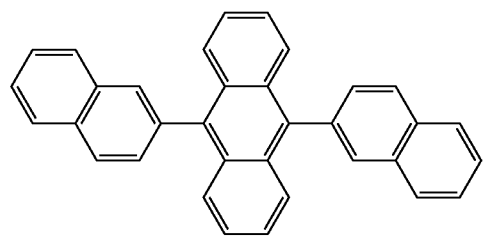

5-3

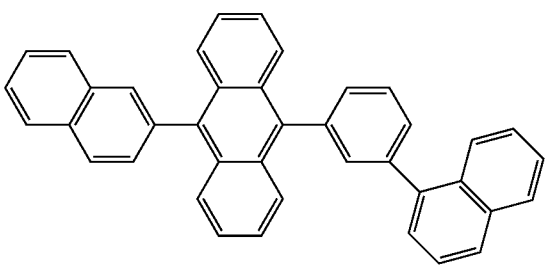

5-4

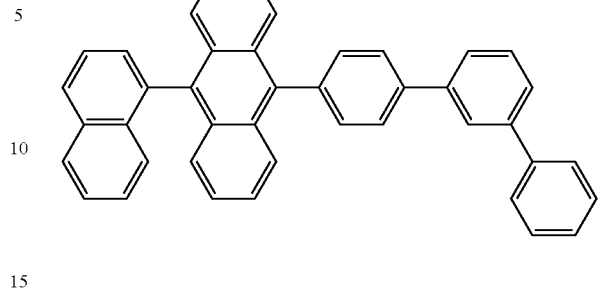

5-5

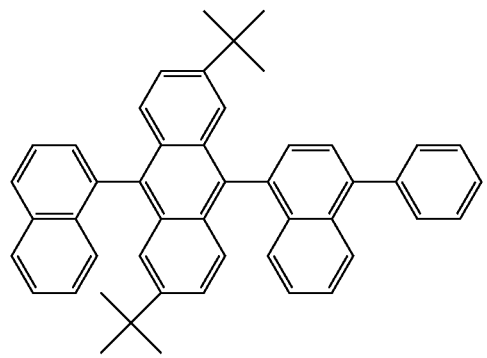

5-6

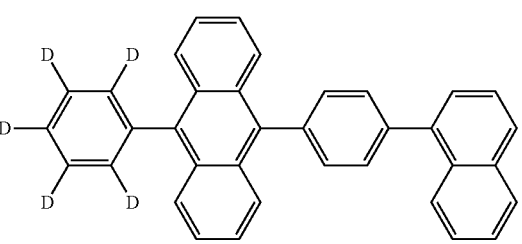

5-7

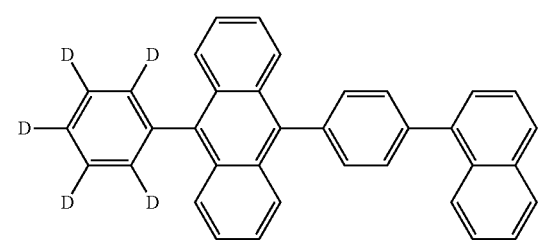

5-8

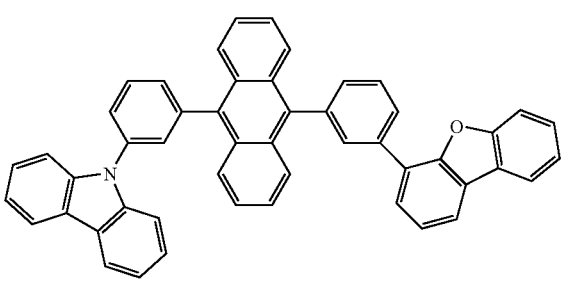

-continued 5-9
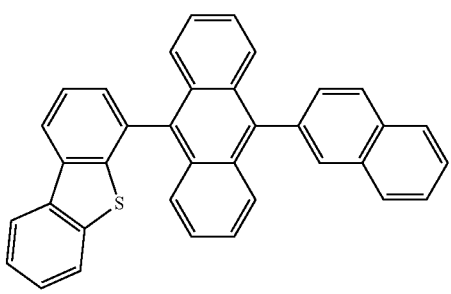

5-10
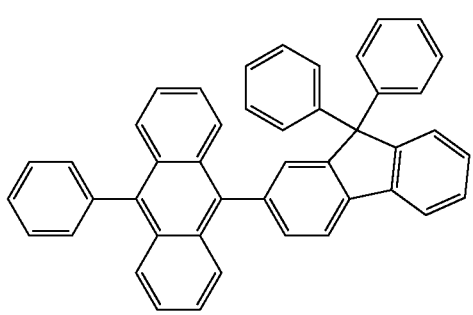

5-11
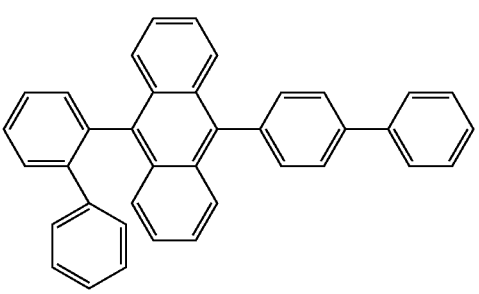

5-12
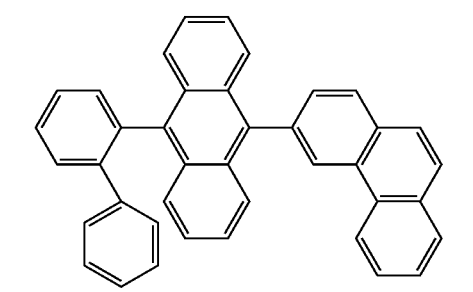

5-13
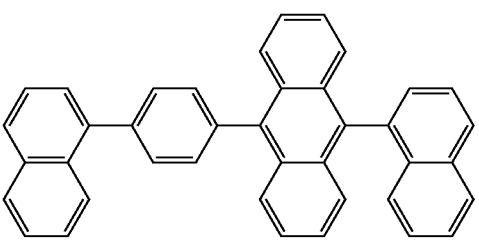

-continued 5-14
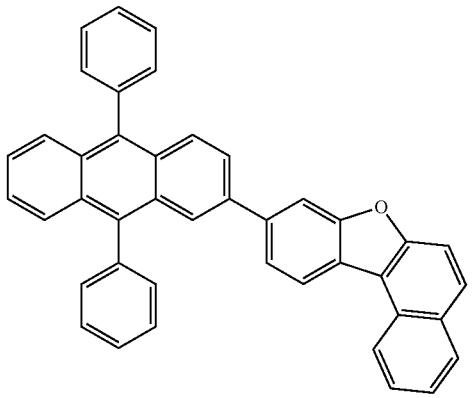

5-15
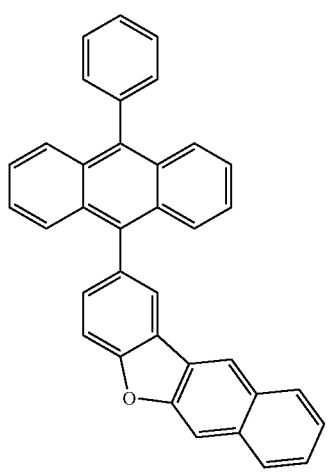

5-16
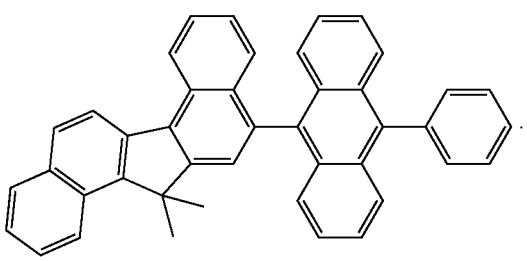

In an embodiment, the emission layer EML may include, as host materials, tris(8-hydroxyquinolino)aluminum ($Alq_3$), 4,4'-bis(N-carbazolyl)-1,1'-biphenyl (CBP), poly(n-vinylcarbazole) (PVK), 9,10-di(naphthalen-2-yl)anthracene (ADN), 4,4',4"-tris(carbazol-9-yl)-triphenylamine (TCTA), 1,3,5-tris(1-phenyl-1H-benz[d]imidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO3), octaphenylcyclotetra siloxane (DPSiO4), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), etc. However, embodiments are not limited thereto, and any suitable delayed fluorescence emission host materials other than the listed host materials may be included.

In some embodiments, the emission layer EML in the organic electroluminescence device 10 of an embodiment may further include any other suitable dopant materials. In an embodiment, the emission layer EML may further include, as dopant materials, styryl derivatives (e.g., 1,4-bis [2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and derivatives thereof (e.g., 2,5,8, 11-tetra-t-butylperylene (TBP)), pyrene and derivatives thereof (e.g., 1,1-dipyrene, 1,4-dipyrenylbenzene), etc.

In some embodiments, the emission layer EML may include two dopant materials, each having a different lowest triplet exciton energy level (T1 level). The emission layer EML of the organic electroluminescence device 10 of an embodiment may include a host having a first lowest triplet exciton energy level, a first dopant having a second lowest triplet exciton energy level lower than the first lowest triplet exciton energy level, and a second dopant having a third lowest triplet exciton energy level lower than the second lowest triplet exciton energy level. In an embodiment, the emission layer EML may include the above-described fused polycyclic compound of an embodiment as the first dopant.

In the organic electroluminescence device 10 of an embodiment including a host, a first dopant, and a second dopant in the emission layer EML, the first dopant may be a delayed fluorescence dopant, and the second dopant may be a fluorescence dopant. In some embodiments, the fused polycyclic compound represented by Formula 1 may serve as an assistant dopant in the organic electroluminescence device 10 of an embodiment.

For example, when the emission layer EML of the organic electroluminescence device 10 of an embodiment includes a plurality of dopants, the emission layer EML may include the above-described polycyclic compound of an embodiment as the first dopant, and one of the above-described suitable dopant materials as the second dopant. For example, when the emission layer EML is to emit blue light, the emission layer EML may further include, as a second dopant, any one selected from the group consisting of spiro-DPVBi, spiro-6P, distyryl-benzene (DSB), distyryl-arylene (DSA), polyfluorene (PFO)-based polymer, and poly (p-phenylene vinylene) (PPV)-based polymer. An organometallic complex or a metal complex such as (4,6-F2ppy)$_2$Irpic, and/or perylene and derivatives thereof, etc. may also be used as a second dopant.

In some embodiments, in the organic electroluminescence device 10 of an embodiment including the fused polycyclic compound as a first dopant of the emission layer EML, the emission layer EML may be to emit green light or red light, and the second dopant material may be an above-described suitable dopant, a green fluorescence dopant, or a red fluorescence dopant.

The emission layer EML in the organic electroluminescence device 10 of an embodiment may be a phosphorescence (phosphorescent) emission layer. For example, the fused polycyclic compound according to an embodiment may be included in the emission layer EML as a phosphorescence host material.

In the organic electroluminescence device 10 of an embodiment shown in FIGS. 1 to 4, the electron transport region ETR is disposed on the emission layer EML. The electron transport region ETR may include at least one of a hole blocking layer HBL, an electron transport layer ETL, or an electron injection layer EIL, but an embodiment is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In some embodiments, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, about 100 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.)

When the electron transport region ETR includes the electron transport layer ETL, the electron transport region ETR may include an anthracene-based compound. However, embodiments are not limited thereto, and the electron transport region may include, for example, tris(8-hydroxyquinolinato)aluminum (Alq$_3$), 1,3,5-tri[(3-pyridyl)-phen-3-yl] benzene, 2,4,6-tris(3'-(pyridin-3-yl)biphenyl-3-yl)-1,3,5-triazine, 2-(4-(N-phenylbenzimidazolyl-1-ylphenyl)-9,10-dinaphthylanthracene, 1,3,5-tris(1-phenyl-1H-benz[d] imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate (Bebq$_2$), 9,10-di(naphthalen-2-yl)anthracene (ADN), diphenyl(4-(triphenylsilyl)phenyl)phosphine oxide (TSPO1), or a mixture thereof. The thickness of the electron transport layers ETL may be about 100 Å to about 1,000 Å, for example, about 150 Å to about 500 Å. When the thickness of the electron transport layers ETL satisfies the above-described range, satisfactory electron transport characteristics may be obtained without a substantial increase in driving voltage.

When the electron transport region ETR includes the electron injection layer EIL, the electron transport region ETR may be formed using metal halides (such as LiF, NaCl, CsF, RbCl, RbI, and/or CuI), lanthanum metals (such as Yb), metal oxides (such as Li$_2$O and/or BaO), lithium quinolate (LiQ), etc., but embodiments are not limited thereto. The electron injection layer EIL may also be formed of a mixture of an electron transport material and an insulating organometal salt. The organo-metal salt may be a material having an energy band gap of about 4 eV or more. The organo-metal salt may include, for example, metal acetates, metal benzoates, metal acetoacetates, metal acetylacetonates, and/or metal stearates. The thickness of the electron injection layers EIL may be about 1 Å to about 500 Å, and about 3 Å to about 300 Å. When the thickness of the electron injection layers EIL satisfies the above-described range, satisfactory electron injection properties may be obtained without a substantial increase in driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen), but is not limited thereto.

The second electrode EL2 is disposed on the electron transport region ETR. The second electrode EL2 may be a common electrode or a negative electrode. The second electrode EL2 may be a transmissive electrode, a transflective electrode, or a reflective electrode. When the second electrode EL2 is a transmissive electrode, the second electrode EL2 may be formed of a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). In some embodiments, the first electrode EL1 may have a multilayer structure including a reflective layer or a transflective layer formed of the above-described materials, and a transparent conductive layer formed of ITO, IZO, ZnO, ITZO, etc.

In some embodiments, the second electrode EL2 may be connected with an auxiliary electrode. When the second electrode EL2 is connected to the auxiliary electrode, the resistance of the second electrode EL2 may decrease.

In some embodiments, the organic electroluminescence device 10 of an embodiment may include a buffer layer between the emission layer EML and the electron transport region ETR. The buffer layer may control or affect the concentration of excitons generated in the emission layer EML. In some embodiments, the buffer layer may include at least some of the emission layer EML materials. For example, the buffer layer may include host materials of the emission layer EML materials (e.g., the same host materials that are included in the emission layer EML). The lowest triplet exciton energy level of the buffer layer material may be controlled or selected to be higher than or substantially equal to the lowest triplet exciton energy level of the second dopant or to be lower than or substantially equal to the lowest triplet exciton energy level of the second dopant, depending on the combination of host and dopant materials included in the emission layer EML.

In some embodiments, a capping layer CPL may be further disposed on the second electrode EL2 of the organic electroluminescence device 10 according to an embodiment. The capping layer CPL may include an organic layer and/or an inorganic layer. The capping layer CPL may be, for example, a single layer of an organic layer or an inorganic layer, or a layer in which an organic layer and an inorganic layer are sequentially stacked. The capping layer may have a refractive index of about 1.6 or more within a wavelength range of about 560 nm to about 600 nm. The capping layer may include the amine compound CPL1 and/or CPL2:

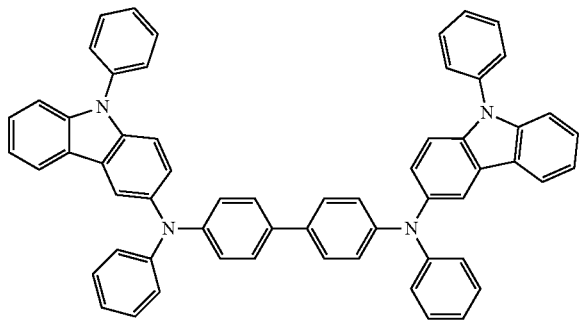

CPL1

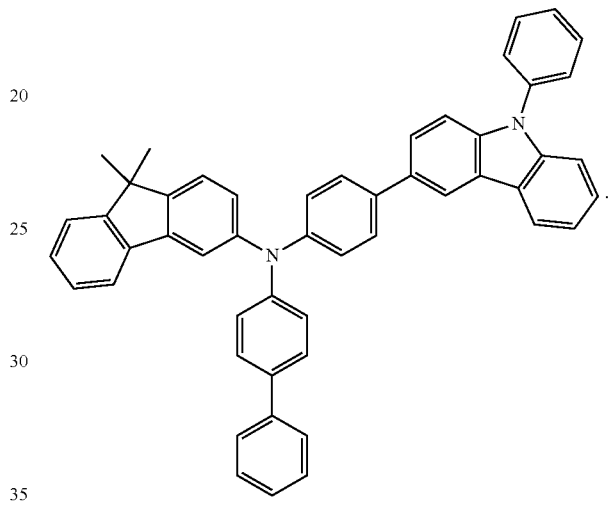

CPL2

In some embodiments, the capping layer CPL may include α-NPD, NPB, TPD, m-MTDATA, Alq$_3$, CuPc, N4,N4,N4',N4'-tetra(biphenyl-4-yl)biphenyl-4,4'-diamine (TPD15), 4,4',4"-tris(carbazol-9-yl)triphenylamine (TCTA), etc. In some embodiments, the capping layer CPL may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc.

The fused polycyclic compound of an embodiment as described above includes a structure in which two or more structures of Formula 2, each including one boron atom and two hetero atoms, are fused to a central triphenylene core. The fused polycyclic compound represented by Formula 1 according to an embodiment has an expanded conjugation structure, and may thereby achieve high efficiency of the organic electroluminescence device when the fused polycyclic compound of an embodiment is used as a luminescent material of the organic electroluminescence device.

Hereinafter, the fused polycyclic compound according to an embodiment of the present disclosure will be explained in more detail with reference to Examples and Comparative Examples. The embodiments are provided as illustrations to assist understanding of the present disclosure, and the scope of the present disclosure is not limited thereto.

Examples

1. Synthesis of Fused Polycyclic Compound

Example synthetic methods of the fused polycyclic compound according to the present embodiment will be described with respect to compounds 9, 25, 27, 53, 58, 59, 76 and 81. The synthetic methods of the fused polycyclic compound are provided as examples, and are not limited thereto.

(1) Synthesis of Compound 9

Synthesis of Intermediate Compound A

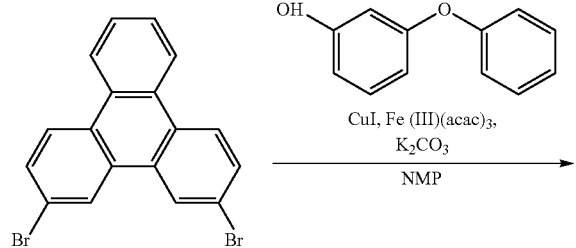

2,11-dibromotriphenylene (20.0 g, 51.8 mmol), 3-phenoxyphenol (20.3 g, 109 mmol), CuI (0.49 g, 2.59 mmol), K$_2$CO$_3$ (28.6 g, 207 mmol), and tris(2,4-pentanedionato)iron (III) (Fe(III)(acac)$_3$, 1.67 g, 5.2 mmol) were added to 1-methyl-2-pyrrolidone (NMP, 117 mL) and heated and stirred at 180° C. for 24 hours. The mixture was allowed to cool, filtered through Celite, and separated by adding toluene and water to obtain an organic layer. The organic layer was concentrated, purified by column chromatography (silica gel), concentrated, and washed with extra hexane to obtain Compound A (25.3 g, yield 82%). The molecular weight of Compound A was 597 as measured by FAB-MS.

Synthesis of Compound 9

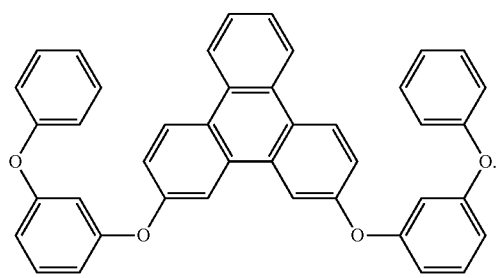

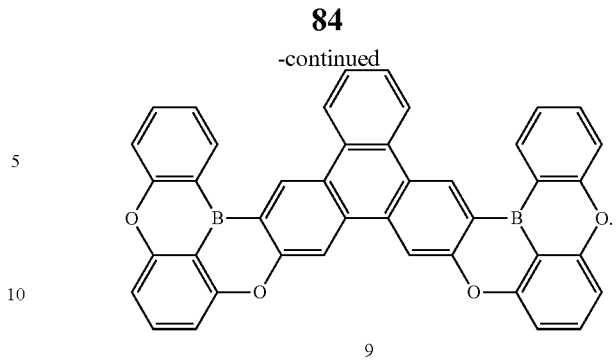

In an argon (Ar) atmosphere, Compound A (23 g, 38.5 mmol) was added to tert-butylbenzene (96 mL) and cooled to −30° C., and tert-butyllithium (1.6 M/L pentane, 96 mL, 154 mmol) was slowly added thereto. The mixture was allowed to approach room temperature for about 1 hour, and then the mixture was heated and stirred at about 60° C. for 3 hours. The reaction solution was cooled to −30° C., and BBr$_3$ (38.6 g, 154 mmol) was slowly added thereto and heated and stirred at an internal temperature of 30° C. for 1 hour. The reaction solution was ice-cooled, and N,N-diisopropylethylamine (20.0 g, 154 mmol) was added thereto and heated and stirred at 100° C. for 2 hours. After cooling and adding water, the resultant mixture was filtered through Celite and an organic layer was concentrated. The concentrated organic layer was purified by silica gel column chromatography to obtain Compound 9 (7.79 g, yield 33%). The molecular weight of Compound 9 was 928 as measured by FAB-MS measurement. The obtained Compound 9 was subjected to sublimation purification (300° C., 8.7×10$^{-3}$ Pa) again and was used as a sample for evaluation.

(2) Synthesis of Compound 25

Synthesis of Intermediate Compound B

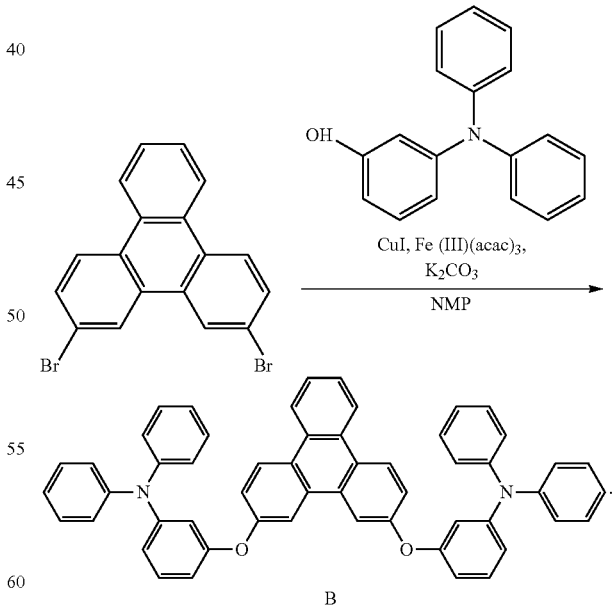

The reaction was performed utilizing substantially the same conditions as the Synthesis of Intermediate Compound A, except 3-(diphenylamino)phenol (18.9 g) was used in place of 3-phenoxyphenol. As a result, Intermediate Compound B (15.6 g, yield 72%) was obtained.

Synthesis of Compound 25

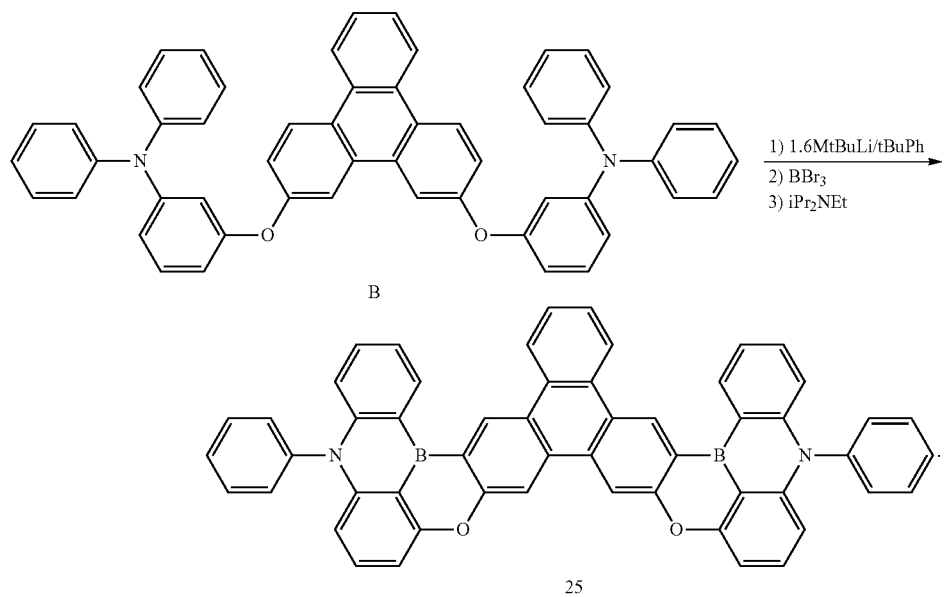

The reaction was performed utilizing substantially the same conditions as the Synthesis of Compound 9 except that the obtained Intermediate Compound B (15.0 g) was used in place of Intermediate Compound A. As a result, Compound 25 (4.44 g, yield 29%) was obtained. The molecular weight of Compound 25 was 762 as measured by FAB-MS. The obtained Compound A-4 was subjected to sublimation purification (300° C., 8.7×10$^{-3}$ Pa) for evaluation.

(3) Synthesis of Compound 27

Synthesis of Intermediate Compounds C and D

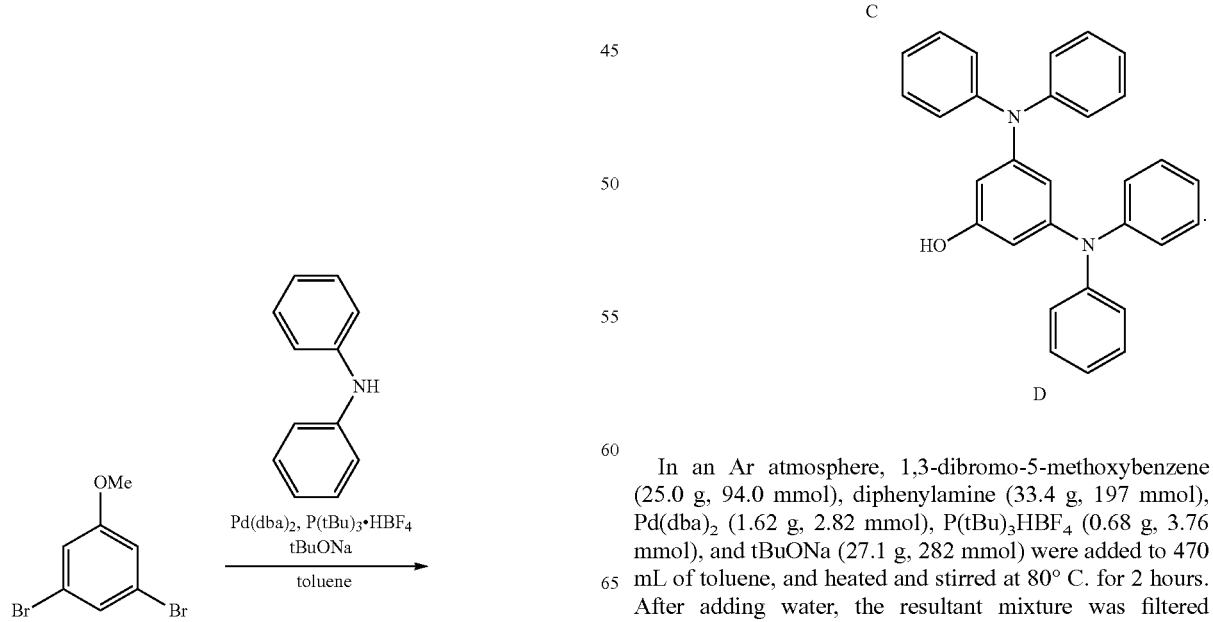

In an Ar atmosphere, 1,3-dibromo-5-methoxybenzene (25.0 g, 94.0 mmol), diphenylamine (33.4 g, 197 mmol), Pd(dba)$_2$ (1.62 g, 2.82 mmol), P(tBu)$_3$HBF$_4$ (0.68 g, 3.76 mmol), and tBuONa (27.1 g, 282 mmol) were added to 470 mL of toluene, and heated and stirred at 80° C. for 2 hours. After adding water, the resultant mixture was filtered through Celite and an organic layer was separated and concentrated. The concentrated organic layer was purified by silica gel column chromatography to obtain Intermediate Compound C (41.6 g, yield 80%). Thereafter, Intermediate Compound C was dissolved in 500 mL of CH$_2$Cl$_2$, and BBr$_3$ (46.4 g, 185 mmol) was added thereto and stirred at 0° C. for 24 hours. After adding water, the resultant mixture was filtered through Celite and an organic layer was concentrated and purified by silica gel column chromatography to obtain Intermediate Compound D (29.8 g, yield 75%). The molecular weight of Intermediate Compound D was 443 as measured by FAB-MS.

Synthesis of Intermediate Compound E

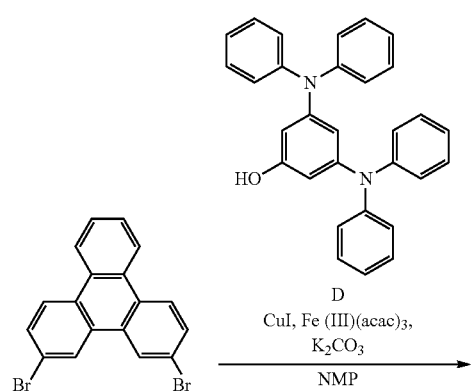

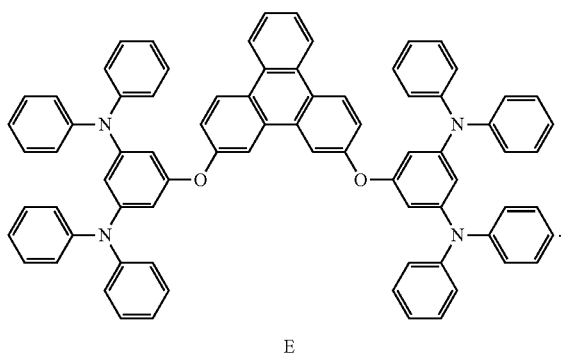

The reaction was performed utilizing substantially the same conditions as the Synthesis of Intermediate Compound A, except that the obtained Intermediate Compound D (28.3 g) was used in place of 3-phenoxyphenol. As a result, Intermediate Compound E (20.0 g, yield 70%) was obtained. The molecular weight of Intermediate Compound E was 1080 as measured by FAB-MS.

Synthesis of Compound 27

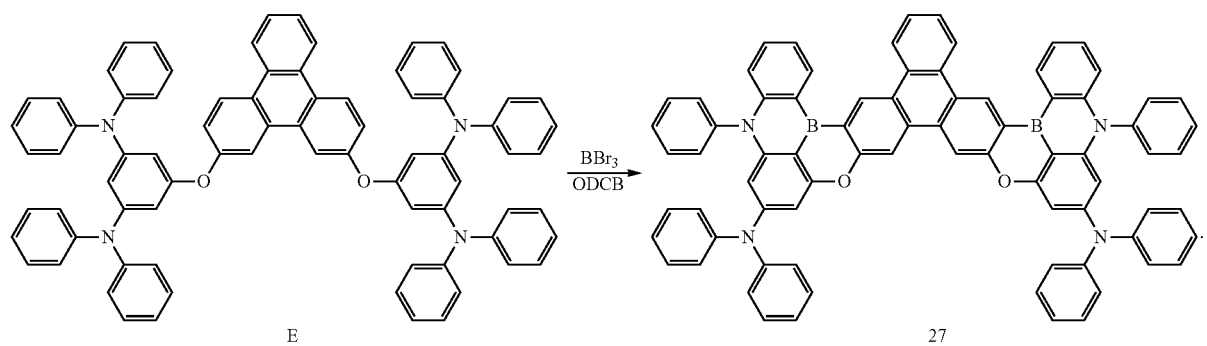

Intermediate Compound E (18.0 g, 17.9 mmol) was dissolved in 180 mL of ODCB, and BBr$_3$ (13.4 g, 53.6 mmol) was added thereto, and stirred at 180° C. for 10 hours. The reaction solution was ice-cooled, N,N-diisopropylethylamine (20.0 g, 154 mmol) was added thereto, and the resultant mixture was filtered through Celite and an organic layer was concentrated. The concentrated organic layer was purified by silica gel column chromatography to obtain Compound 27 (12.8 g, yield 70%). The molecular weight of Compound 27 was 1097 as measured by FAB MS. The obtained Compound 27 was subjected to sublimation purification (300° C., 8.7×10$^{-3}$ Pa) for evaluation.

(4) Synthesis of Compound 53

Synthesis of Intermediate Compound F

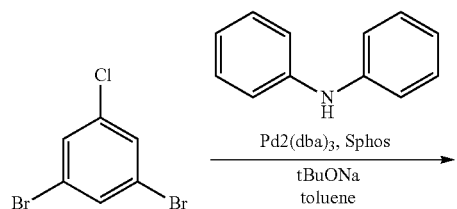

Synthesis of Intermediate Compound G

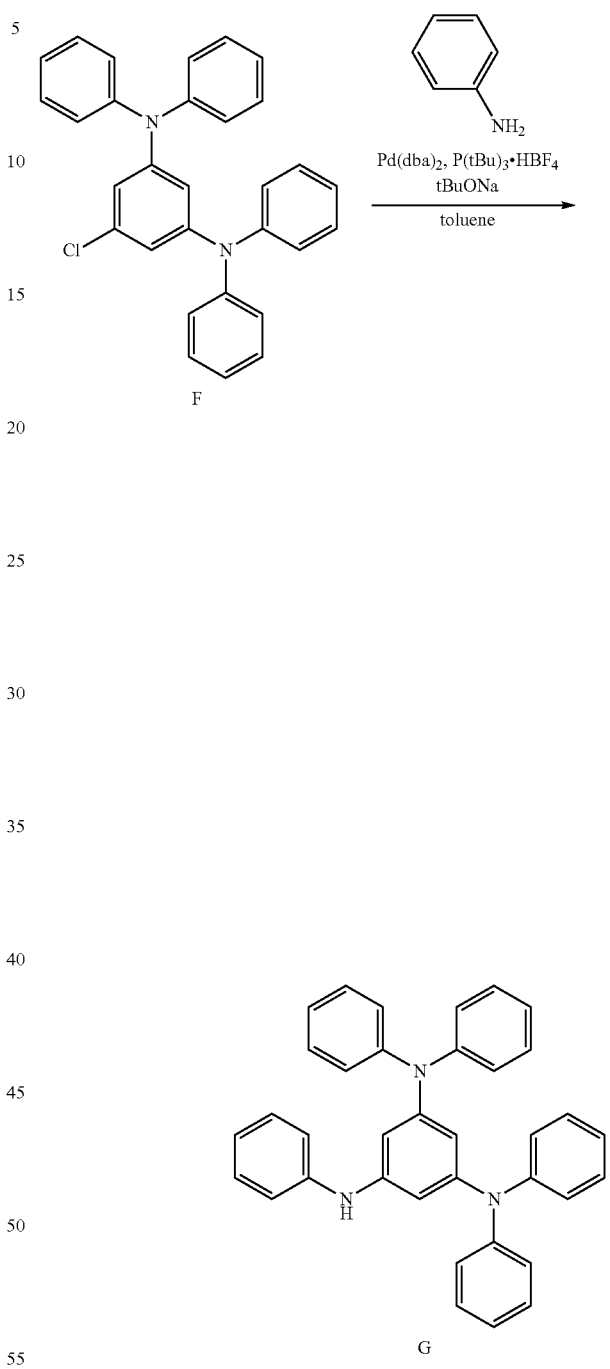

1,3-dibromo-5-chlorobenzene (35.0 g, 129 mmol), diphenylamine (43.8 g, 259 mmol), Pd$_2$(dba)$_3$ (2.49 g, 2.72 mmol), Sphos (2.23 g, 5.44 mmol), and tBuONa (37.9 g, 394 mmol) were added to 500 mL of toluene, and heated and stirred at 80° C. for 5 hours. The mixture was allowed to cool, filtered through Celite, and separated by adding toluene and water to obtain an organic layer. The organic layer was concentrated, purified by column chromatography (silica gel), concentrated, and washed with extra hexane to obtain Compound F (45.0 g, yield 78%). The molecular weight of Compound F was 447 as measured by FAB-MS.

Compound F (35.0 g, 78.3 mmol), aniline (7.29 g, 78.3 mmol), Pd(dba)$_2$ (1.80 g, 3.13 mmol), P(tBu)$_3$HBF$_4$ (1.82 g, 6.26 mmol), and tBuONa (11.29 g, 117 mmol) were added to 200 mL of toluene, and then heated and stirred at 80° C. for 5 hours. The mixture was allowed to cool, filtered through Celite, and separated by adding toluene and water to obtain an organic layer. The organic layer was concentrated, purified by column chromatography (silica gel), concentrated, and washed with extra hexane to obtain Compound G (28.0 g, yield 71%). The molecular weight of Compound G was 504 as measured by FAB-MS.

Synthesis of Intermediate Compound H

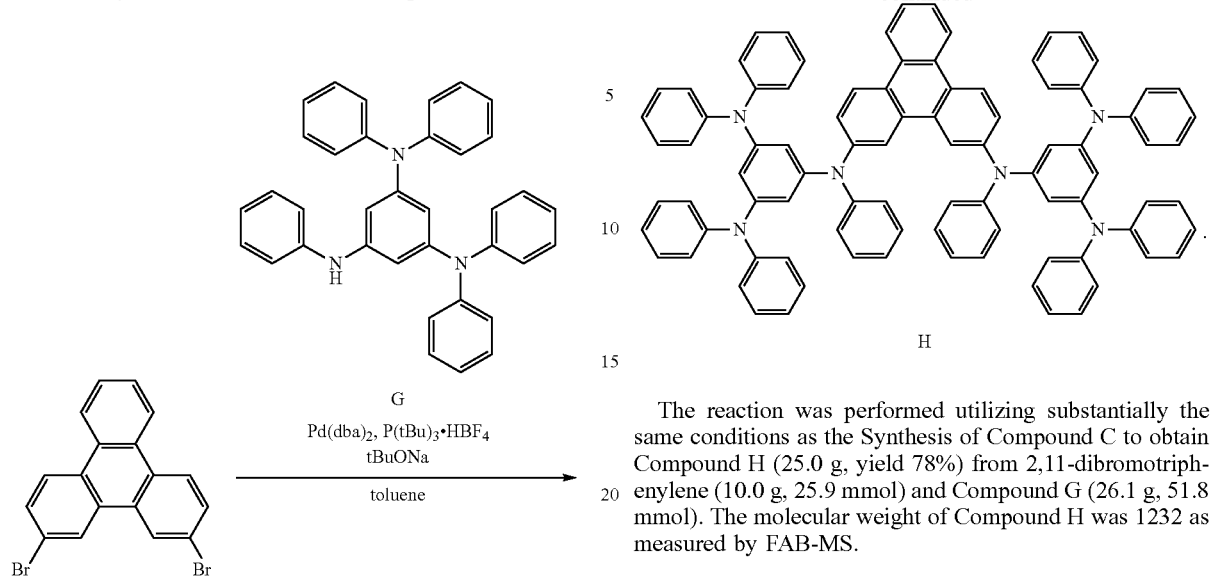

G

Pd(dba)$_2$, P(tBu)$_3$·HBF$_4$
tBuONa toluene

H

The reaction was performed utilizing substantially the same conditions as the Synthesis of Compound C to obtain Compound H (25.0 g, yield 78%) from 2,11-dibromotriphenylene (10.0 g, 25.9 mmol) and Compound G (26.1 g, 51.8 mmol). The molecular weight of Compound H was 1232 as measured by FAB-MS.

Synthesis of Compound 53

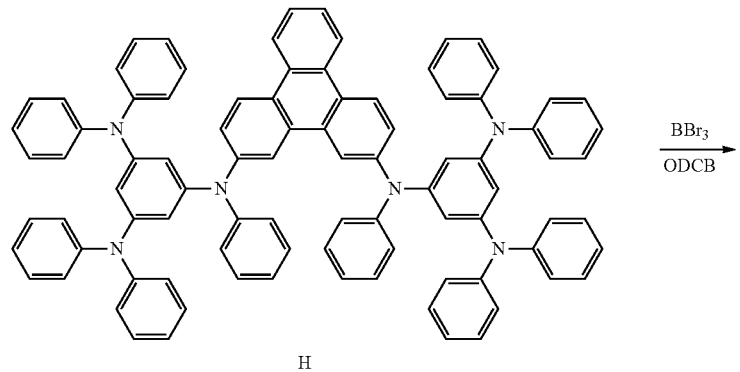

H

BBr$_3$
ODCB

53

Compound H (15.0 g, 12.2 mmol) was added to 162 mL of ODCB, and BBr$_3$ (18.3 g, 73 mmol) was added thereto and then heated and stirred at 180° C. for 6 hours. The mixture was allowed to cool, N,N-diisopropylethylamine (47.0 g, 365 mmol) was added thereto, and the mixture was filtered after addition to 1 L of acetonitrile. The resultant product was purified by silica gel column chromatography to obtain Compound 53 (8.0 g, yield 53%). The molecular weight of Compound 53 was 1247 as measured by FAB MS. The obtained Compound 53 was subjected to sublimation purification (430° C., 8.2×10$^{-3}$ Pa) for evaluation.

(5) Synthesis of Compound 58

Synthesis of Intermediate Compound I

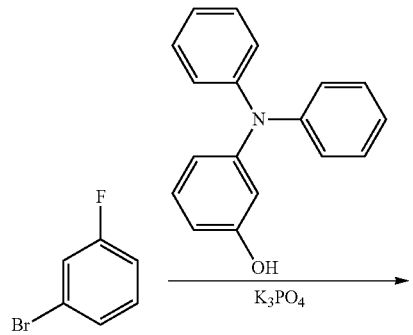

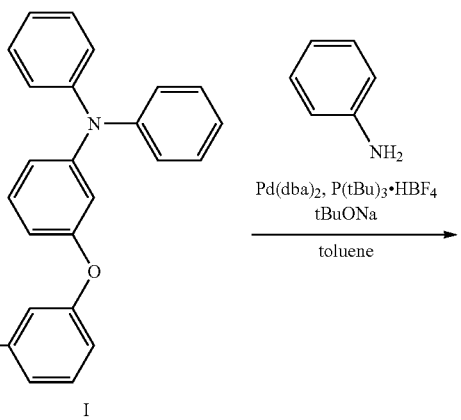

1-bromo-3-fluorobenzene (16.0 g, 91.4 mmol), 3-(diphenylamino)phenol (35.8 g, 137 mmol), and K$_3$PO$_4$ (58.2 g, 274 mmol) were added to 160 mL of NMP and then heated and stirred at 180° C. for 8 hours. The mixture was allowed to cool, filtered through Celite, and separated by adding toluene and water to obtain an organic layer. The organic layer was concentrated, purified by column chromatography (silica gel), concentrated, and washed with extra hexane to obtain Compound I (30.0 g, yield 79%). The molecular weight of Compound I was 416 as measured by FAB-MS.

Synthesis of Intermediate Compound J

The reaction was performed utilizing substantially the same conditions as the Synthesis of Compound G to obtain Compound J (22.0 g, yield 76%) using Compound I (28.0 g, 67.3 mmol) and aniline (6.26 g, 67.3 mmol). The molecular weight of Compound J was 429 as measured by FAB-MS.

Synthesis of Intermediate Compound K
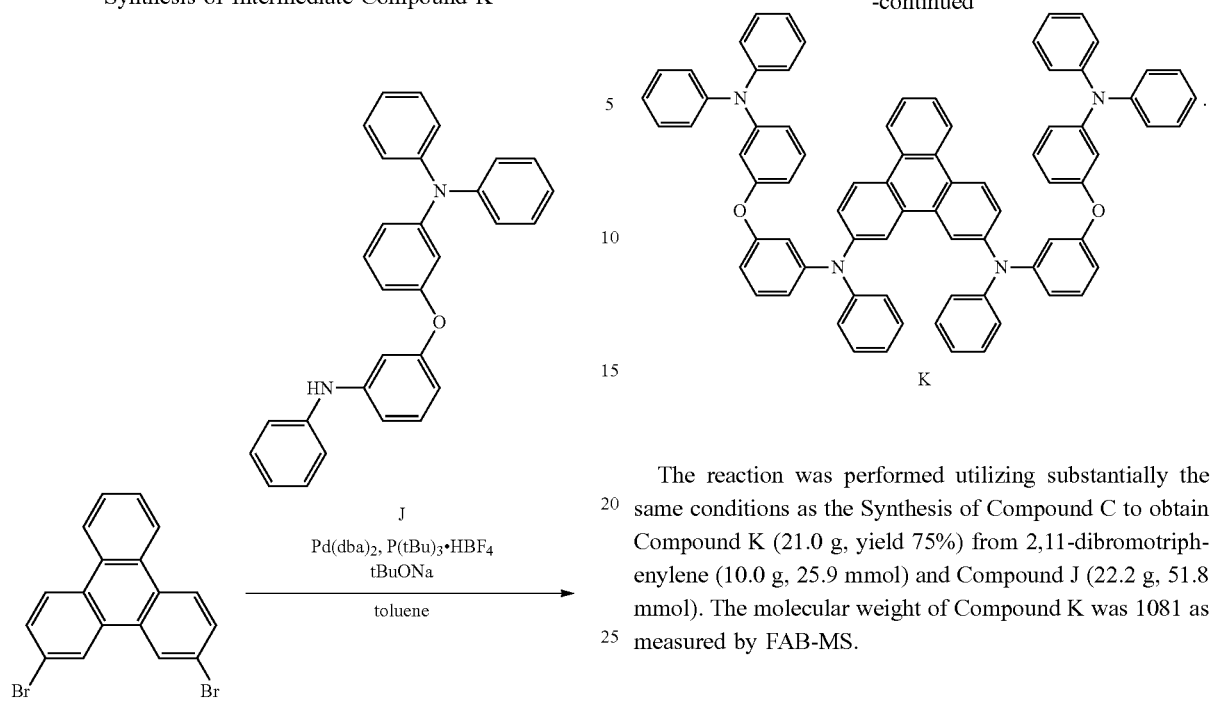
The reaction was performed utilizing substantially the same conditions as the Synthesis of Compound C to obtain Compound K (21.0 g, yield 75%) from 2,11-dibromotriphenylene (10.0 g, 25.9 mmol) and Compound J (22.2 g, 51.8 mmol). The molecular weight of Compound K was 1081 as measured by FAB-MS.
Synthesis of Compound 58
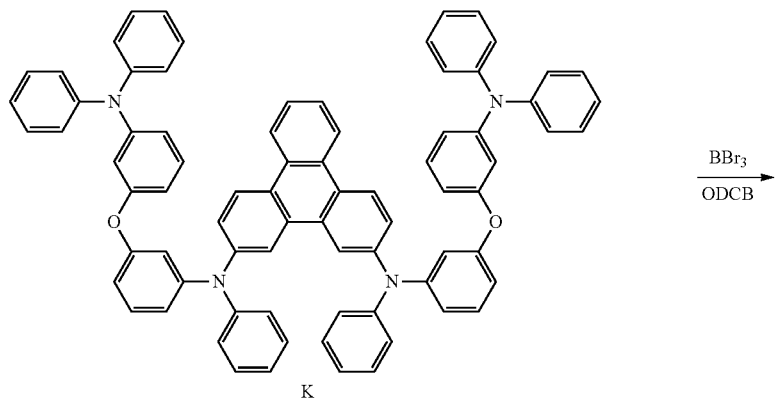
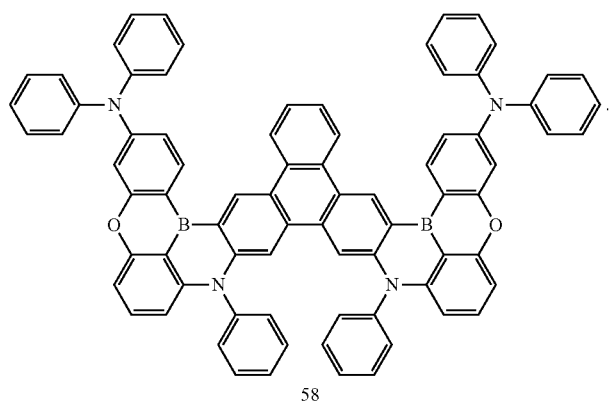

The reaction was performed utilizing substantially the same conditions as the Synthesis of Compound 53 to obtain Compound 58 (3.0 g, yield 14%) from Compound K (21.0 g, 19.4 mmol). The molecular weight of Compound 58 was 1097 as measured by FAB MS. The obtained Compound 58 was subjected to sublimation purification (415° C., 8.7×10$^{-3}$ Pa) for evaluation.

(6) Synthesis of Compound 59

Synthesis of Intermediate Compound L

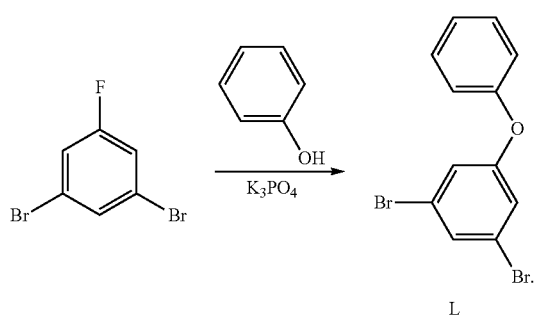

The reaction was performed utilizing substantially the same conditions as the Synthesis of Compound I to obtain Compound L (14.0 g, yield 72%) from 1,3-dibromo-5-fluorobenzene (15.0 g, 59.1 mmol) and phenol (8.34 g, 88.6 mmol). The molecular weight of Compound L was 328 as measured by FAB-MS.

Synthesis of Intermediate Compound M

Compound L (13.9 g, 42.6 mmol), diphenylamine (6.0 g, 35.5 mmol), Pd$_2$(dba)$_3$ (0.81 g, 0.89 mmol), XantPhos (0.86 mmol), and tBuONa (4.1 g, 42.6 mmol) were added to 79 mL of toluene and stirred at 80° C. for 5 hours and/or at 100° C. for 3 hours. The mixture was allowed to cool, filtered through Celite, and separated by adding toluene and water to obtain an organic layer. The organic layer was concentrated, purified by column chromatography (silica gel), concentrated, and washed with extra hexane to obtain Compound M (12.0 g, yield 81%). The molecular weight of Compound M was 416 as measured by FAB-MS.

Synthesis of Intermediate Compound N

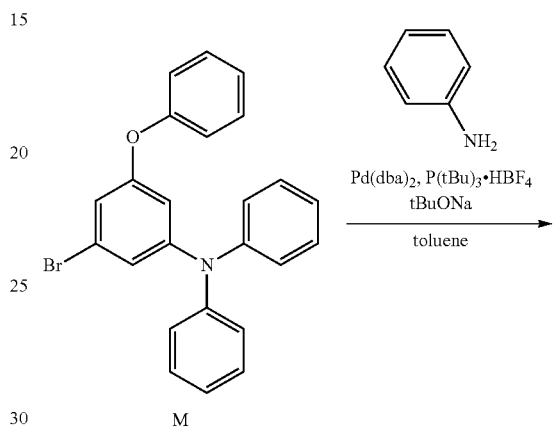

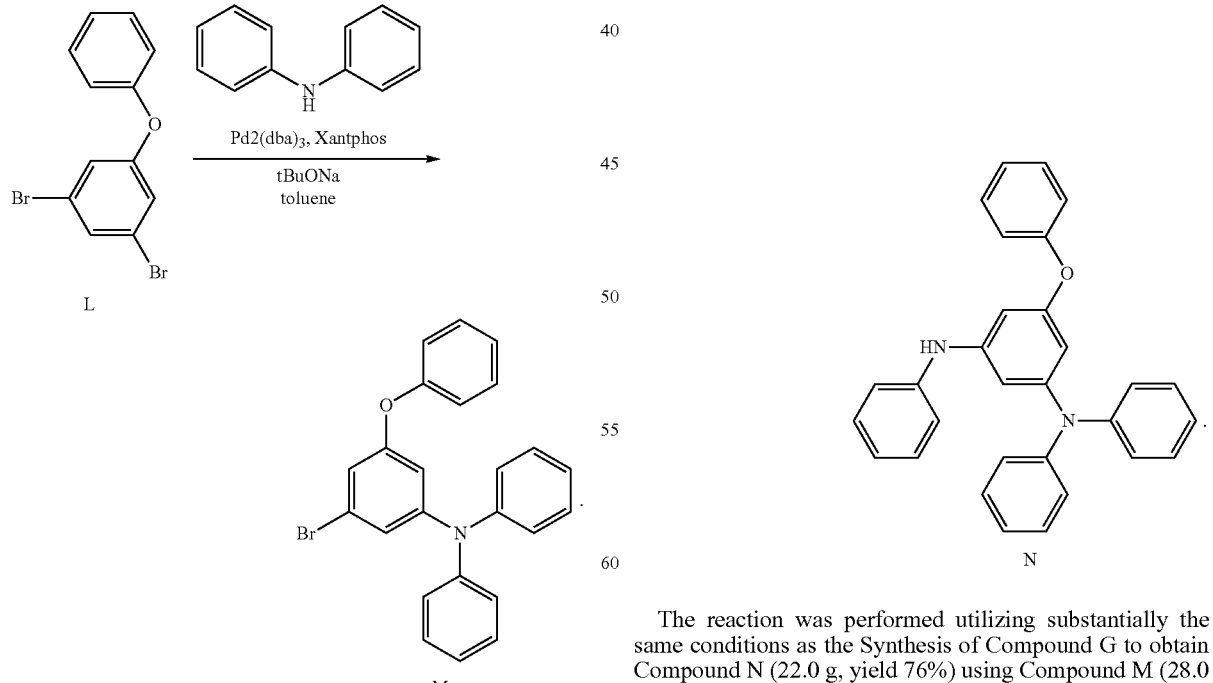

The reaction was performed utilizing substantially the same conditions as the Synthesis of Compound G to obtain Compound N (22.0 g, yield 76%) using Compound M (28.0 g, 67.3 mmol) and aniline (6.26 g, 67.3 mmol). The molecular weight of Compound N was 429 as measured by FAB-MS.

Synthesis of Intermediate Compound 0
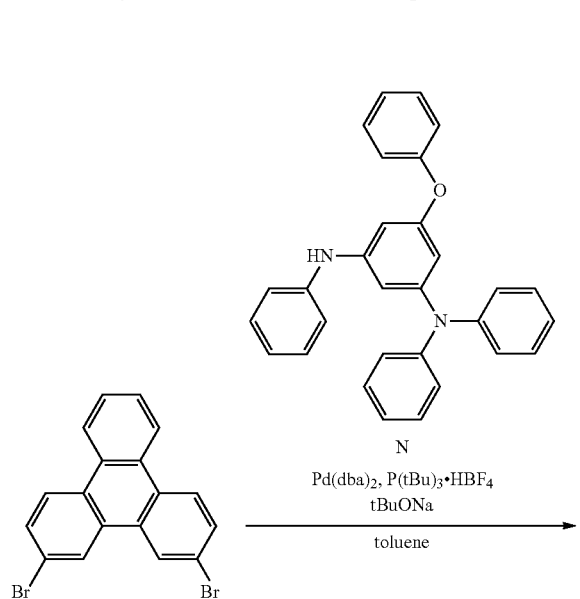
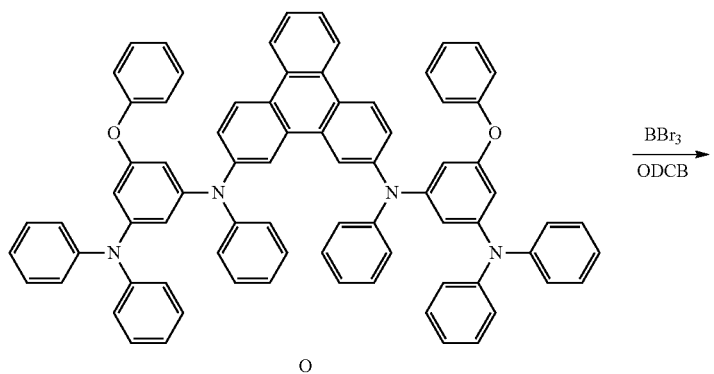
The reaction was performed utilizing substantially the same conditions as the Synthesis of Compound C to obtain Compound 0 (20.0 g, yield 71%) from 2,11-dibromotriphenylene (10.0 g, 25.9 mmol) and Compound N (22.2 g, 51.8 mmol). The molecular weight of Compound 0 was 1081 as measured by FAB-MS.
Synthesis of Compound 59
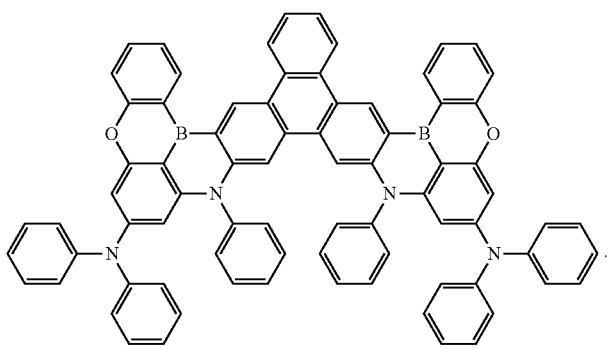

The reaction was performed utilizing substantially the same conditions as the Synthesis of Compound 53 to obtain Compound 59 (1.2 g, yield 6%) from Compound 0 (19.0 g, 17.6 mmol). The molecular weight of Compound 59 was 1097 as measured by FAB MS. The obtained Compound 59 was subjected to sublimation purification (405° C., 8.2×10$^{-3}$ Pa) for evaluation.

(7) Synthesis of Compound 76

Synthesis of Intermediate Compound P

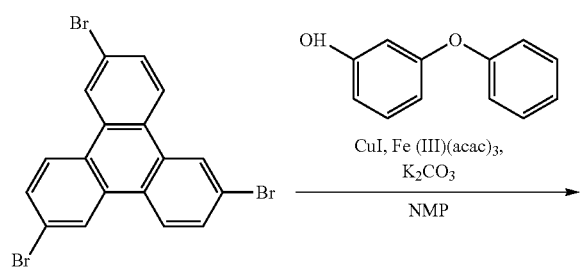

102

Synthesis of Compound 76

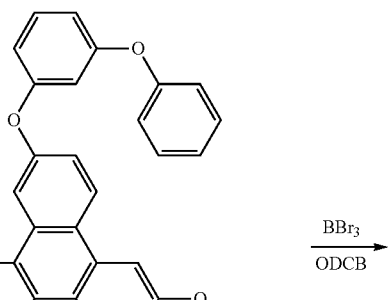

P

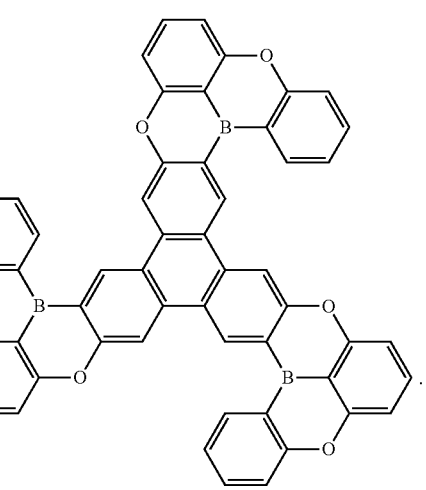

76

The reaction was performed utilizing substantially the same conditions as the Synthesis of Compound A to obtain Compound P (12.6 g, yield 75%) from 2,6,10-tribromotriphenylene (10.0 g, 21.5 mmol) and 3-phenoxyphenol (13.2 g, 71.0 mmol). The molecular weight of Compound P was 781 as measured by FAB-MS.

The reaction was performed utilizing substantially the same conditions as the Synthesis of Compound 9 except that the obtained Intermediate Compound P (23.0 g, 29.5 mmol) was used. As a result, Compound 76 (5.50 g, yield 23%) was obtained. The molecular weight of Compound 76 was 804 as measured by FAB-MS. The obtained compound was subjected to sublimation purification (320° C., 8.3×10$^{-3}$ Pa) for evaluation.

(8) Synthesis of Compound 81

Synthesis of Intermediate Compound Q

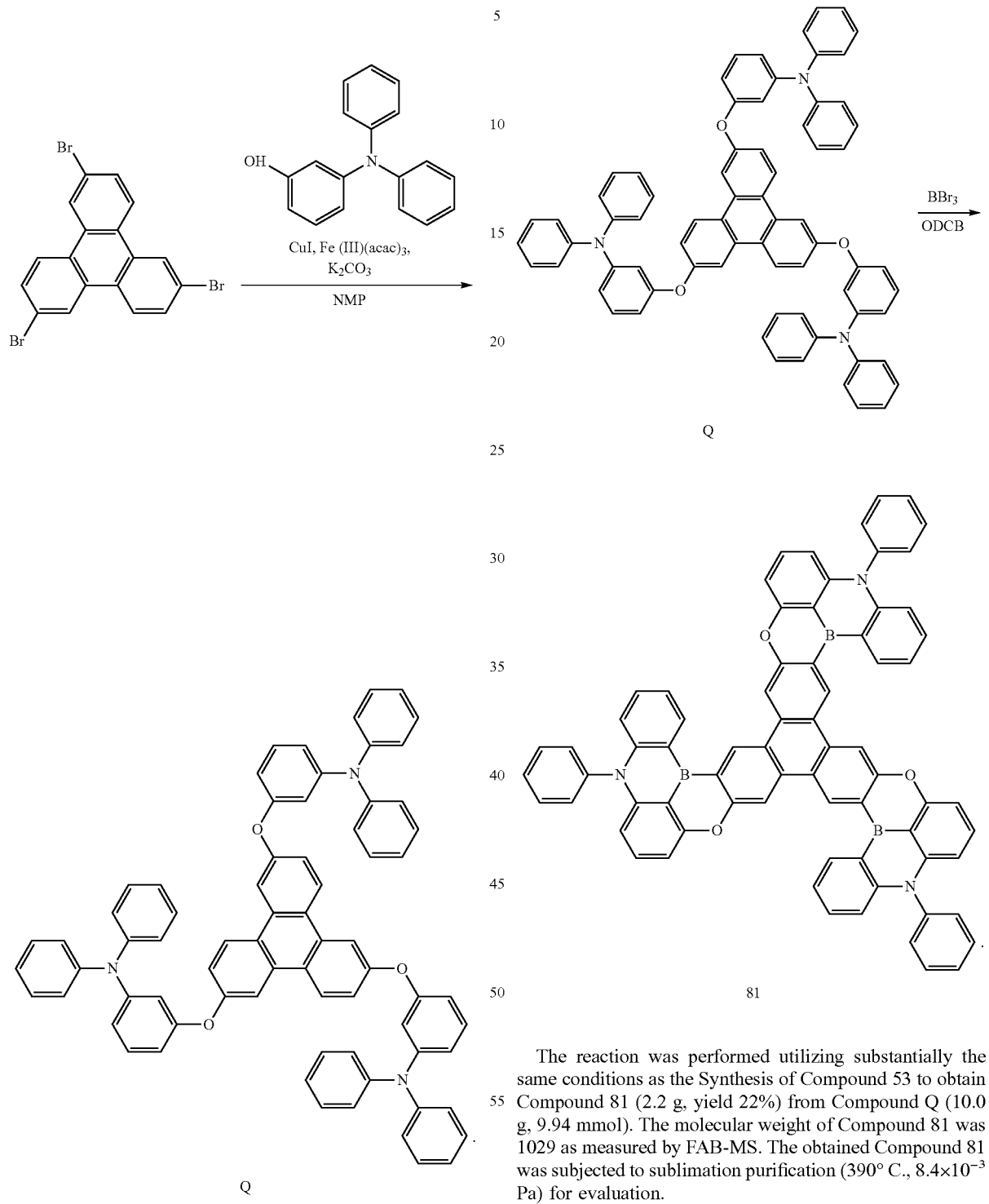

The reaction was performed utilizing substantially the same conditions as the Synthesis of Compound A to obtain Compound Q (12.1 g, yield 70%) from 2,6,10-tribromotriphenylene (8.0 g, 17.2 mmol) and 3-(diphenylamino)phenol (14.8 mmol). The molecular weight of Compound Q was 1006 as measured by FAB-MS.

Synthesis of Compound 81

The reaction was performed utilizing substantially the same conditions as the Synthesis of Compound 53 to obtain Compound 81 (2.2 g, yield 22%) from Compound Q (10.0 g, 9.94 mmol). The molecular weight of Compound 81 was 1029 as measured by FAB-MS. The obtained Compound 81 was subjected to sublimation purification (390° C., $8.4 \times 10^{-3}$ Pa) for evaluation.

2. Manufacture and Evaluation of Organic Electroluminescence Device Including Fused Polycyclic Compound Manufacture of Organic Electroluminescence Device Compounds 9, 25, 27, 53, 58, 59, 76, and 81 were used as emission layer dopant materials in the manufacture of the organic electroluminescence devices of Examples 1 to 8, respectively.

Example Compounds
9
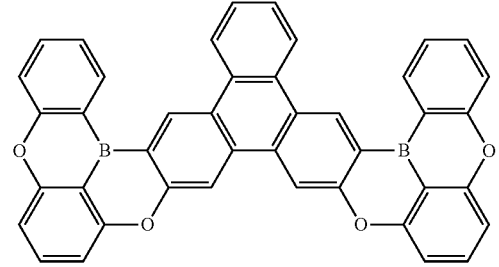
27
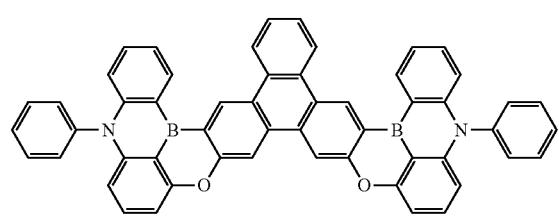
53
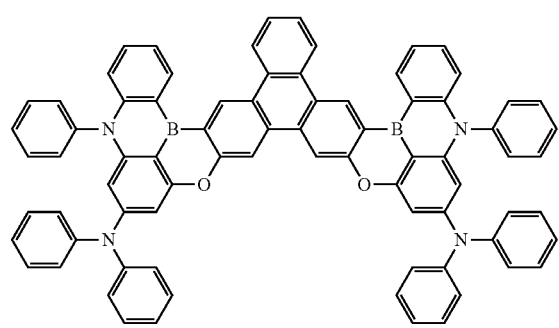
59
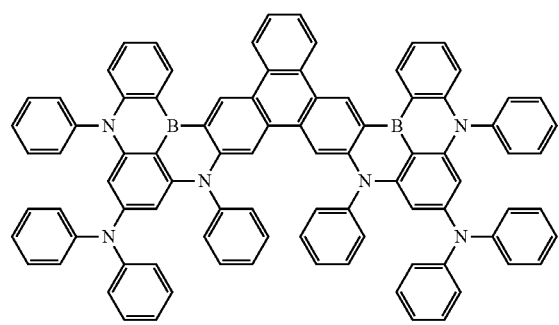
59
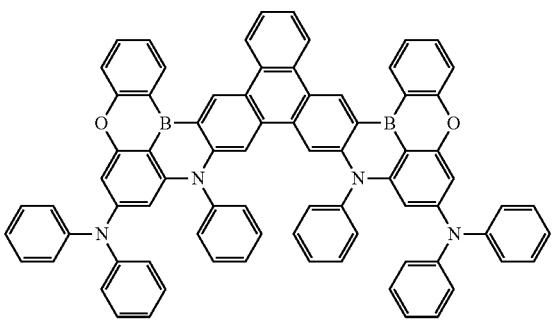
76
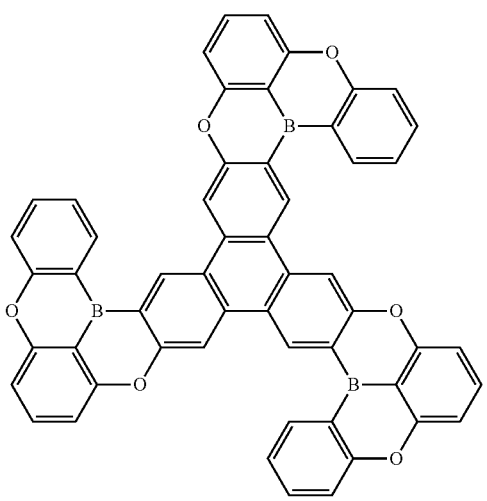
81
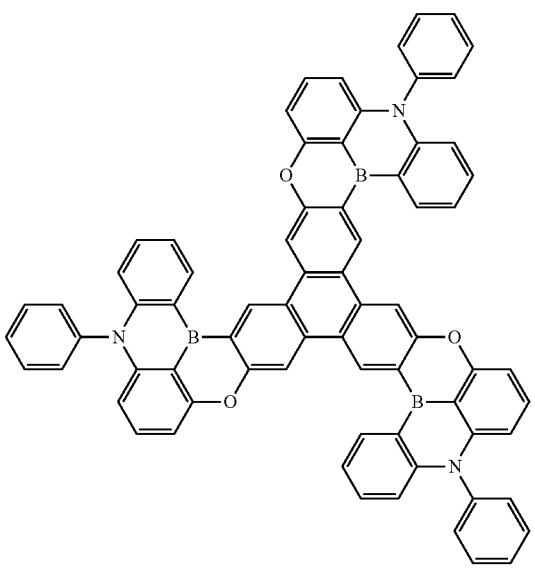
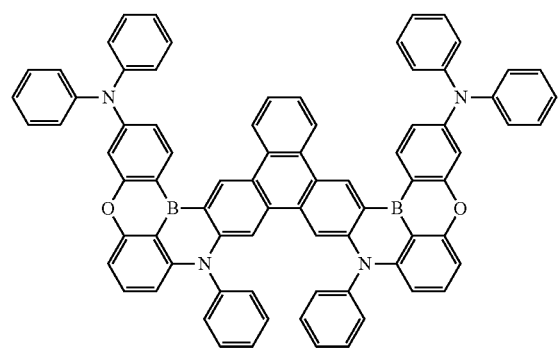

Comparative Example Compounds X-1 to X-5 were used to manufacture the devices of the Comparative Examples:

Comparative Example Compounds

X-1
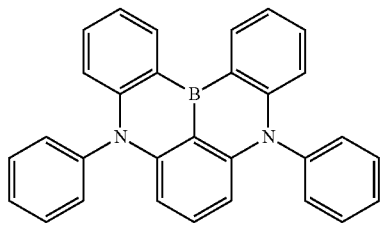

X-2
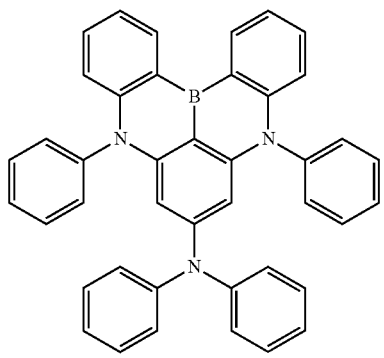

X-3
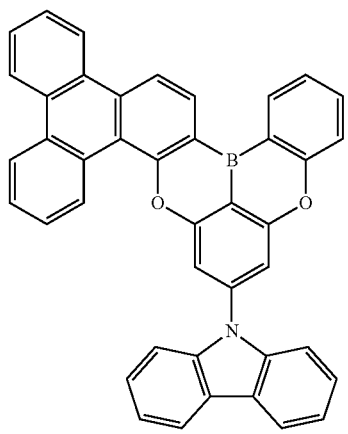

-continued

X-4
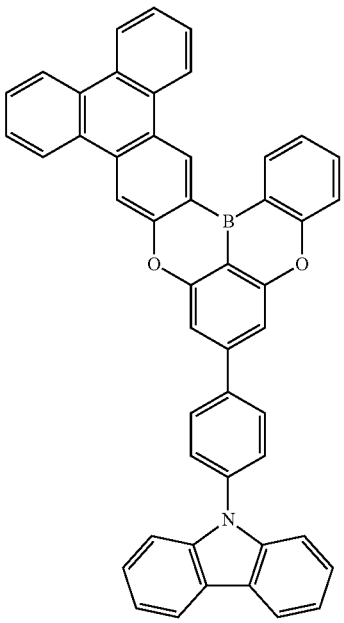

X-5
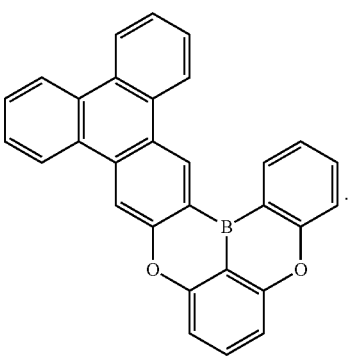

The organic electroluminescence device \ including the fused polycyclic compound of an embodiment in the emission layer was manufactured as follows. Examples 1 to 8 correspond to the organic electroluminescence devices manufactured using respective Compounds 9, 25, 27, 53, 58, 59, 76, and 81 as luminescent materials. Comparative Examples 1 to 5 correspond to the organic electroluminescence devices manufactured using respective Comparative Example Compounds X-1 to X-5 as luminescent materials.

A 150 nm-thick first electrode was formed with ITO, a 10 nm-thick hole injection layer was formed of 1,4,5,8,9,11-hexaazatriphenylene hexacarbonitrile (HAT-CN), a 80 nm-thick first hole transport layer was formed of N,N'-di(1-naphthyl)-N,N'-diphenyl-(1,1'-biphenyl)-4,4'-diamine (α-NPD), a 5 nm-thick second hole transport layer was formed of 1,3-bis(N-carbazolyl)benzene (mCP), a 20 nm-thick emission layer was formed by doping 1% of the respective Example Compound or Comparative Example Compound in 3,3'-bis(N-carbazolyl)-1,1'-biphenyl (mCBP), a 30 nm-thick electron transport layer was formed of 1,3,5-tris(N-phenylbenzimidazole-2-yl)benzene (TPBi), a 0.5 nm-thick electron injection layer was formed of LiF, and a 100 nm-thick second electrode was formed of Al. A 70 nm-thick capping layer was formed of N4,N4'-diphenyl-N4,N4'-bis(9-phenyl-9H-carbazol-3-yl)-[1,1'-biphenyl]-4,4'-diamine (CPL1) on the second electrode. Each layer was formed utilizing a deposition method in a vacuum atmosphere.

The compounds used for manufacturing the organic electroluminescence devices of the Examples and Comparative Examples are disclosed.

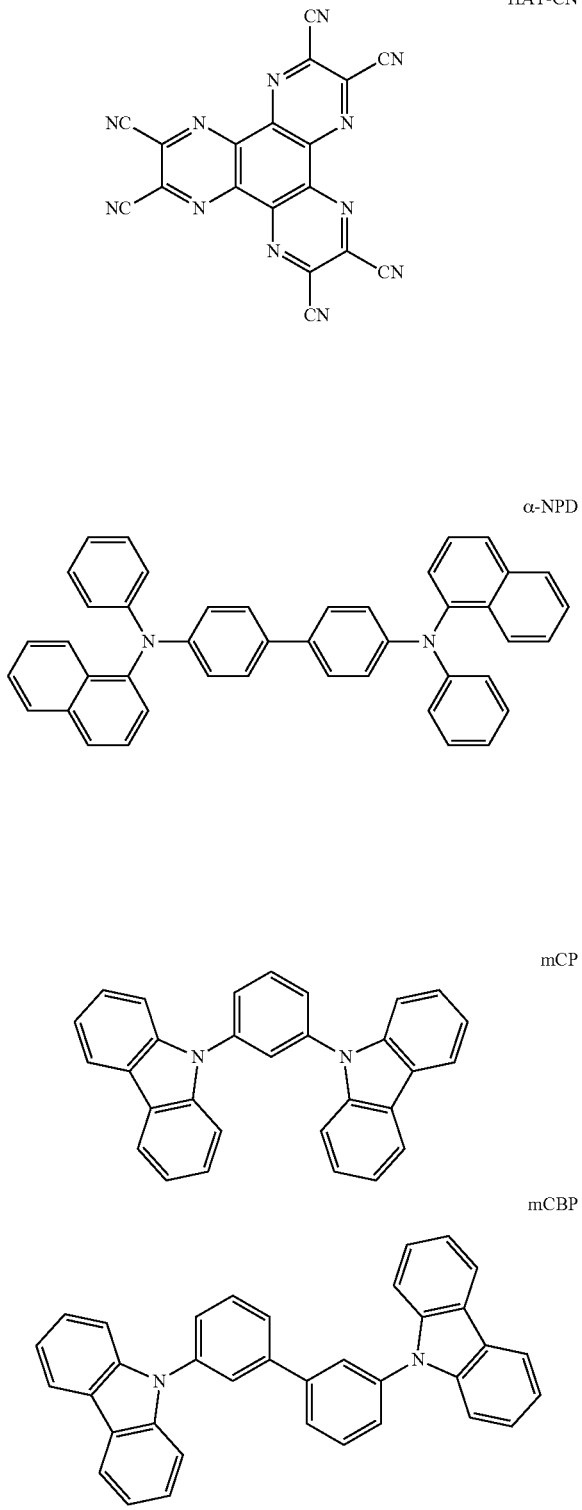

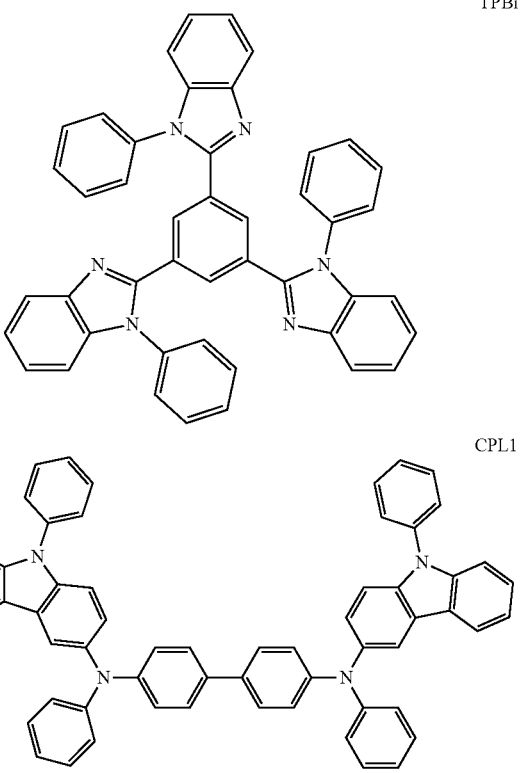

Experimental Examples

The efficiencies of the organic electroluminescence devices manufactured with Experimental Example Compounds 9, 25, 27, 53, 58, 59, 76, and 81 and Comparative Example Compounds X-1 to X-5 were evaluated. The evaluation results are shown in Table 1. The maximum emission wavelength in the emission spectrum is expressed in $\lambda_{max}$, the maximum value of the external quantum efficiency is expressed in $EQE_{max}$, and the value of the external quantum efficiency is expressed at 1000 cd/m² in $EQE_{1000\ nit}$.

TABLE 1

| Device manufactured examples | Dopant compound | $\lambda_{max}$ (nm) | $EQE_{max}$ (%) | $EQE_{1000nit}$ (%) |
|---|---|---|---|---|
| Example 1 | Compound 9 | 442 | 15.6 | 7.2 |
| Example 2 | Compound 25 | 462 | 15.7 | 7.8 |
| Example 3 | Compound 27 | 450 | 14.8 | 8.3 |
| Example 4 | Compound 53 | 460 | 16.8 | 12.3 |
| Example 5 | Compound 58 | 459 | 146 | 10.2 |
| Example 6 | Compound 59 | 455 | 15.6 | 12.2 |
| Example 7 | Compound 76 | 458 | 14.9 | 10.5 |
| Example 8 | Compound 81 | 457 | 14.6 | 11.2 |
| Comparative Example 1 | Comparative Example Compound X-1 | 459 | 13.2 | 5.4 |
| Comparative Example 2 | Comparative Example Compound X-2 | 467 | 14.2 | 6.4 |
| Comparative Example 3 | Comparative Example Compound X-3 | 440 | 5.8 | 2.1 |

TABLE 1-continued

| Device manufactured examples | Dopant compound | $\lambda_{max}$ (nm) | $EQE_{max}$ (%) | $EQE_{1000nit}$ (%) |
|---|---|---|---|---|
| Comparative Example 4 | Comparative Example Compound X-4 | 435 | 5.4 | 1.8 |
| Comparative Example 5 | Comparative Example Compound X-5 | 430 | 5.0 | 1.1 |

Referring to the results of Table 1, it can be seen that the Examples of the organic luminescence device using the fused polycyclic compound according to an embodiment of the present disclosure as a luminescent material each exhibited improved luminous efficiency while maintaining an emission wavelength of blue light, compared to the Comparative Examples.

The Example Compounds have a structure in which two or more four-ring fused polycyclic heterocycles, each containing a boron atom and a hetero atom as a bidentate linker, are fused with a central triphenylene core having a high T1 level, and thereby has a half-width and wavelength range suitable for a blue luminescent material and an expanded conjugated system, and thus the stability of the compound molecule may be increased. Accordingly, the organic electroluminescence devices of the Examples may exhibit improved luminous efficiency compared to the organic electroluminescence devices of Comparative Examples. the organic electroluminescence devices of the Examples include the fused polycyclic compound thermally activated delayed fluorescence (TADF) dopant, and thus may achieve high device efficiency in a blue wavelength region, for example, a deep blue wavelength region.

Comparative Example Compound X-1 (included in Comparative Example 1) and Comparative Example Compound X-2 (included in Comparative Example 2) each do not have a triphenylene moiety, and the stability of these compounds are decreased compared to the Example Compounds. Therefore, the devices of Comparative Examples 1 and 2 exhibit decreased device efficiency compared to the Examples.

Comparative Example Compounds X-3 to X-5 included in Comparative Examples 3 to 5 each have a triphenylene moiety, but have a structure in which only one four-ring fused polycyclic heterocycle containing a boron atom and a hetero atom is fused to the triphenylene core. The polycyclic compound structures of Comparative Example Compounds X-3 to X-5, which contain one boron atom, each have a too-short wavelength of about 440 nm or less, and the stabilities of these compounds are decreased compared to the Example Compounds, and thus the devices of Comparative Examples 3 to 5 each have decreased device efficiency compared to the Examples.

The organic electroluminescence device of an embodiment may exhibit improved device characteristics of high efficiency.

The fused polycyclic compounds of an embodiment may be included in the emission layer of the organic electroluminescence device to contribute to high efficiency of the organic electroluminescence device.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the present disclosure has been described with reference to example embodiments of the present disclosure, it will be understood that the present disclosure is not limited to these embodiments, but various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and equivalents thereof.

What is claimed is:

1. An organic electroluminescence device comprising:
   a first electrode;
   a second electrode facing the first electrode; and
   a plurality of organic layers between the first electrode and the second electrode,
   wherein the first electrode and the second electrode each independently comprise any one selected from Ag, Mg, Cu, Al, Pt, Pd, Au, Ni, Nd, Ir, Cr, Li, Ca, LiF/Ca, LiF/Al, Mo, Ti, In, Zn, Sn, and Yb, a compound of two or more thereof, a mixture of two or more thereof, or at least one oxide thereof, and
   at least one organic layer among the plurality of organic layers comprises a fused polycyclic compound represented by any one selected from among Formula 3-1 to Formula 3-5:

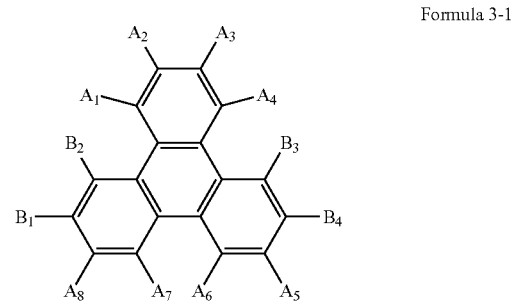

Formula 3-1

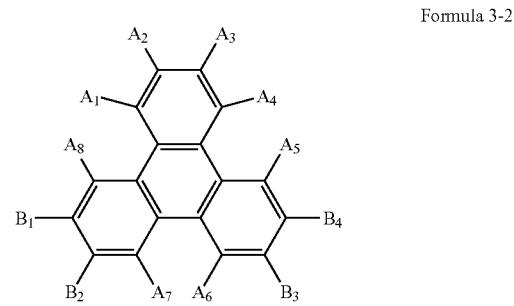

Formula 3-2

-continued

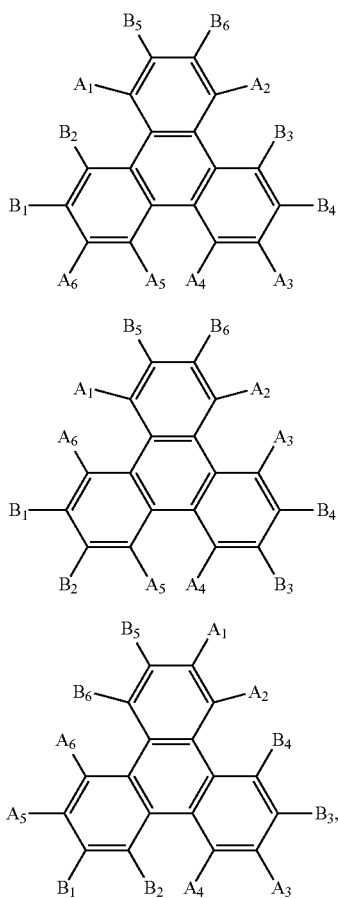

Formula 3-3

Formula 3-4

Formula 3-5 wherein, in Formula 3-1 to Formula 3-5, $A_1$ to $A_8$ are each independently a hydrogen atom, a deuterium atom, a halogen atom, a substituted or unsubstituted oxy group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring; and $B_1$ and $B_2$, $B_3$ and $B_4$, and $B_5$ and $B_6$ are each fused to a substituent represented by Formula 2:

Formula 2

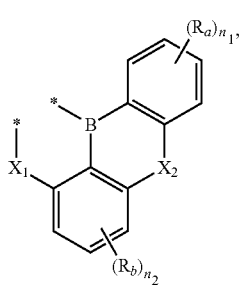

wherein, in Formula 2,

—* is a position of fusion to one of the two or more pairs selected from among $B_1$ and $B_2$, $B_3$ and $B_4$, and $B_5$ and $B_6$;

$X_1$ and $X_2$ are each independently $NAr_1$, O, or S;

$Ar_1$ is a substituted or unsubstituted aryl group having 6 to 30 ring-forming carbon atoms, or a substituted or unsubstituted heteroaryl group having 2 to 30 ring-forming carbon atoms, and/or is bonded to an adjacent group to form a ring;

$R_a$ and $R_b$ are each independently a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring;

$n_1$ is an integer of 0 to 4; and $n_2$ is an integer of 0 to 3.

2. The organic electroluminescence device of claim 1, wherein the plurality of organic layers comprises:

a hole transport region on the first electrode;

an emission layer on the hole transport region;

an electron transport region on the emission layer; and wherein the emission layer comprises the fused polycyclic compound.

3. The organic electroluminescence device of claim 2, wherein the emission layer is to emit delayed fluorescence.

4. The organic electroluminescence device of claim 2, wherein the emission layer is a delayed fluorescence emission layer comprising a host and a dopant, and the dopant comprises the fused polycyclic compound represented by one selected from among Formula 3-1 to Formula 3-5.

5. The organic electroluminescence device of claim 1, wherein two or three substituents represented by Formula 2 are fused to the fused polycyclic compound represented by one selected from among Formula 3-1 to Formula 3-5, and the two or three fused substituents represented by Formula 2 are the same as each other.

6. The organic electroluminescence device of claim 1, wherein the substituent represented by Formula 2 is represented by any one selected from Formula 2-1 to Formula 2-8:

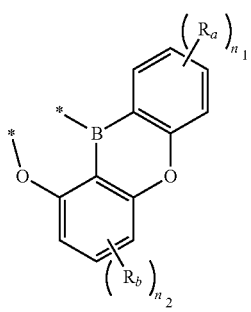

Formula 2-1

Formula 2-2

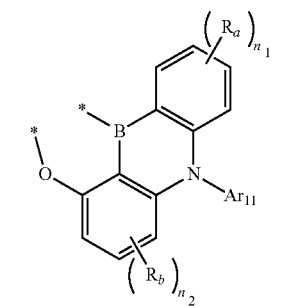

Formula 2-3

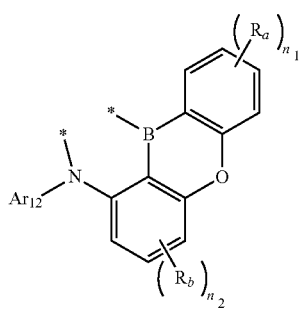

Formula 2-4

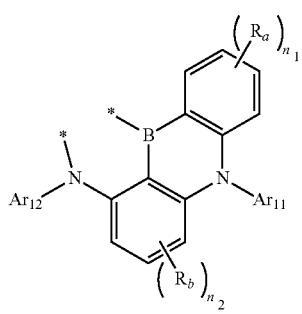

Formula 2-5

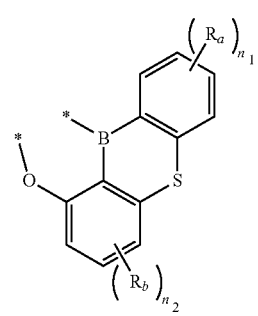

Formula 2-6

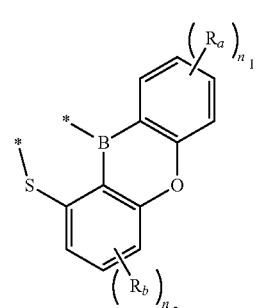

Formula 2-7

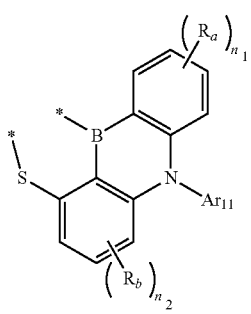

Formula 2-8

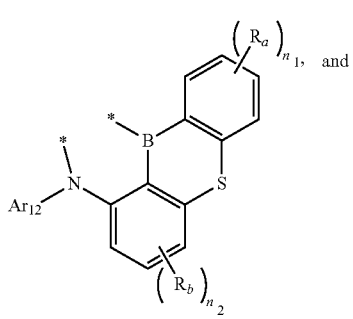

and wherein, in Formula 2-1 to Formula 2-8, $Ar_{11}$ and $Ar_{12}$ are each independently a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring and $R_a$ and $R_b$, and $n_1$ and $n_2$ are each independently the same as defined in Formula 2.

7. The organic electroluminescence device of claim 1, wherein the substituent represented by Formula 2 is represented by Formula 2-a:

Formula 2-a

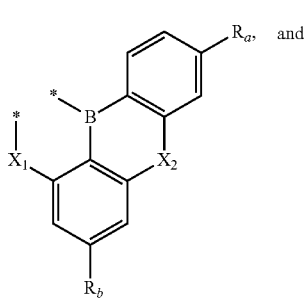

wherein, in Formula 2-a, $X_1$ and $X_2$, and $R_a$ and $R_b$ are each independently the same as defined in Formula 2.

8. The organic electroluminescence device of claim 1, wherein the fused polycyclic compound represented by one selected from among Formula 3-1 to Formula 3-5 is represented by any one selected from among Formula 4-1 to Formula 4-8:

Formula 4-1
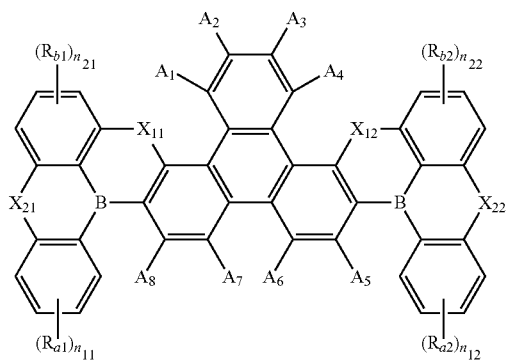
Formula 4-2
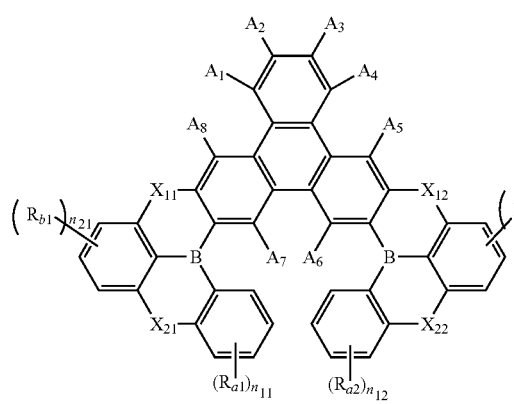
Formula 4-3
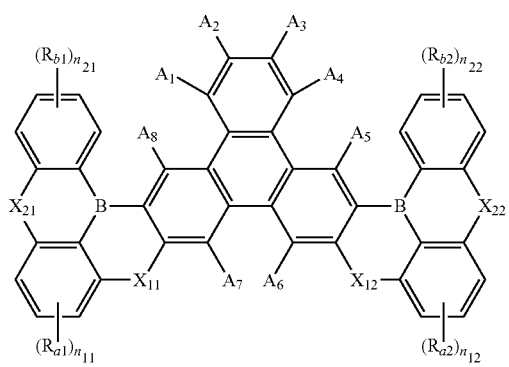
Formula 4-4
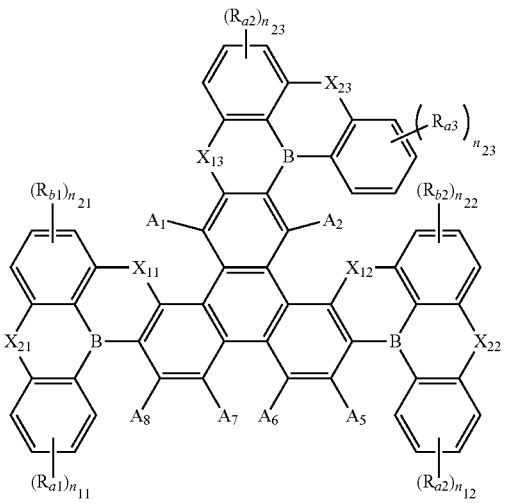
Formula 4-5
Formula 4-6
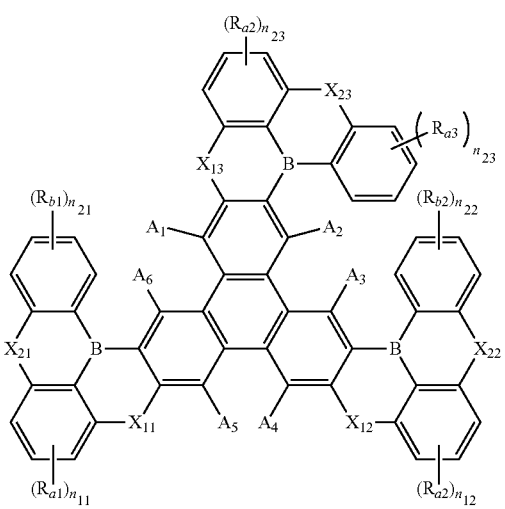

Formula 4-7

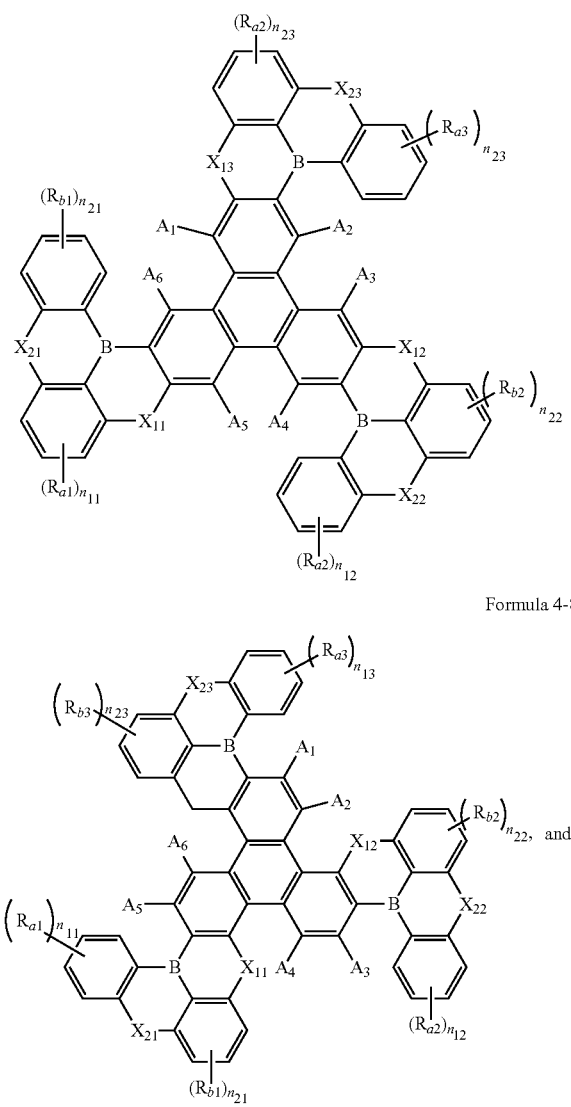

Formula 4-8 wherein, in Formula 4-1 to Formula 4-8, $X_{11}$, $X_{12}$, $X_{13}$, $X_{21}$, $X_{22}$, and $X_{23}$ are each independently $NAr_1$, O, or S;

$R_{a1}$, $R_{a2}$, $R_{a3}$, $R_{b1}$, $R_{b2}$, and $R_{b3}$ are each independently a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring;

$n_{11}$, $n_{12}$, and $n_{13}$ are each independently an integer of 0 to 4;

$n_{21}$, $n_{22}$, and $n_{23}$ are each independently an integer of 0 to 3; and $Ar_1$ and $A_1$ to $A_8$ are each independently the same as defined in Formula 2 and Formula 3-1 to Formula 3-5.

9. The organic electroluminescence device of claim 1, wherein $R_a$ and $R_b$ are each independently a hydrogen atom, a deuterium atom, a substituted or unsubstituted methyl group, a substituted or unsubstituted t-butyl group, a substituted or unsubstituted arylamine group, a substituted or unsubstituted phenyl group, or a substituted or unsubstituted carbazole group.

10. The organic electroluminescence device of claim 1, wherein $A_1$ to $A_8$ are each independently a hydrogen atom or a deuterium atom.

11. The organic electroluminescence device of claim 1, further comprising a capping layer on the second electrode and having a refractive index of about 1.6 or more.

12. The organic electroluminescence device of claim 1, wherein the fused polycyclic compound represented by one selected from among Formula 3-1 to Formula 3-5 is at least one selected from compounds represented by Compound Group 1:

Compound Group 1

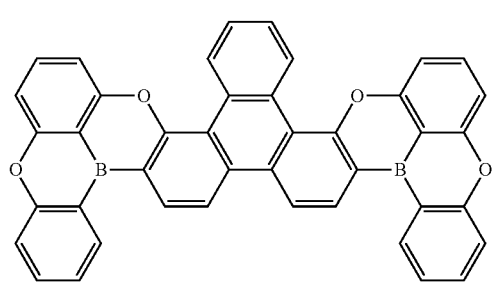

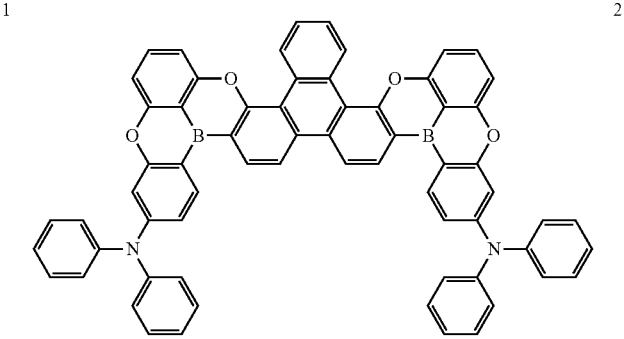

-continued
3
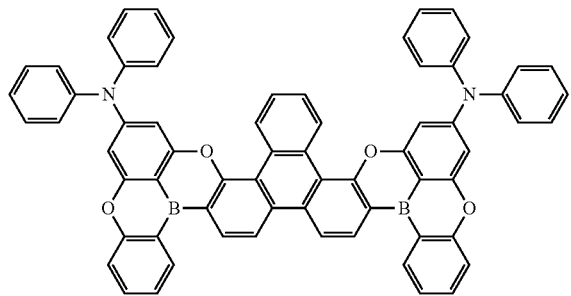
4
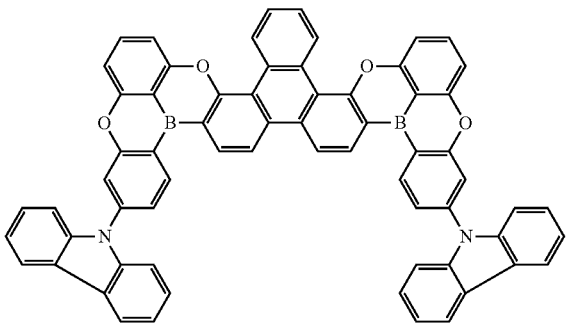
5
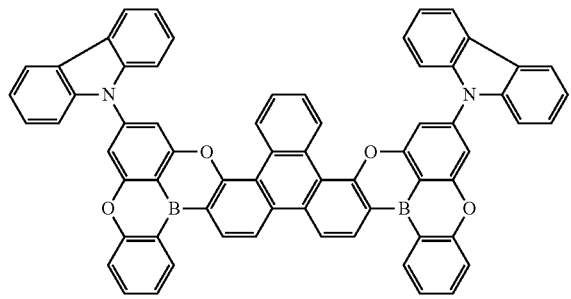
6
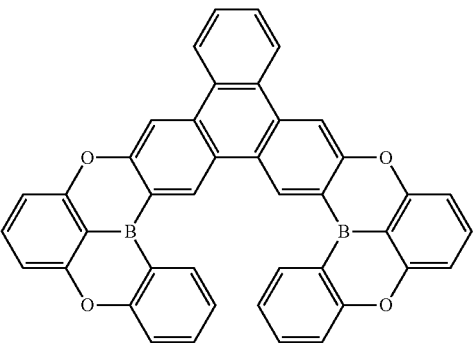
7
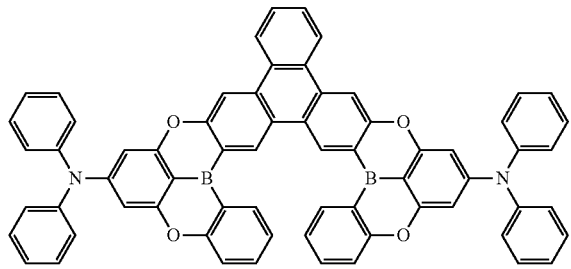
8
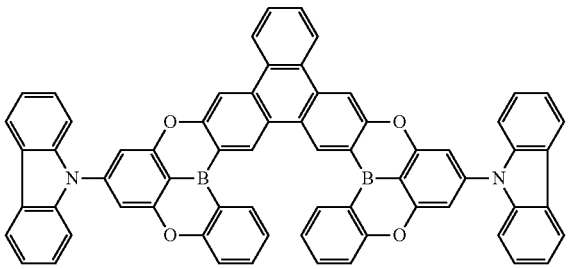
9
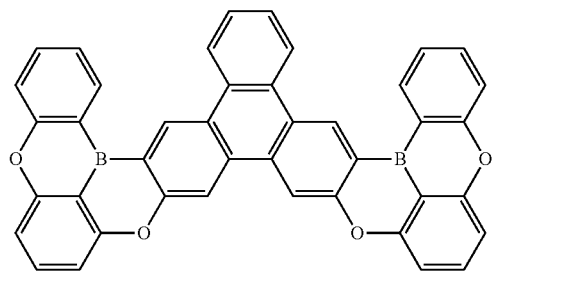
10
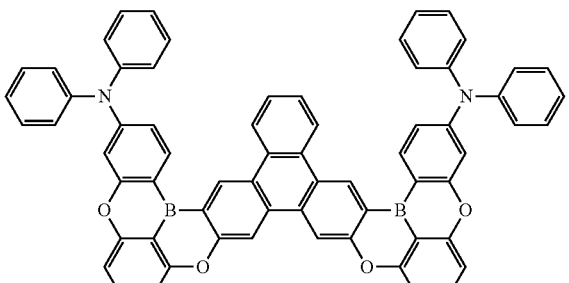
11
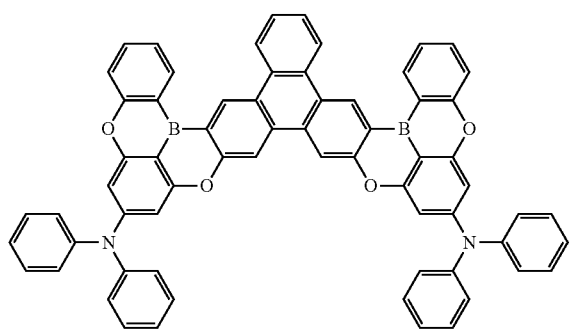
12
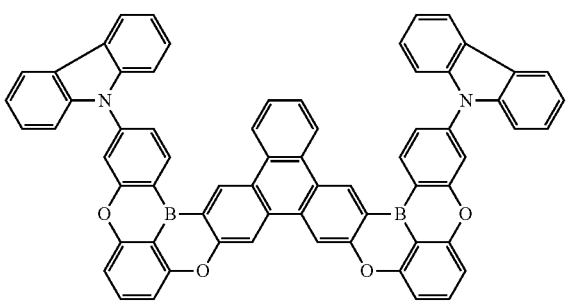

-continued
13
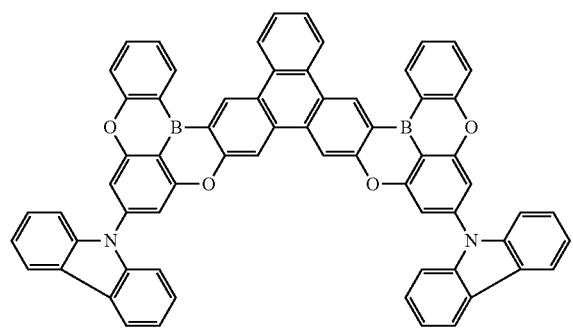
14
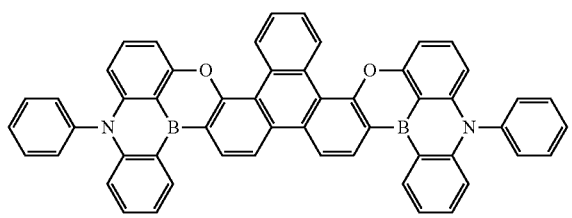
15
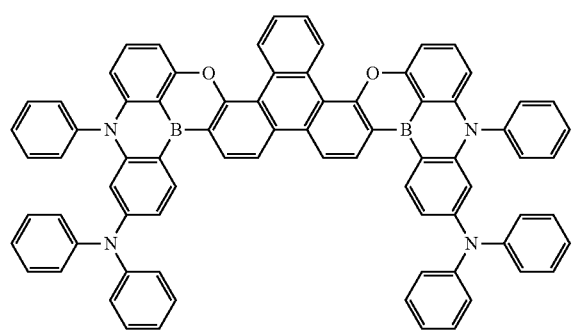
16
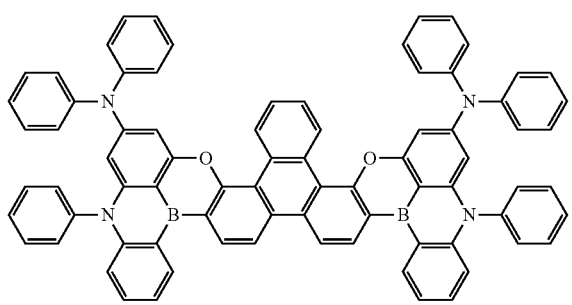
17
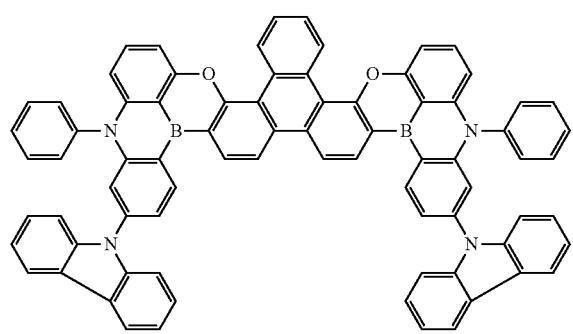
18
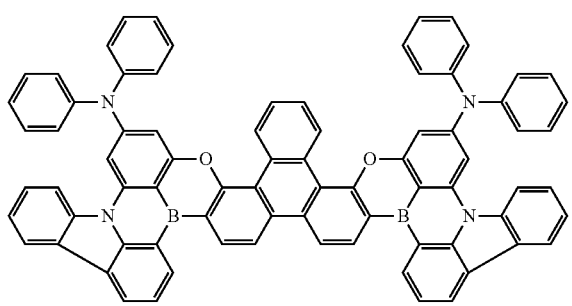
19
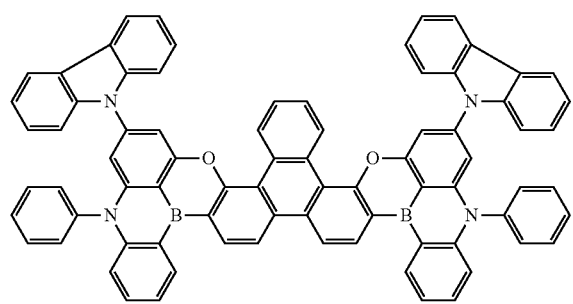
20
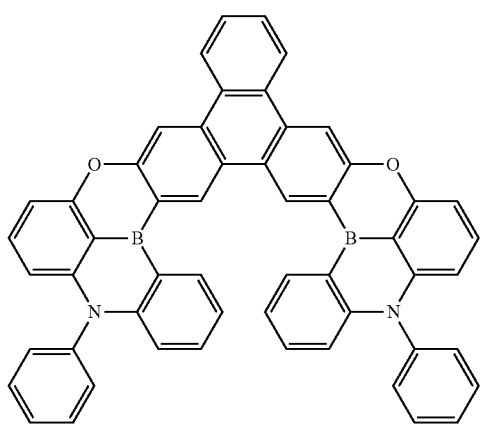

-continued
21
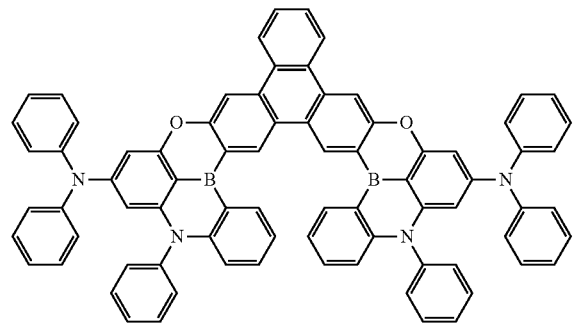
22
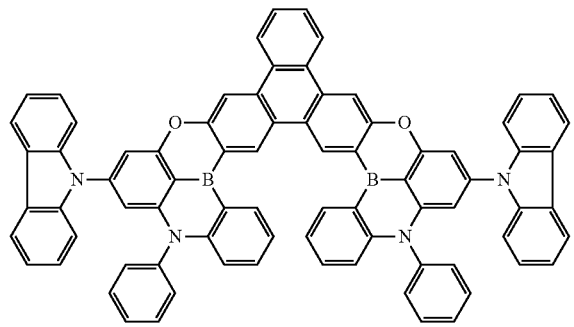
23
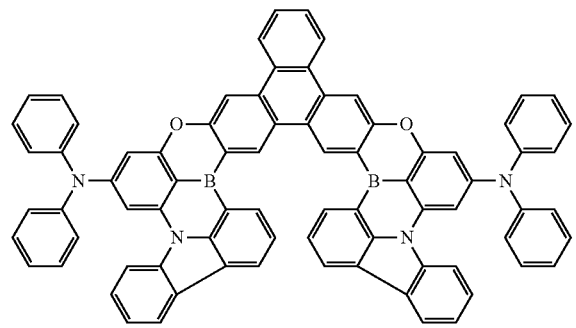
24
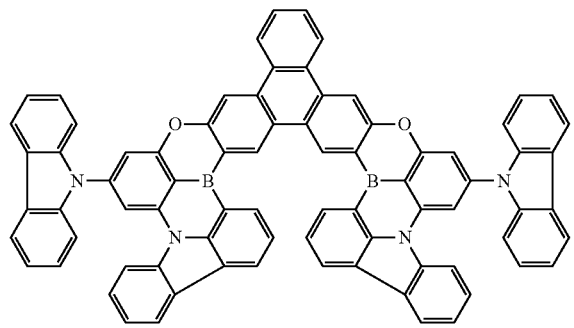
25
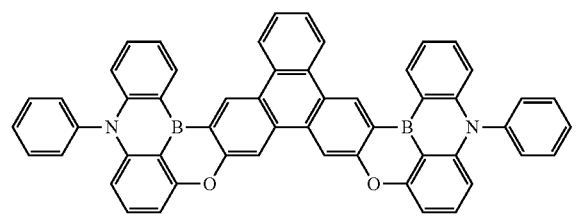
26
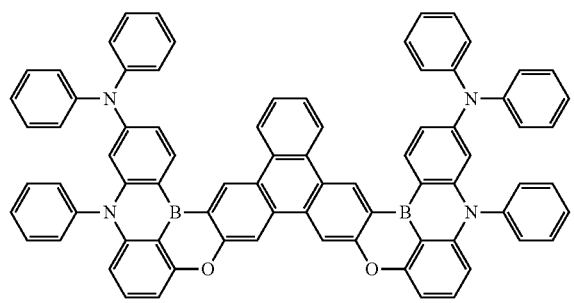
27
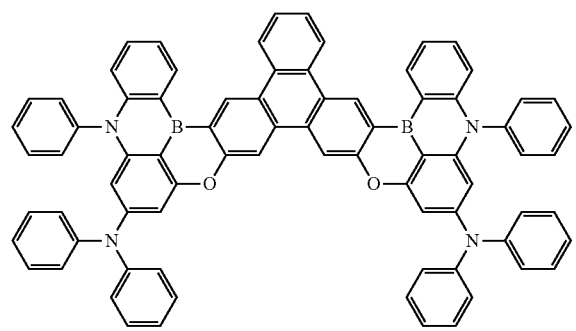
28
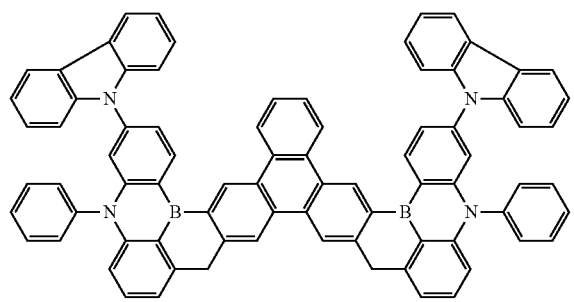

-continued
29
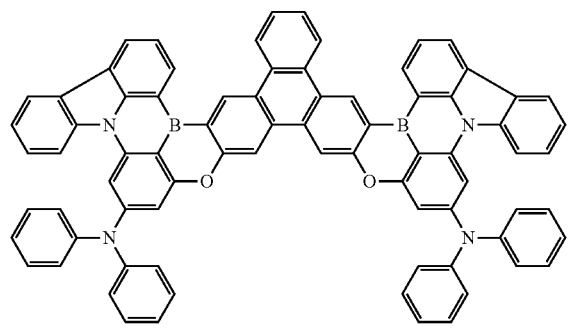
30
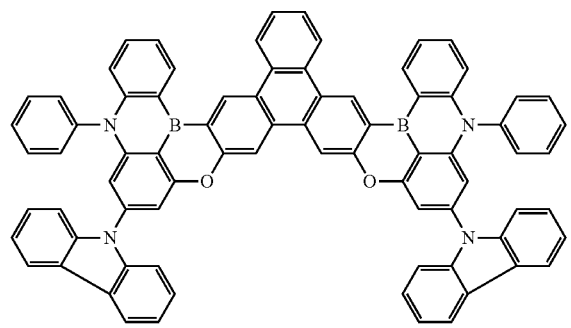
31
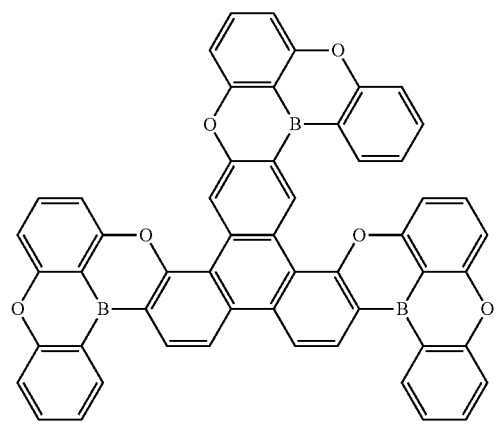
32
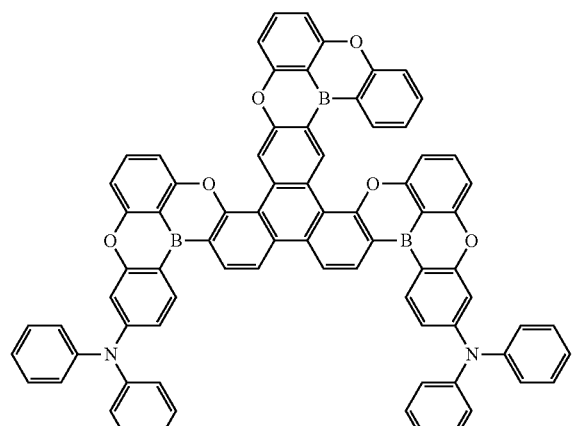
33
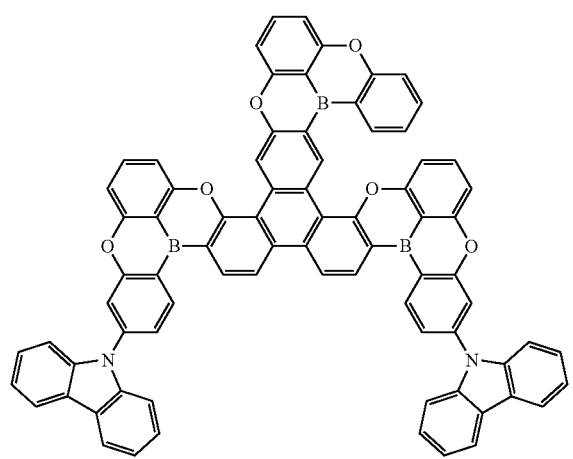
34
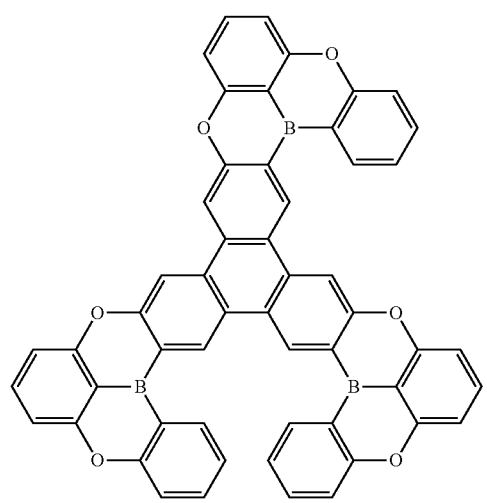

-continued
35
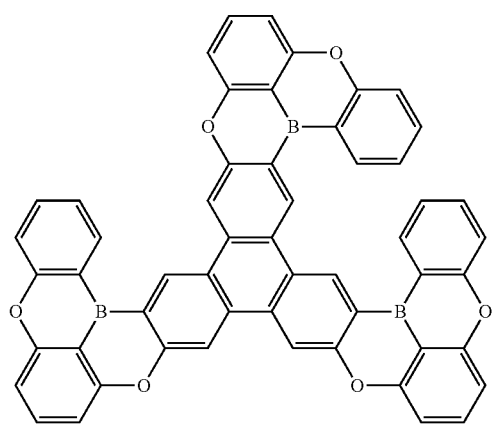
36
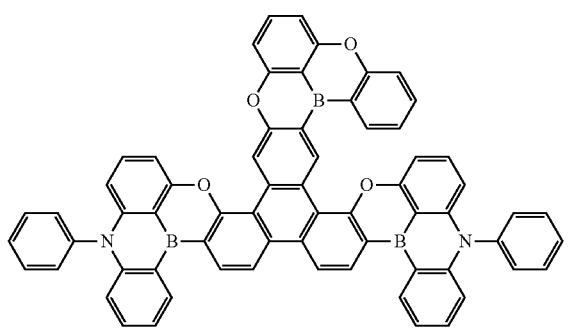
37
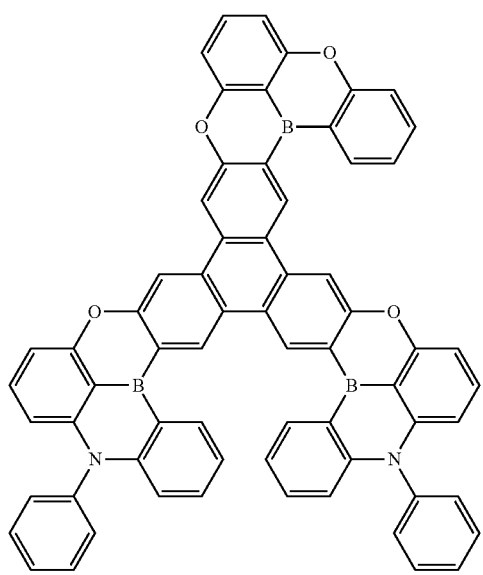
38
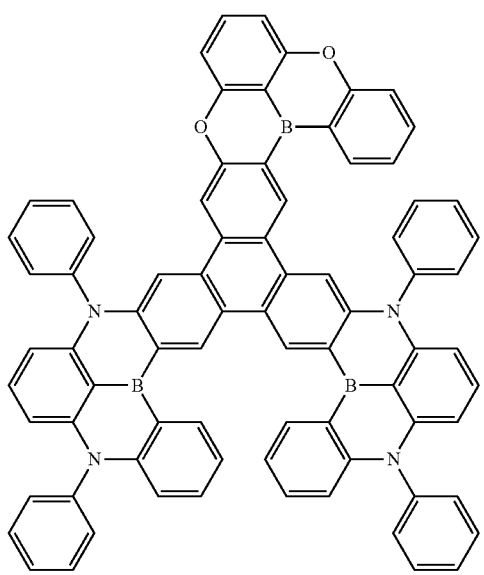
39
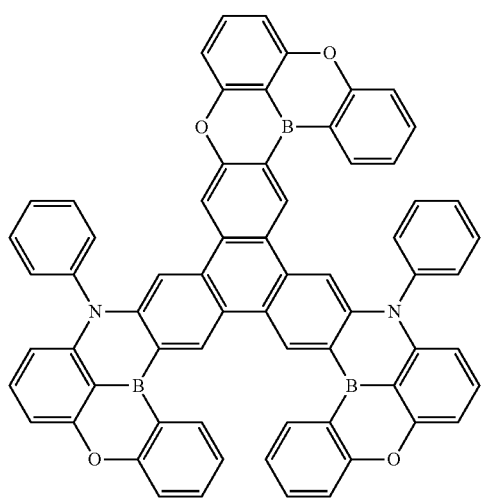
40
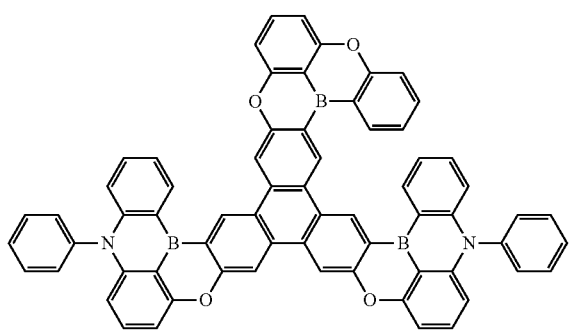

41
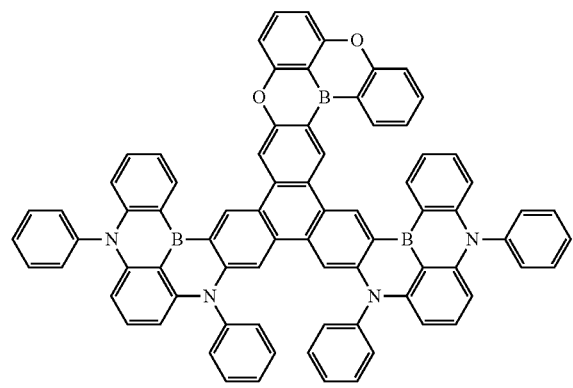
42
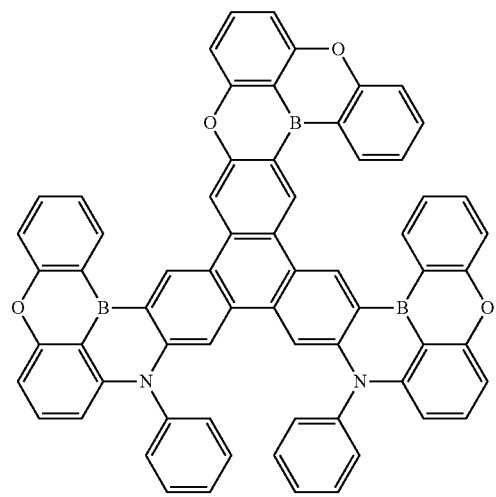
43
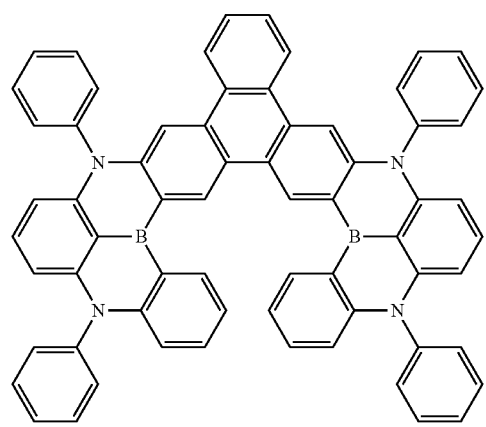
44
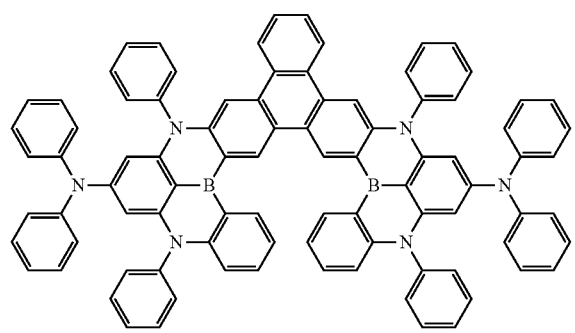
45
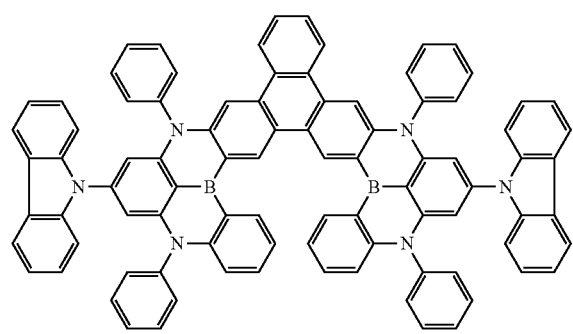
46
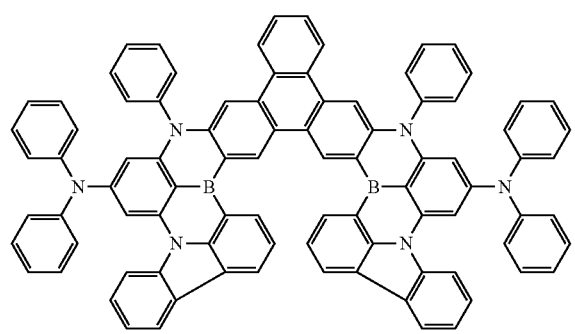

47
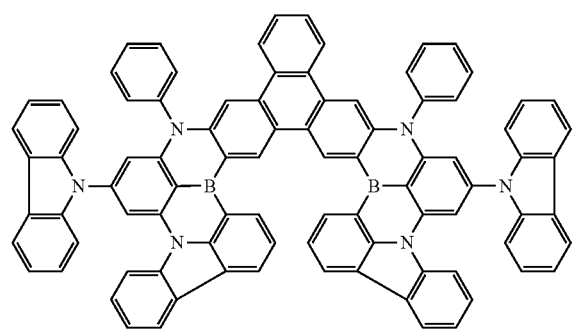
48
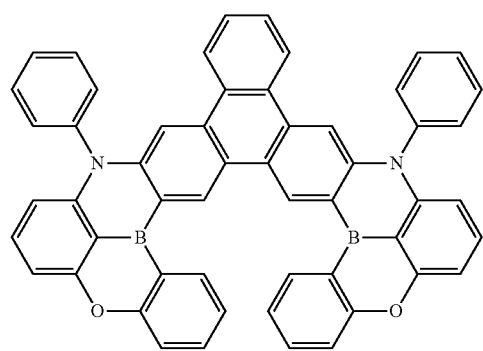
49
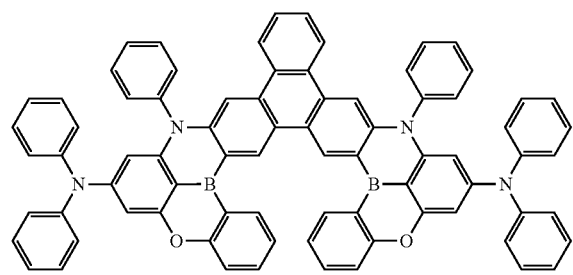
50
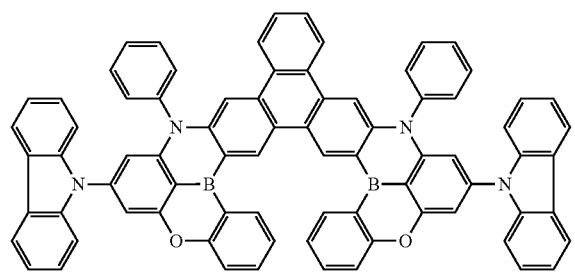
51
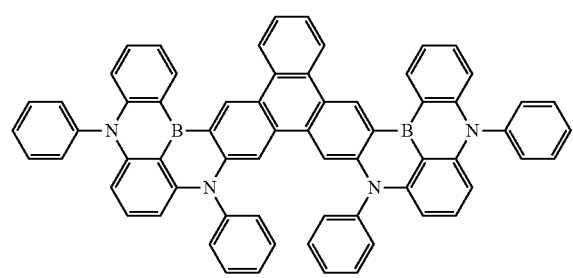
52
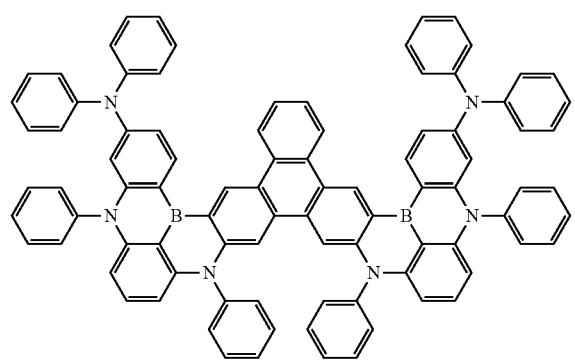
53
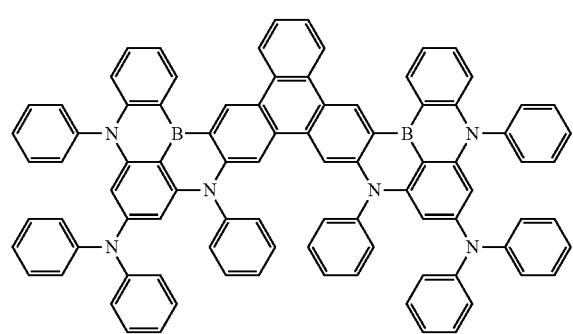
54
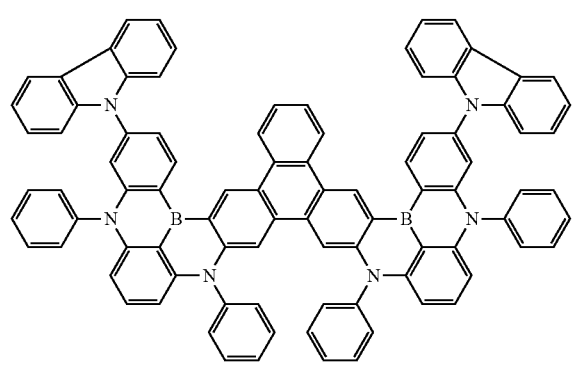

55
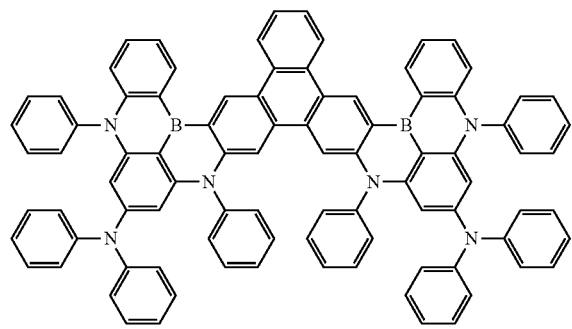
56
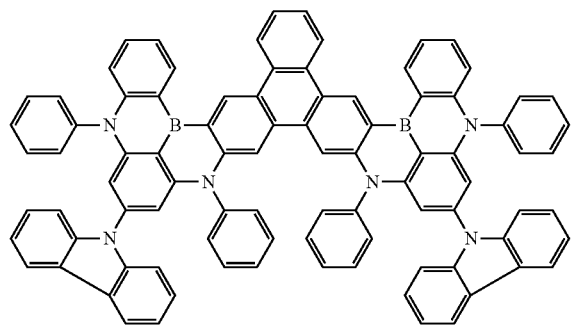
57
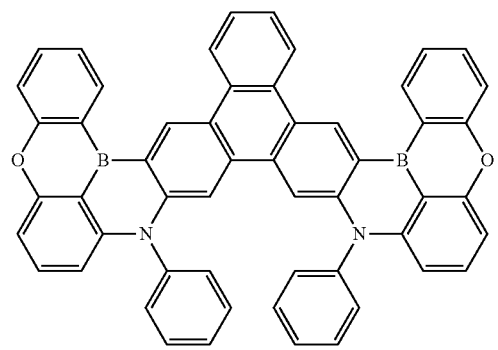
58
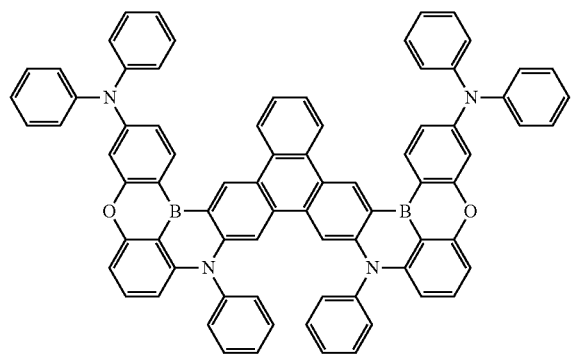
59
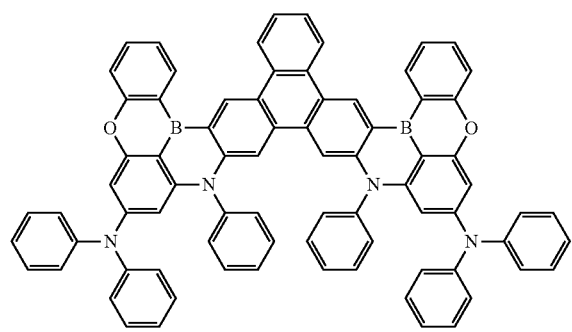
60
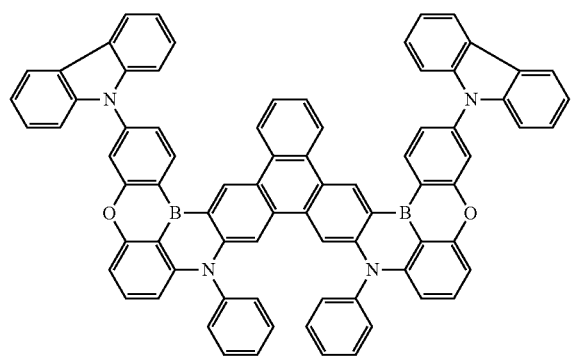
61
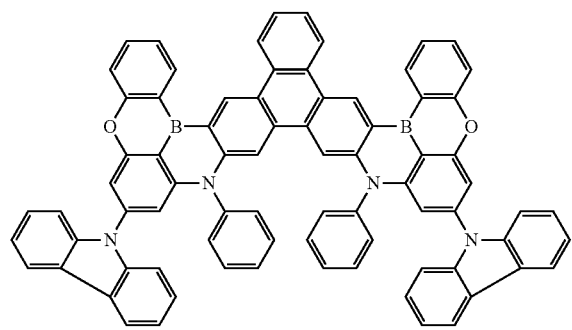
62
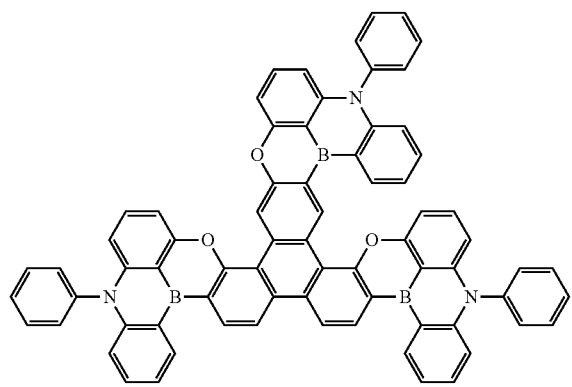

63
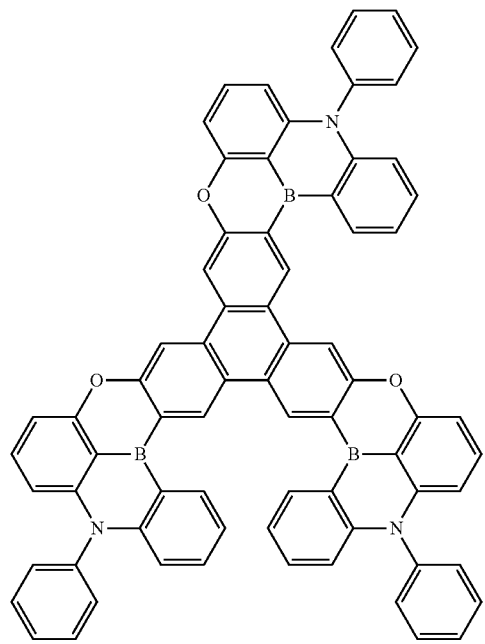
64
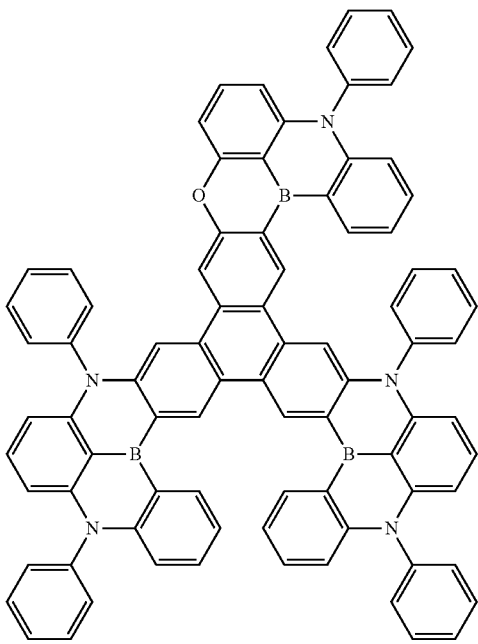
65
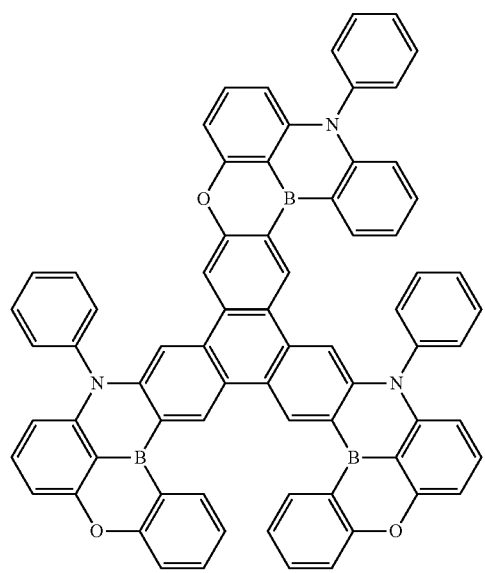
66
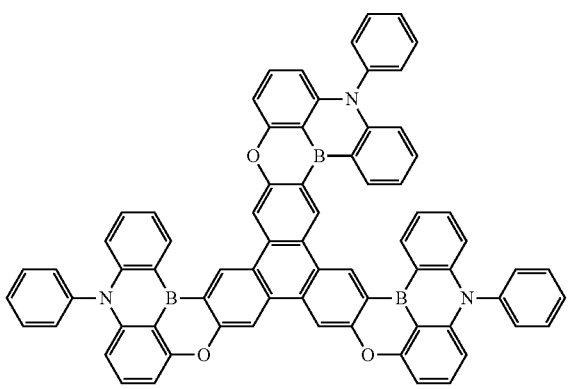

67
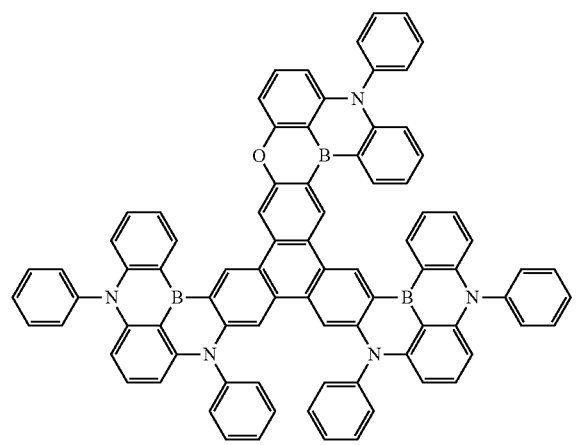
68
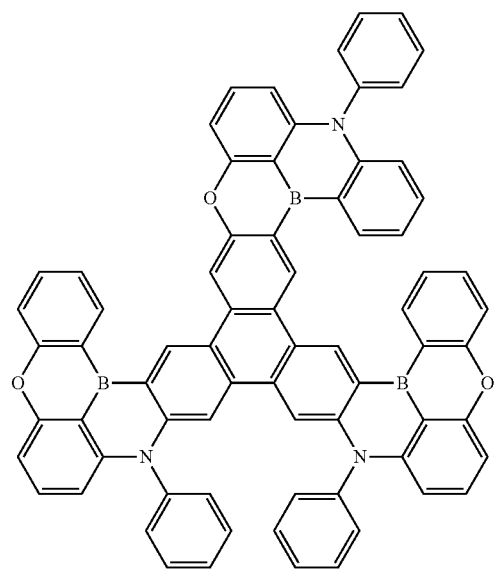
69
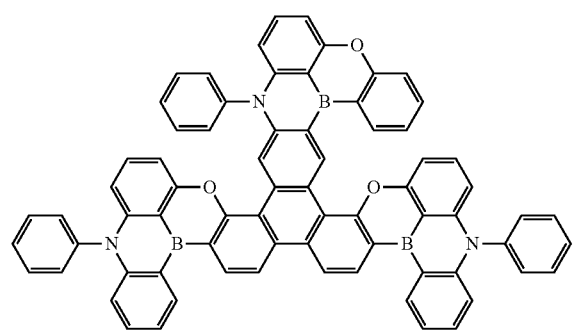
70
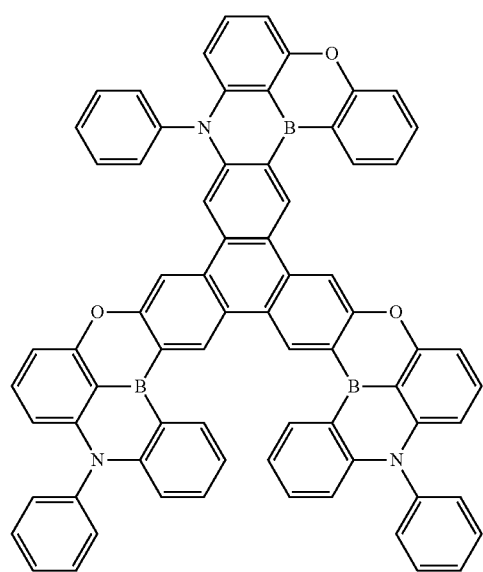

-continued
71
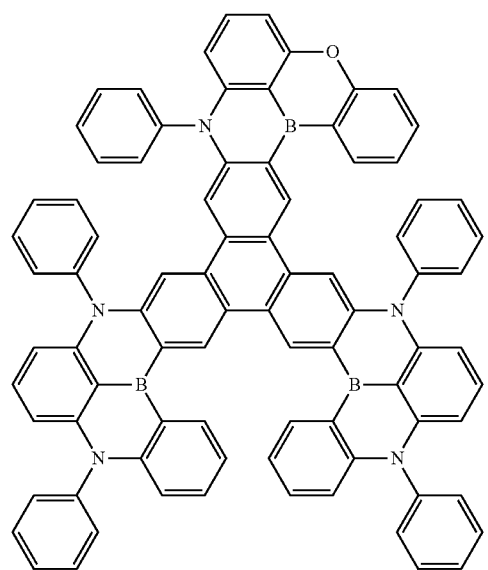
72
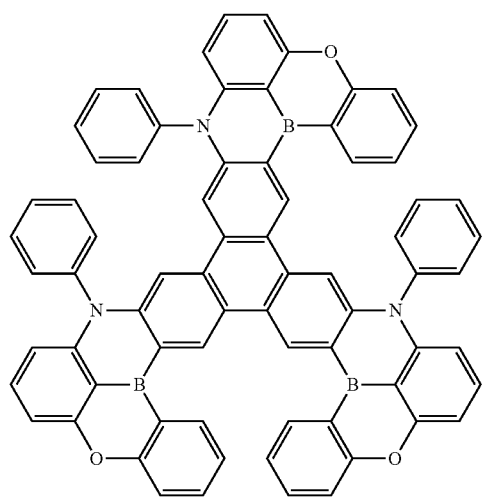
73
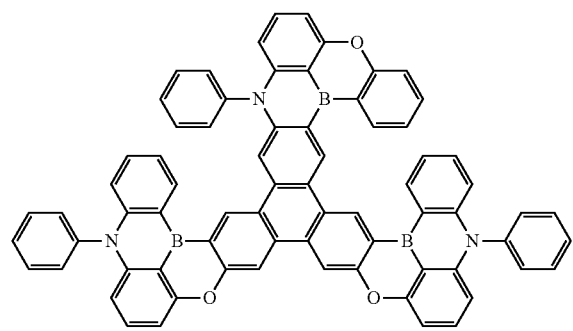
74
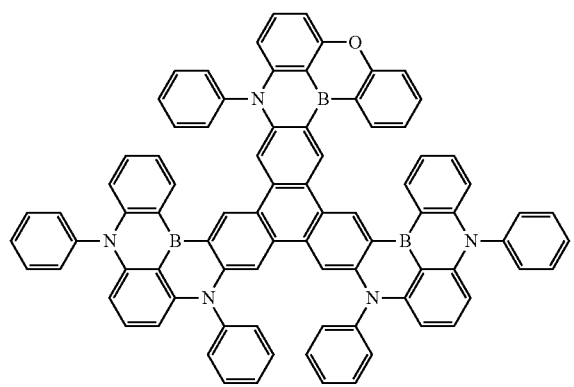
75
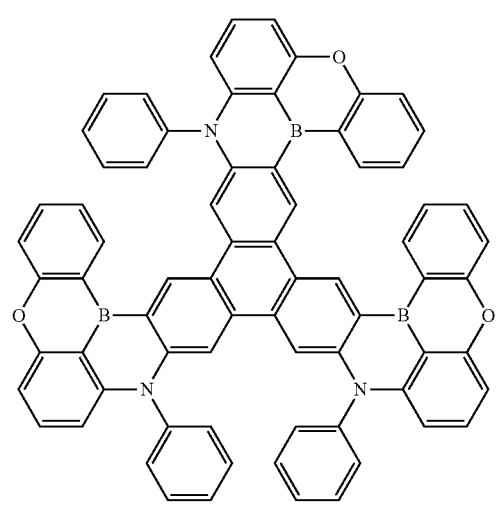
76
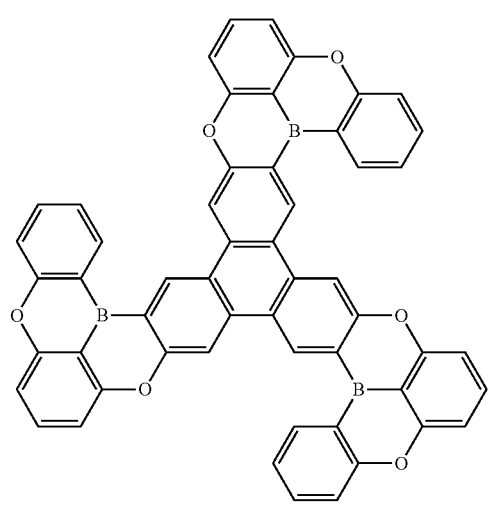

-continued
77
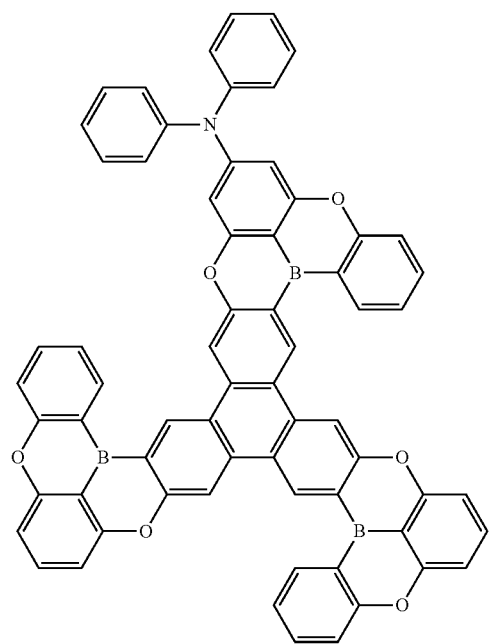
78
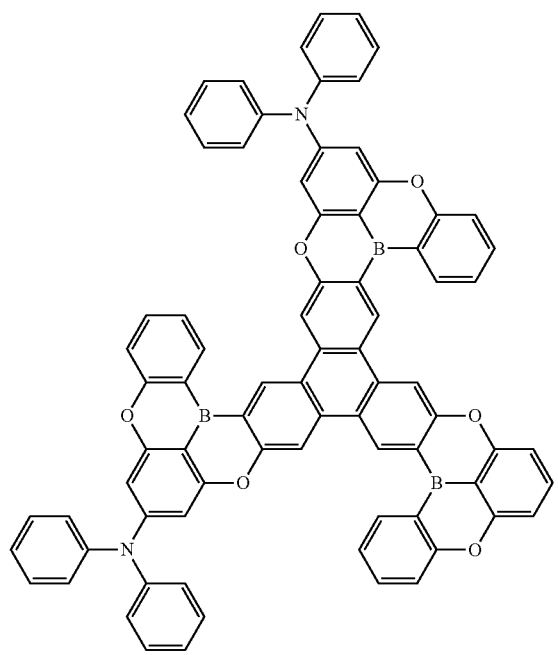
79
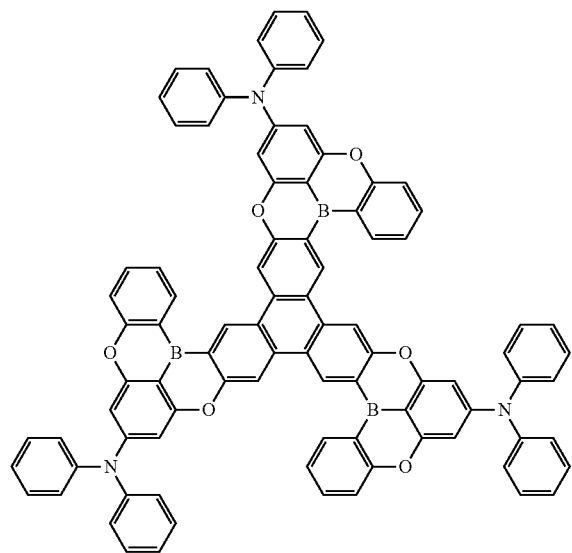
80
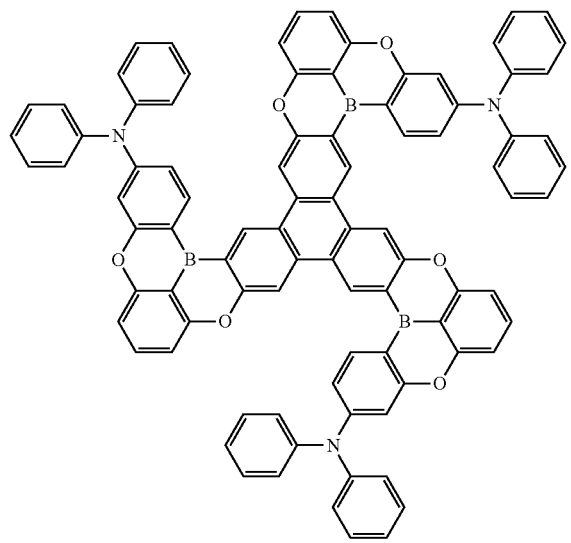

81
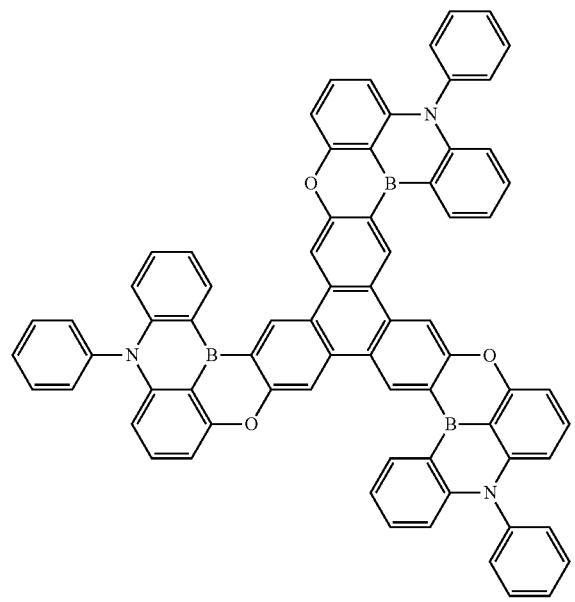
82
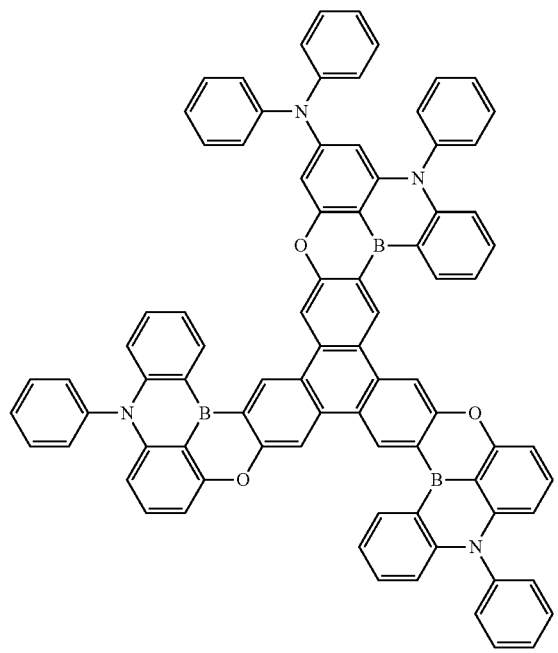
83
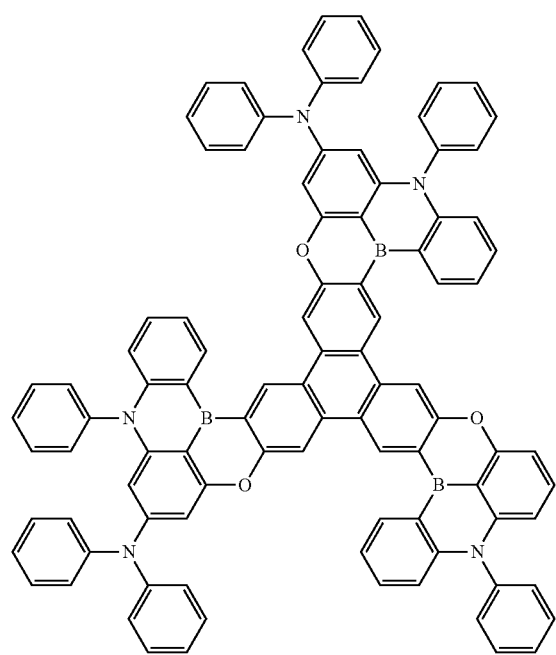
84
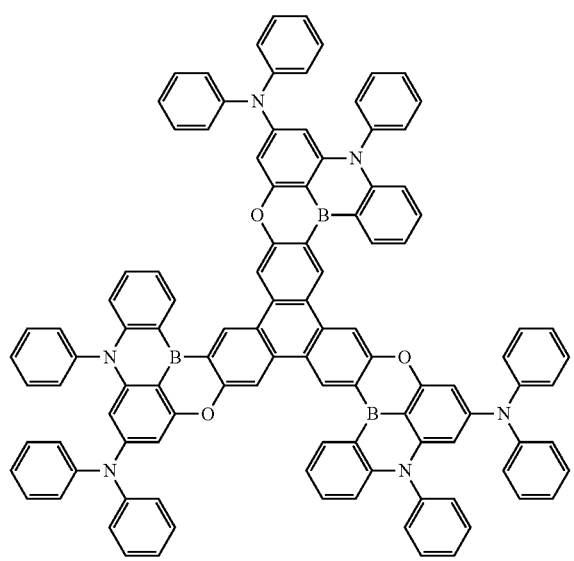

85
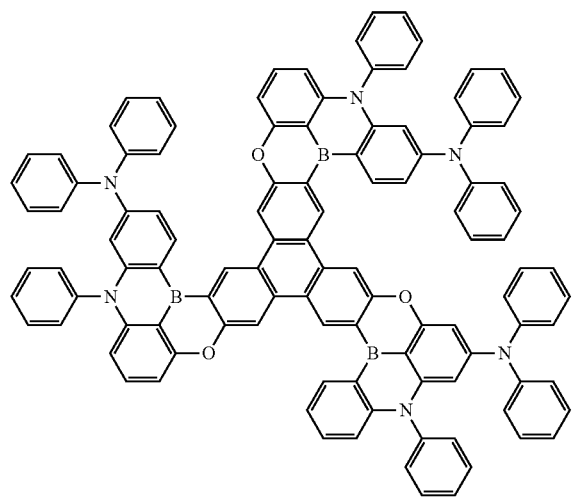
86
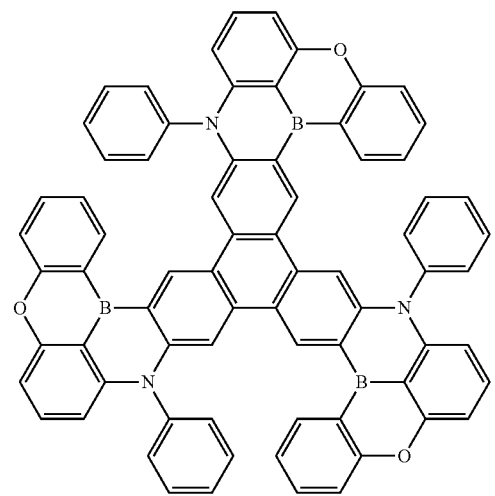
87
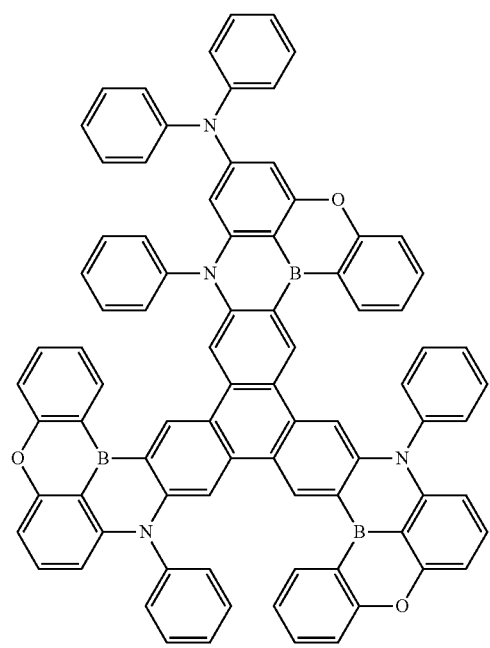
88
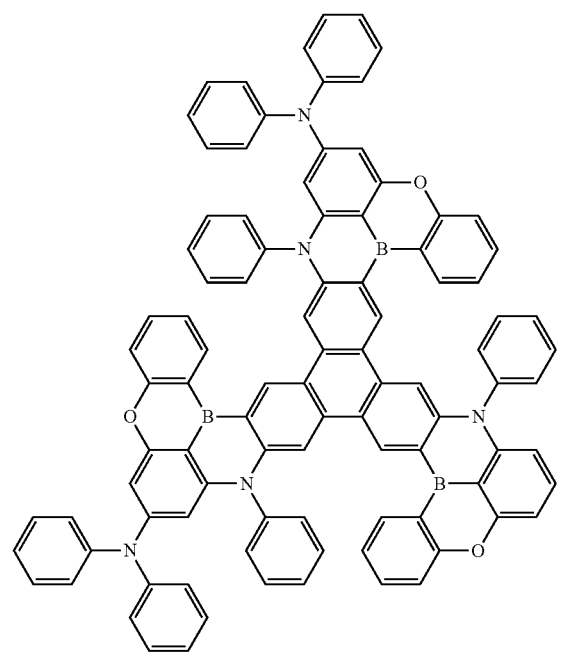

89
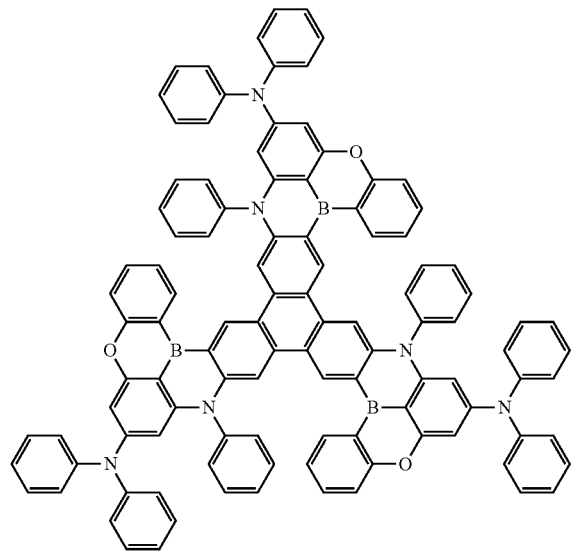
90
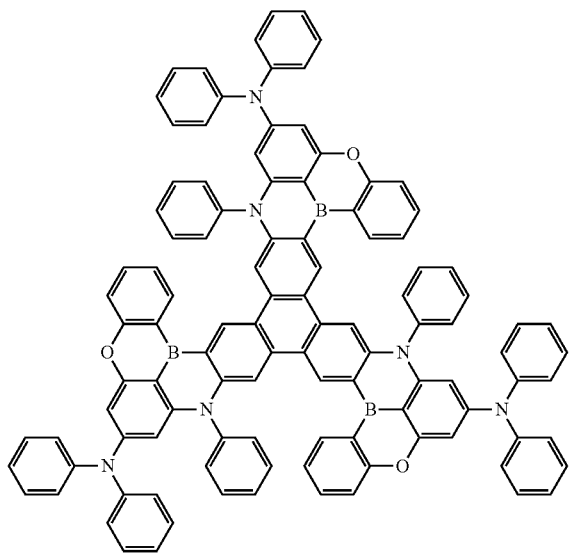
91
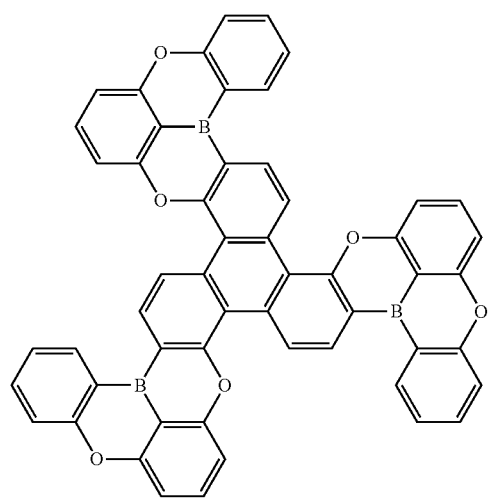
92
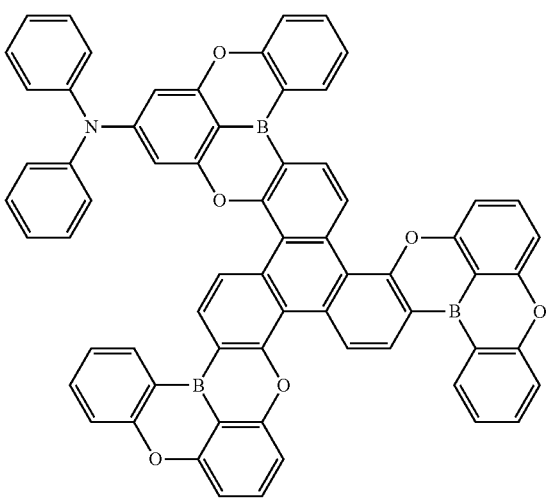

-continued
93
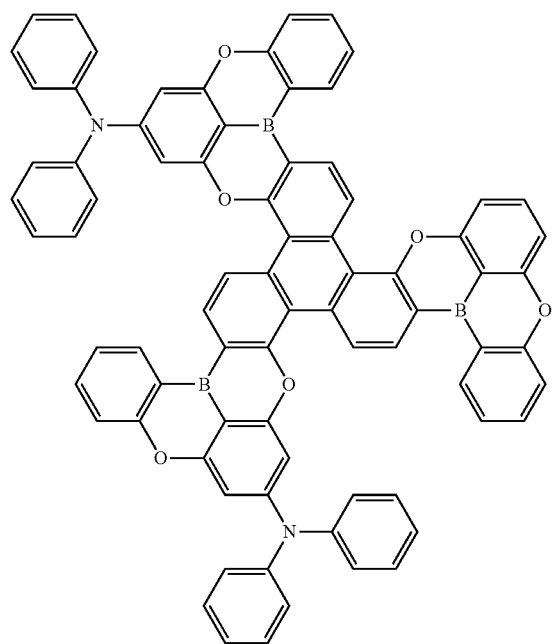
94
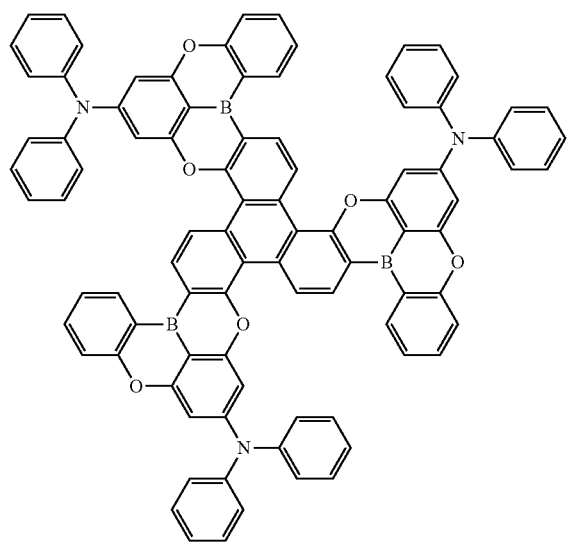
95
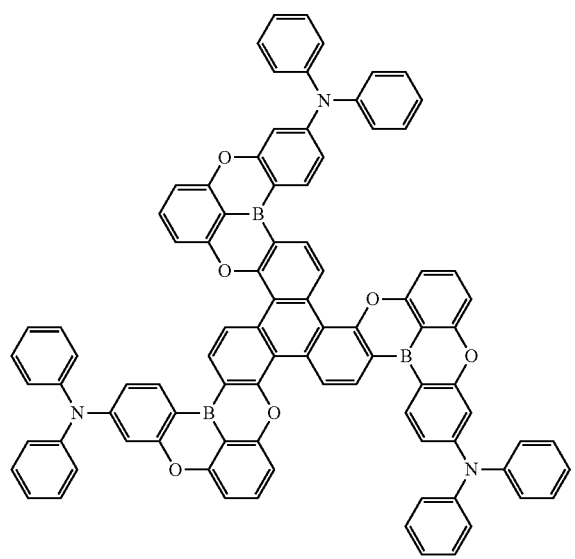
96
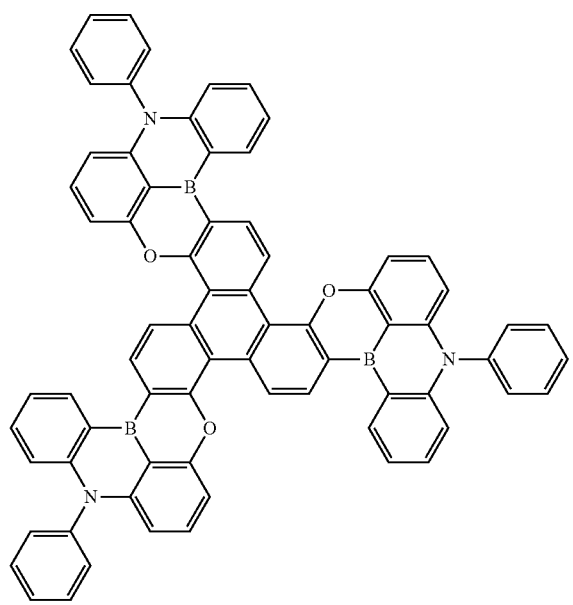

-continued
97
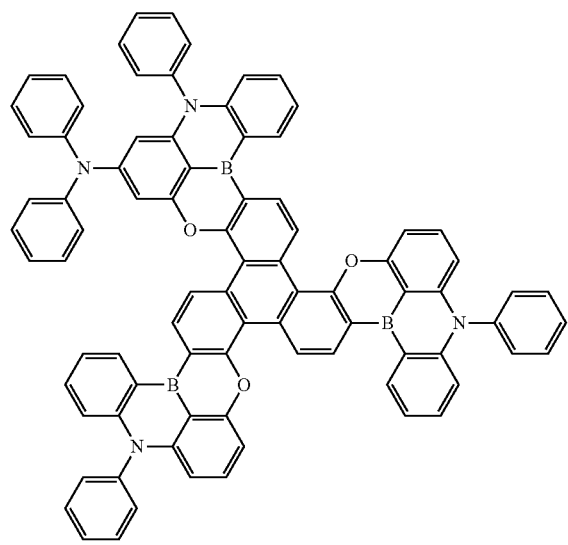
98
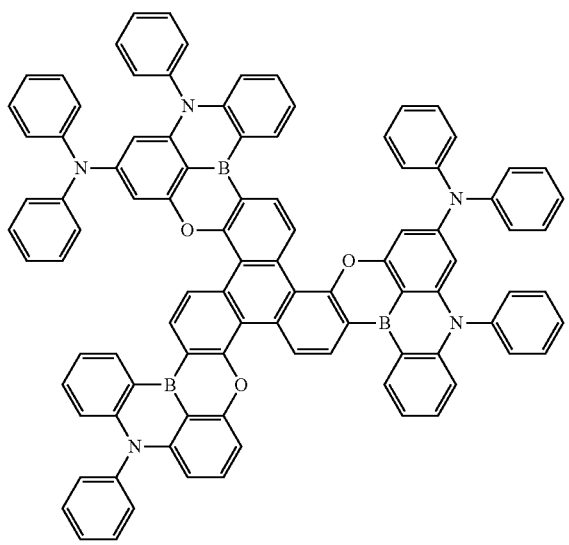
99
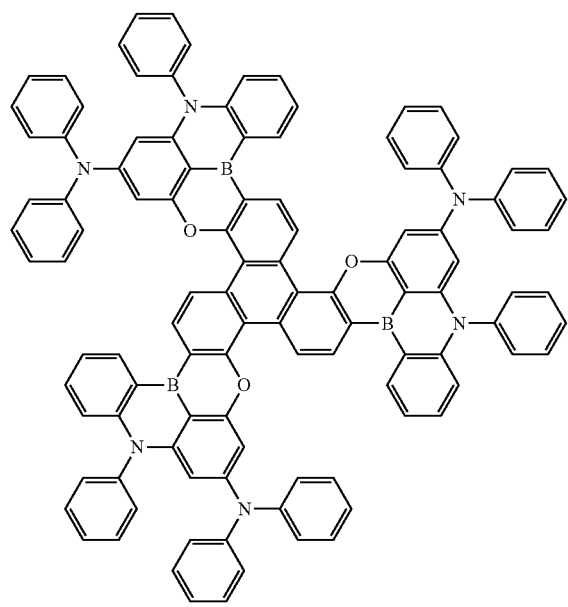
100
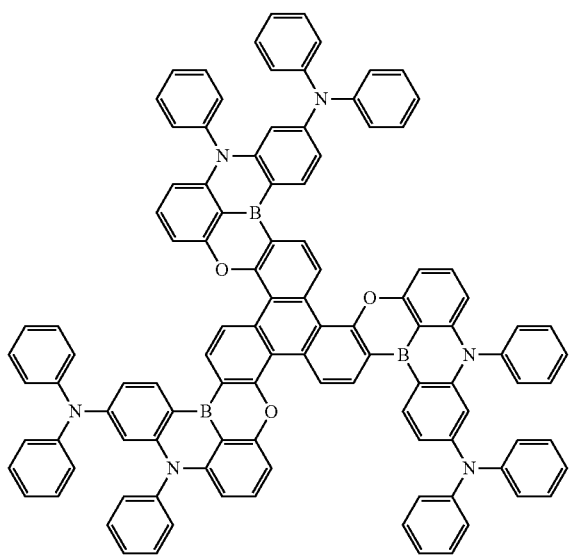

101
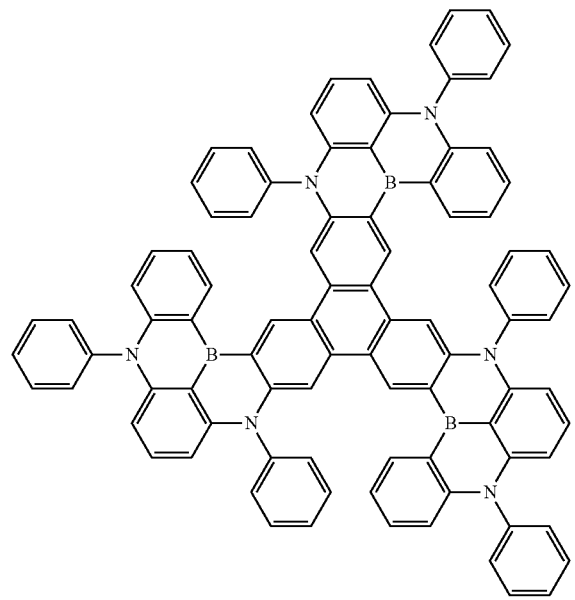
102
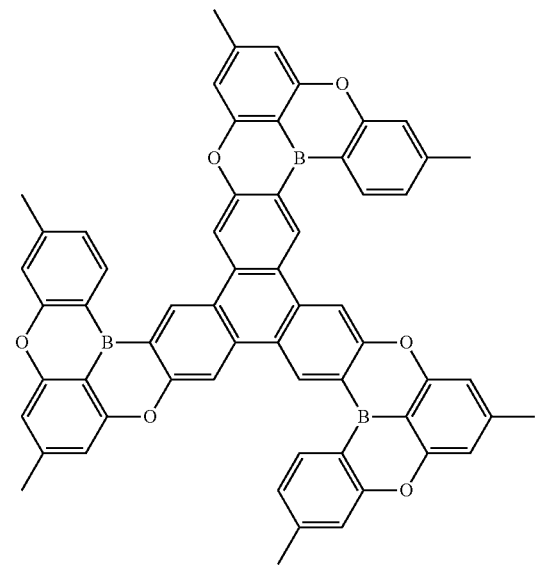
103
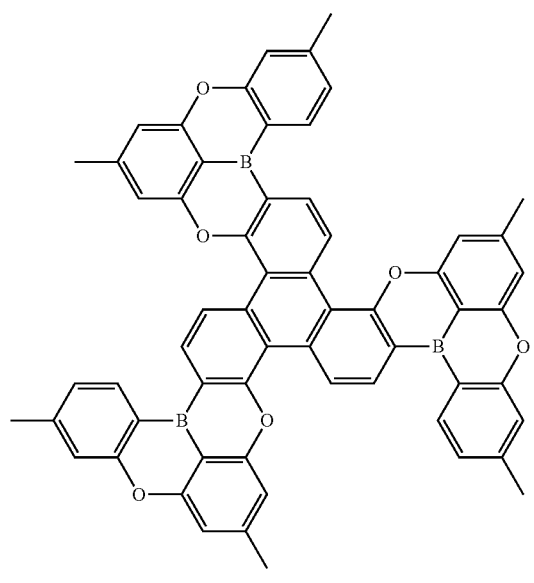
104
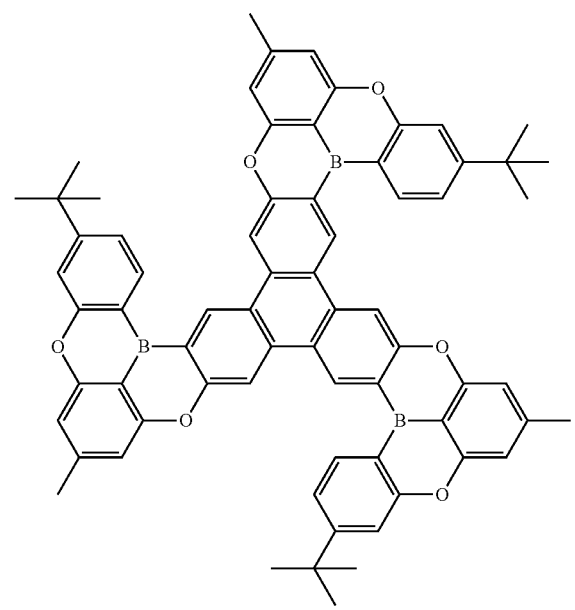

-continued
105
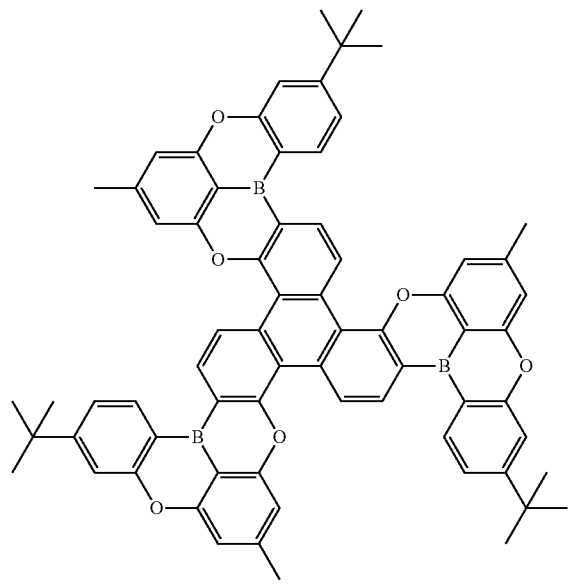
106
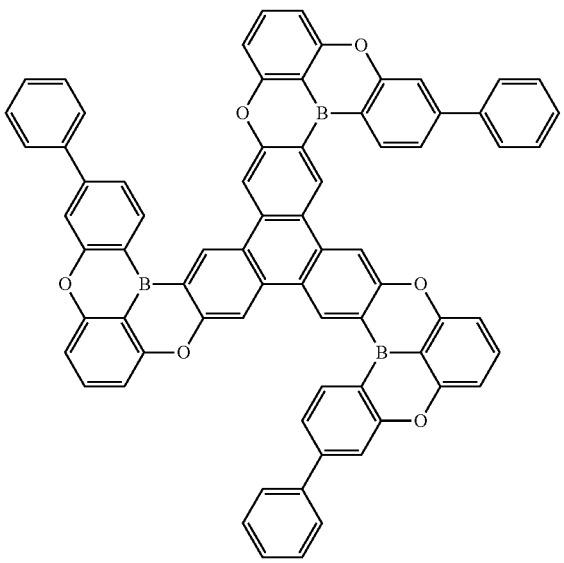
107
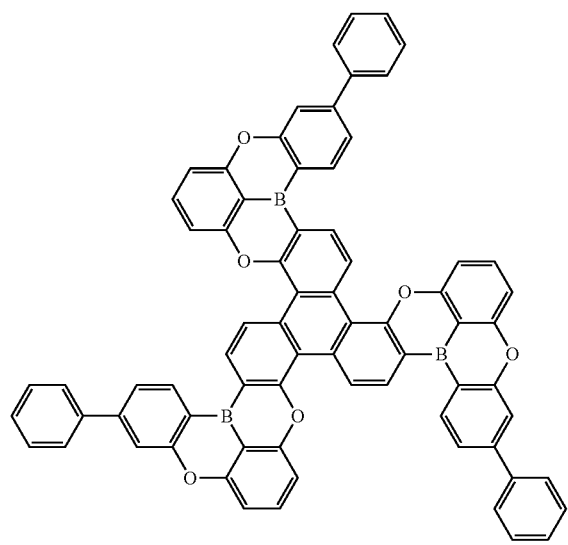
108
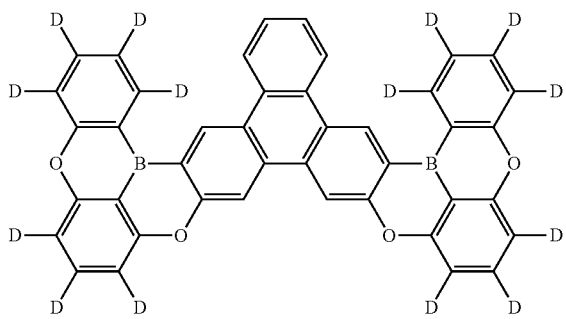
109
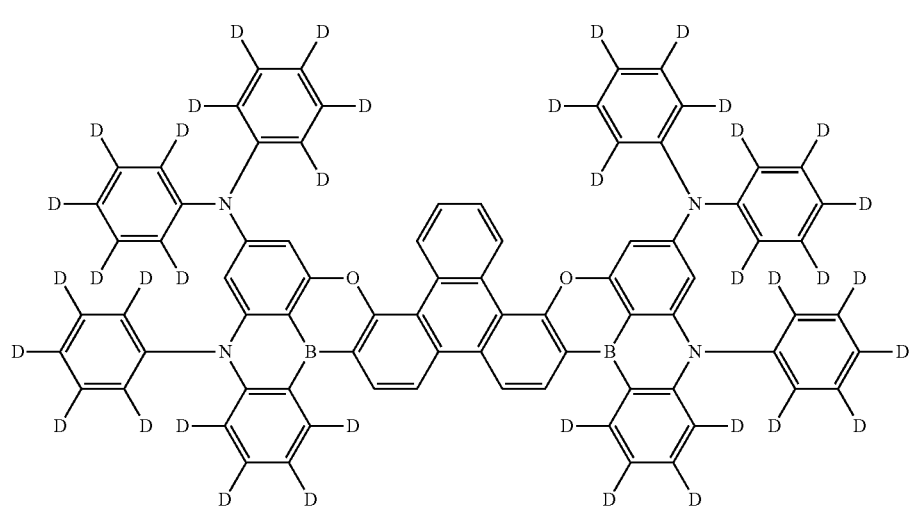

-continued
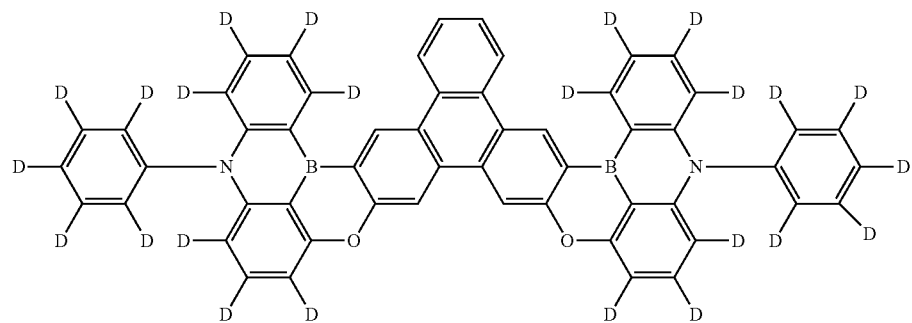
110
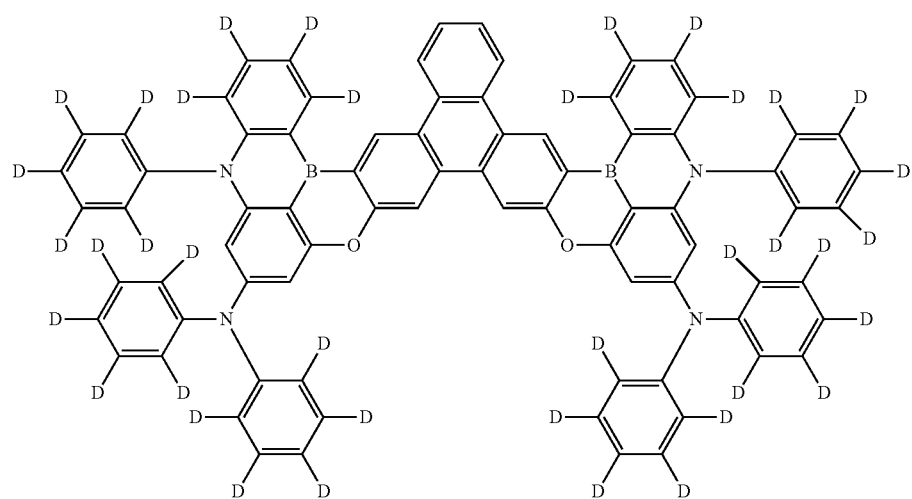
111
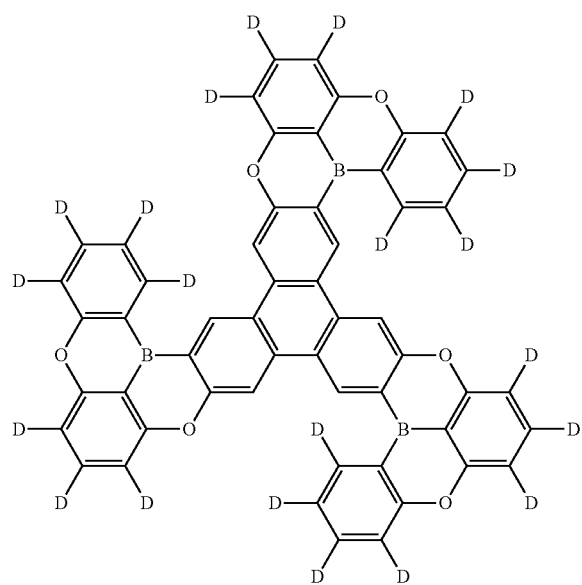
112
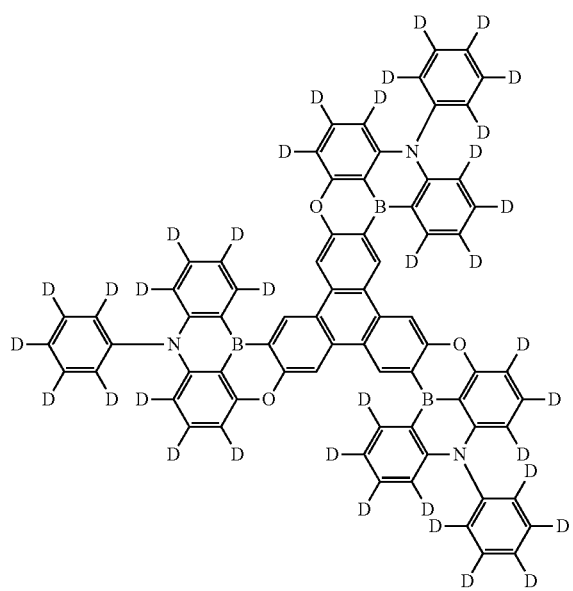
113

-continued
114
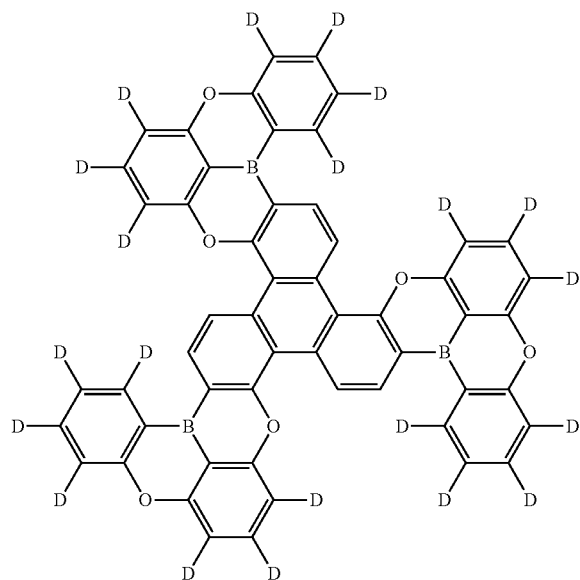
115
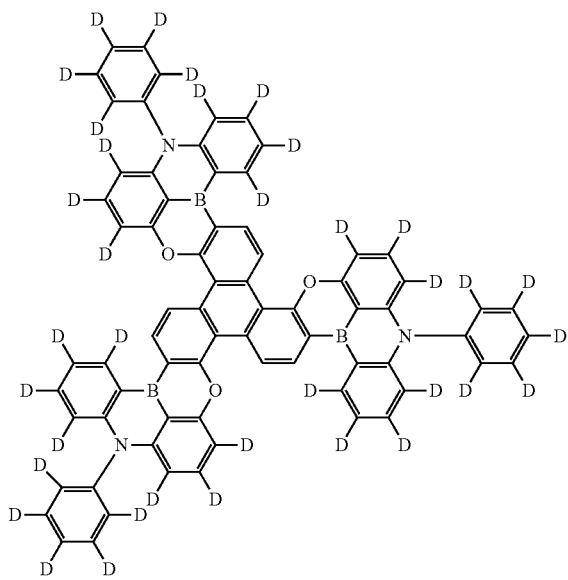
116
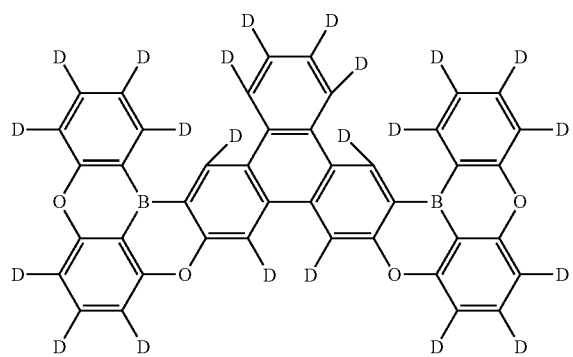
117
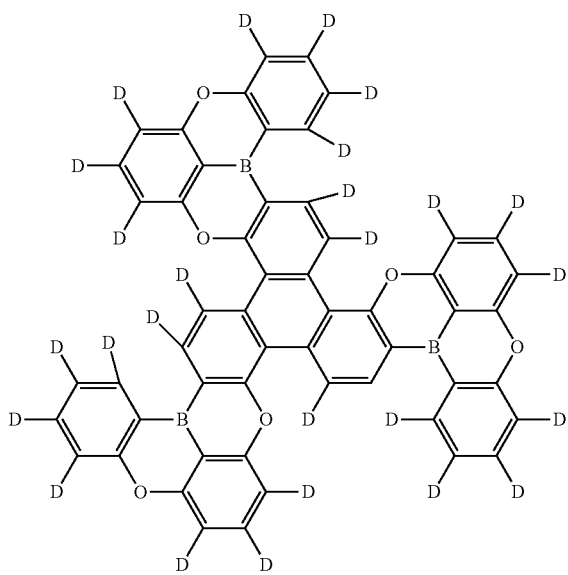
118
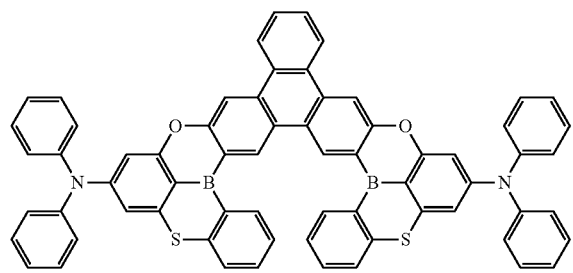
119
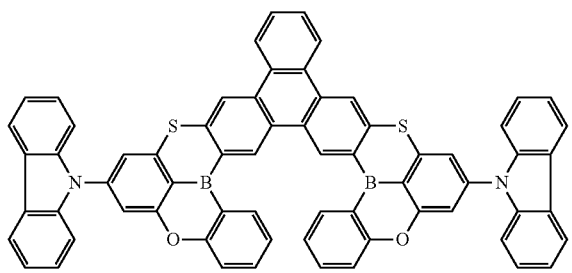

-continued
120
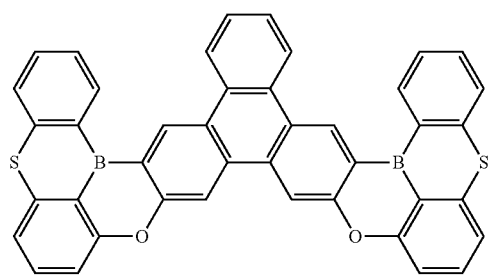
121
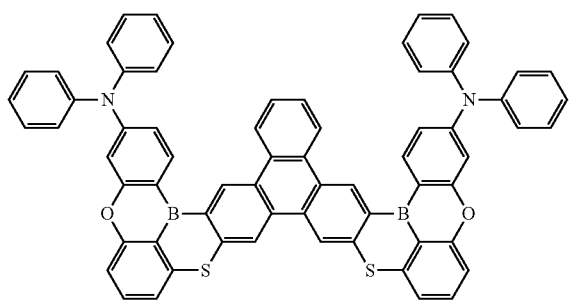
122
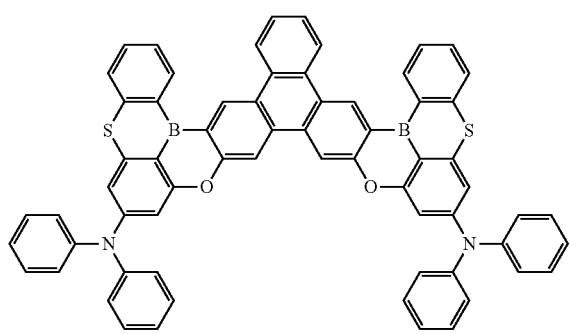
123
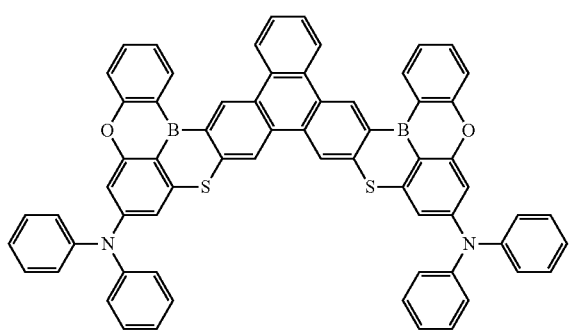
124
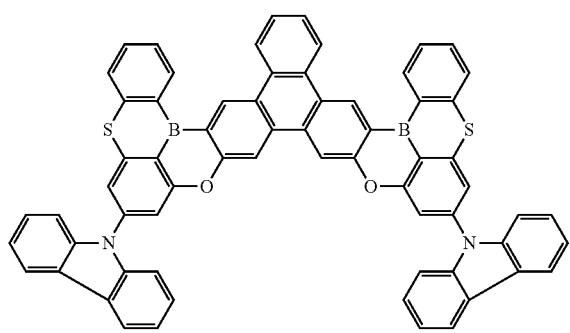
125
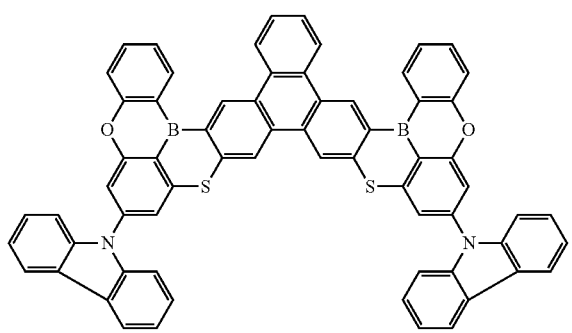
126
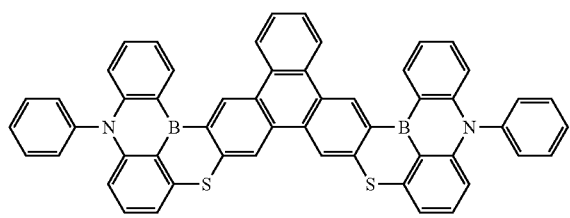
127
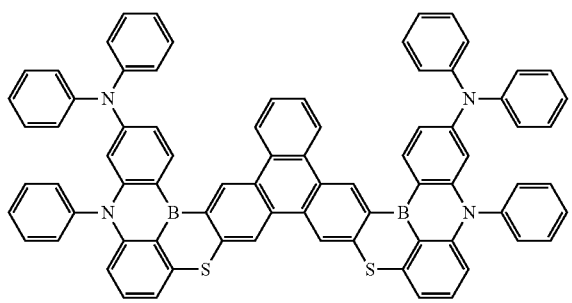

-continued
128
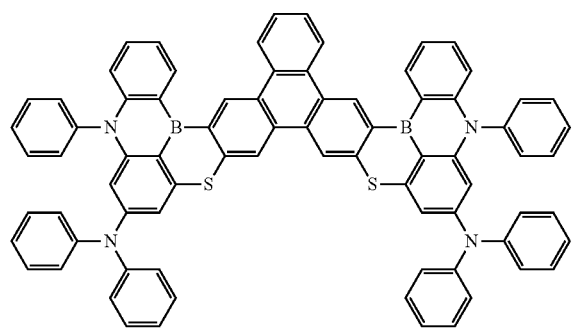
129
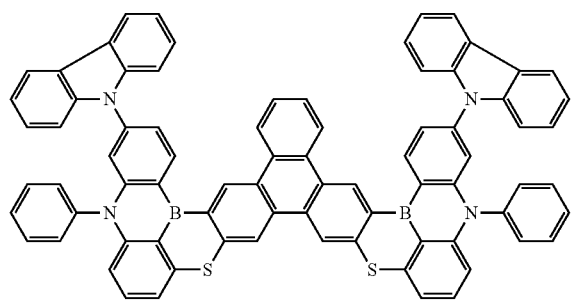
130
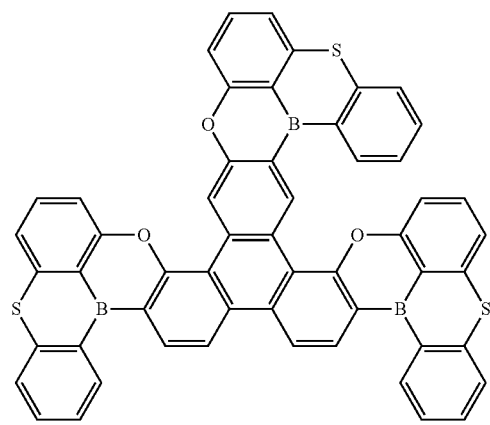
131
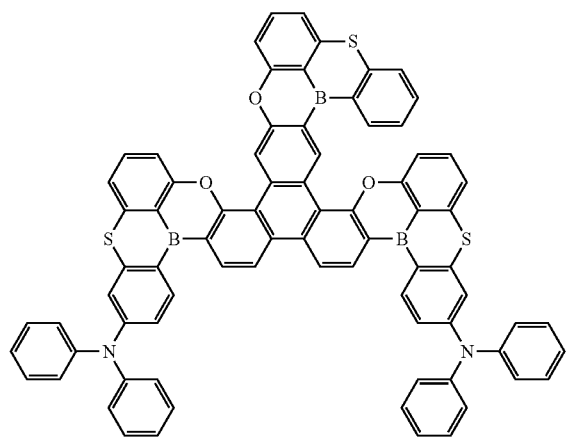
132
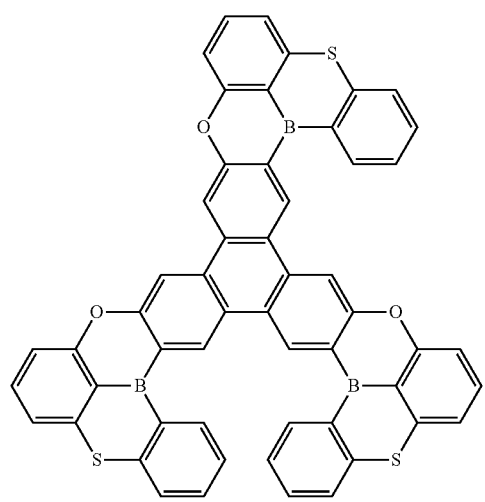
133
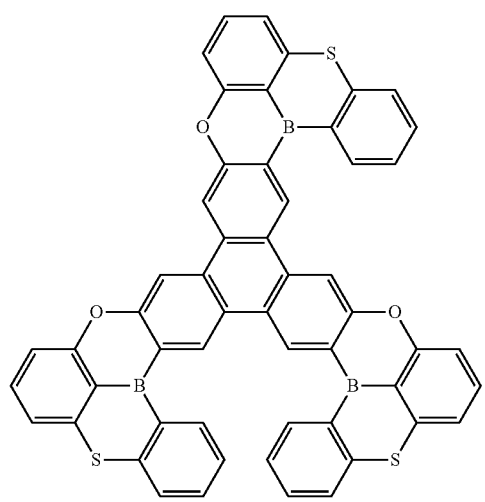

-continued
134
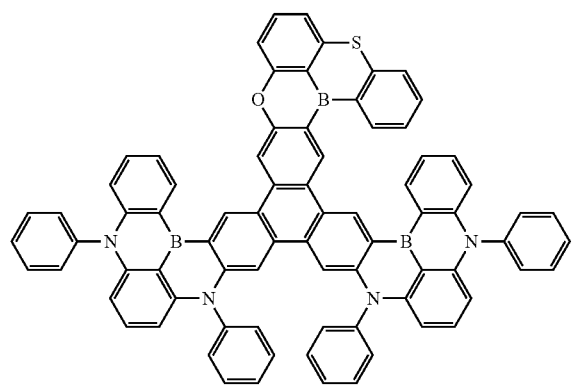
135
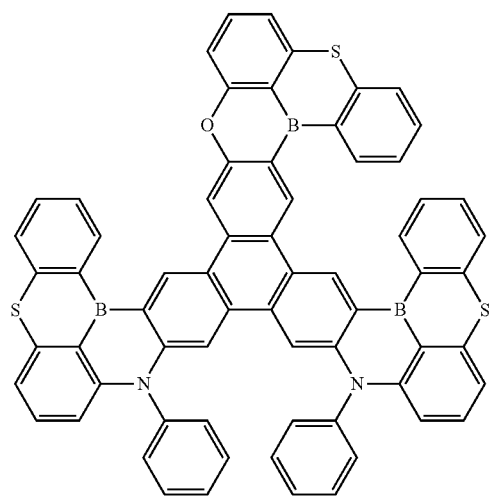
136
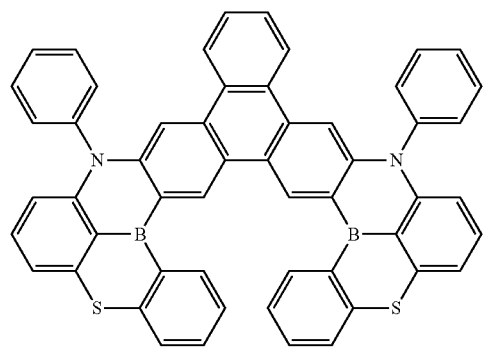
137
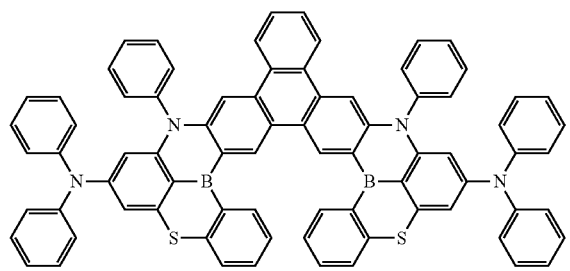
138
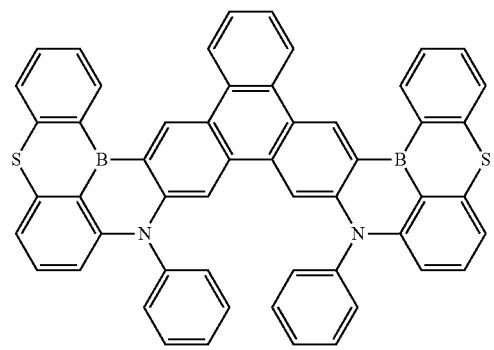
139
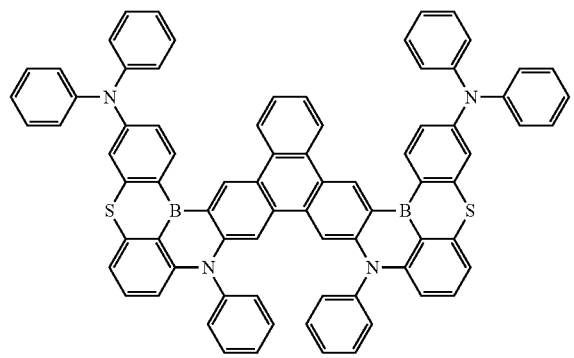

-continued

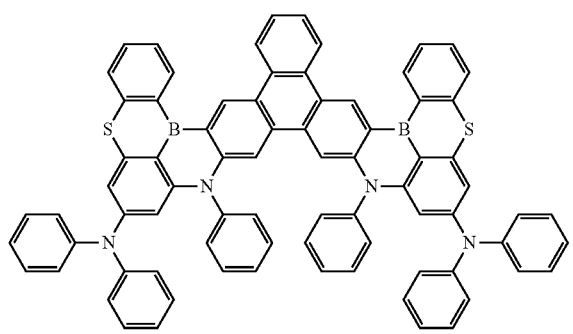
140

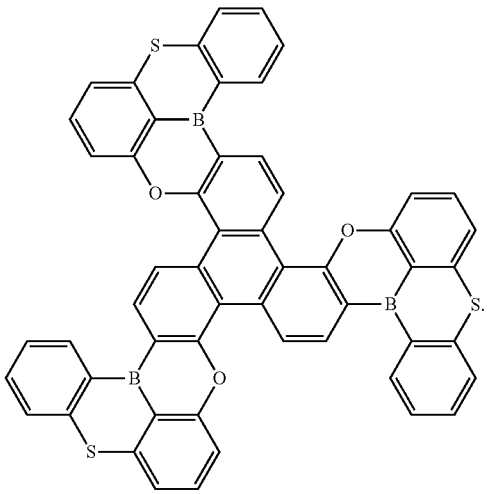
141

13. A fused polycyclic compound represented by any one selected from among Formula 3-1 to Formula 3-5:

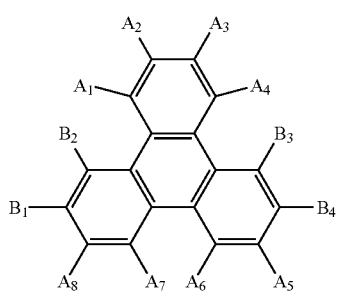
Formula 3-1

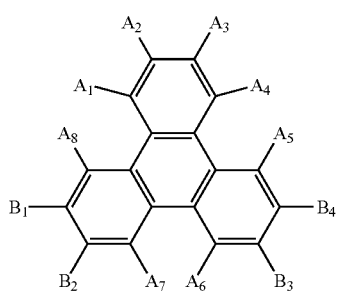
Formula 3-2

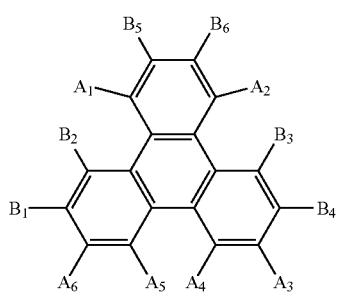
Formula 3-3

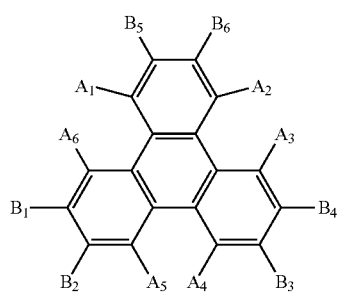
Formula 3-4

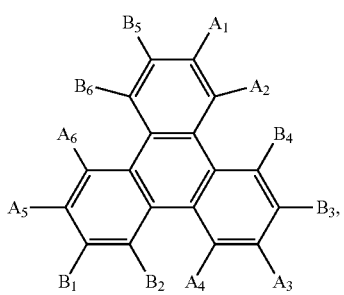
Formula 3-5 wherein, in Formula 3-1 to Formula 3-5, $A_1$ to $A_8$ are each independently a hydrogen atom, a deuterium atom, a halogen atom, a substituted or unsubstituted oxy group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring; and $B_1$ and $B_2$, $B_3$ and $B_4$, and $B_5$ and $B_6$ are each fused to a substituent represented by Formula 2:

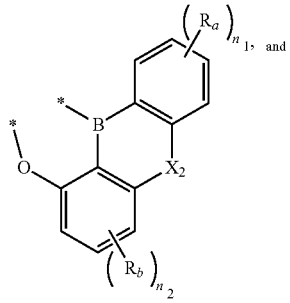

Formula 2 wherein, in Formula 2,

—* is a position of fusion to one of the two or more pairs selected from among $B_1$ and $B_2$, $B_3$ and $B_4$, and $B_5$ and $B_6$;

$X_1$ and $X_2$ are each independently $NAr_1$, O, or S;

$Ar_1$ is a substituted or unsubstituted aryl group having 6 to 30 ring-forming carbon atoms, or a substituted or unsubstituted heteroaryl group having 2 to 30 ring-forming carbon atoms, and/or is bonded to an adjacent group to form a ring;

$R_a$ and $R_b$ are each independently a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring;

$n_1$ is an integer of 0 to 4; and $n_2$ is an integer of 0 to 3.

14. The fused polycyclic compound of claim 13, wherein two or three substituents represented by Formula 2 are fused to the fused polycyclic compound represented by one selected from among Formula 3-1 to Formula 3-5, and the two or three fused substituents represented by Formula 2 are the same as each other.

15. The fused polycyclic compound of claim 13, wherein the substituent represented by Formula 2 is represented by any one selected from Formula 2-1 to Formula 2-8:

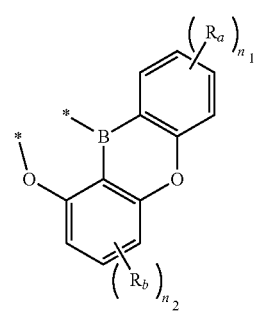

Formula 2-1

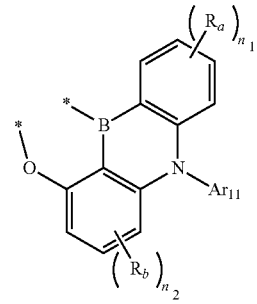

Formula 2-2

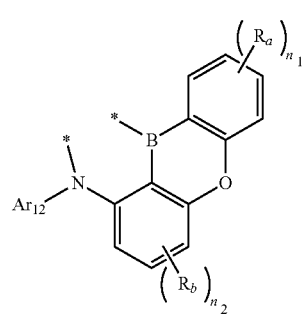

Formula 2-3

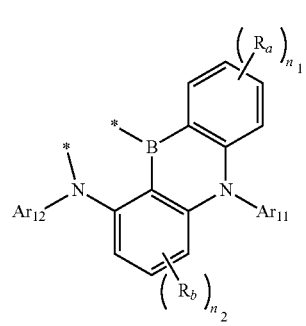

Formula 2-4

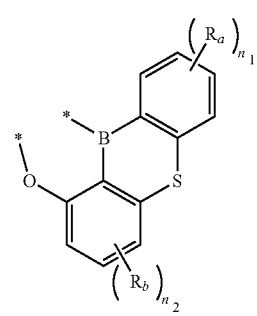

Formula 2-5

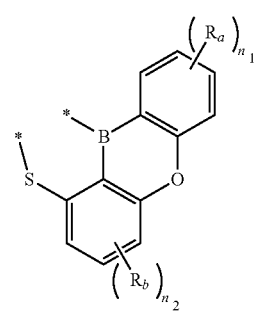

Formula 2-6

-continued

Formula 2-7

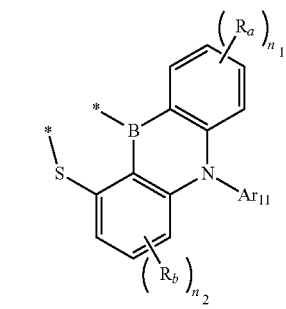

Formula 2-8

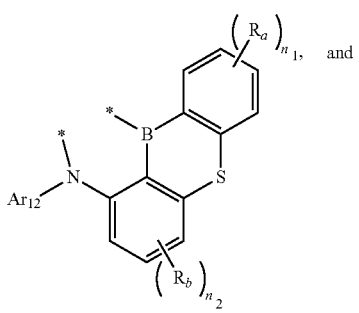

and wherein, in Formula 2-1 to Formula 2-8, $Ar_{11}$ and $Ar_{12}$ are each independently a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring; and $R_a$ and $R_b$, and $n_1$ and $n_2$ are each independently the same as defined in Formula 2.

16. The fused polycyclic compound of claim 13, wherein the substituent represented by Formula 2 is represented by Formula 2-a:

Formula 2-a

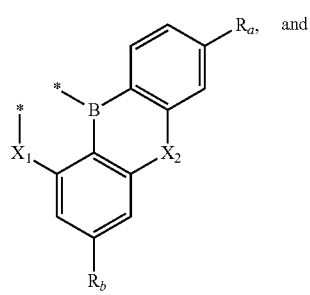

wherein, in Formula 2-a, $X_1$ and $X_2$, and $R_a$ and $R_b$ are each independently the same as defined in Formula 2.

17. The fused polycyclic compound of claim 13, wherein the fused polycyclic compound represented by one selected from among Formula 3-1 to Formula 3-5 is represented by any one selected from Formula 4-1 to Formula 4-8:

Formula 4-1

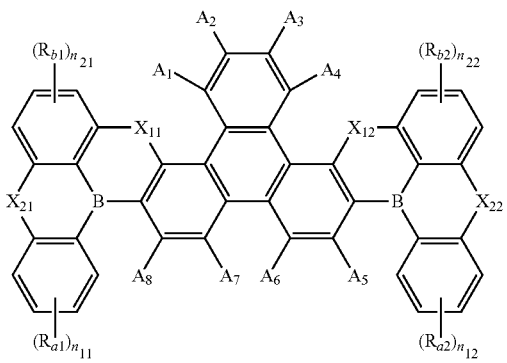

Formula 4-2

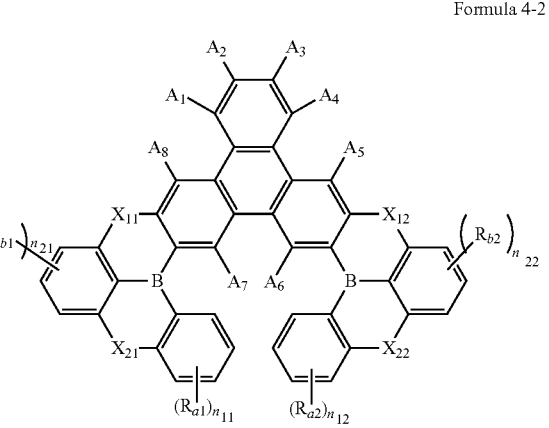

Formula 4-3

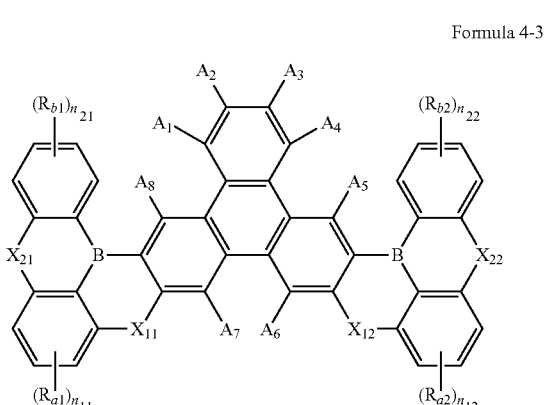

Formula 4-4

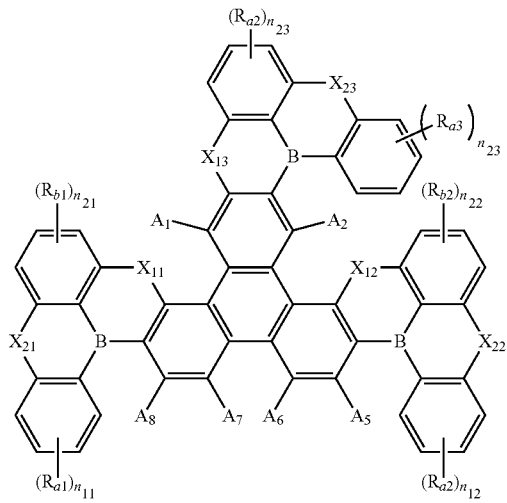

Formula 4-5

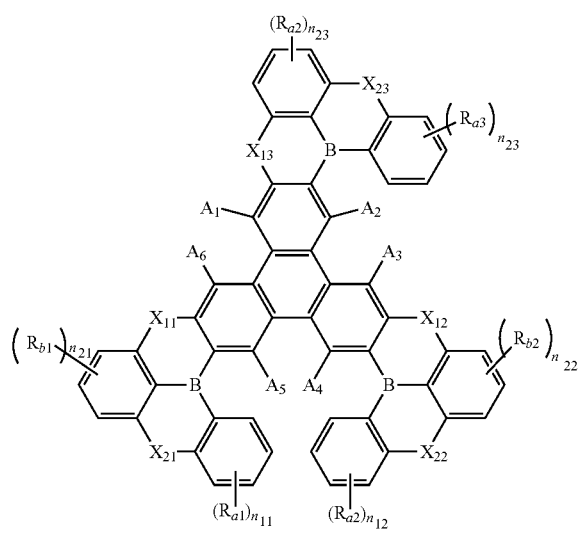

Formula 4-6

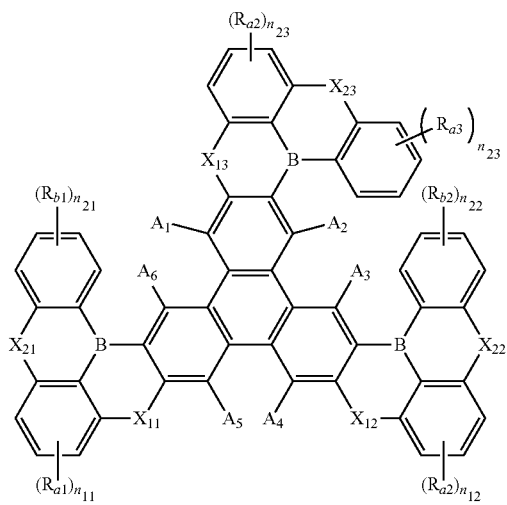

Formula 4-7

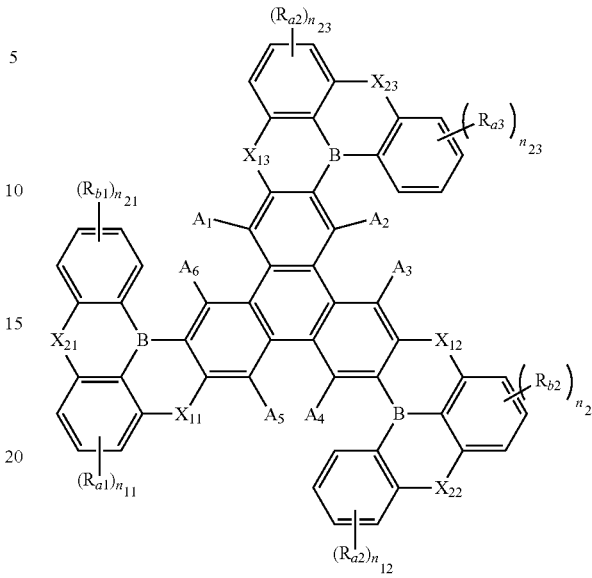

Formula 4-8

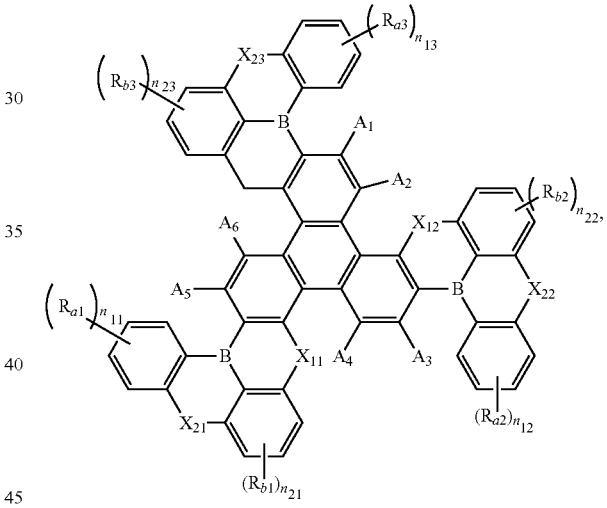

wherein, in Formula 4-1 to Formula 4-8, $X_{11}$, $X_{12}$, $X_{13}$, $X_{21}$, $X_{22}$, and $X_{23}$ are each independently $NAr_1$, O, or S;

$R_{a1}$, $R_{a2}$, $R_{a3}$, $R_{b1}$, $R_{b2}$, and $R_{b3}$ are each independently a hydrogen atom, a deuterium atom, a halogen atom, a substituted or unsubstituted amino group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are bonded to an adjacent group to form a ring;

$n_{11}$, $n_{12}$, and $n_{13}$ are each independently an integer of 0 to 4;

$n_{21}$, $n_{22}$, and $n_{23}$ are each independently an integer of 0 to 3; and $Ar_1$ and $A_1$ to $A_8$ are each independently the same as defined in Formula 2 and Formula 3-1 to Formula 3-5.

18. The fused polycyclic compound of claim 13, wherein the fused polycyclic compound represented by one selected from among Formula 3-1 to Formula 3-5 is at least one selected from compounds represented by Compound Group 1:
Compound Group 1
1
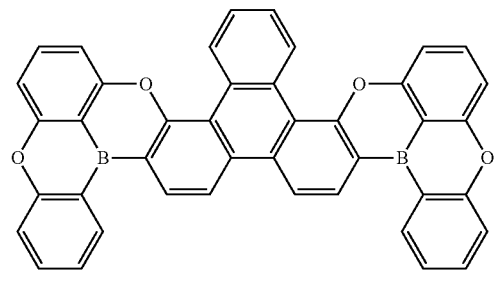
2
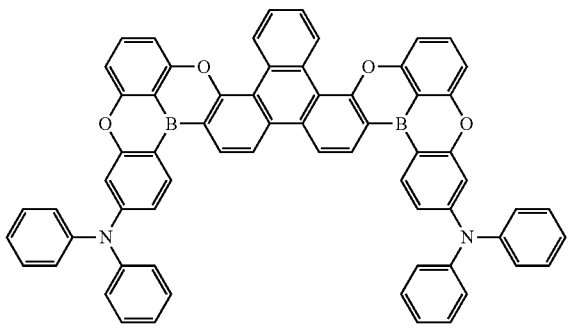
3
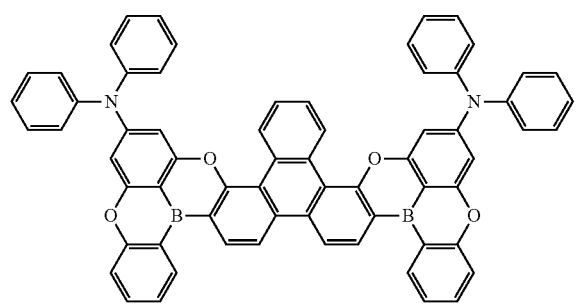
4
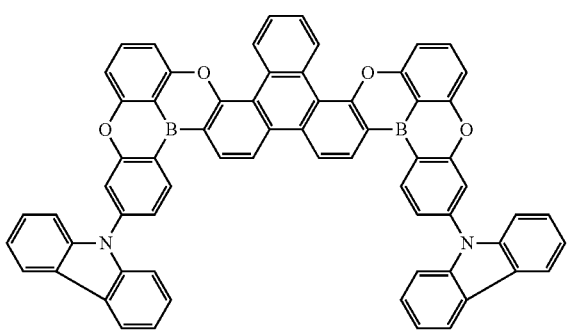
5
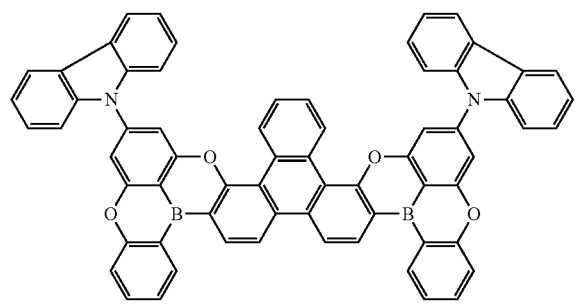
6
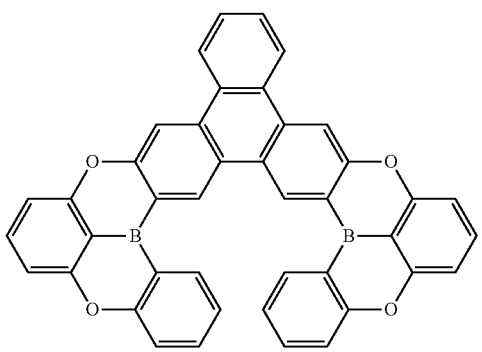
7
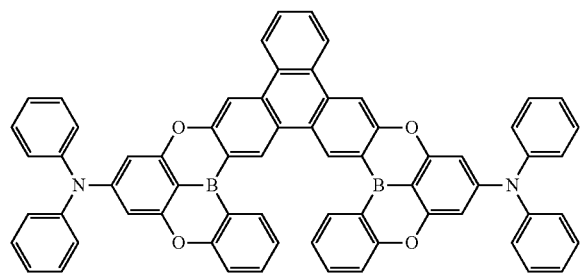
8
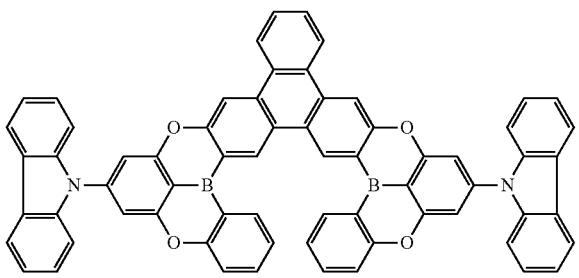

9
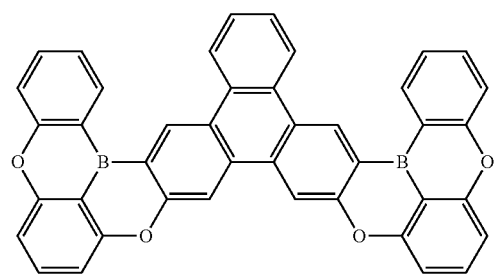
10
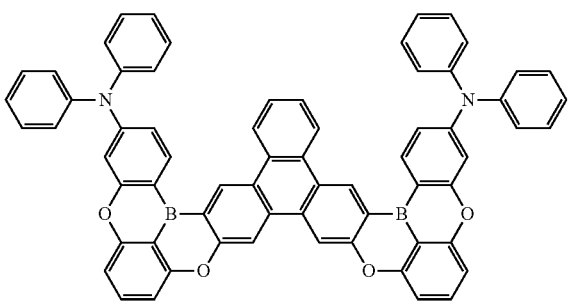
11
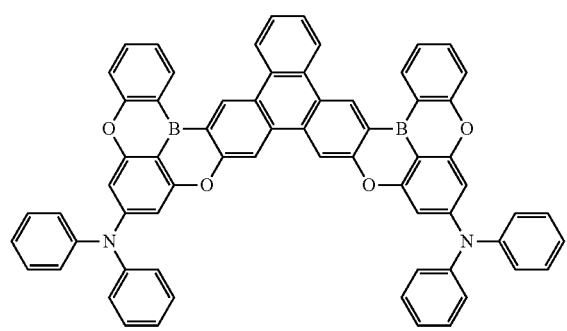
12
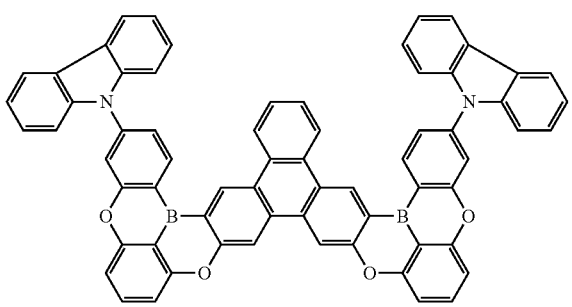
13
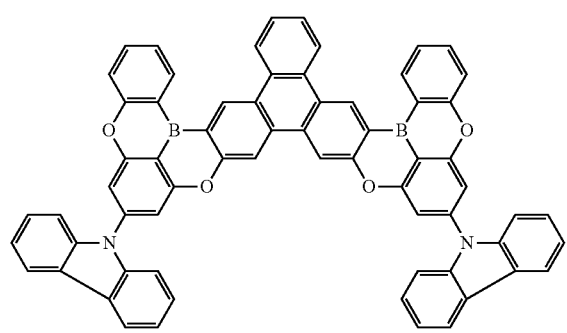
14
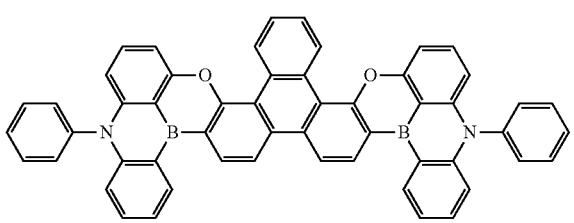
15
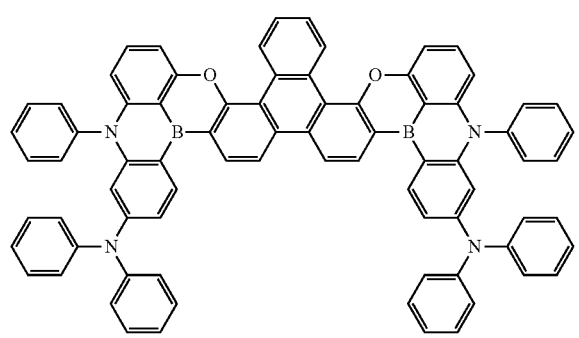
16
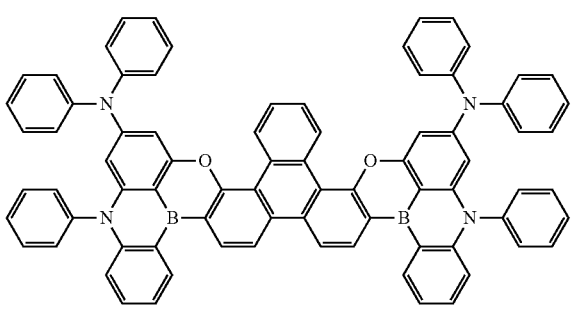

17
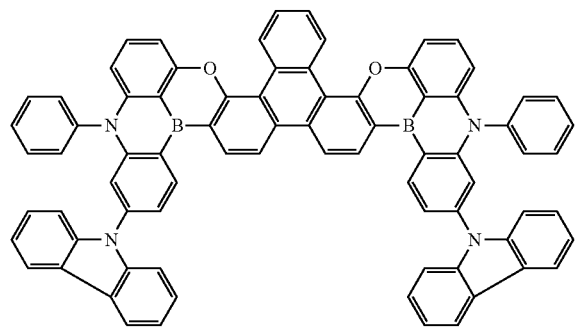
18
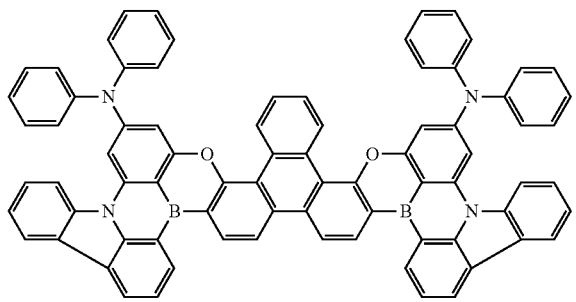
19
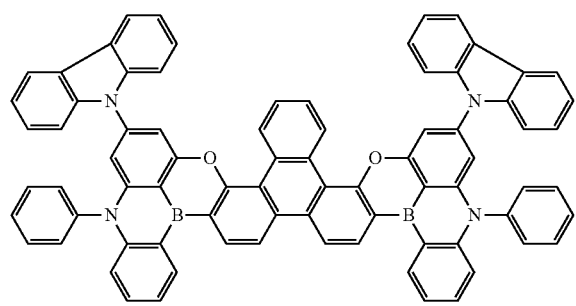
20
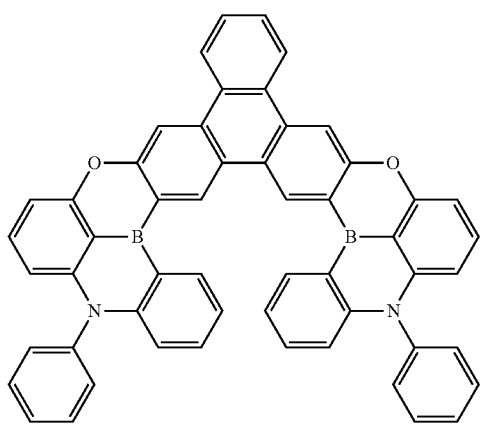
21
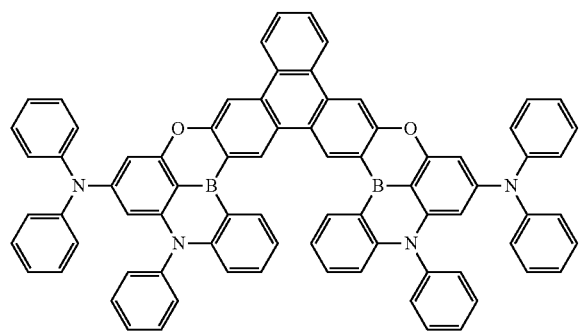
22
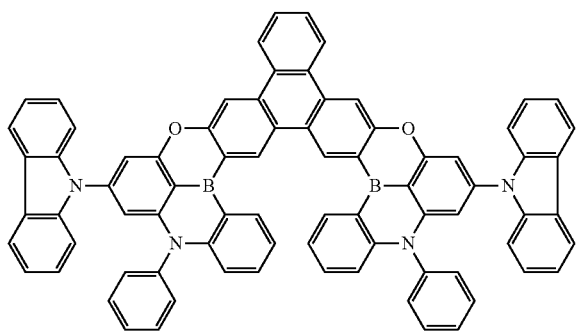
23
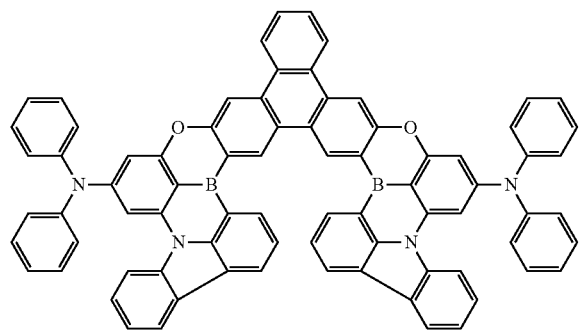
24
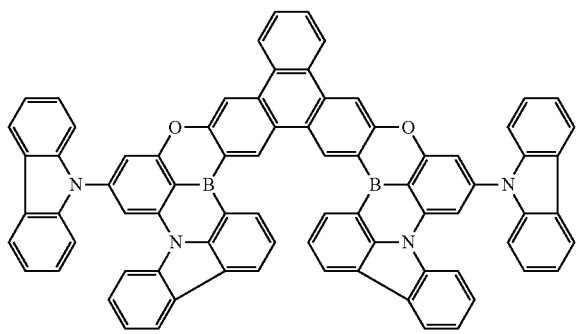

25
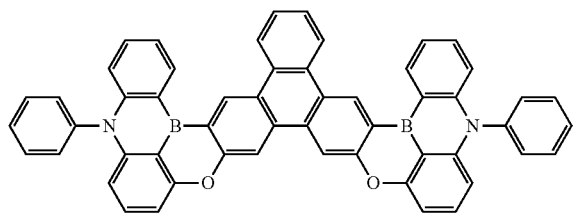
26
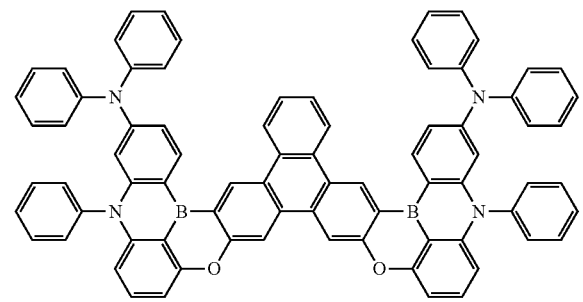
27
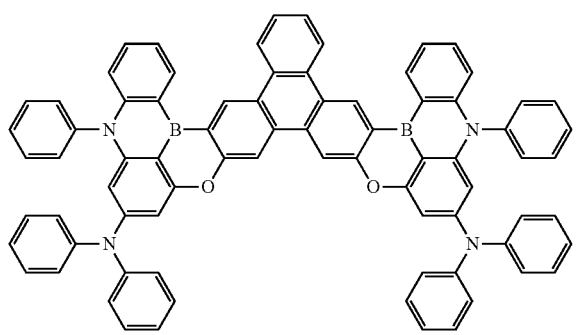
28
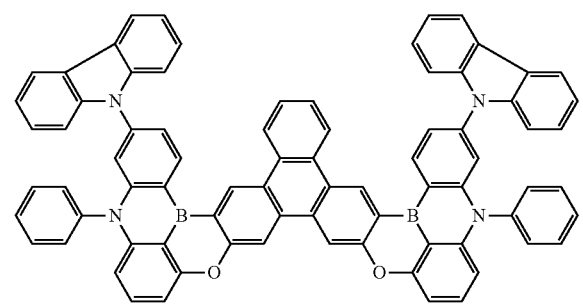
29
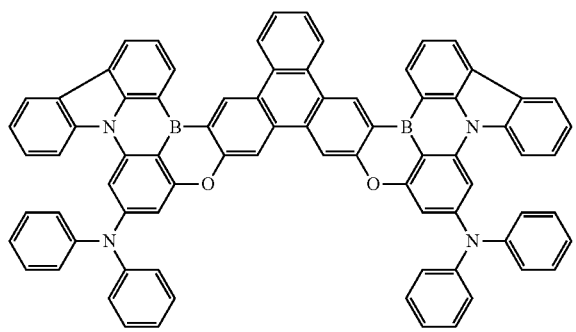
30
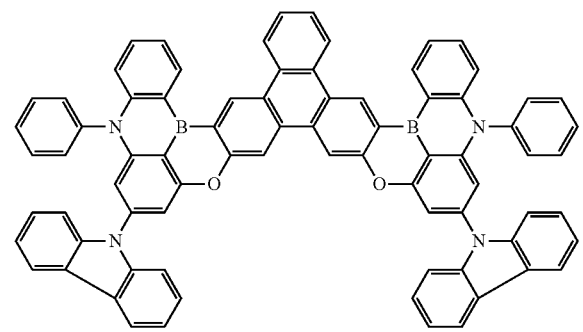
31
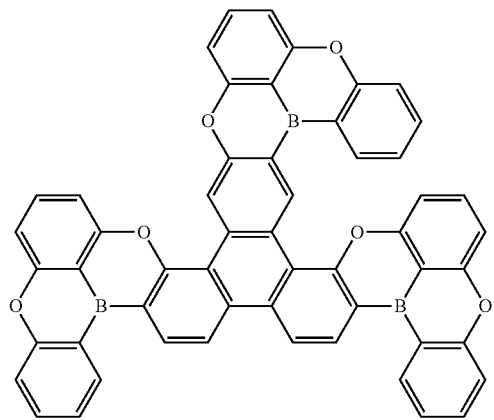
32
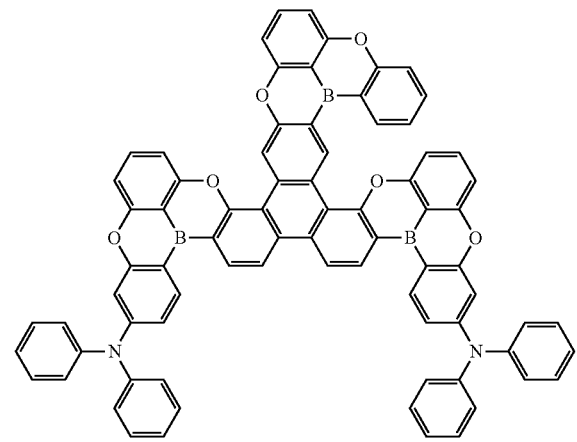

33
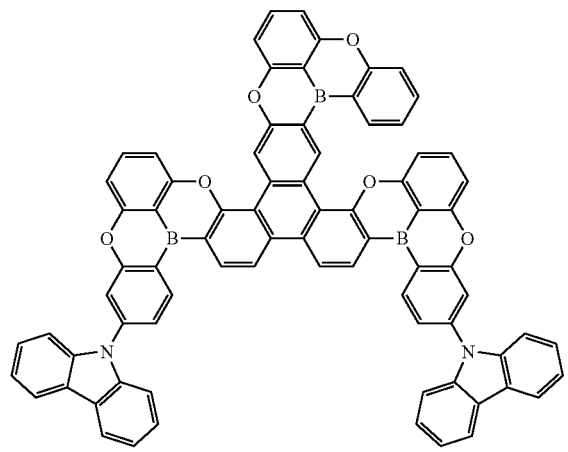
34
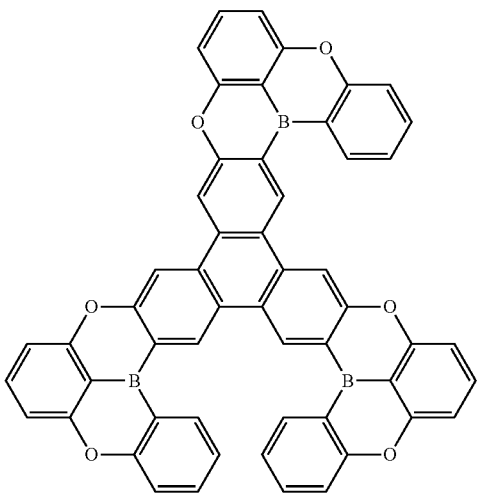
35
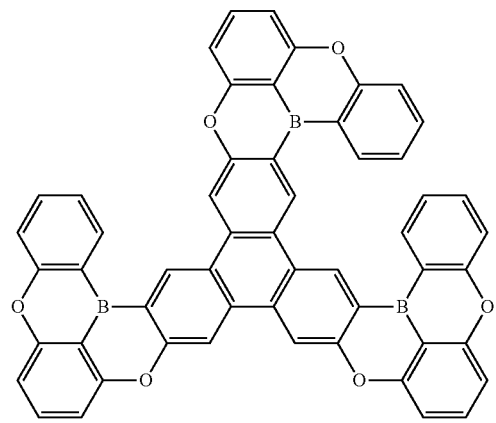
36
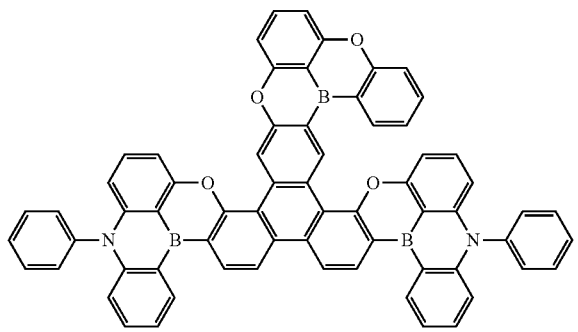
37
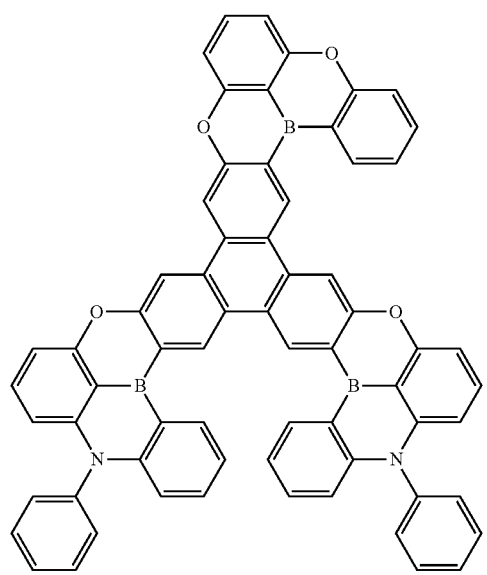
38
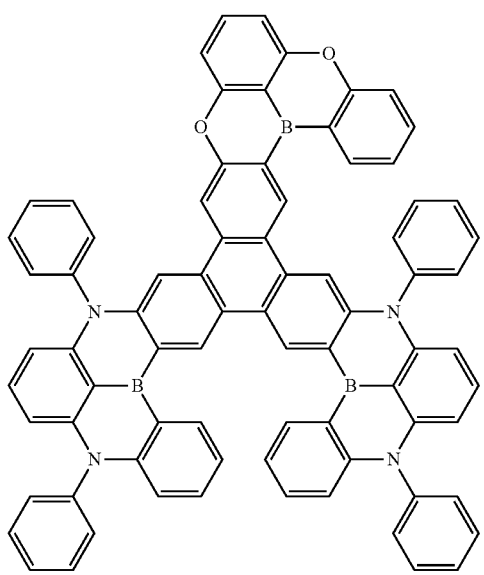

39
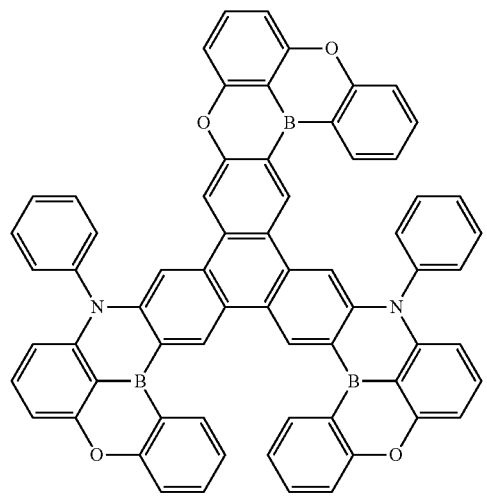
40
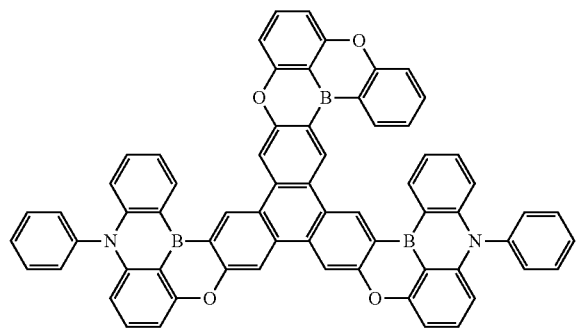
41
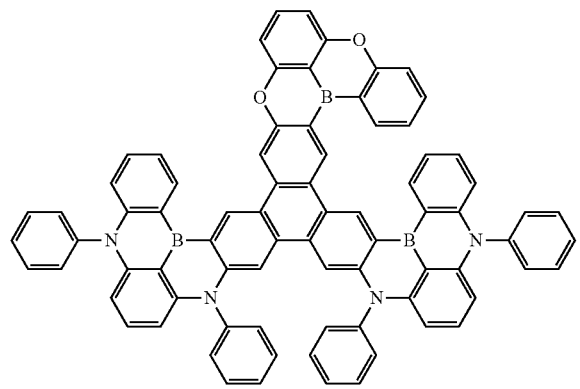
42
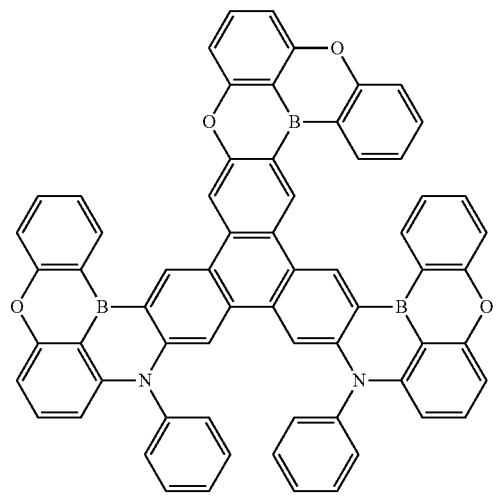
43
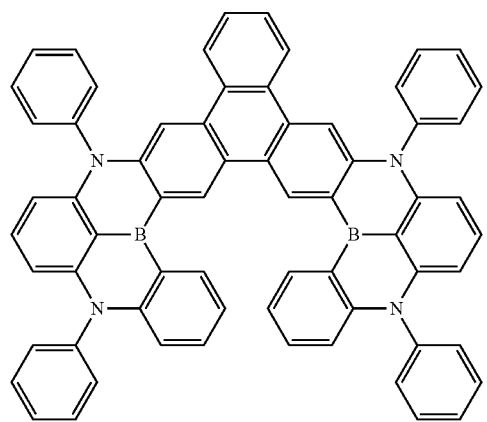
44
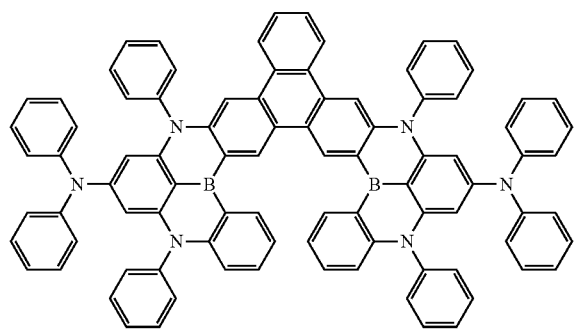

45
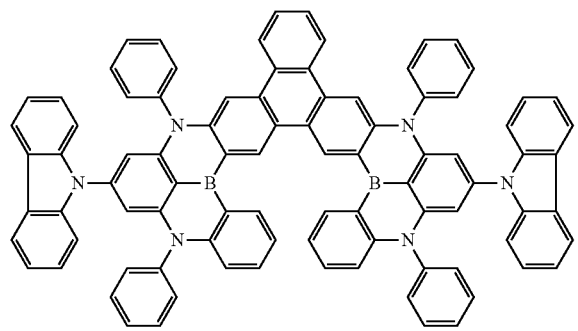
46
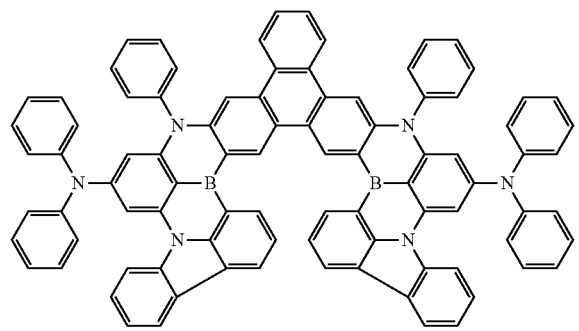
47
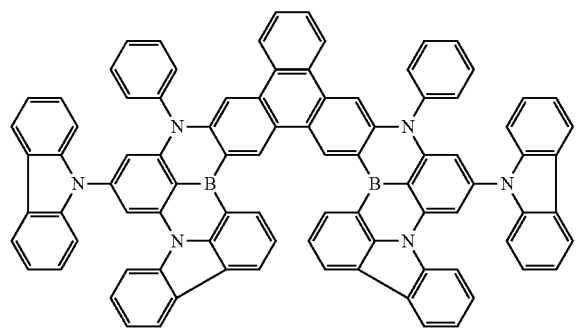
48
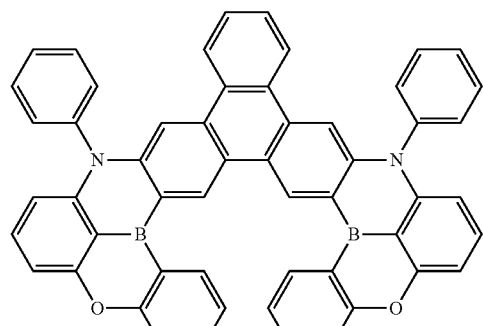
49
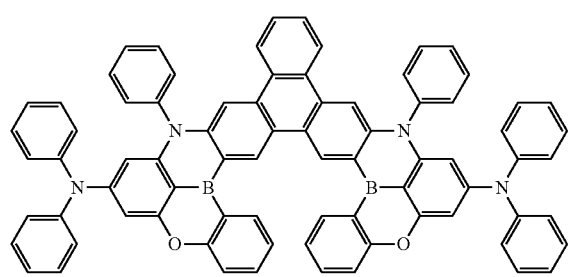
50
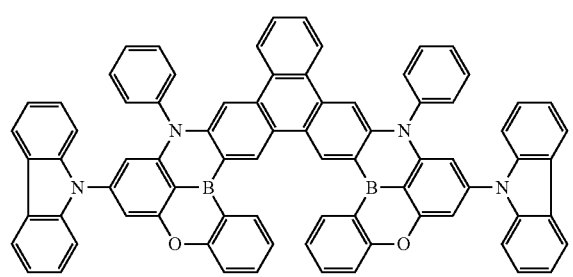
51
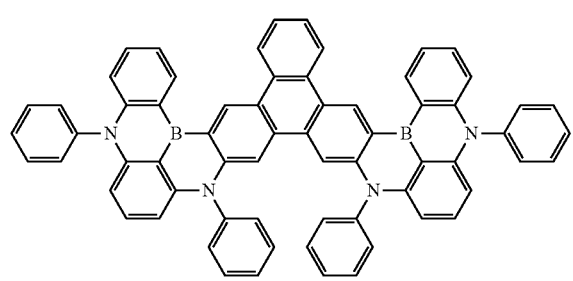
52
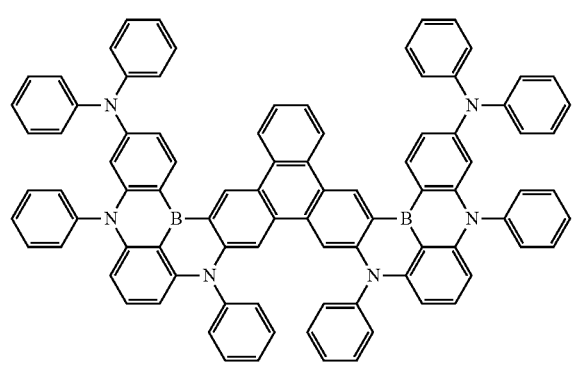

-continued
53
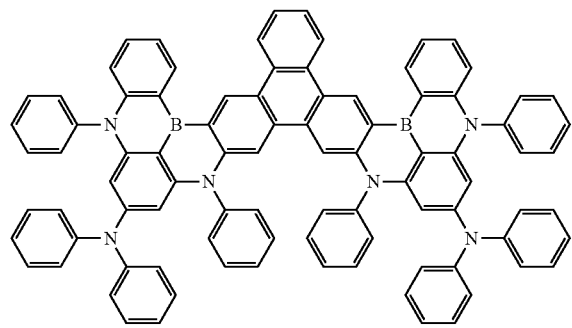
54
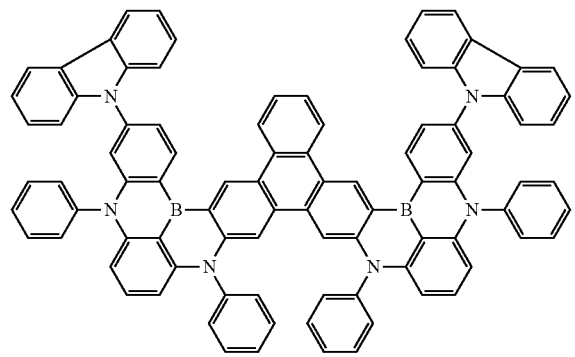
55
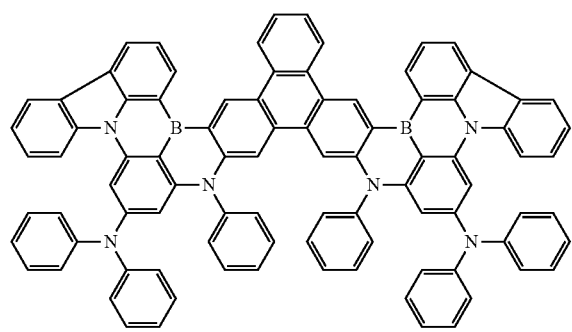
56
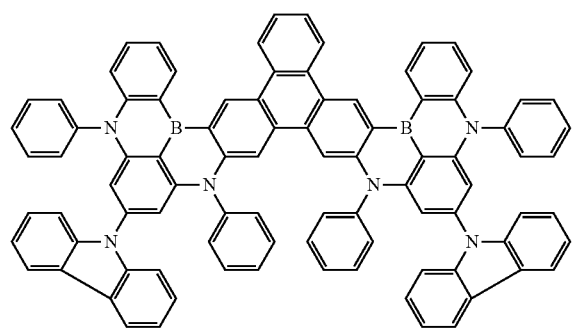
57
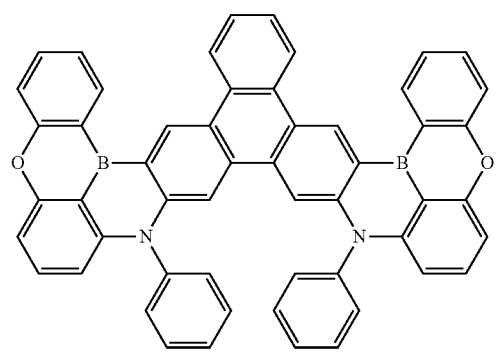
58
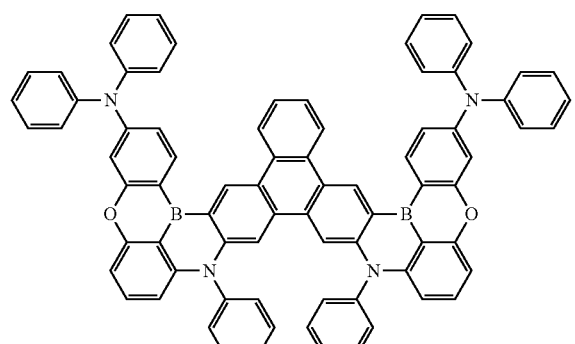
59
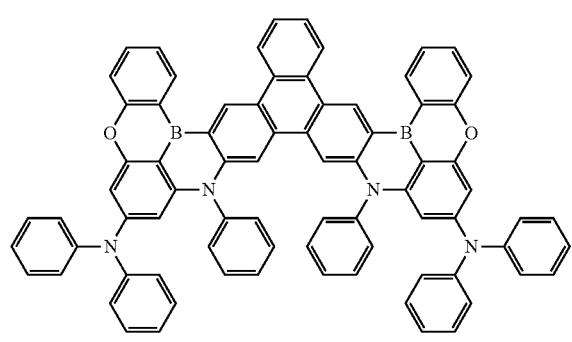
60
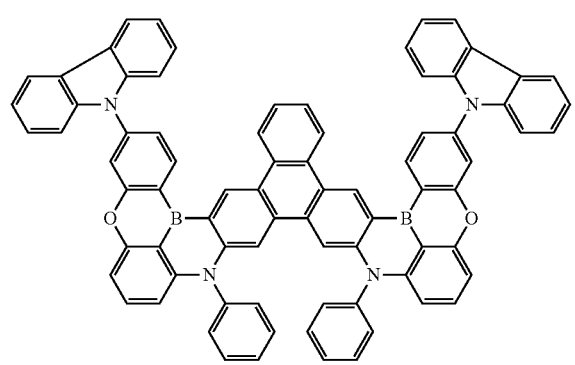

61
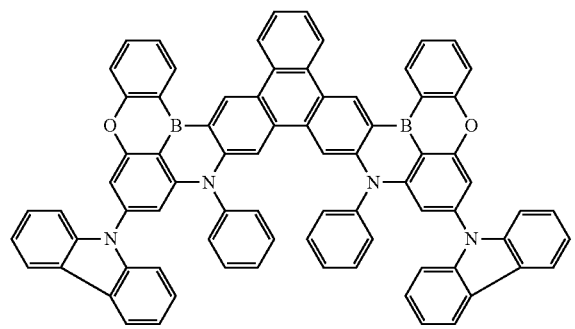
62
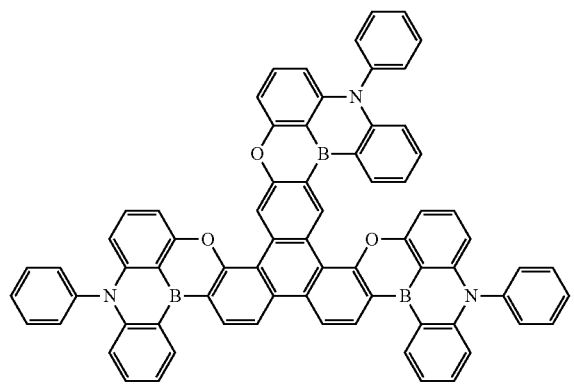
63
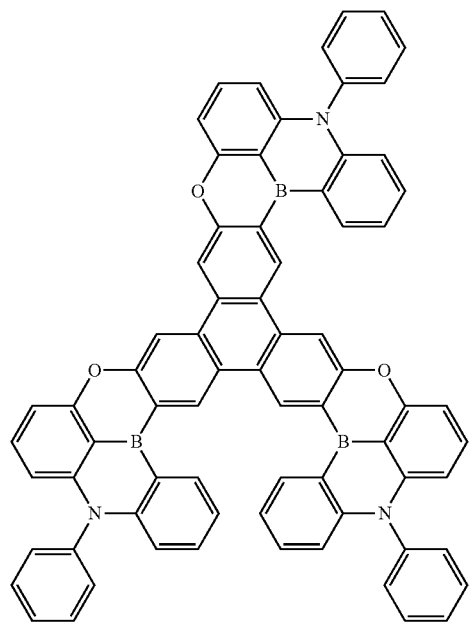
64
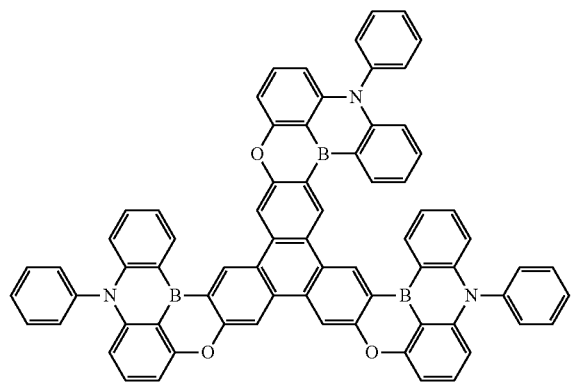
65
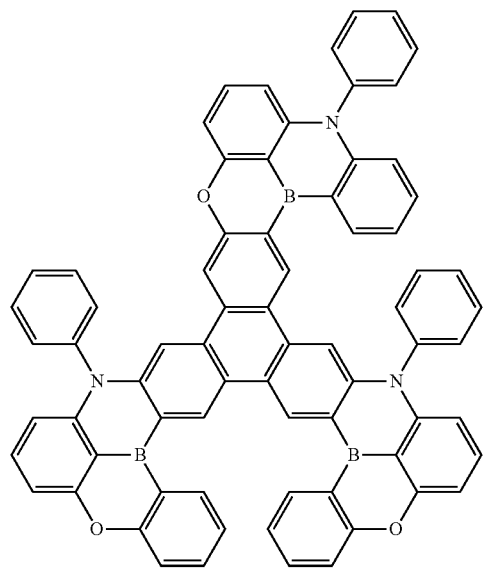
66
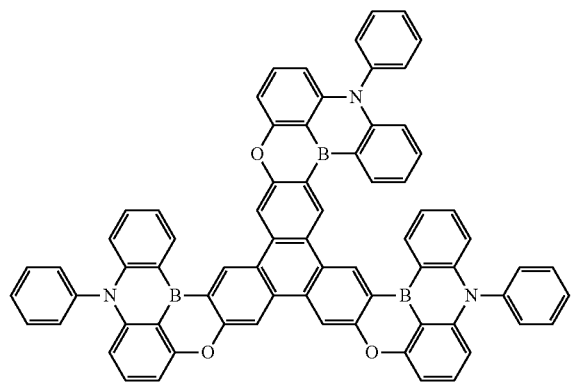

67
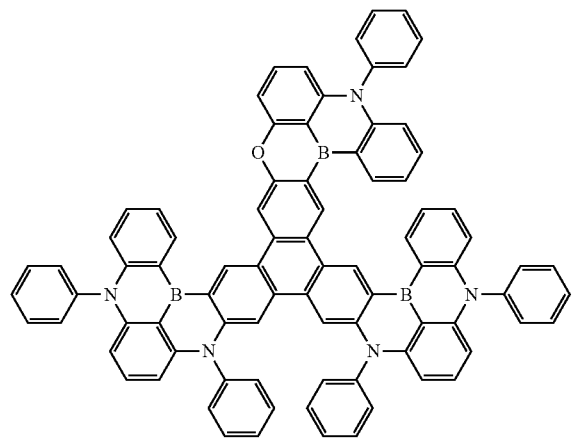
68
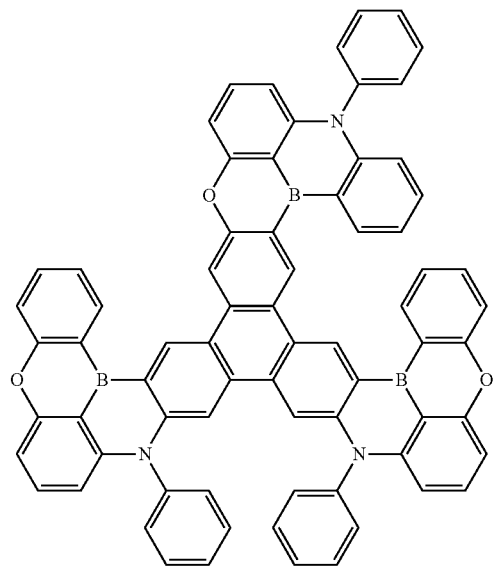
69
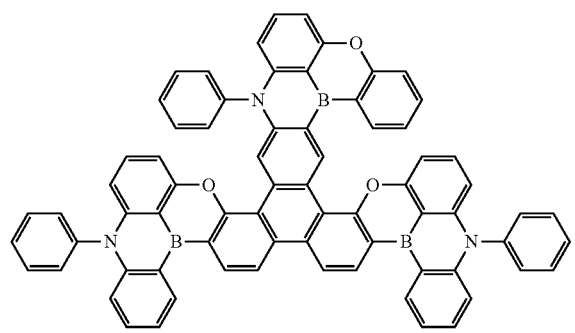
70
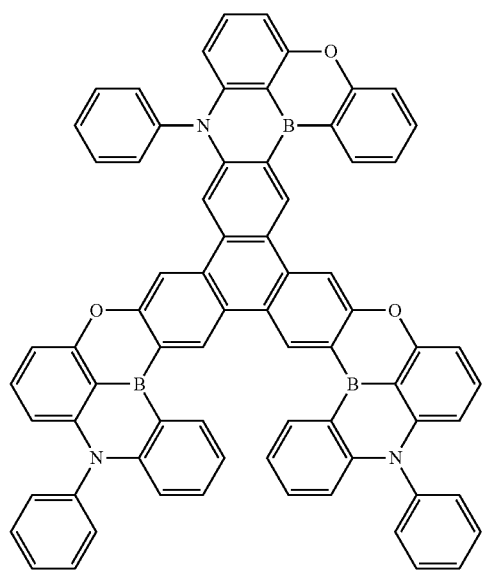

-continued
71
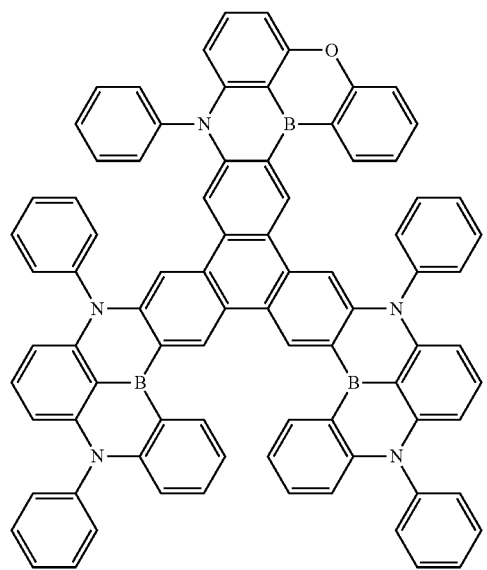
72
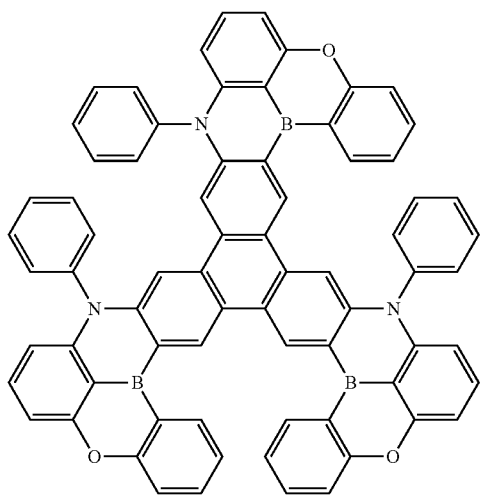
73
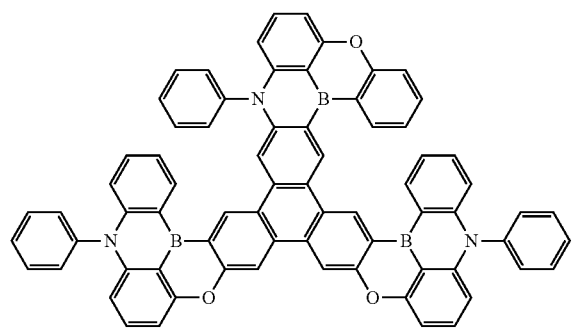
74
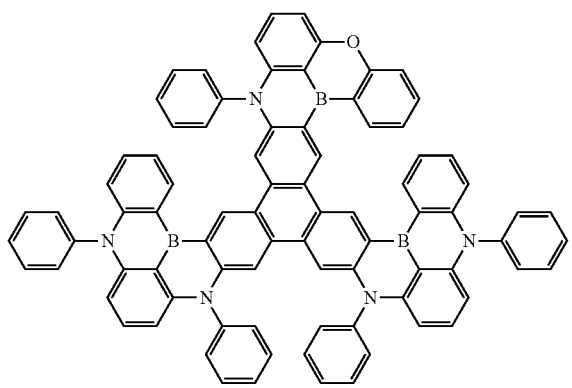
75
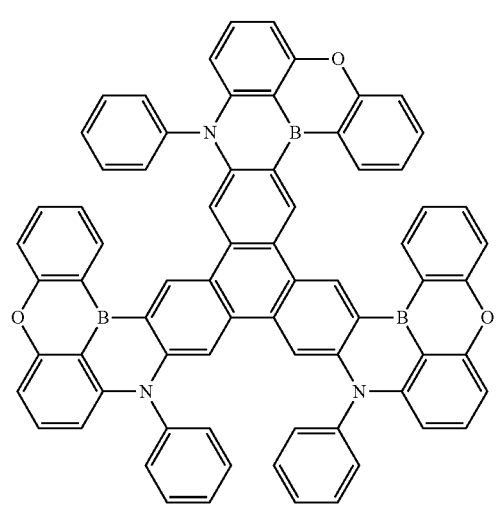
76
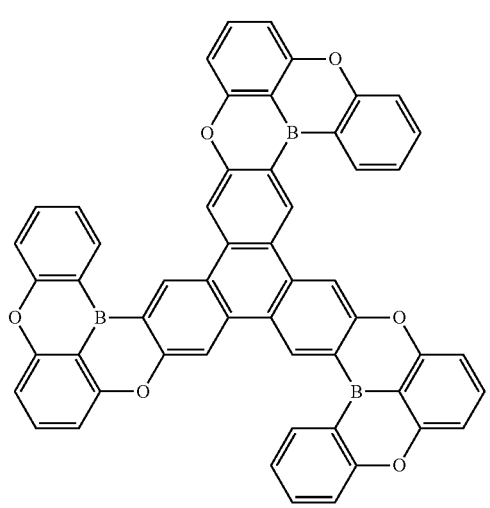

-continued
77
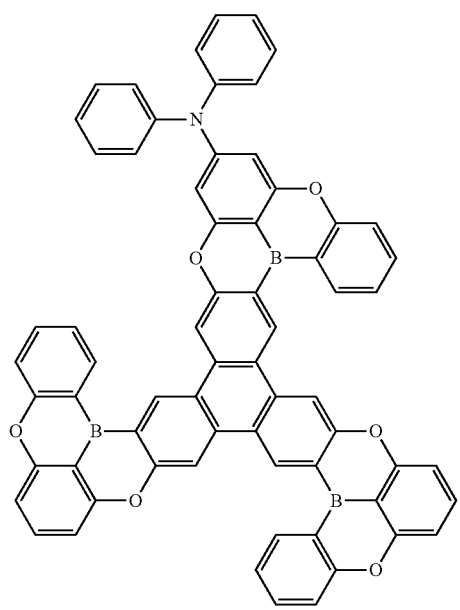
78
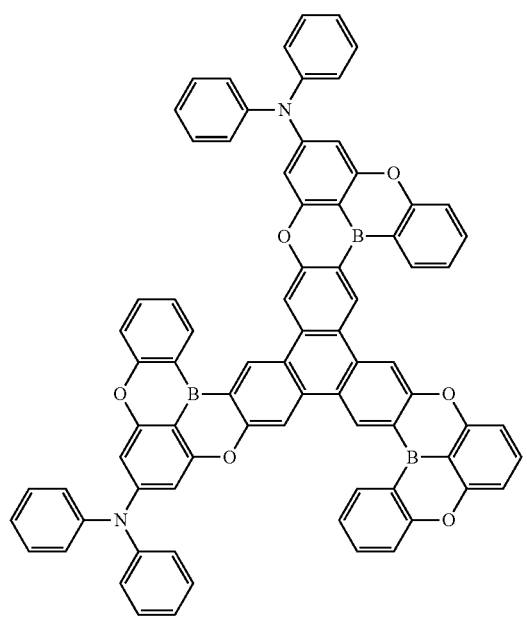
79
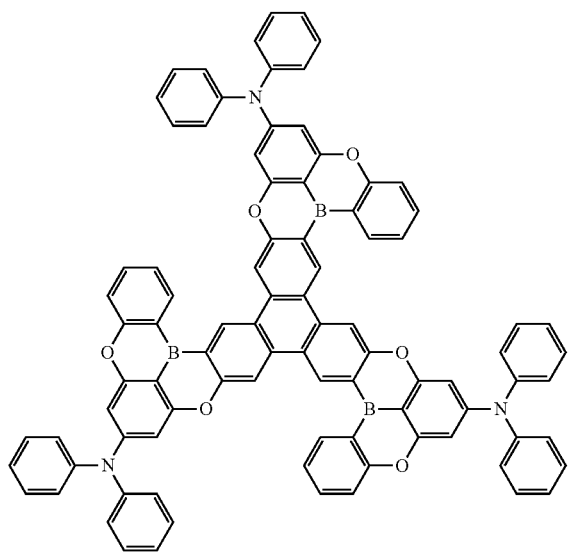
80
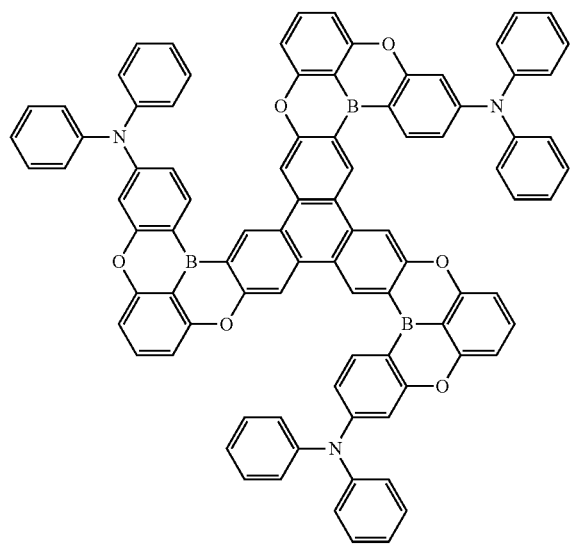

201
202
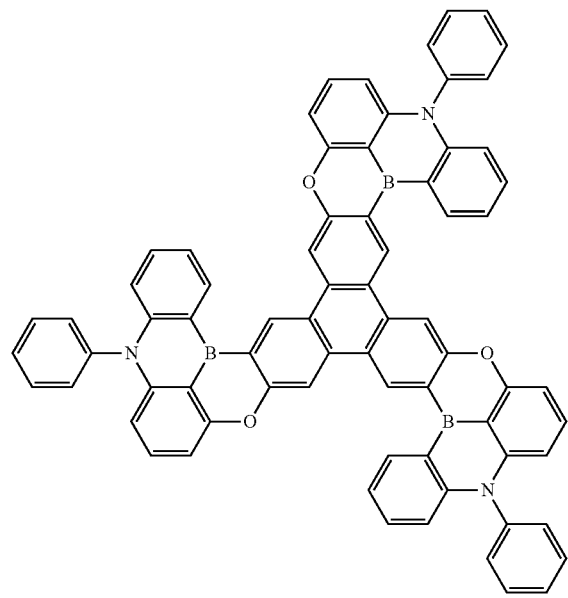
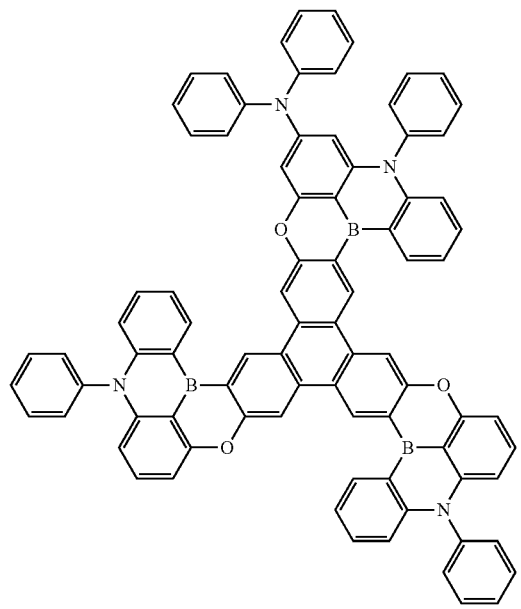
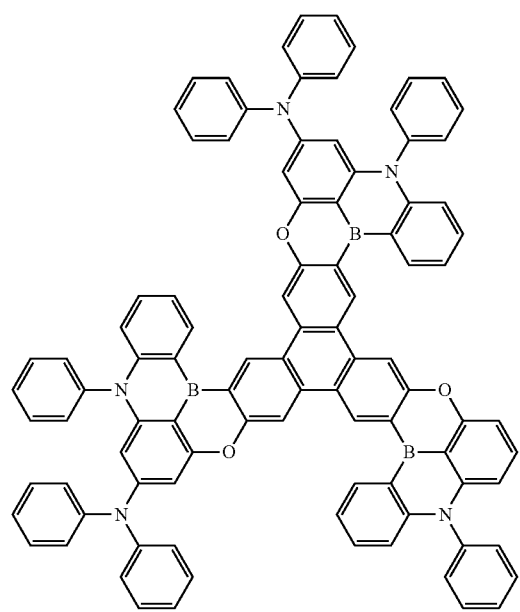
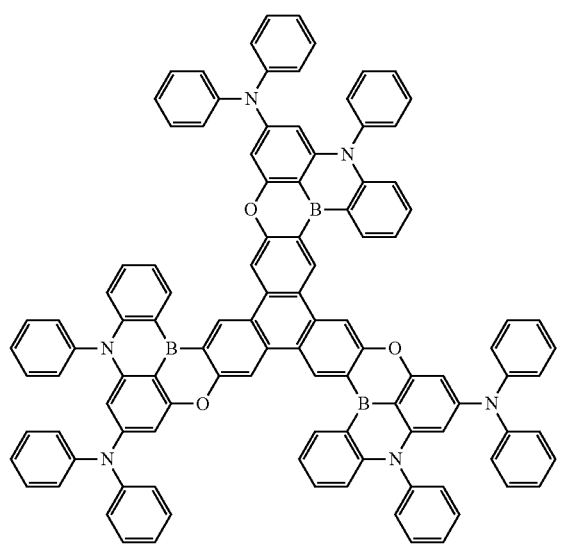

-continued
85
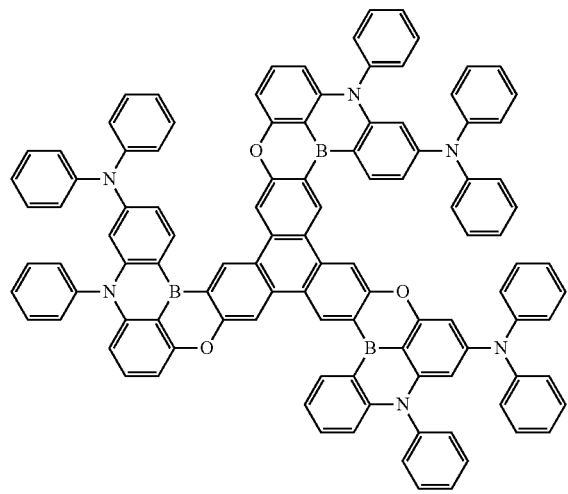
86
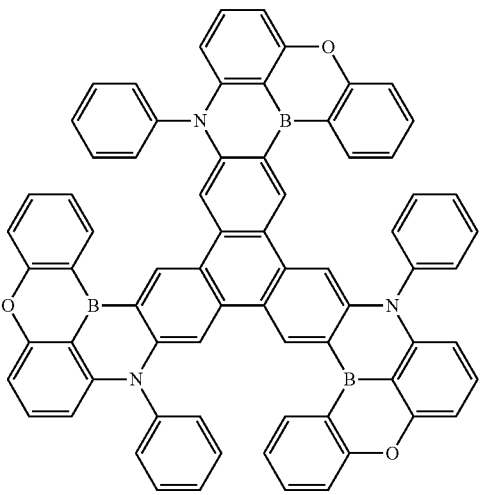
87
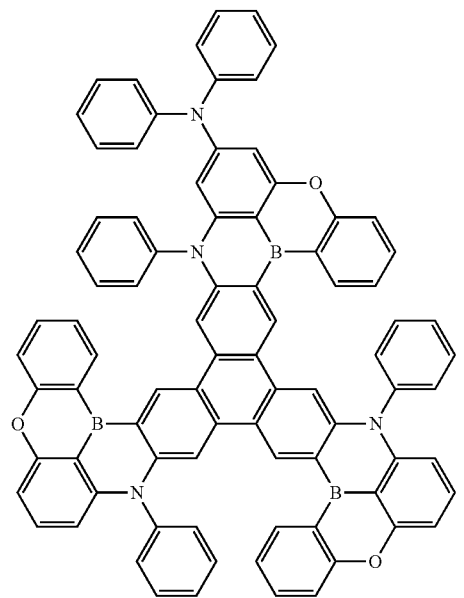
88
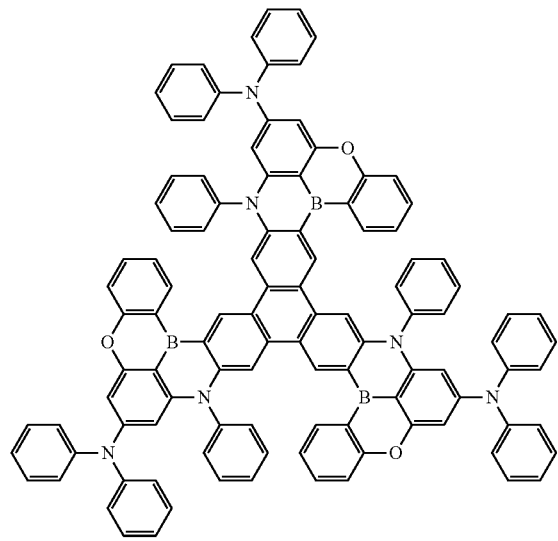
89
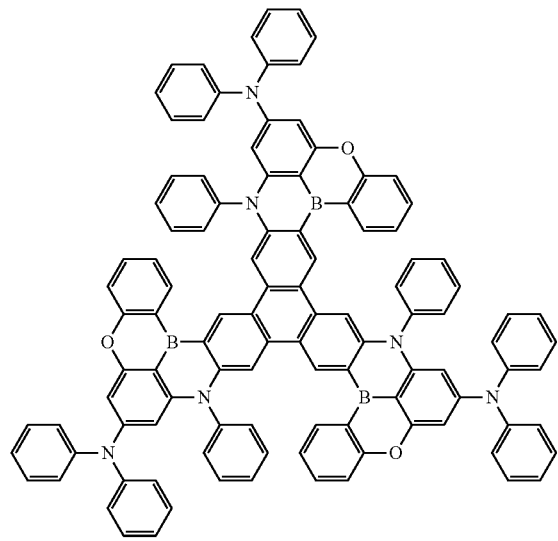
90
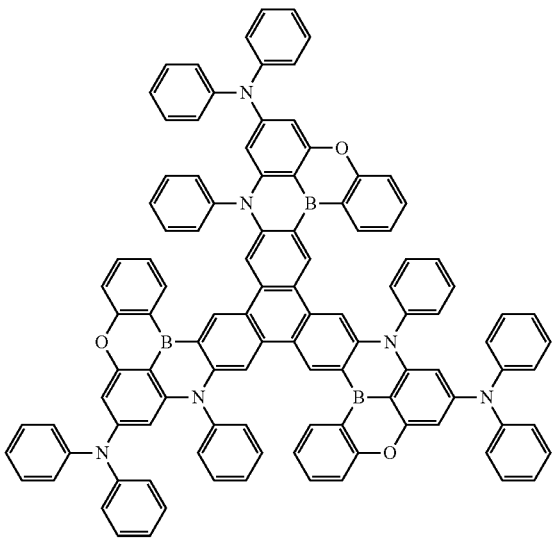

-continued
205
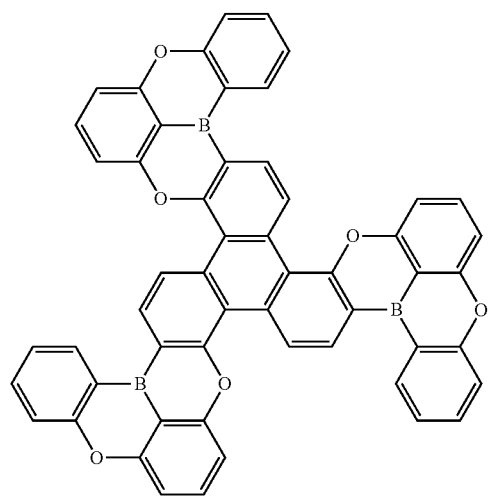
206
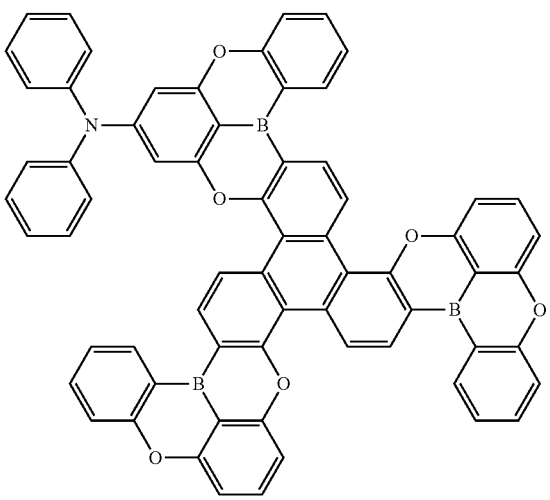
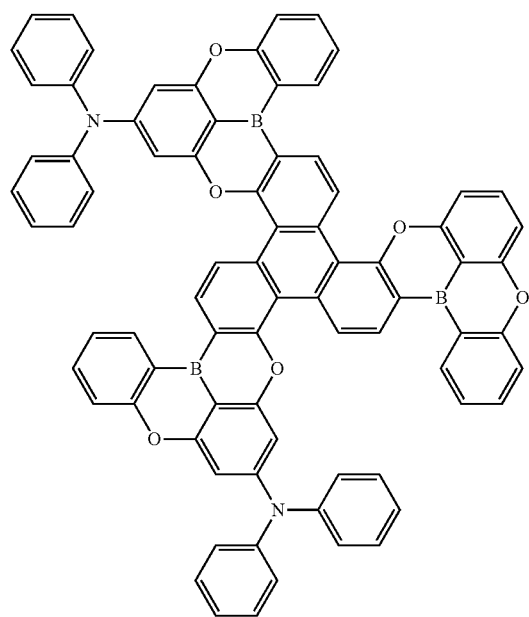
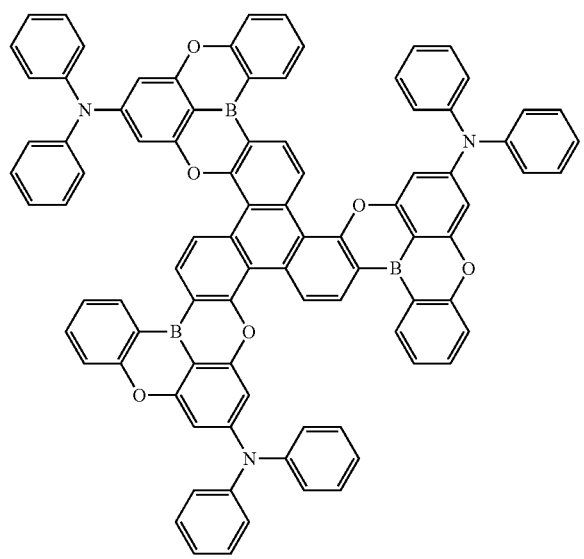

207
208
95
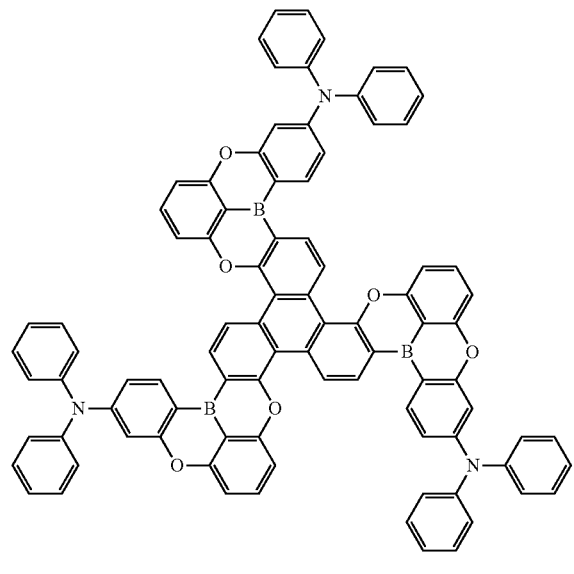
96
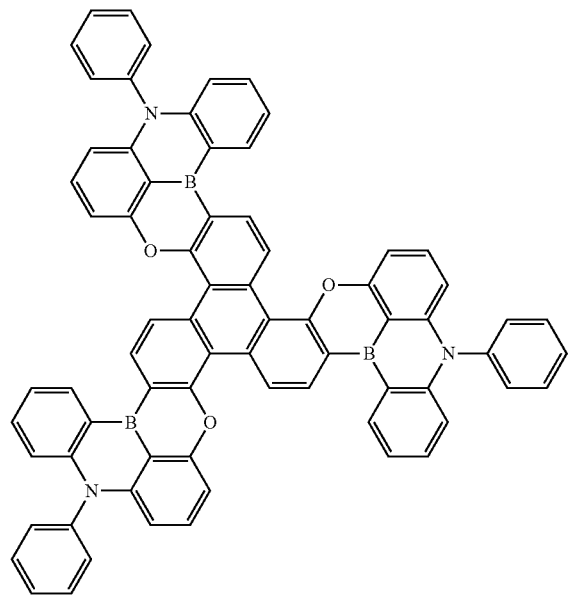
97
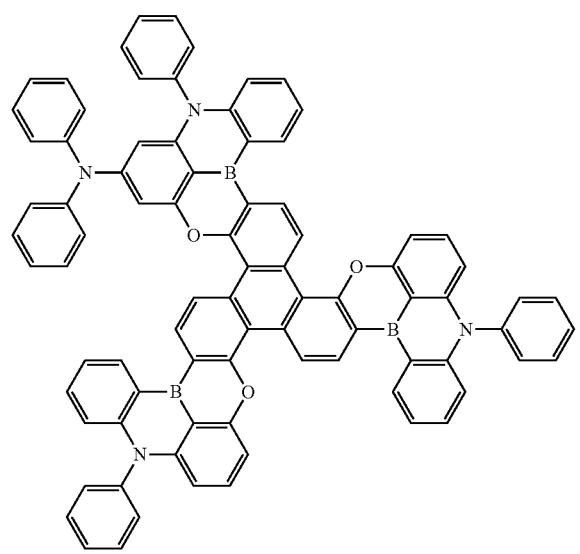
98
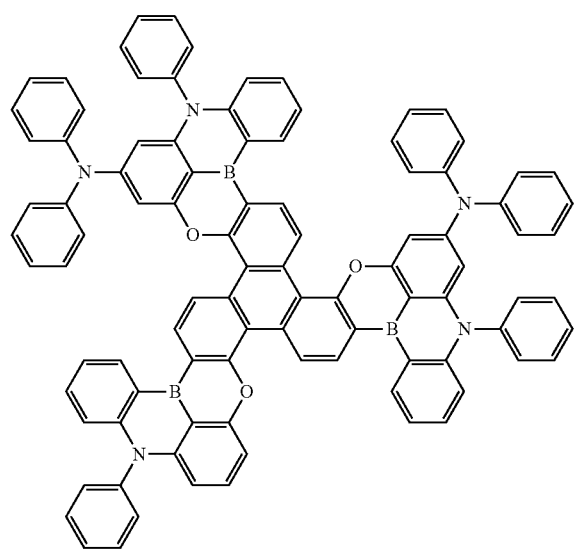

209 210
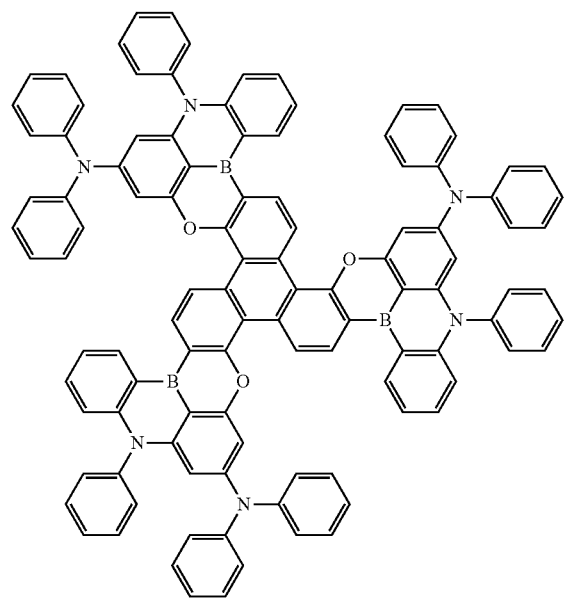 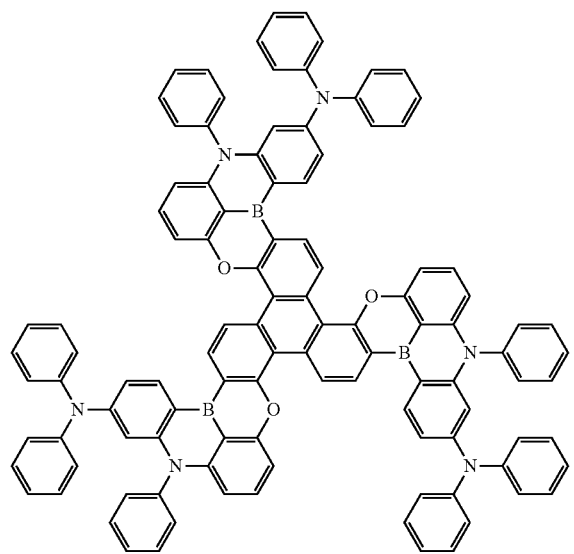
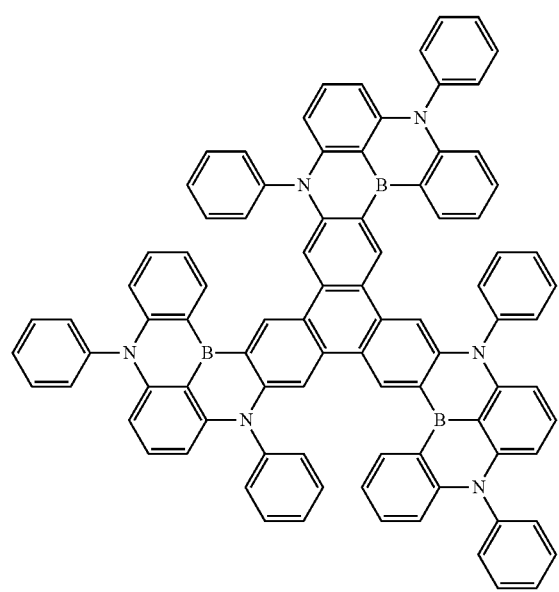 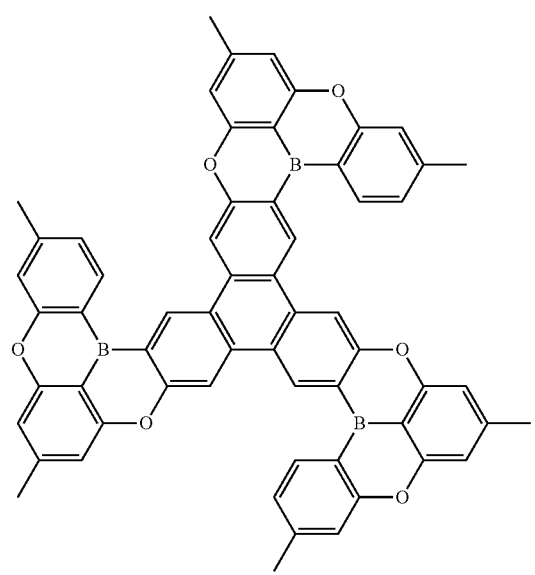

211
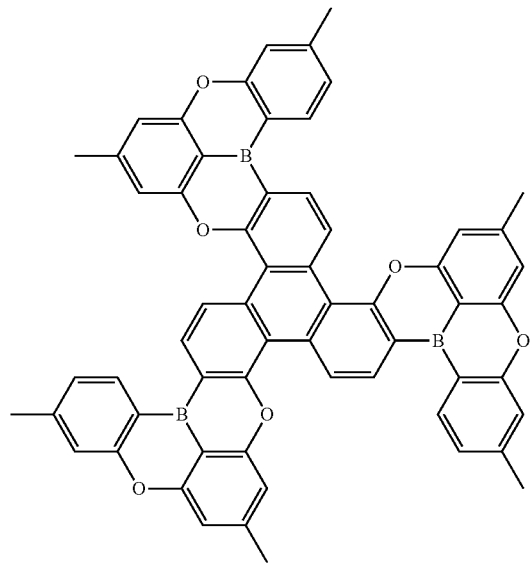
212
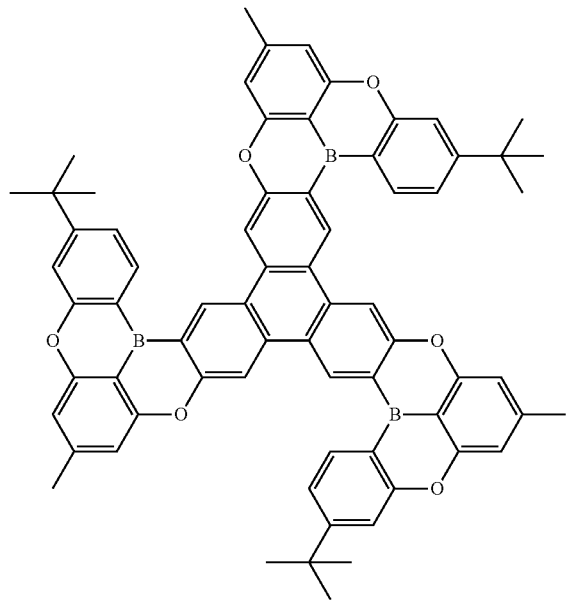
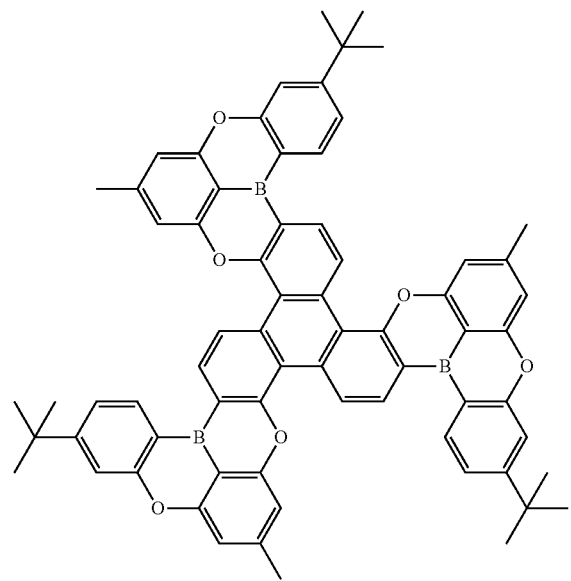
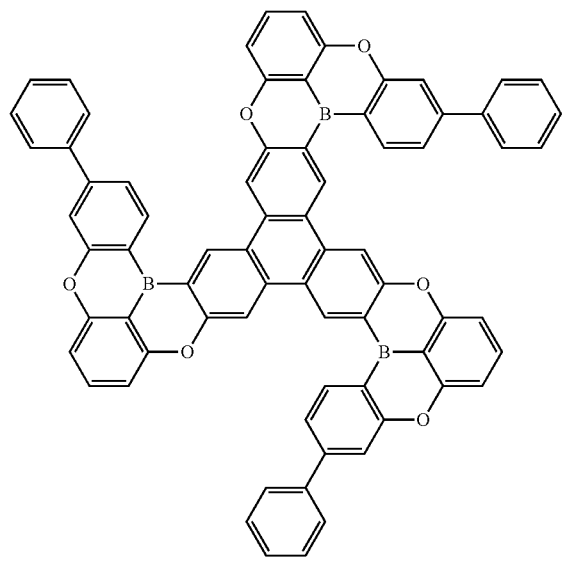

107
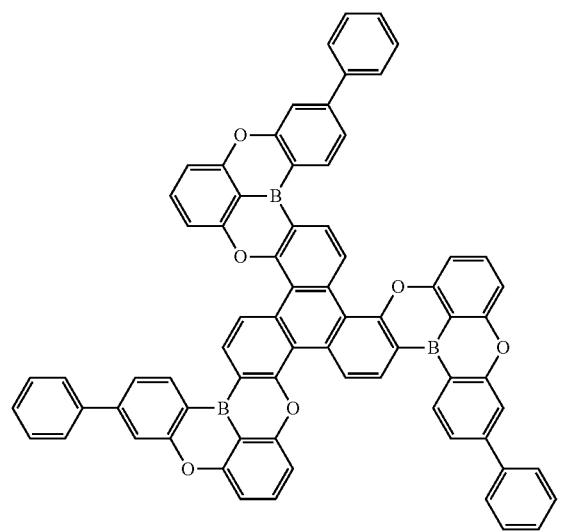
108
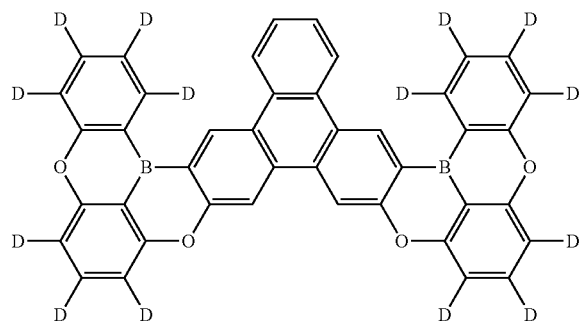
109
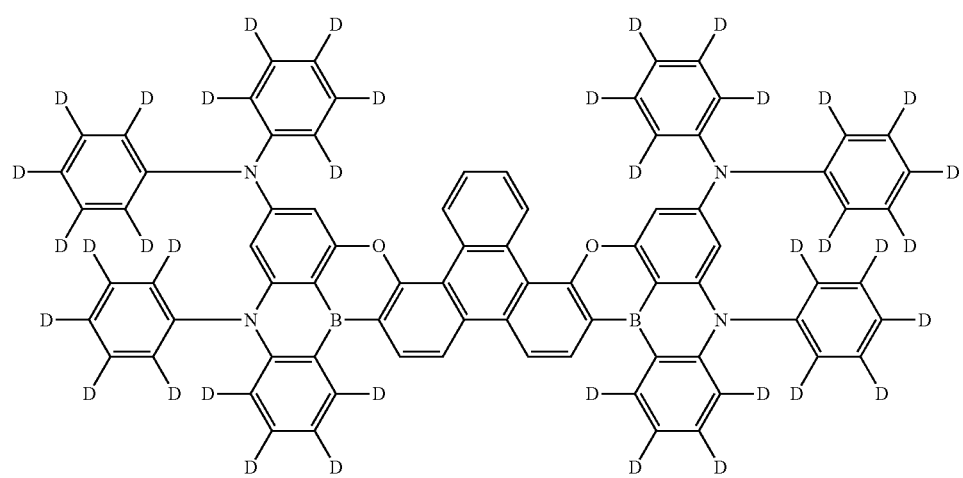
110
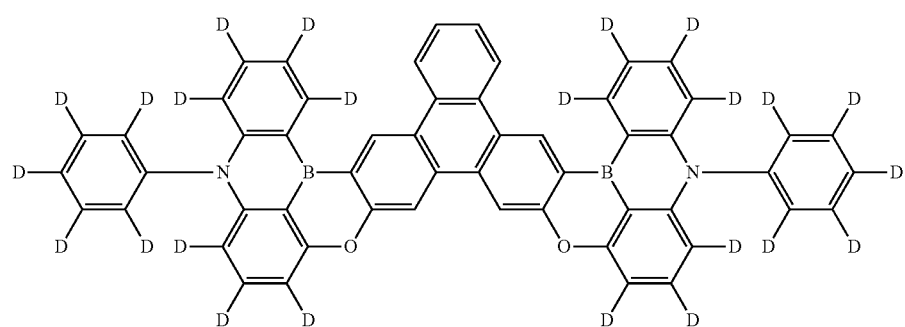

-continued
111
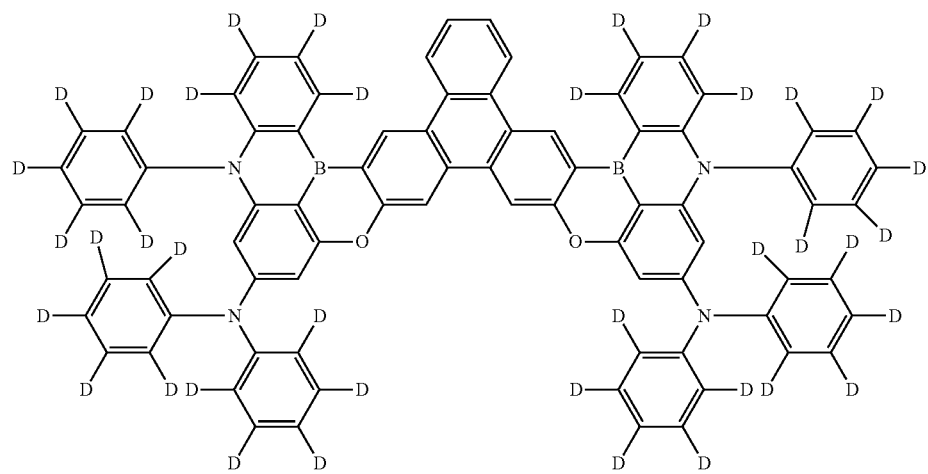
112
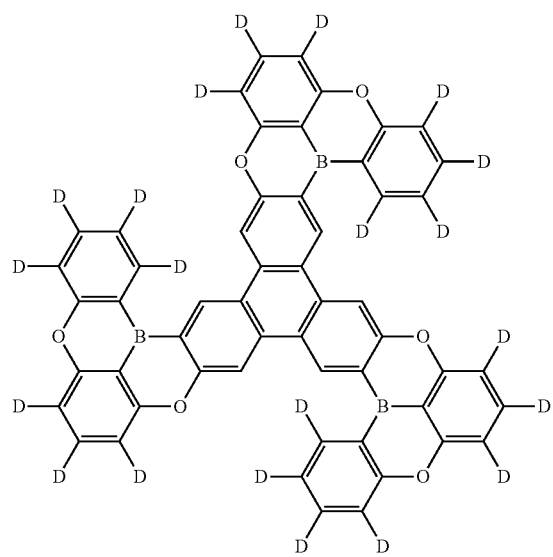
113
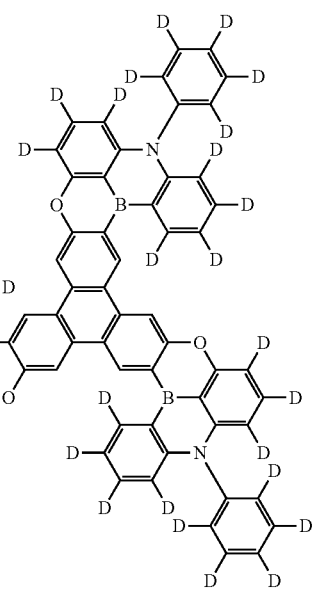
114
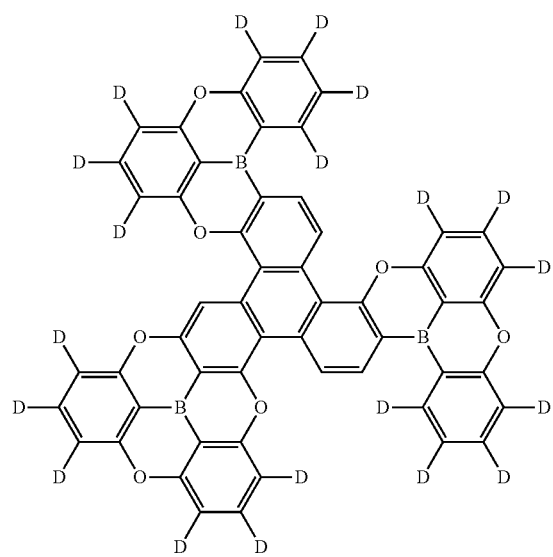
115
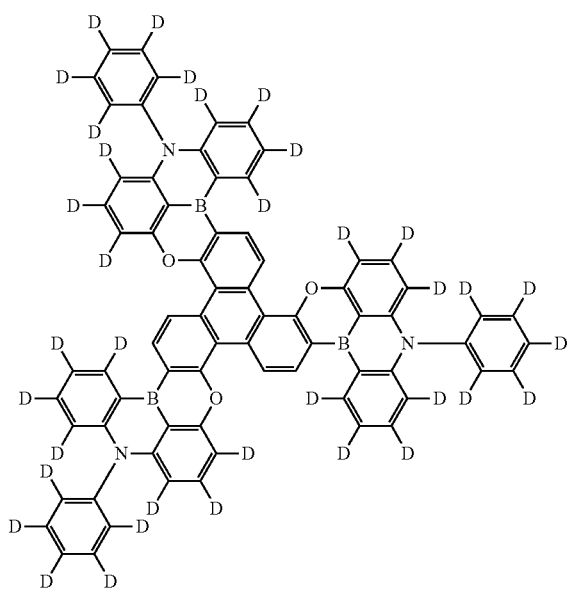

-continued
116
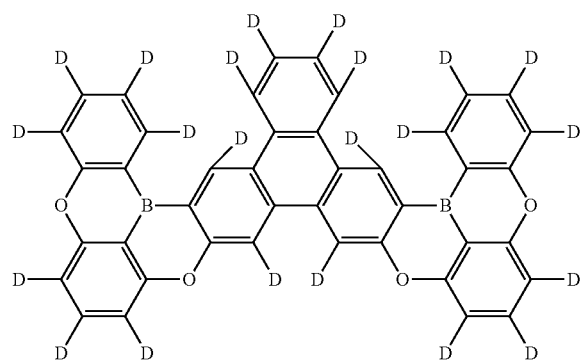
117
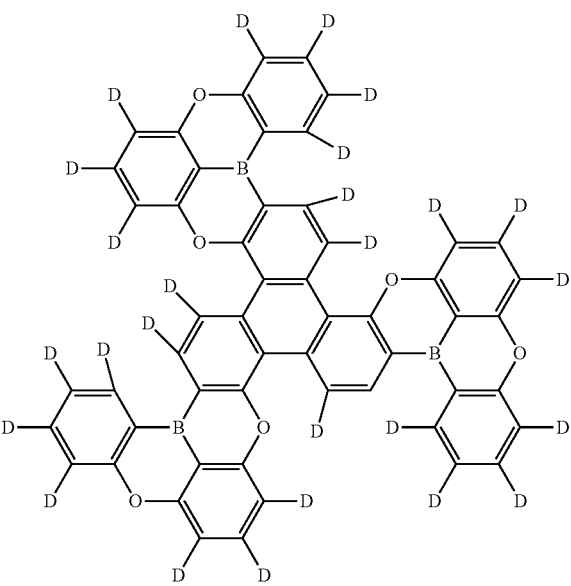
118
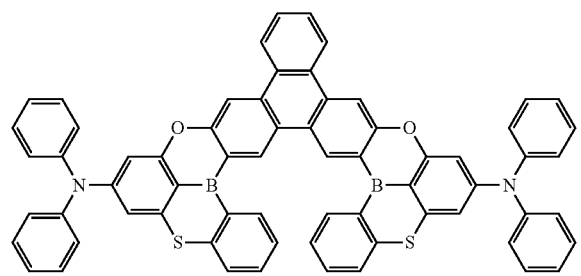
119
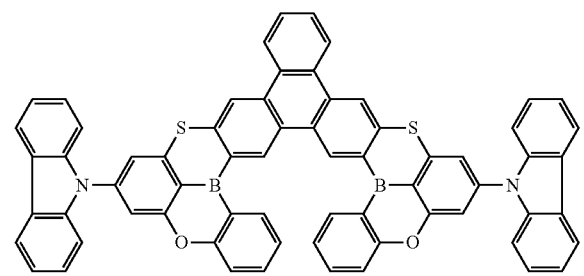
120
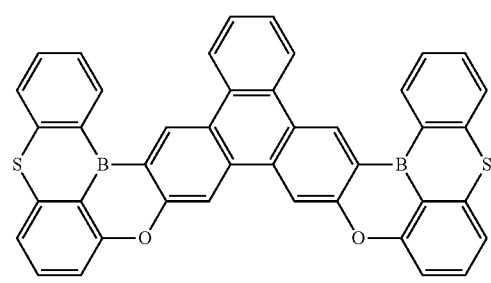
121
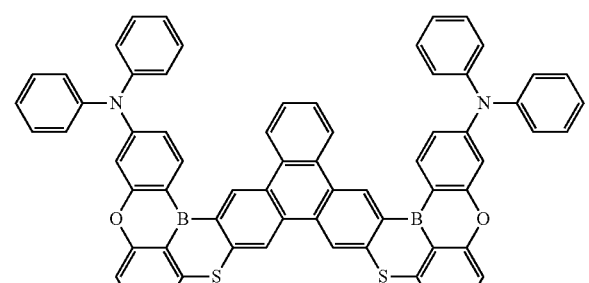
122
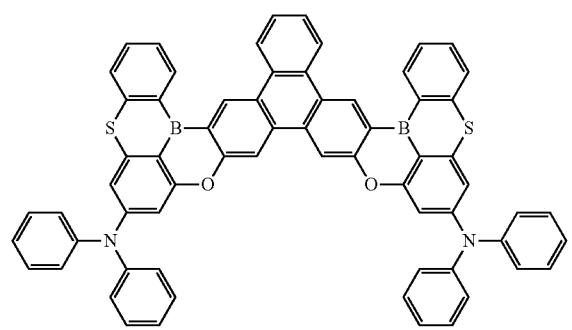
123
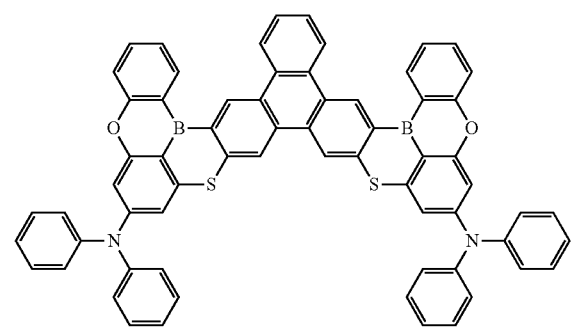

-continued
124
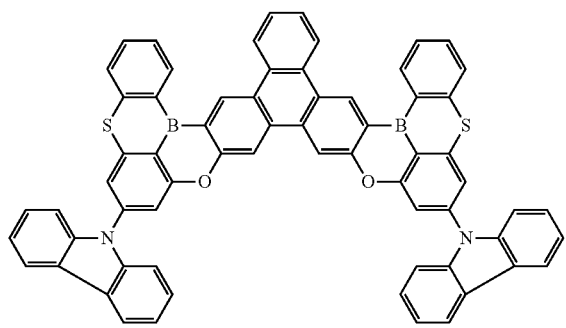
125
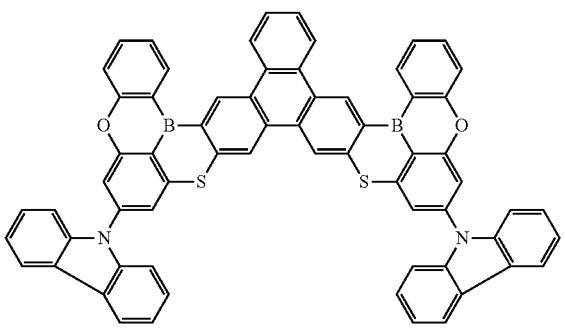
126
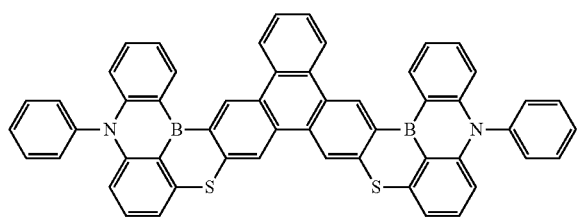
127
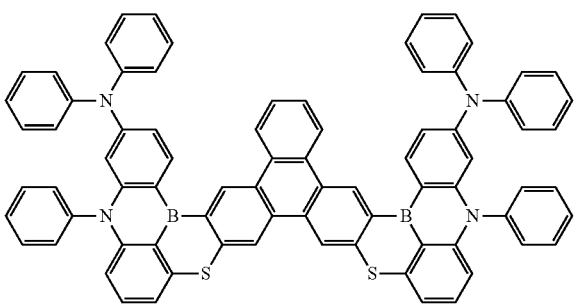
128
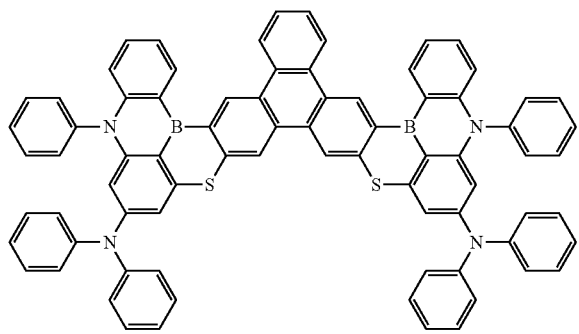
129
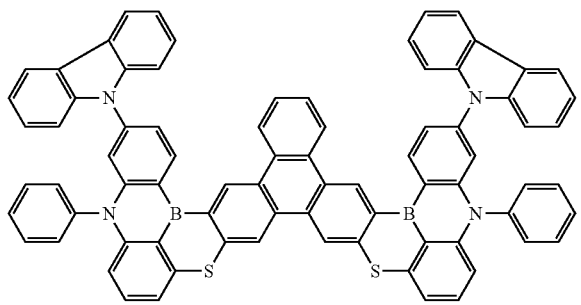
130
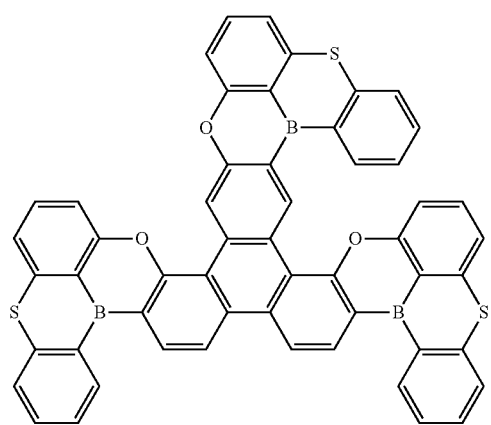
131
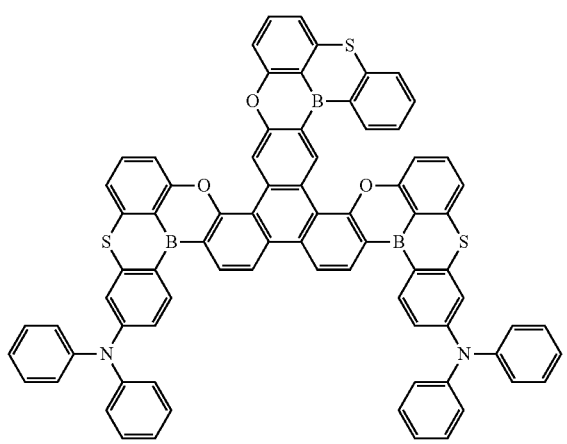

-continued
132
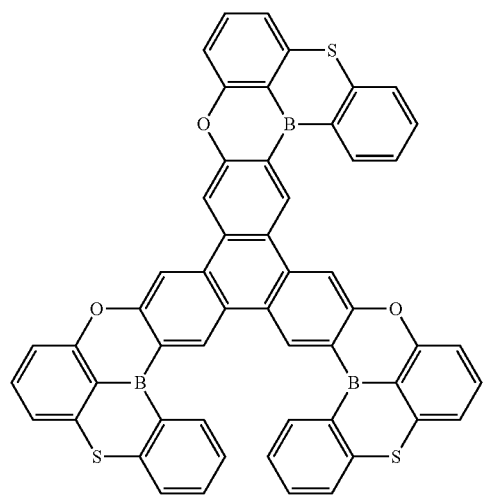
133
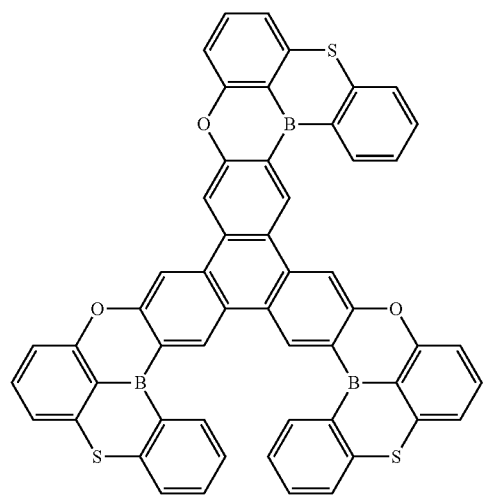
134
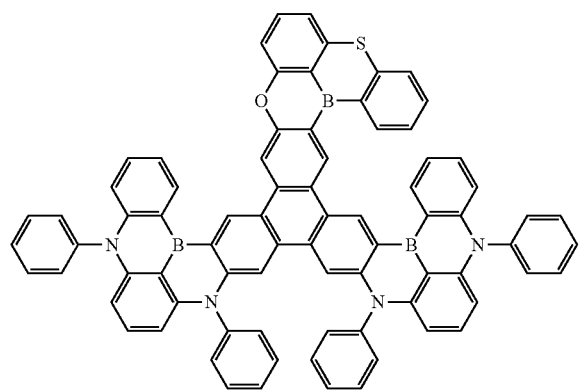
135
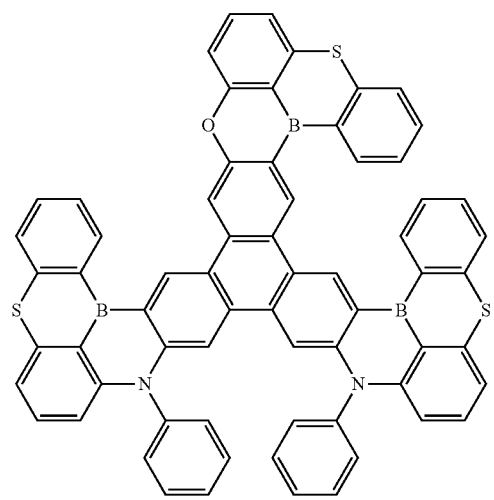
136
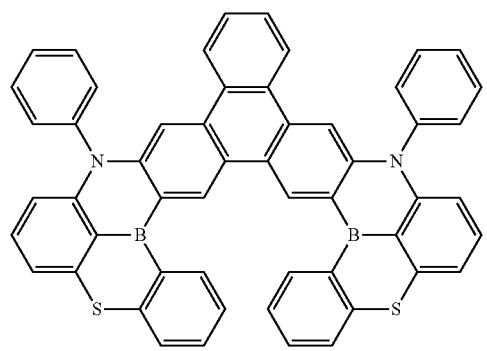
137
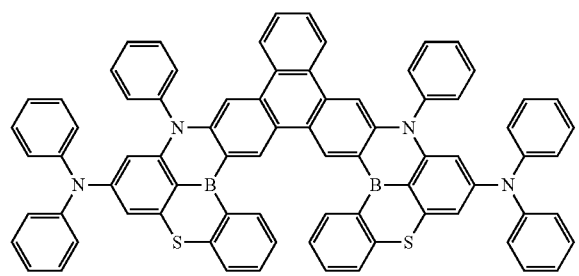

-continued
138
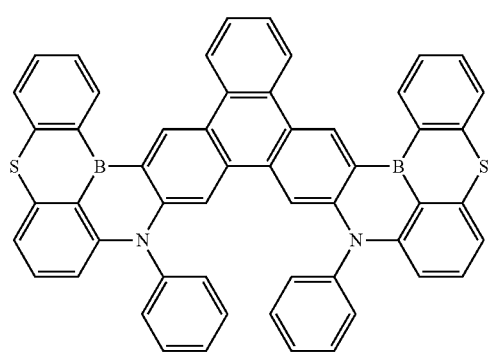
139
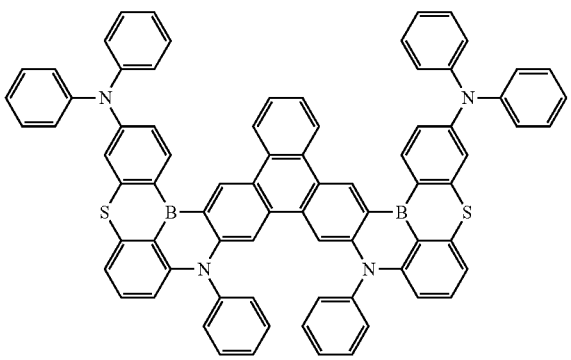
140
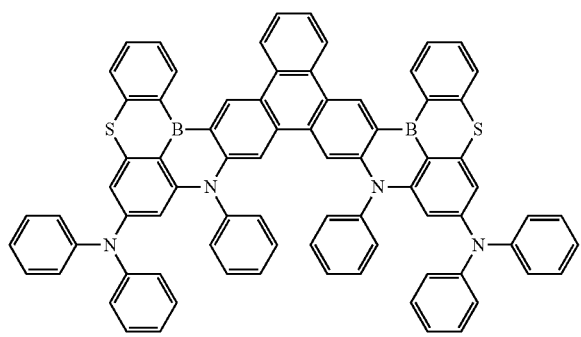
141
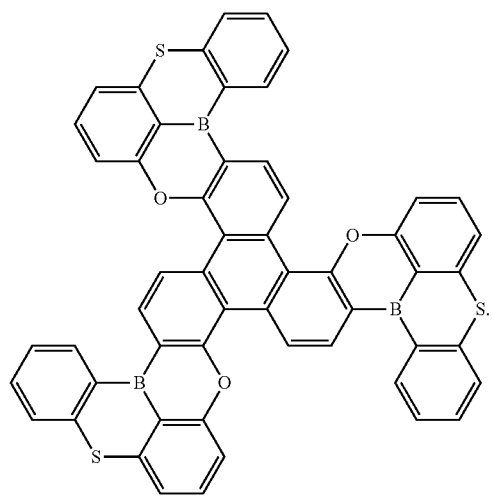
* * * * *